(12) United States Patent
Prins et al.

(10) Patent No.: US 8,751,755 B2
(45) Date of Patent: Jun. 10, 2014

(54) MASS STORAGE CONTROLLER VOLATILE MEMORY CONTAINING METADATA RELATED TO FLASH MEMORY STORAGE

(75) Inventors: Douglas A. Prins, Laguna Hills, CA (US); Aaron K. Olbrich, Morgan Hill, CA (US)

(73) Assignee: Sandisk Enterprise IP LLC, Milpitas, CA (US)

( * ) Notice: Subject to any disclaimer, the term of this patent is extended or adjusted under 35 U.S.C. 154(b) by 335 days.

(21) Appl. No.: 12/082,206

(22) Filed: Apr. 8, 2008

(65) Prior Publication Data

US 2009/0172259 A1    Jul. 2, 2009

Related U.S. Application Data

(60) Provisional application No. 61/017,123, filed on Dec. 27, 2007.

(51) Int. Cl.
*G06F 12/02*    (2006.01)

(52) U.S. Cl.
USPC ............... 711/154; 711/5; 711/140; 711/147; 711/169; 710/317

(58) Field of Classification Search
USPC ................ 711/5, 140, 147, 169; 710/317
See application file for complete search history.

(56) References Cited

U.S. PATENT DOCUMENTS

| | | | |
|---|---|---|---|
| 4,916,652 A | 4/1990 | Schwarz | |
| 5,530,705 A | 6/1996 | Malone, Sr. | |
| 5,537,555 A | 7/1996 | Landry | |
| 5,551,003 A | 8/1996 | Matton et al. | |
| 5,657,332 A | 8/1997 | Auclair et al. | |
| 5,666,114 A | 9/1997 | Brodie et al. | |
| 5,943,692 A | 8/1999 | Marberg et al. | |
| 5,982,664 A | 11/1999 | Watanabe | |
| 6,000,006 A * | 12/1999 | Bruce et al. | ................ 711/103 |
| 6,016,560 A | 1/2000 | Wada | |
| 6,295,592 B1 | 9/2001 | Jeddeloh | |
| 6,311,263 B1 | 10/2001 | Barlow et al. | |
| 6,442,076 B1 | 8/2002 | Roohparvar | |
| 6,449,625 B1 | 9/2002 | Wang | |
| 6,484,224 B1 | 11/2002 | Robins et al. | |

(Continued)

FOREIGN PATENT DOCUMENTS

| | | |
|---|---|---|
| EP | 1465203 A1 | 10/2004 |
| JP | 2002-532806 | 10/2002 |

(Continued)

OTHER PUBLICATIONS

Peter T. McLean, T13/1153D "Information Technology—AT Attachment with Packet Interface Extension (ATA/ATAPI-4)", NCITS, Revision 18, Aug. 1998.*

(Continued)

*Primary Examiner* — Matthew Bradley
*Assistant Examiner* — Ramon A Mercado
(74) *Attorney, Agent, or Firm* — Morgan, Lewis & Bockius LLP

(57) ABSTRACT

A volatile memory associated with a mass storage controller and a flash memory module. The volatile memory includes a number of tables containing information related to the flash memory storage, including a table storing physical flash memory addresses and a plurality of tables containing metadata.

27 Claims, 70 Drawing Sheets

(56) References Cited

U.S. PATENT DOCUMENTS

| | | | |
|---|---|---|---|
| 6,678,788 B1 | 1/2004 | O'Connell | |
| 6,757,768 B1 | 6/2004 | Potter et al. | |
| 6,775,792 B2 * | 8/2004 | Ulrich et al. | 714/6.12 |
| 6,810,440 B2 | 10/2004 | Micalizzi, Jr. et al. | |
| 6,836,808 B2 | 12/2004 | Bunce | |
| 6,836,815 B1 | 12/2004 | Purcell et al. | |
| 6,842,436 B2 | 1/2005 | Moeller | |
| 6,871,257 B2 | 3/2005 | Conley | |
| 6,895,464 B2 * | 5/2005 | Chow et al. | 711/103 |
| 6,978,343 B1 | 12/2005 | Ichiriu | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,032,123 B2 | 4/2006 | Kane et al. | |
| 7,043,505 B1 | 5/2006 | Teague et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets | |
| 7,184,446 B2 | 2/2007 | Rashid | |
| 7,516,292 B2 | 4/2009 | Kimura et al. | |
| 7,523,157 B2 | 4/2009 | Aguilar, Jr. et al. | |
| 7,571,277 B2 | 8/2009 | Mizushima | |
| 7,574,554 B2 | 8/2009 | Tanaka et al. | |
| 7,596,643 B2 | 9/2009 | Merry | |
| 7,681,106 B2 | 3/2010 | Jarrar | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins | |
| 7,971,112 B2 | 6/2011 | Murata | |
| 7,978,516 B2 | 7/2011 | Olbrich | |
| 7,996,642 B1 | 8/2011 | Smith | |
| 8,032,724 B1 | 10/2011 | Smith | |
| 8,412,985 B1 | 4/2013 | Bowers et al. | |
| 2002/0024846 A1 | 2/2002 | Kawahara et al. | |
| 2002/0083299 A1 | 6/2002 | Van Huben et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid | |
| 2003/0088805 A1 | 5/2003 | Majni et al. | |
| 2003/0093628 A1 | 5/2003 | Matter et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 * | 3/2005 | Shrader et al. | 711/149 |
| 2005/0114587 A1 | 5/2005 | Chou et al. | |
| 2005/0172065 A1 | 8/2005 | Keays | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0053246 A1 | 3/2006 | Lee | |
| 2006/0085671 A1 | 4/2006 | Majni et al. | |
| 2006/0136570 A1 | 6/2006 | Pandya | |
| 2006/0156177 A1 | 7/2006 | Kottapalli et al. | |
| 2006/0195650 A1 | 8/2006 | Su et al. | |
| 2006/0259528 A1 | 11/2006 | Dussud et al. | |
| 2007/0011413 A1 | 1/2007 | Nonaka | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon | |
| 2007/0083697 A1 * | 4/2007 | Birrell et al. | 711/103 |
| 2007/0113019 A1 | 5/2007 | Beukema et al. | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujibayashi et al. | |
| 2007/0208901 A1 | 9/2007 | Purcell et al. | |
| 2007/0234143 A1 | 10/2007 | Kim | |
| 2007/0245061 A1 | 10/2007 | Harriman | |
| 2007/0277036 A1 | 11/2007 | Chamberlain et al. | |
| 2007/0291556 A1 | 12/2007 | Kamei | |
| 2007/0294496 A1 | 12/2007 | Goss et al. | |
| 2007/0300130 A1 | 12/2007 | Gorobets | |
| 2008/0019182 A1 | 1/2008 | Yanagidaira et al. | |
| 2008/0022163 A1 | 1/2008 | Tanaka et al. | |
| 2008/0052446 A1 | 2/2008 | Lasser et al. | |
| 2008/0077841 A1 | 3/2008 | Gonzalez et al. | |
| 2008/0077937 A1 | 3/2008 | Shin et al. | |
| 2008/0086677 A1 | 4/2008 | Yang et al. | |
| 2008/0144371 A1 | 6/2008 | Yeh et al. | |
| 2008/0147964 A1 | 6/2008 | Chow et al. | |
| 2008/0147998 A1 | 6/2008 | Jeong | |
| 2008/0148124 A1 | 6/2008 | Zhang et al. | |
| 2008/0163030 A1 | 7/2008 | Lee | |
| 2008/0168319 A1 | 7/2008 | Lee et al. | |
| 2008/0170460 A1 | 7/2008 | Oh et al. | |
| 2008/0229000 A1 | 9/2008 | Kim | |
| 2008/0229003 A1 | 9/2008 | Mizushima et al. | |
| 2008/0229176 A1 | 9/2008 | Arnez et al. | |
| 2008/0270680 A1 | 10/2008 | Chang | |
| 2008/0282128 A1 | 11/2008 | Lee et al. | |
| 2008/0285351 A1 | 11/2008 | Shlick et al. | |
| 2009/0003058 A1 | 1/2009 | Kang | |
| 2009/0037652 A1 | 2/2009 | Yu et al. | |
| 2009/0144598 A1 | 6/2009 | Yoon et al. | |
| 2009/0168525 A1 | 7/2009 | Olbrich et al. | |
| 2009/0172258 A1 | 7/2009 | Olbrich | |
| 2009/0172259 A1 | 7/2009 | Prins | |
| 2009/0172260 A1 | 7/2009 | Olbrich | |
| 2009/0172261 A1 | 7/2009 | Prins | |
| 2009/0172262 A1 | 7/2009 | Olbrich | |
| 2009/0172308 A1 | 7/2009 | Prins | |
| 2009/0172335 A1 | 7/2009 | Kulkarni et al. | |
| 2009/0172499 A1 | 7/2009 | Olbrich | |
| 2009/0193058 A1 | 7/2009 | Reid | |
| 2009/0207660 A1 | 8/2009 | Hwang et al. | |
| 2009/0222708 A1 | 9/2009 | Yamaga | |
| 2009/0296466 A1 | 12/2009 | Kim et al. | |
| 2009/0296486 A1 | 12/2009 | Kim et al. | |
| 2009/0319864 A1 | 12/2009 | Shrader | |
| 2010/0061151 A1 | 3/2010 | Miwa et al. | |
| 2010/0103737 A1 | 4/2010 | Park | |
| 2010/0199125 A1 | 8/2010 | Reche | |
| 2010/0202196 A1 | 8/2010 | Lee et al. | |
| 2010/0208521 A1 | 8/2010 | Kim et al. | |
| 2010/0262889 A1 | 10/2010 | Bains | |
| 2010/0281207 A1 | 11/2010 | Miller et al. | |
| 2010/0281342 A1 | 11/2010 | Chang et al. | |
| 2011/0083060 A1 | 4/2011 | Sakurada et al. | |
| 2011/0113281 A1 | 5/2011 | Zhang et al. | |
| 2011/0131444 A1 | 6/2011 | Buch et al. | |
| 2011/0205823 A1 | 8/2011 | Hemink et al. | |
| 2011/0213920 A1 | 9/2011 | Frost et al. | |
| 2011/0228601 A1 | 9/2011 | Olbrich | |
| 2011/0231600 A1 | 9/2011 | Tanaka et al. | |
| 2012/0096217 A1 * | 4/2012 | Son et al. | 711/103 |
| 2012/0195126 A1 | 8/2012 | Roohparvar | |
| 2012/0239976 A1 | 9/2012 | Cometti et al. | |

(56) References Cited

U.S. PATENT DOCUMENTS

FOREIGN PATENT DOCUMENTS

| WO | WO 2007/036834 A2 | 4/2007 |
|----|-------------------|--------|
| WO | WO 2007/080586 A2 | 7/2007 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/134576 A1 | 11/2009 |

OTHER PUBLICATIONS

Chanik Park; Talawar, P.; Daesik Won; MyungJin Jung; JungBeen Im; Suksan Kim; Youngjoon Choi; , "A High Performance Controller for NAND Flash-based Solid State Disk (NSSD)," Non-Volatile Semiconductor Memory Workshop, 2006. IEEE NVSMW 2006. 21st , vol., No., pp. 17-20, Feb. 12-16, 2006.*
Jesung Kim; Jong Min Kim; Noh, S.H.; Sang Lyul Min; Yookun Cho; , "A space-efficient flash translation layer for CompactFlash systems ," Consumer Electronics, IEEE Transactions on , vol. 48, No. 2, pp. 366-375, May 2002.*
Peter T. McLean, T13/1153D "Information Technology—AT Attachment with Packet Interface Extension (ATA/ATAPI-4y", NCITS, Revision 18, Aug. 1998.*
International Search Report and Written Opinion dated Feb. 18, 2009.
SanDisk Enterprise IP LLC, Office Action, Chinese Patent Application 200880127623.8, Apr. 18, 2012, 20 pgs.
International Search Report and Written Opinion dated Mar. 19, 2009 for PCT/US08/88133.
International Search Report and Written Opinion dated Mar. 19, 2009 for PCT/US08/88136.
International Search Report and Written Opinion dated Feb. 26, 2009 for PCT/US08/88146.
International Search Report and Written Opinion dated Feb. 27, 2009 for PCT/US08/88154.
International Search Report and Written Opinion dated Feb. 13, 2009 for PCT/US08/88164.
International Search Report and Written Opinion dated Feb. 18, 2009 for PCT/US08/88206.
International Search Report and Written Opinion dated Feb. 19, 2009 for PCT/US08/88217.
International Search Report and Written Opinion dated Feb. 13, 2009 for PCT/US08/88229.
International Search Report and Written Opinion dated Feb. 19, 2009 for PCT/US08/88232.
International Search Report and Written Opinion dated Feb. 19, 2009 for PCT/US08/88236.
Park, Chanik, et al., "A High Performance Controller for NAND Flash-Based Solid State Disk (NSSD)," Non-Volatile Semiconductor Memory Workshop, IEEE, Feb. 12-16, 2006, 4 pages.
McLean, Peter, T13, 1153D, Information Technology—AT Attachment with Packet Interface Extension (ATA/atap1-4) NCITS, Revision 18, Aug. 19, 1998, 339 pages.
Zeidman, B., et al., 1999 Verilog Designer's Library (04US), $1^{st}$ . Prentice Hall PTR, Chapter 24, 9 pages.
Jim, Jesung, et al, "A Space-Efficient Flash Translation Layer for CompactFlash Systems," IEEE, vol. 48, No. 2, May 2002, 10 pages.
Murphy, Niall and Michael Barr, "Introduction to Watchdog Timers", Embedded System Programming, Oct. 2001, 3 pages.
SanDisk Enterprise, ISR/WO, PCT/US2012/042764, Aug. 31, 2012, 12 pgs.
SanDisk Enterprise, Office Action, Japanese Patent Application No. 2010-540863, Jul. 24, 2012, 3 pgs.
Pliant Technology Inc., International Search Report and Written Opinion for PCT/US2011/028637 dated Oct. 27, 2011, 11 pgs.
Pliant Technology, Inc., Supplementary European Search Report for EP Application 08866997.3, dated Feb. 23, 2012, 6 pgs.
SanDisk Enterprise, ISR/WO, PCT/US2012/042775, Sep. 26, 2012, 9 pgs.
Sandisk Enterprise, ISR/WO, PCT/US2012/059459, Feb. 14, 2013, 9 pgs.
SanDisk Enterprise, Office Action, CN 200880127623.8, Dec. 31, 2012, 9 pgs.
Kang, A Multi-Channel Architecture for High-Performance NAND Flash-Based Storage System, J. Syst. Archit., 53, 9, Sep. 2007, 15 pgs.
Watchdog Timer and Power Savin Modes, Microchip Technology Inc., 2005 14 pgs.
Sandisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
SanDisk Enterprise IP LLC, Notification of the Decision to Grant a Patent Right for Patent for Invention, CN 200880127623.8, Jul. 4, 2013, 1 pg.

* cited by examiner

| | | |
|---|---|---|
| $LBA_A$ CONTENTS | S PAGE SECTOR 0 | |
| $LBA_{A+1}$ CONTENTS | S PAGE SECTOR 1 | |
| $LBA_{A+2}$ CONTENTS | S PAGE SECTOR 2 | S PAGE 0 |
| ⋮ | ⋮ | |
| $LBA_{A+14}$ CONTENTS | S PAGE SECTOR 14 | |
| $LBA_B$ CONTENTS | S PAGE SECTOR 0 | |
| $LBA_{B+1}$ CONTENTS | S PAGE SECTOR 1 | |
| $LBA_{B+2}$ CONTENTS | S PAGE SECTOR 2 | S PAGE 1 |
| ⋮ | ⋮ | |
| $LBA_{B+14}$ CONTENTS | S PAGE SECTOR 14 | |
| ⋮ | ⋮ | ⋮ |
| $LBA_C$ CONTENTS | S PAGE SECTOR 0 | |
| $LBA_{C+1}$ CONTENTS | S PAGE SECTOR 1 | |
| $LBA_{C+2}$ CONTENTS | S PAGE SECTOR 2 | S PAGE 63 |
| ⋮ | ⋮ | |
| $LBA_{C+14}$ CONTENTS | S PAGE SECTOR 14 | |

BLOCK 0 encompasses the rows from $LBA_A$ through $LBA_{C+14}$.

| | | |
|---|---|---|
| $LBA_D$ CONTENTS | S PAGE SECTOR 0 | |
| $LBA_{D+1}$ CONTENTS | S PAGE SECTOR 1 | |
| $LBA_{D+2}$ CONTENTS | S PAGE SECTOR 2 | S PAGE 0 |
| ⋮ | ⋮ | |
| $LBA_{D+14}$ CONTENTS | S PAGE SECTOR 14 | |
| ⋮ | ⋮ | ⋮ |
| $LBA_E$ CONTENTS | S PAGE SECTOR 0 | |
| $LBA_{E+1}$ CONTENTS | S PAGE SECTOR 1 | |
| $LBA_{E+2}$ CONTENTS | S PAGE SECTOR 2 | S PAGE 63 |
| ⋮ | ⋮ | |
| $LBA_{E+14}$ CONTENTS | S PAGE SECTOR 14 | |

BLOCK 1 encompasses the rows from $LBA_D$ through $LBA_{E+14}$.

FIG. 15

| 1601 | FLASH GROUP 0 | | FLASH GROUP 1 | | FLASH GROUP 2 | |
|---|---|---|---|---|---|---|
| BANK | SP0 | SP1 | SP0 | SP1 | SP0 | SP1 |
| 0 | SMT | 285-299 | SMT | 375-389 | SMT | 465-479 |
| 1 | 0-14 | 300-314 | 90-104 | 390-404 | 180-194 | 480-494 |
| 2 | 15-29 | 315-329 | 105-119 | 405-419 | 195-209 | 495-509 |
| 3 | 30-44 | 330-344 | 120-134 | 420-434 | 210-224 | 510-524 |
| 4 | 45-59 | 345-359 | 135-149 | 435-449 | 225-239 | 525-539 |
| 5 | 60-74 | 540-554 | 150-164 | 585-599 | 240-254 | 630-644 |
| 6 | 75-89 | 555-569 | 165-179 | 600-614 | 255-269 | 645-659 |
| 7 | 270-284 | 570-584 | 360-374 | 615-629 | 450-464 | 660-674 |

| | PORT | BANK | BLOCK | PAGE | USER |
|---|---|---|---|---|---|
| $LBA_{0-14}$ | | | | | |
| $LBA_{15-29}$ | | | | | |
| $LBA_{30-44}$ | | | | | |
| ... | | ... | | | |
| $LBA_{n-n+14}$ | | | | | |

FORWARD TABLE 3201

FIG. 33

| 3502 | SUPER PAGE TIME STAMP 3505 | DEFECT 3510 | LBA 3511 |
|---|---|---|---|
| BANK 0 — SUPER PAGE 0 (3503) | | | |
| SUPER PAGE 1 | | | |
| ⋮ | | | |
| SUPER PAGE 63 | | | |
| BANK 1 — SUPER PAGE 0 (3504) | | | |
| SUPER PAGE 1 | | | |
| ⋮ | | | |
| SUPER PAGE 63 | | | |
| ⋮ | | | |
| BANK n — SUPER PAGE 0 | | | |
| SUPER PAGE 1 | | | |
| ⋮ | | | |
| SUPER PAGE 63 | | | |

3506 — SUPER BLOCK TIME STAMP _____
3507 — ERASE COUNT _____
3508 — OPEN FLAG _____
3509 — CLOSED FLAG _____

SUPER BLOCK METADATA TABLE 3501

FIG. 35

| BANK | 50 | 100 | 150 | 200 | 250 | 300 | 350 | 400 | 450 | 500 | 550 | 600 |
|---|---|---|---|---|---|---|---|---|---|---|---|---|
| 0 | W | W | W | W | W | W | W | | | | | |
| 1 | | W | W | W | W | W | W | W | | | | |
| 2 | | | W | W | W | W | W | W | W | | | |
| 3 | | | W | W | W | W | W | W | W | W | | |
| 4 | | | | | W | W | W | W | W | W | W | |
| 5 | | | | | | W | W | W | W | W | W | W |
| 6 | | | | | | | | | | | | |
| 7 | | | | | | | | | | | | |

TIME (microseconds)

FIG. 44

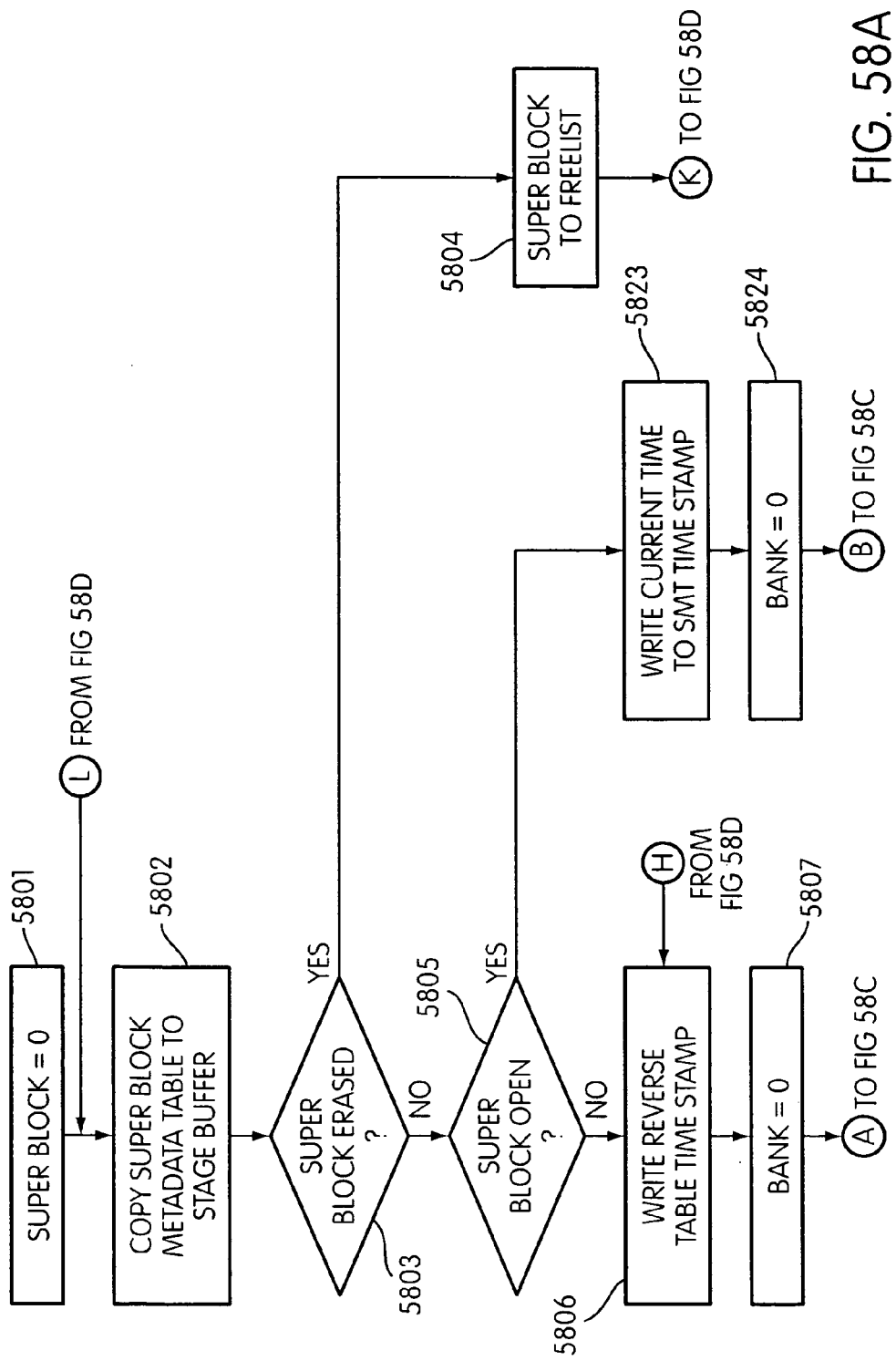

MASS STORAGE CONTROLLER VOLATILE MEMORY CONTAINING METADATA RELATED TO FLASH MEMORY STORAGE

CROSS-REFERENCE TO RELATED APPLICATIONS

This application claims priority to U.S. Provisional Patent Application No. 61/017,123 filed Dec. 27, 2007, the disclosure of which is incorporated herein by reference, as if fully stated here, for all purposes.

The present application contains subject matter related to the subject matter in the following copending patent applications: U.S. patent application Ser. No. M-17228-01 US, filed on even date herewith and entitled "System and Method for Performing Host Initiated Mass Storage Commands Using a Hierarchy of Data Structures;" U.S. patent application Ser. No. M-17228-02 US, filed on even date herewith and entitled "Flash Memory Controller Having Reduced Pinout;" U.S. patent application Ser. No. M-17228-03 US, filed on even date herewith and entitled "Multiprocessor Storage Controller;" U.S. patent application Ser. No. M-17228-04 US, filed on even date herewith and entitled "Storage Controller for Flash Memory Including a Crossbar Switch Connecting a Plurality of Processors With a Plurality of Internal Memories;" U.S. patent application Ser. No. M-17228-05 US, filed on even date herewith and entitled "Flash Memory Controller and System Including Data Pipelines Incorporating Multiple Buffers;" U.S. patent application Ser. No. M-17228-07 US, filed on even date herewith and entitled "Patrol Function Used in Flash Storage Controller to Detect Data Errors;" U.S. patent application Ser. No. M-17228-08 US, filed on even date herewith and entitled "Flash Storage Controller Execute Loop;" U.S. patent application Ser. No. M-17228-09 US, filed on even date herewith and entitled "Metadata Rebuild in a Flash Memory Controller Following a Loss of Power;" and U.S. patent application Ser. No. M-17228-10 US, filed on even date herewith and entitled "Flash Memory Controller Garbage Collection Operations Performed Independently in Multiple Flash Memory Groups."

FIELD OF THE INVENTION

The invention described herein relates to the field of data storage, and in particular to data storage applications using solid state nonvolatile memory devices. This technology has particular relevance to high performance enterprise systems involving multi-user computing and storage platforms deployed in large datacenters, but is also applicable to smaller-scale enterprise applications and to end-user mass storage.

BACKGROUND OF THE INVENTION

Current enterprise-level mass storage relies on hard drives that are typically characterized by a 3.5" form factor, a 15,000 rpm spindle motor and a storage capacity between 73 GB and 450 GB. The mechanical design is identical to the traditional hard drive with a single actuator and 8 read/write heads moving across 8 surfaces. The constraints of the head/media technology limit the read/write capabilities to only one active head at a time. All data requests sent to the drive are handled in a serial manner with long delays between each operation as the actuator moves the read/write head to the required position and the media rotates to place the data under the read/write head.

As a result of the queue of requests waiting for the actuator, the system sees response times increasing to the point where it becomes intolerable to users. Mass storage systems have adapted to this problem by limiting the number of outstanding requests to each drive. This has had the effect of reducing the effective and usable capacity of each drive to as low as 12 GB per drive, even though these devices are available at up to 450 GB capacities. The lower capacity, in turn, has exacerbated floor space, cooling and power issues, all of which have become extremely problematic for enterprise-level mass storage systems.

In an attempt to relieve these problems, the industry is moving towards 2.5" drives. However, although the smaller form factor allows for a larger number of drives in the same space, the serial nature of hard drive operations means that even smaller form factor drives present serious space, cooling and power problems.

Flash memory is attractive in an enterprise mass-storage environment, since flash memory systems do not have the mechanical delays associated with hard drives, thereby allowing higher performance and commensurately lower cost, power, heating and space usage. Nevertheless, flash memory has not traditionally been used in such environments due to certain technical constraints.

The first technical problem is write speed, which may be as slow as one-tenth that of a mechanical hard drive. This results from the fact that data cannot be overwritten on a NAND flash device without a long erase cycle prior to the write. Because the erase cycle directly affects the write performance, most flash designs move the write data to a new location and delay the erase until later. In a busy system, delayed erase cycles may build up until the processor runs out of free flash pages and has to stop to create new ones, thereby significantly affecting system performance.

The second technical problem is the specified limit for each flash memory page of 100,000 erase cycles for Single Level Cell ("SLC") devices and 10,000 cycles for Multi-Level Cell ("MLC") devices. These pose particular problems for datacenters that operate with unpredictable data streams that may cause "hot spots," resulting in certain highly-used areas of memory being subject to a large number of erases.

The third issue is data loss, which can occur as the result of various factors affecting flash memory, including read disturbs or program disturbs, which lead to the loss of data bits caused by the reading or writing of memory cells adjacent to the disturbed cell. The state of a flash memory cell may also change in an unpredictable manner as the result of the passage of time.

These technical problems create serious issues for the use of flash memory in high-capacity, high-performance storage applications. In each case, technical solutions exist, but the solutions place significant strain on the processing power available in standard flash memory controllers, which generally include a single processor. That strain makes it difficult to overcome these technical problems in these environments.

SUMMARY OF THE INVENTION

In one embodiment, the described solution to the performance limitations of flash memory involves the use of multiple microprocessors in the controller design, thereby creating multiple parallel independent pipelines, each of which is capable of handling a portion of a single transaction. This design maximizes use of the host and flash interfaces, and allows individual transactions to be broken up into many small portions, which can be reordered and handled in parallel to increase performance. The architecture is designed to allow multiple processors to perform their functions without the use of costly and inefficient interrupts.

The use of parallel pipelines allows the controller to effectively mask the write latencies inherent in the use of flash memory. In addition, the use of multiple independent processors provides sufficient processing power to handle overhead imposed by solutions to the endurance and error problems described above. By breaking host-initiated transactions into a large number of independent flash reads and writes, the controller architecture described herein allows for a high level of performance that is impossible using conventional controller designs.

DETAILED DESCRIPTION OF THE DRAWINGS

FIG. 15 illustrates an organization of data within a SuperBlock.

FIG. 16 illustrates a stripe organization of data.

FIG. 33 illustrates a forward table.

FIG. 35 illustrates a SuperBlock metadata table.

FIG. 44 illustrates MLC flash write timing.

Figure 50A:
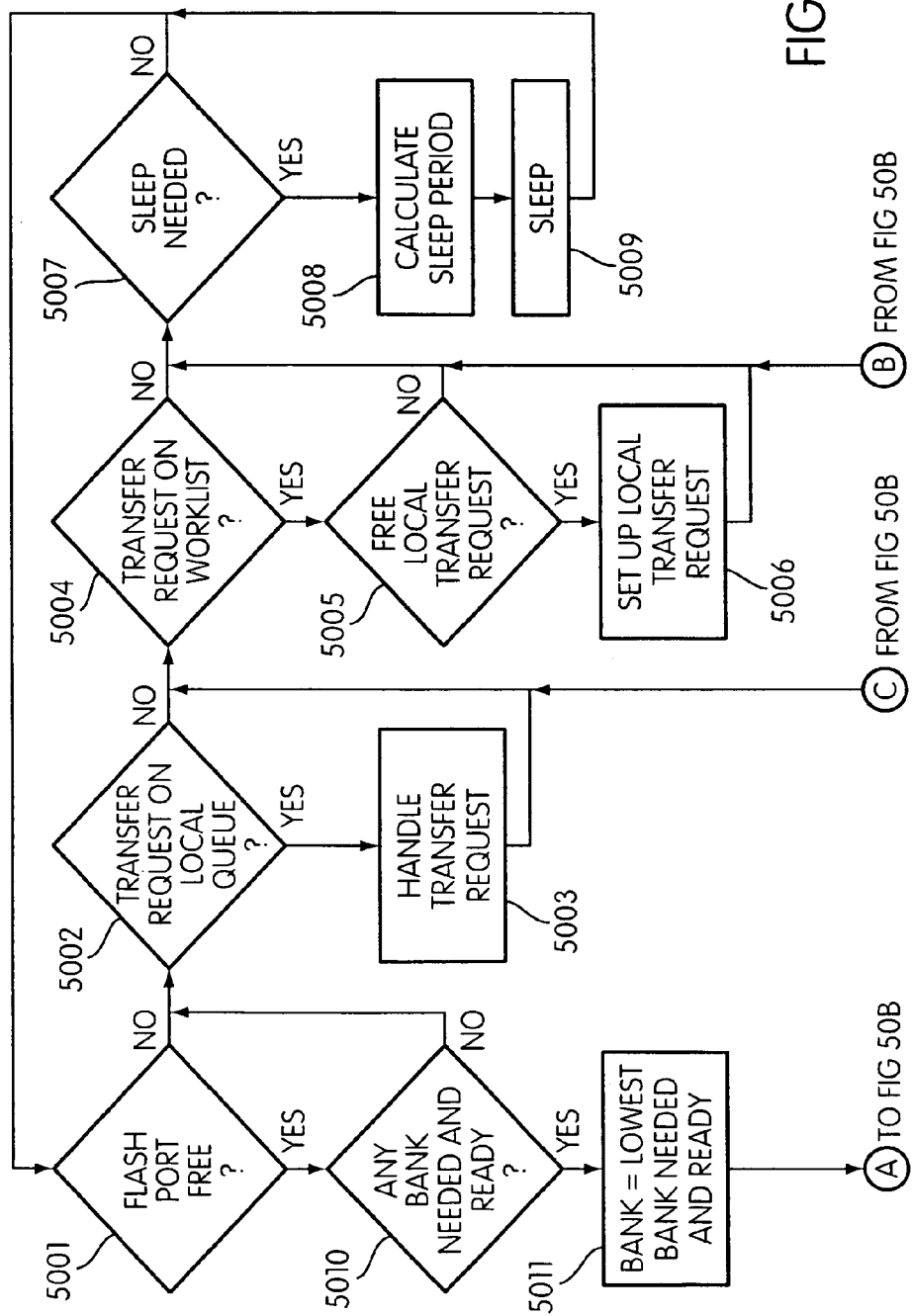
Figure 50B:
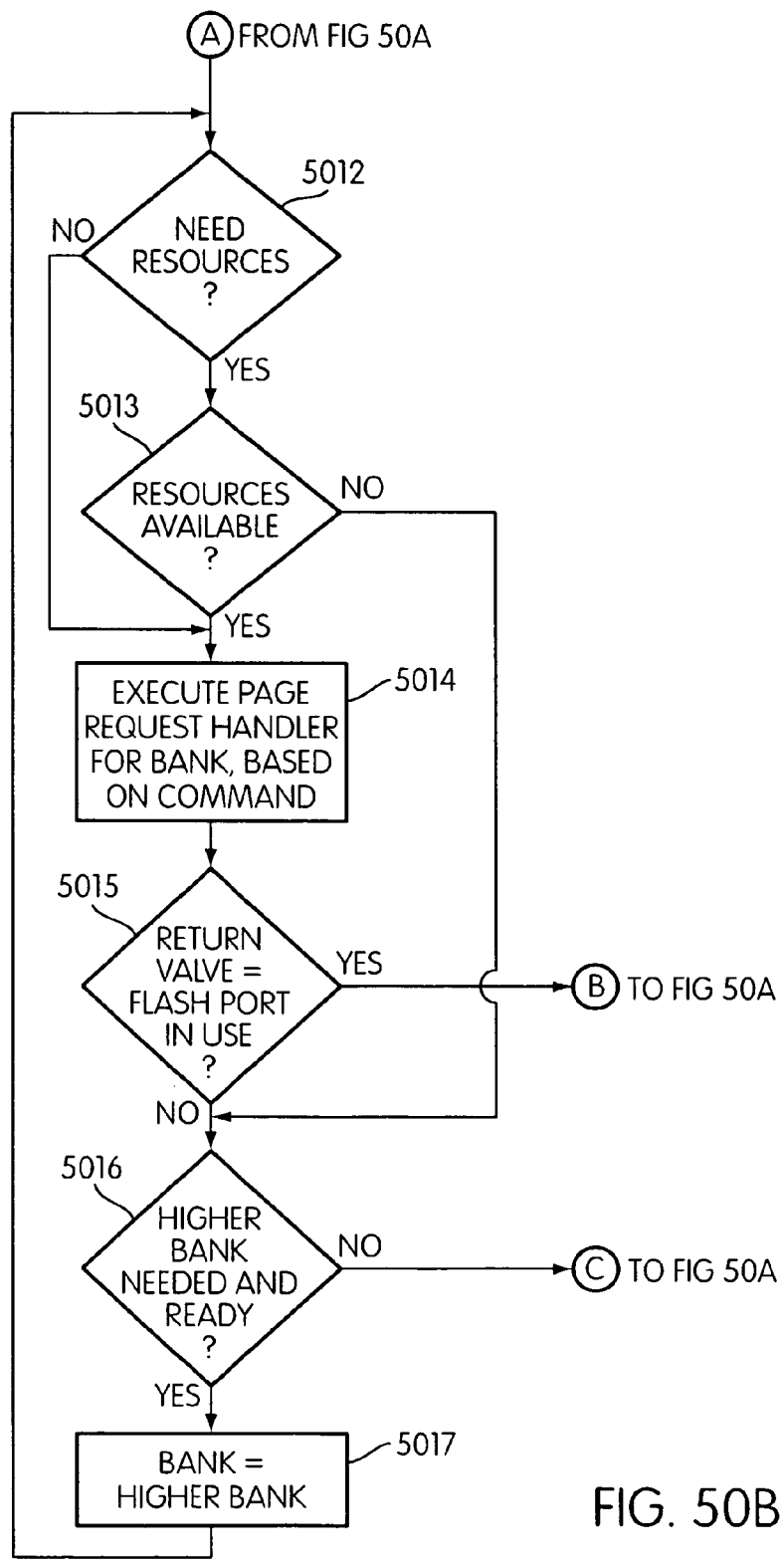

FIG. 50. illustrates the flash HEMi execute loop.

Figure 51A:
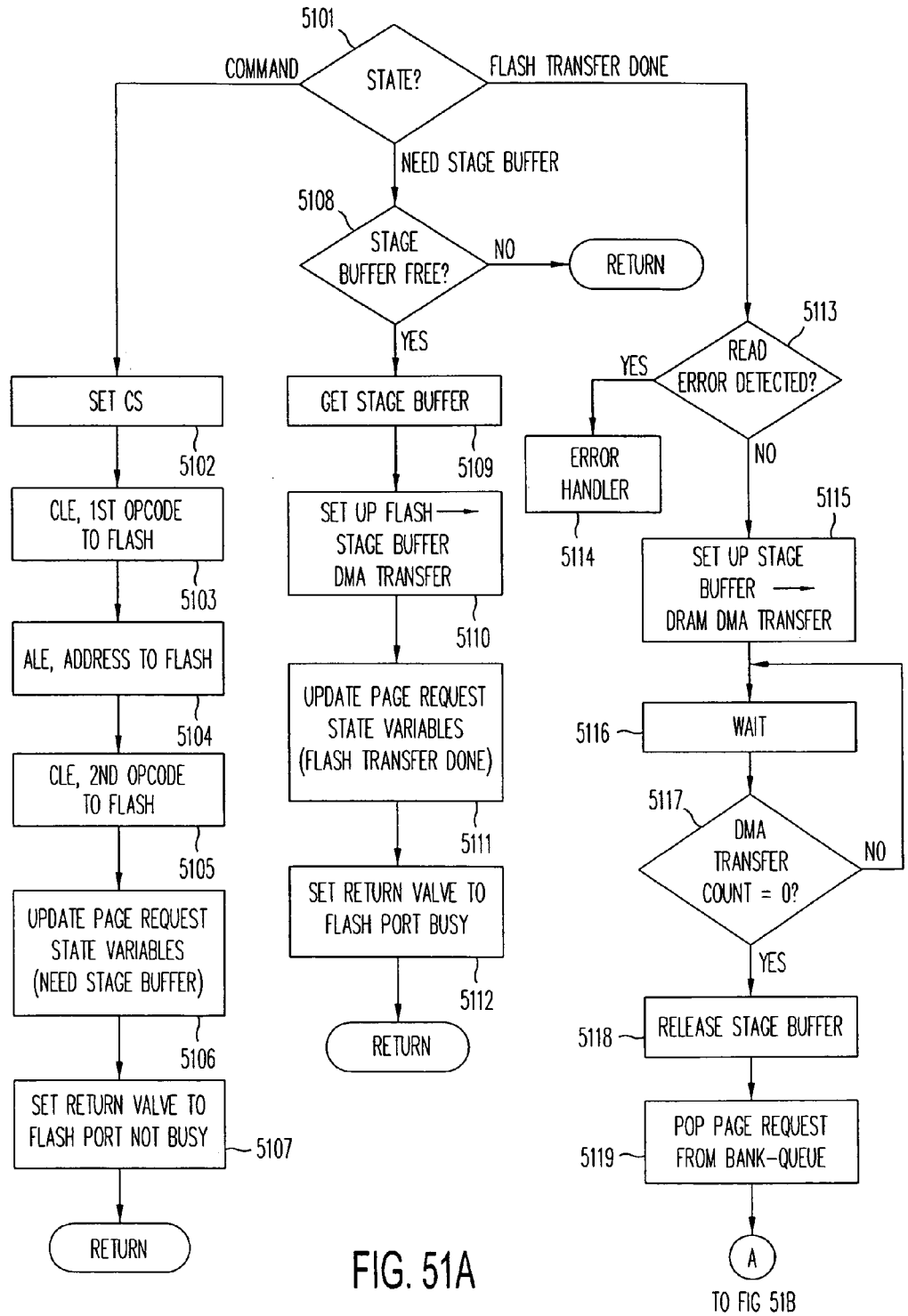
Figure 51B:
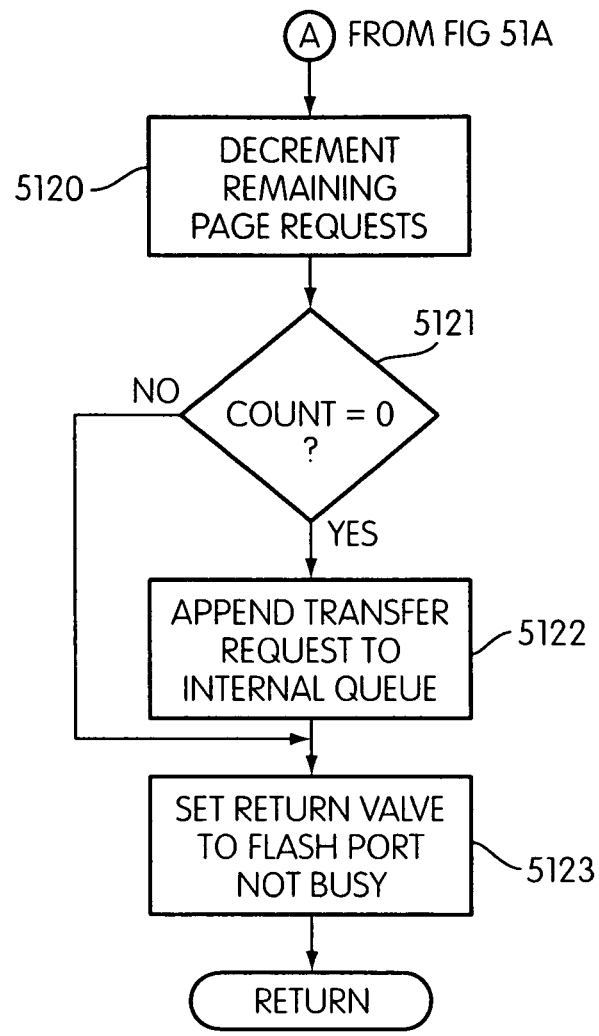

FIG. 51 illustrates the page request read handler.

Figure 52A:
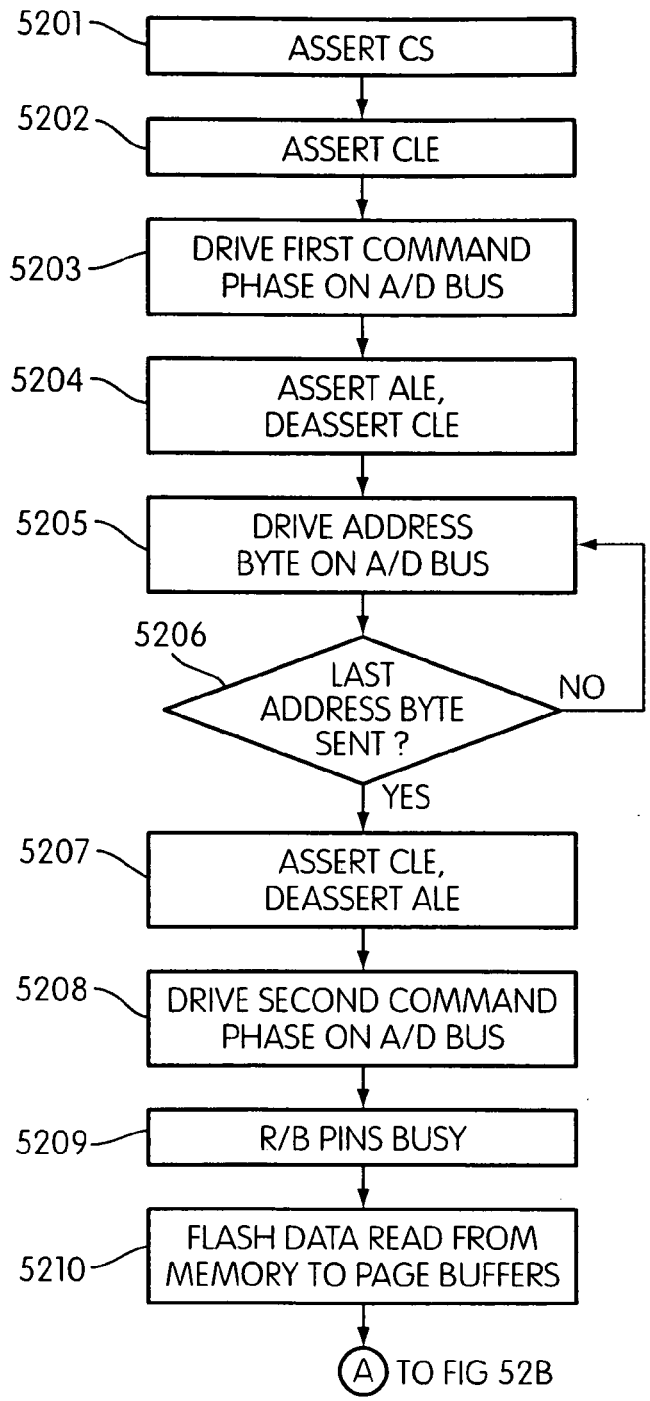
Figure 52B:
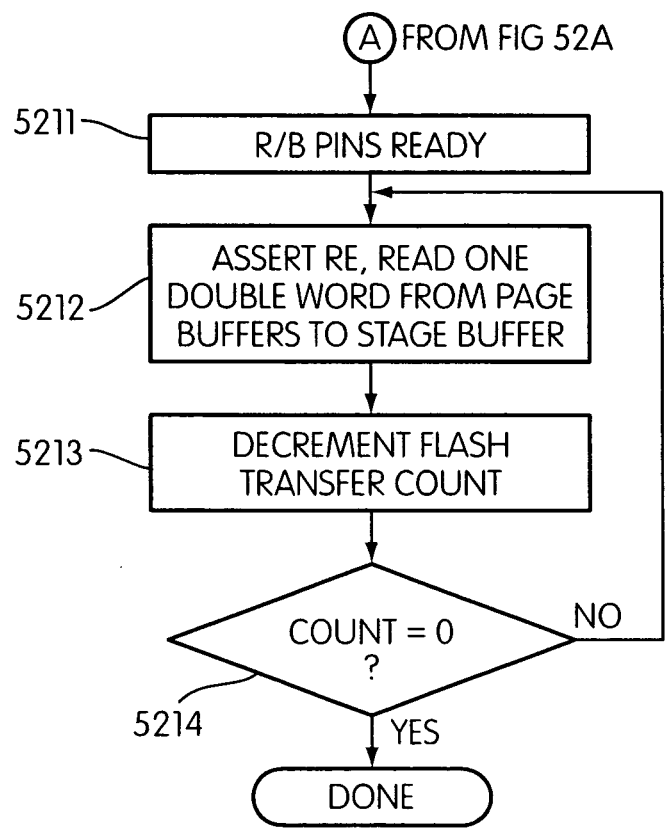

FIG. 52 illustrates a flash read operation in greater detail.

Figure 53A:
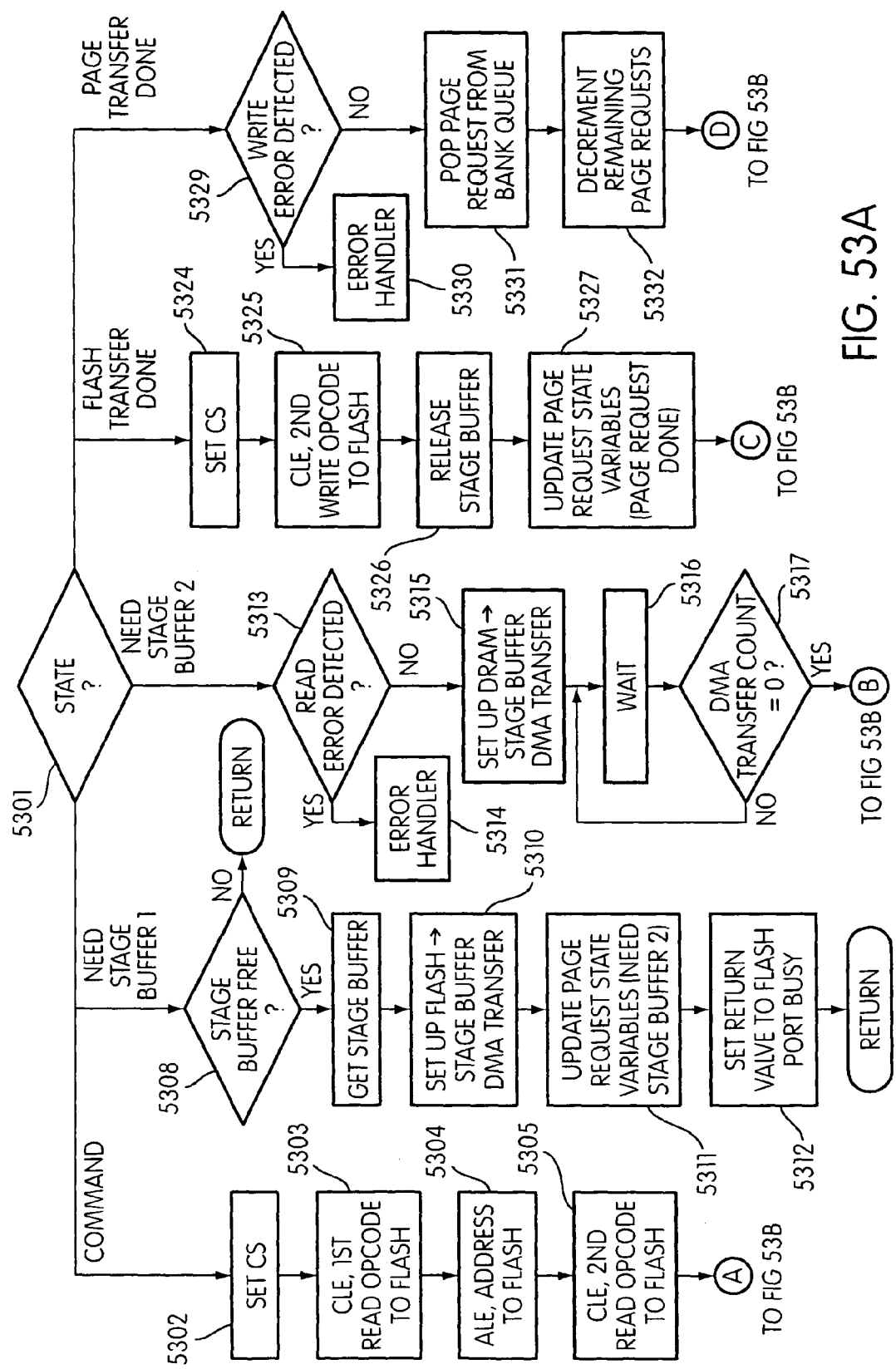
Figure 53B:
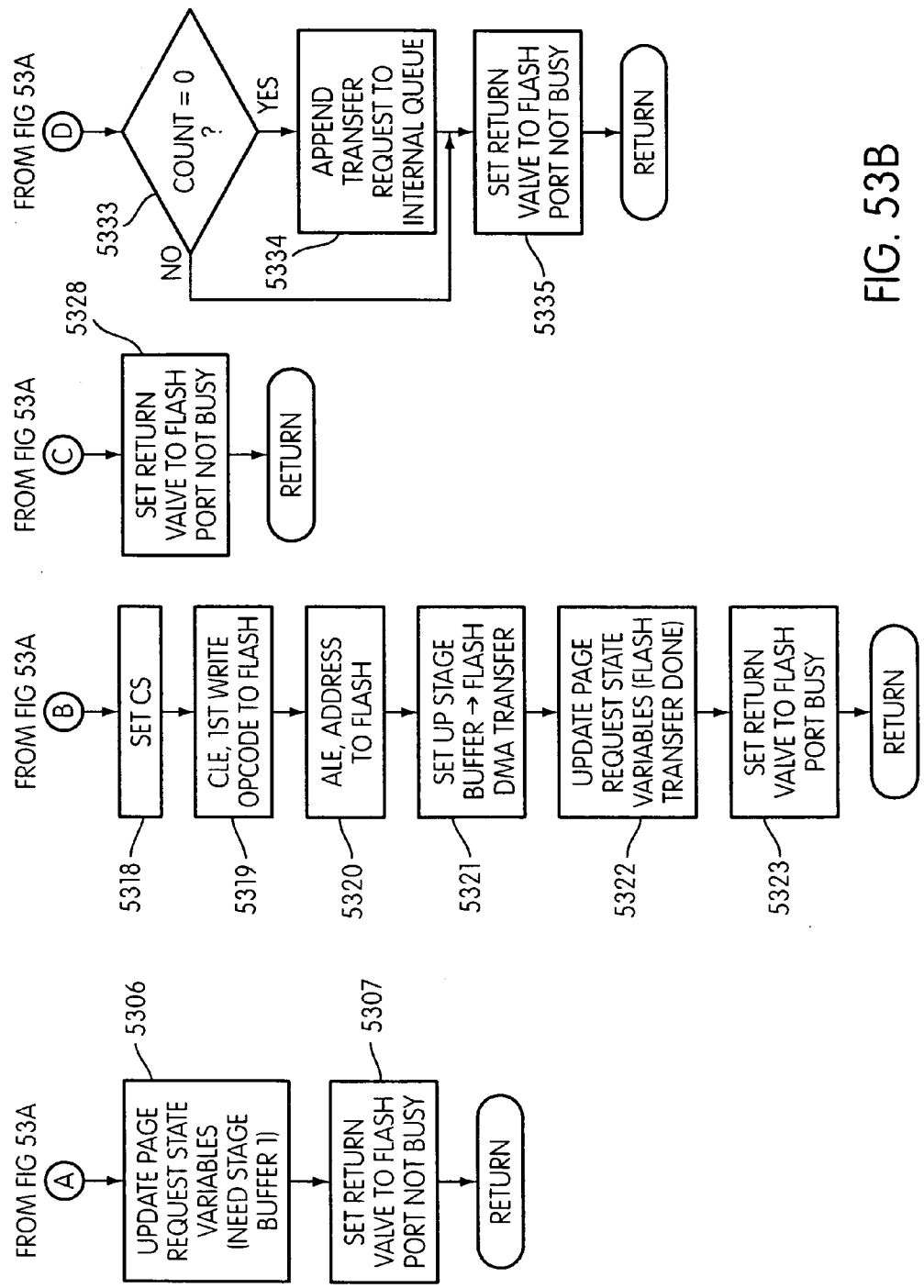

FIG. 53 illustrates the execution of a page request write handler.

Figure 54:
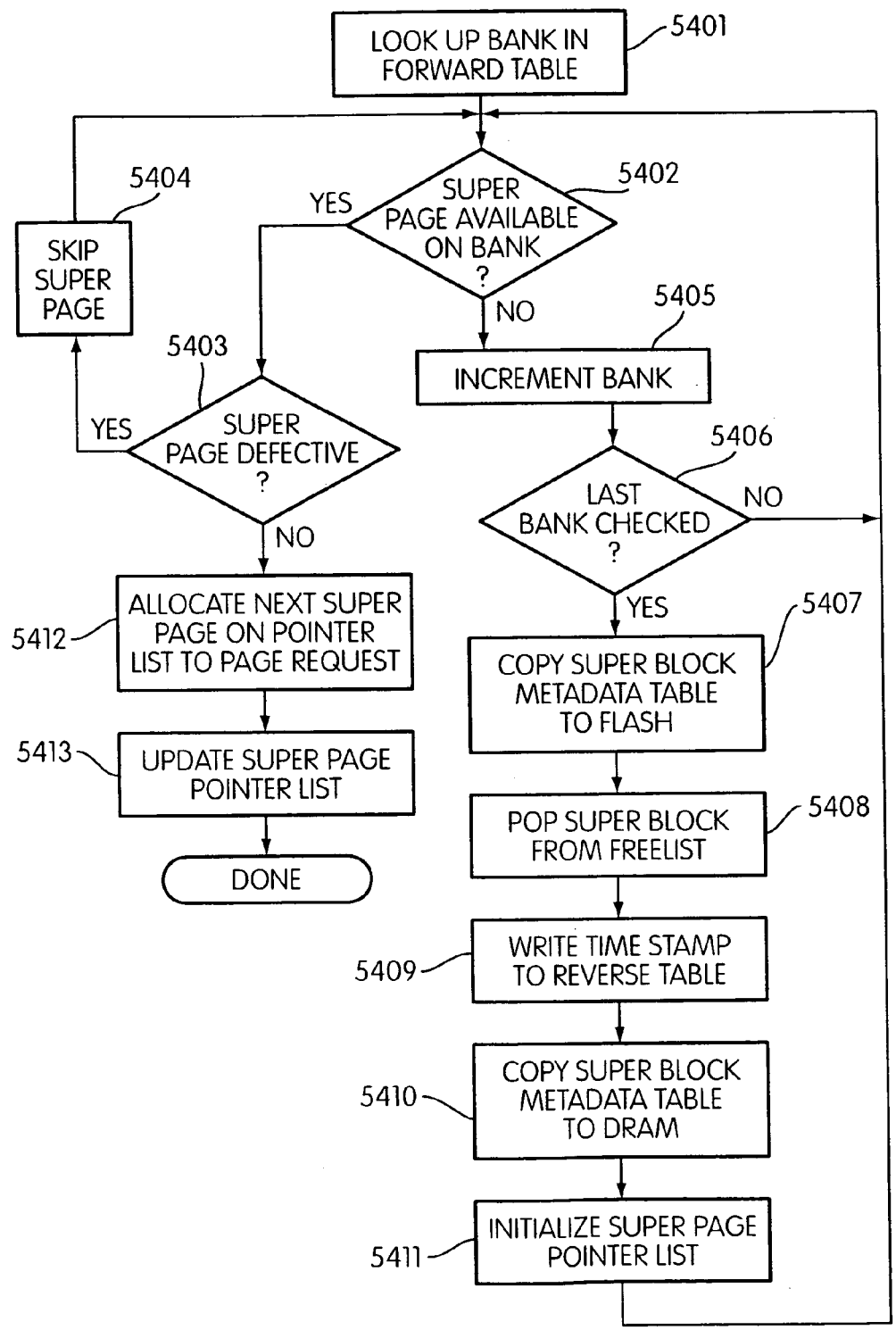

FIG. 54 illustrates allocation of a SuperPage to a page request.

Figure 55:
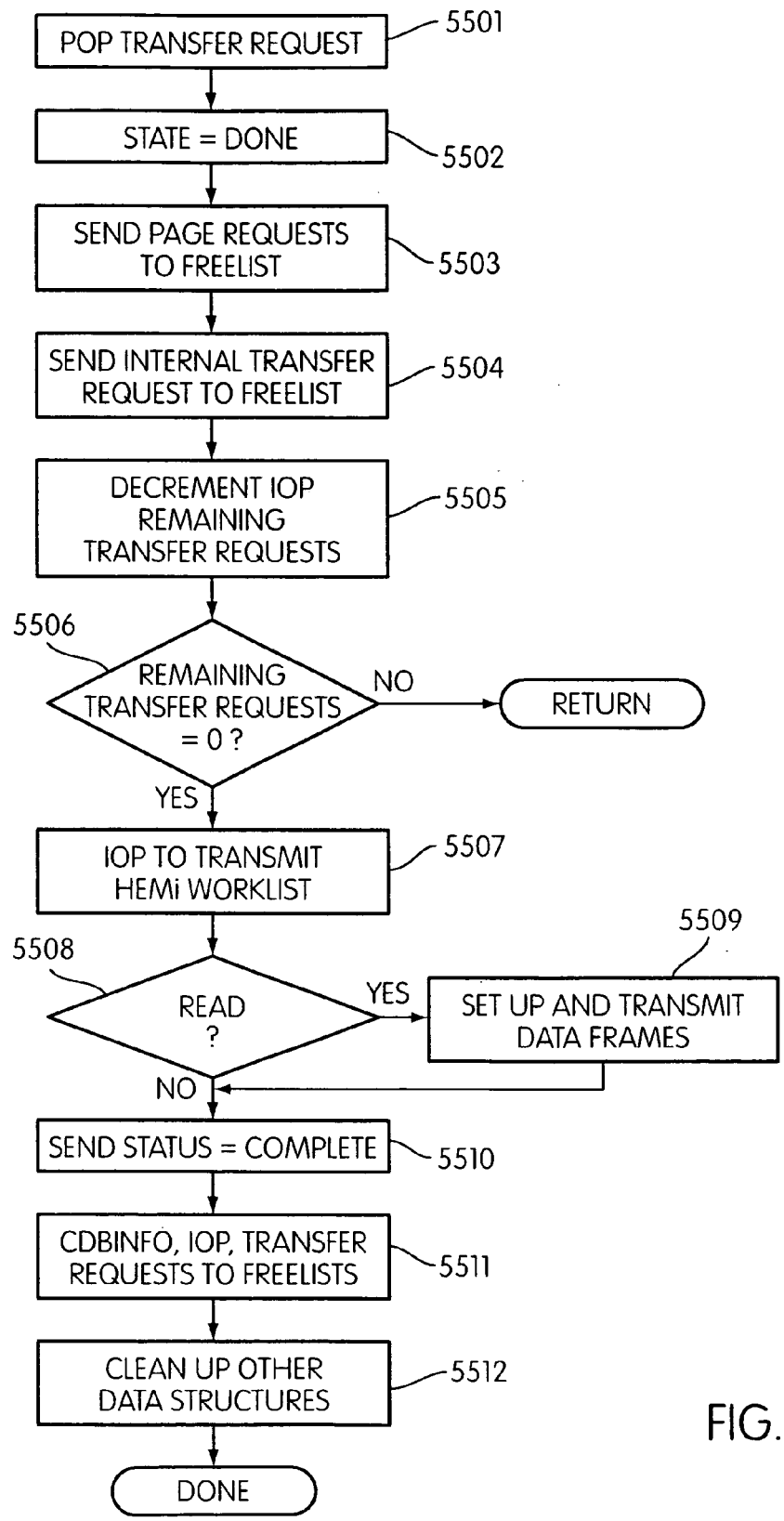

FIG. 55 illustrates clean-up of a completed transaction.

Figure 56:
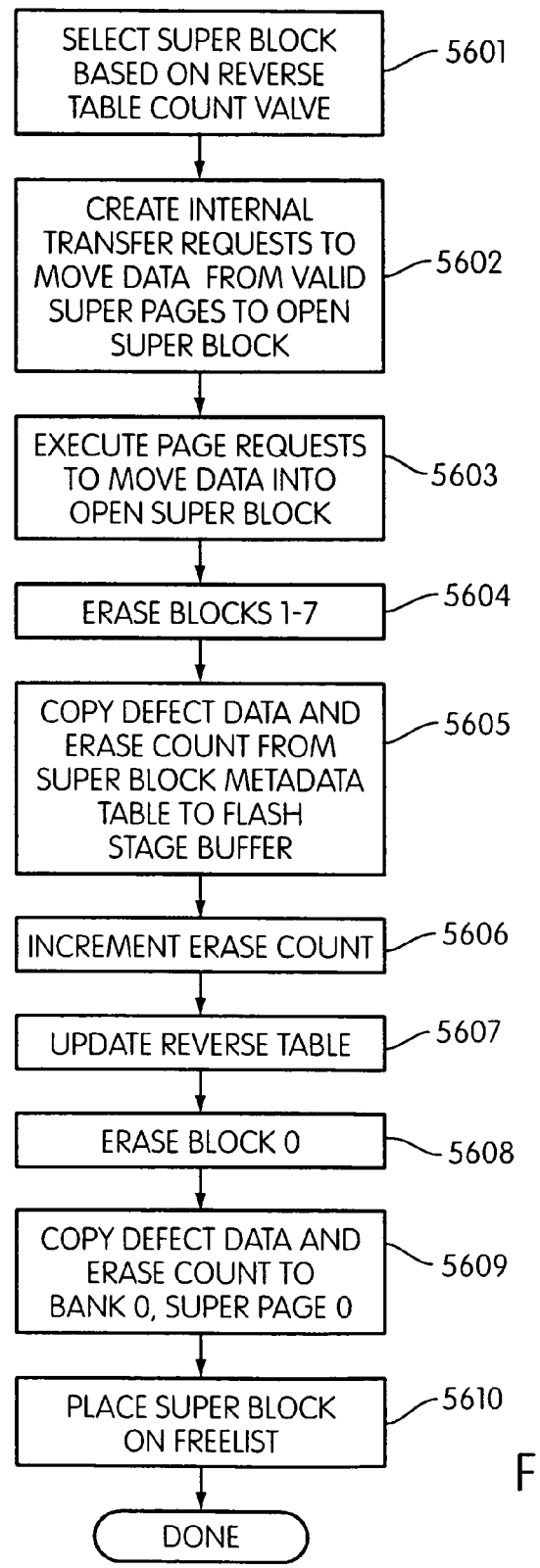

FIG. 56 illustrates a garbage collection process.

Figure 57:
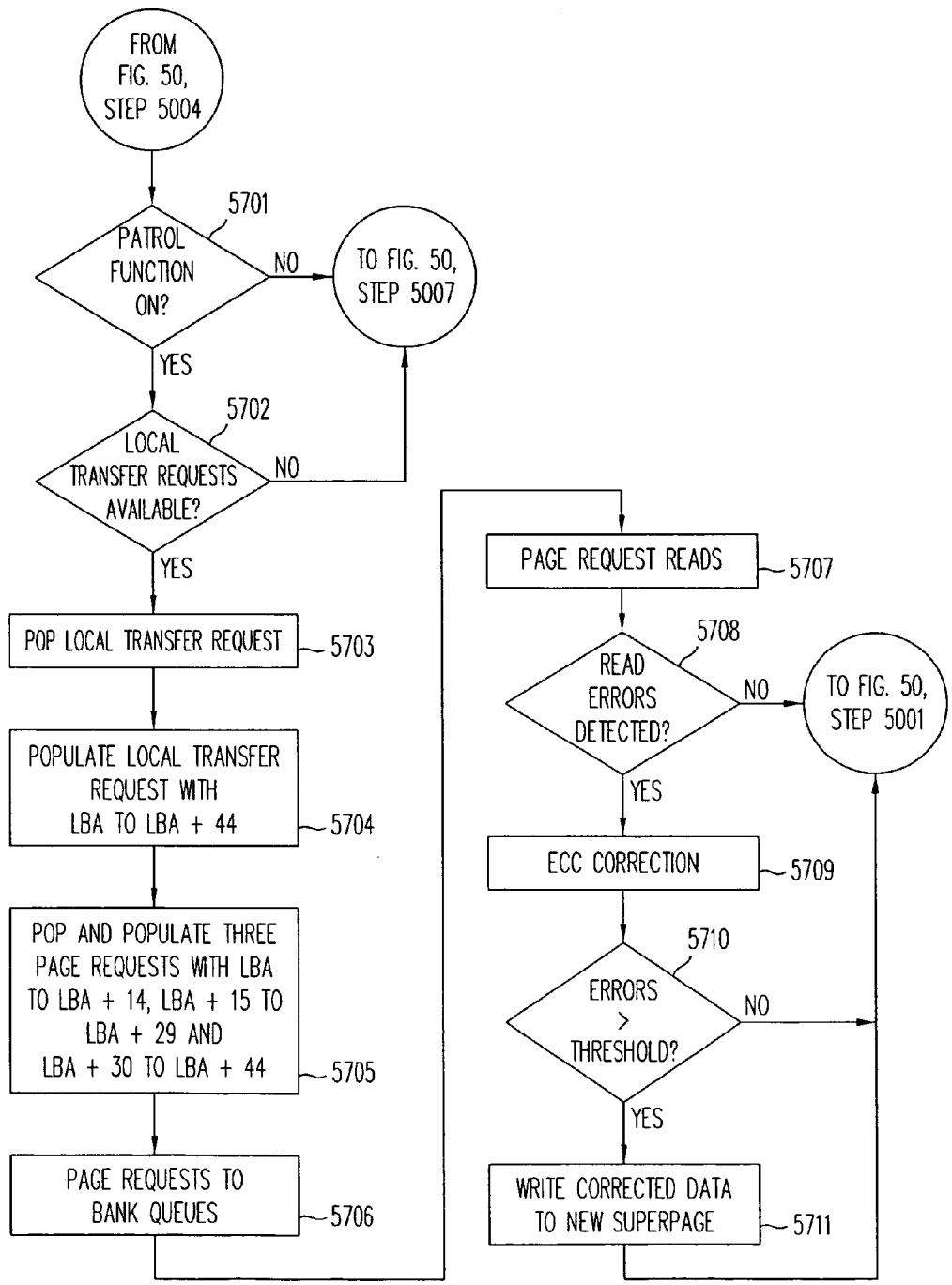

FIG. 57 illustrates a patrol function process.

Figure 58B:
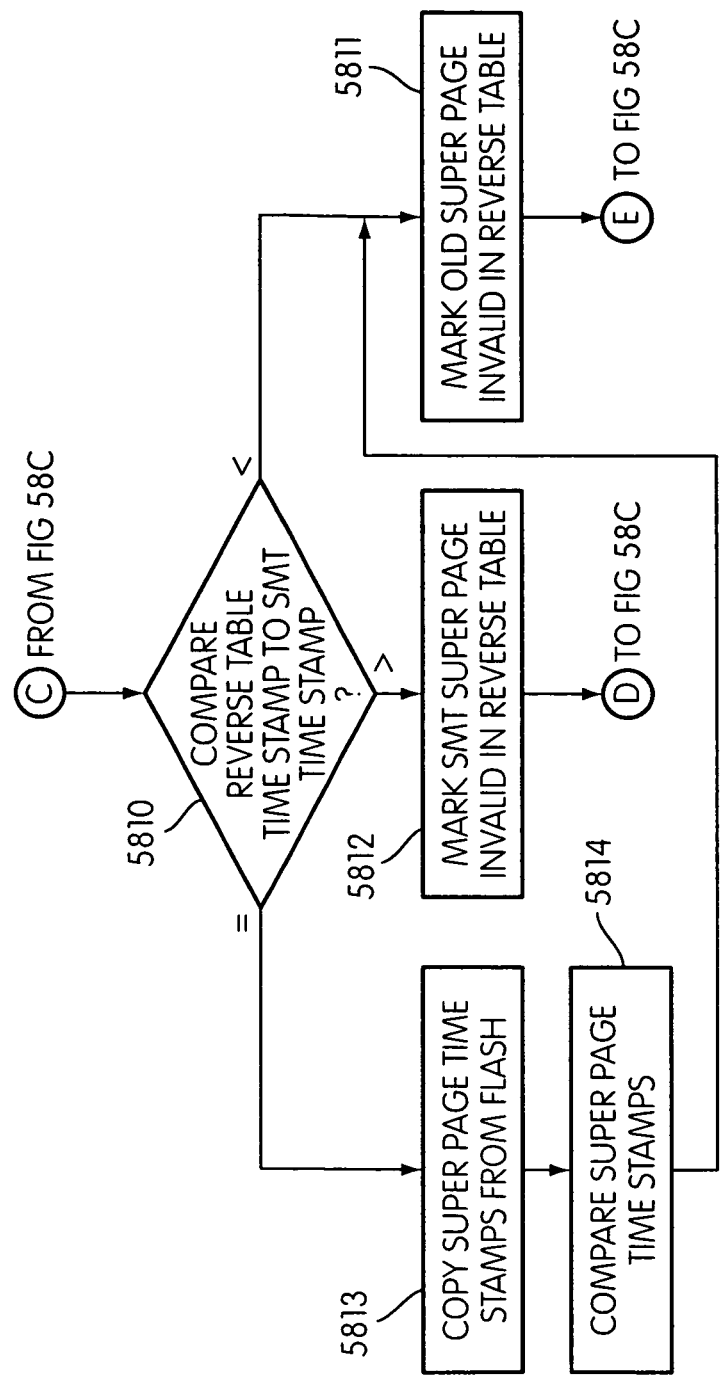
Figure 58C:
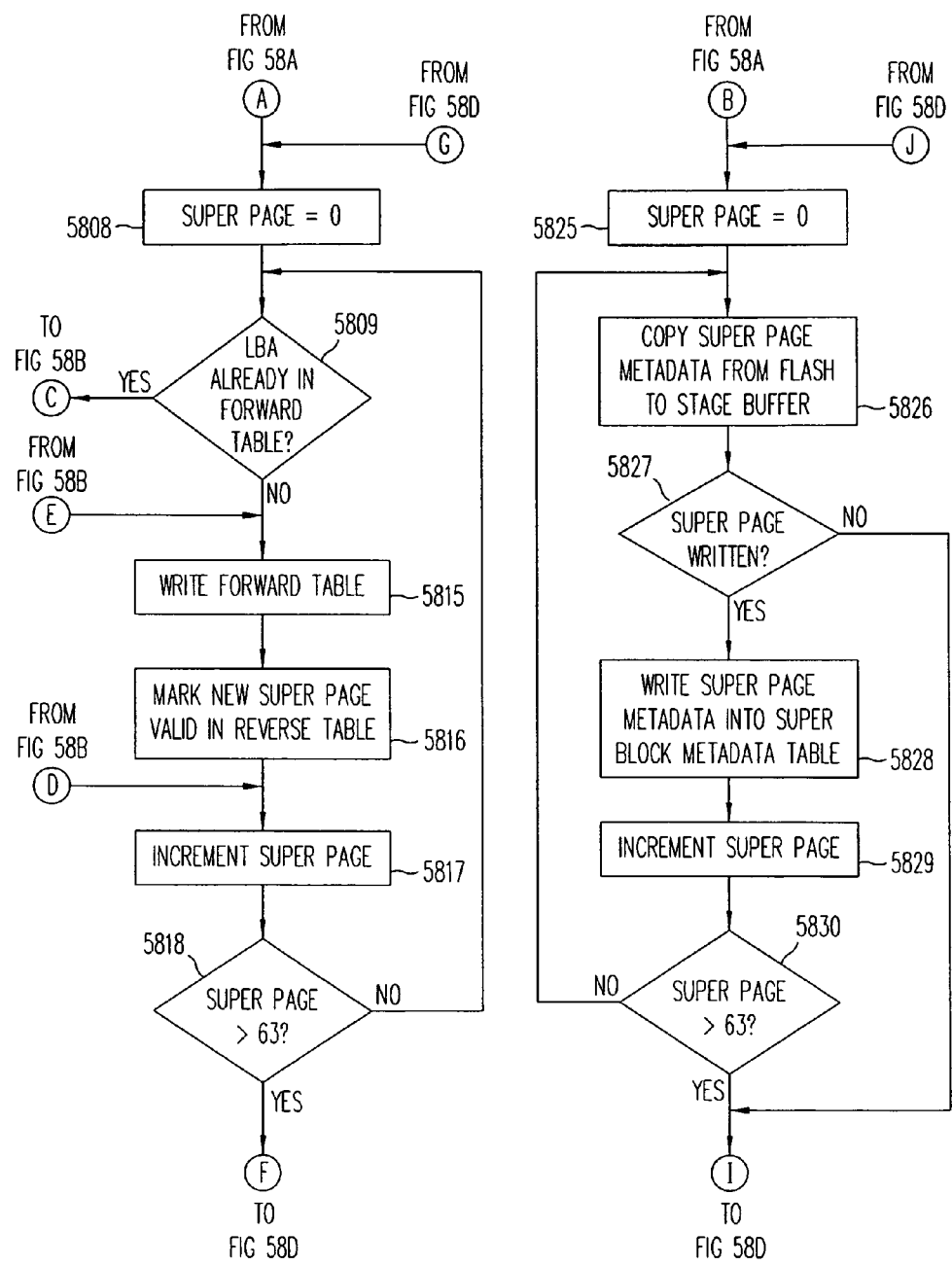
Figure 58D:
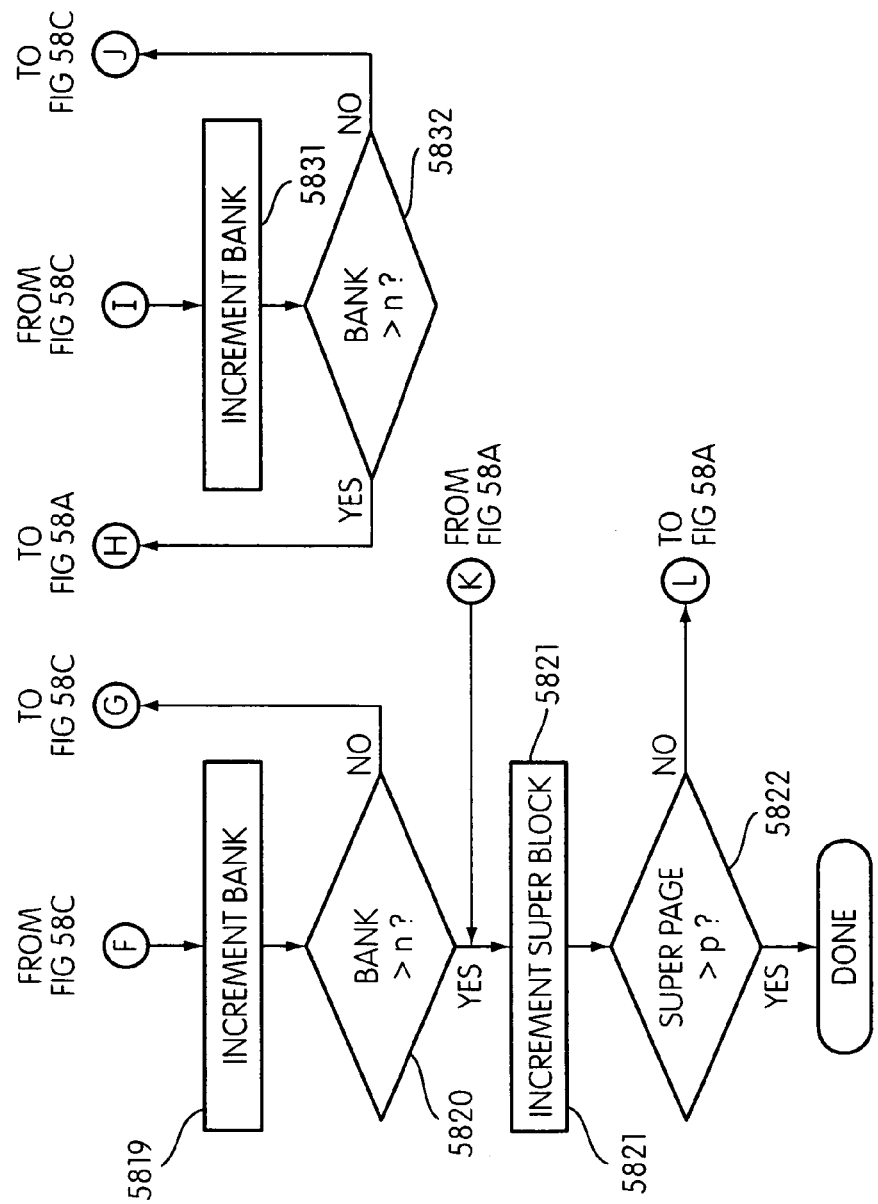

FIG. 58 illustrates a rebuilding process.

DETAILED DESCRIPTION OF CURRENTLY PREFERRED EMBODIMENTS

I. Overview

A. System Overview.

In the currently preferred embodiment, the system described herein is designed to operate with various enterprise-level mass storage protocols, including SAS ("Serial Attached SCSI"), FC ("Fibre Channel") and FC-AL ("Fibre Channel Arbitrated Loop), all of which are based on the Small Computer Systems Interface ("SCSI"), and Serial ATA ("SATA") protocols. These protocols are highly familiar to those of ordinary skill in the art, and will not be further described herein. Except where particular protocols are called out, the systems and methods disclosed herein do not depend on the particular protocol being used and are designed to operate correctly with all of them. Moreover, these systems and methods may be adapted for use with other similar protocols, either currently in use or not yet developed, including protocols designed for enterprise-level applications as well as protocols designed for other applications, such as end-user.

As a matter of convenience, the protocols relevant herein are oftentimes referred to collectively as the "SCSI Protocol," though, as should be understood, this includes non-SCSI protocols and does not include those SCSI protocols that are not relevant.

Figure 1:
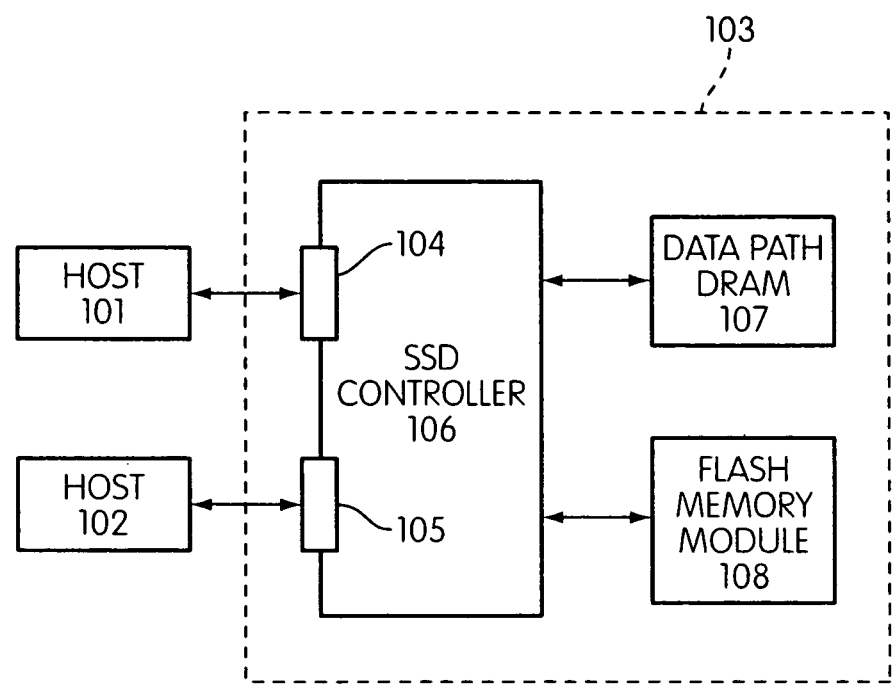
FIG. 1 illustrates a system containing an SSD ("Solid State Drive") controller and flash memory.

The system described herein includes a novel architecture for controlling a mass storage module consisting of flash memory chips. The overall system is illustrated in a high level overview in FIG. 1. As with other block diagram drawings herein, the elements shown in FIG. 1 are conceptual in nature, showing the nature of interrelationships among functional blocks, and are not intended to represent actual, physical circuit-level implementations.

Hosts 101 and 102 are conventional host devices, e.g., two servers that use mass storage resources or two host bus adapters serving one such server. In certain protocols, each Host may support multiple initiators. In SCSI-based systems, initiators are host-side endpoints for data transfers, and may constitute separate physical devices or processes.

Board 103 (represented by dashed lines) represents one or more PCBs. It could, for example, consist of a single PCB board, or of multiple boards connected together in a mother-daughter configuration. In the currently preferred embodiment, Board 103 is designed so that, from the perspective of Hosts 101 and 102, Board 103 appears to constitute a conventional, rotating disk mass storage device. This requires that Host Ports 104 and 105 be designed so that they are physically and logically indistinguishable from conventional mass storage interfaces for which Hosts 101 and 102 have been designed. Thus, in the currently preferred embodiment, use of Board 103 does not require any redesign of Hosts 101 or 102.

In the currently preferred embodiment, SSD Controller 106 represents a single integrated circuit device that is attached to Board 103 and runs at 200 MHz. In alternate embodiments, SSD Controller 106 can consist of more than one integrated circuit device, without departing from the principles of the invention(s) described herein. Clock speed, of course, represents an implementation choice, and will vary among implementations.

In the currently preferred embodiment, Data Path DRAM 107 is a 64-bit wide 256 Mbyte DDR SDRAM with a clock speed of 200 MHz sold by Micron Technology, Inc. of Boise, Id., under the product designation MT47H16M16BC-5E. This provides an effective rate of 128 bits of data transfer per cycle, consisting of two 64-bit transfers per cycle. For purposes of simplicity, this will be described herein as a 128-bit interface. This device automatically checks ECC on all transfers. In an alternate embodiment involving greater overall storage capacity, the Micron MT47H32M16CC-5E, a 512 Mbyte DDR SDRAM, can be substituted. As should be understood, many different options are available for the Data Path DRAM, including the use of types of memory other than DRAM, and the specific products identified here are not integral to the inventions disclosed herein. As is shown in FIG. 1, Data Path DRAM 107 communicates with SSD Controller 106, but does not have any direct connection to any other element in the system.

Flash Memory Module 108 represents a number of flash memory chips. In the currently preferred embodiment, Flash Memory Module 108 consists of 192 2 gigabyte NAND flash chips, each running at 40 MHz. As is explained below, this configuration provides 300 gigabytes of user data capacity. As should be understood, the described system can operate with a larger or smaller overall capacity, with flash memory chips that have more or less capacity than 2 gigabytes and with flash memory chips that operate faster or slower than is currently preferred. In addition, Flash Memory Module 108 may consist of multiple "daughter boards" that are stacked together.

Flash Memory Module 108 communicates with SSD Controller 106, but does not have any connection with any other element in the system.

As is illustrated in FIG. 1, SSD Controller 106 occupies a central location, since it communicates with all other elements in the system, none of which communicate with each other. The design and operation of each of the elements shown as part of Board 103 will be described in detail below.

B. Data Structures Overview.

Figure 2:
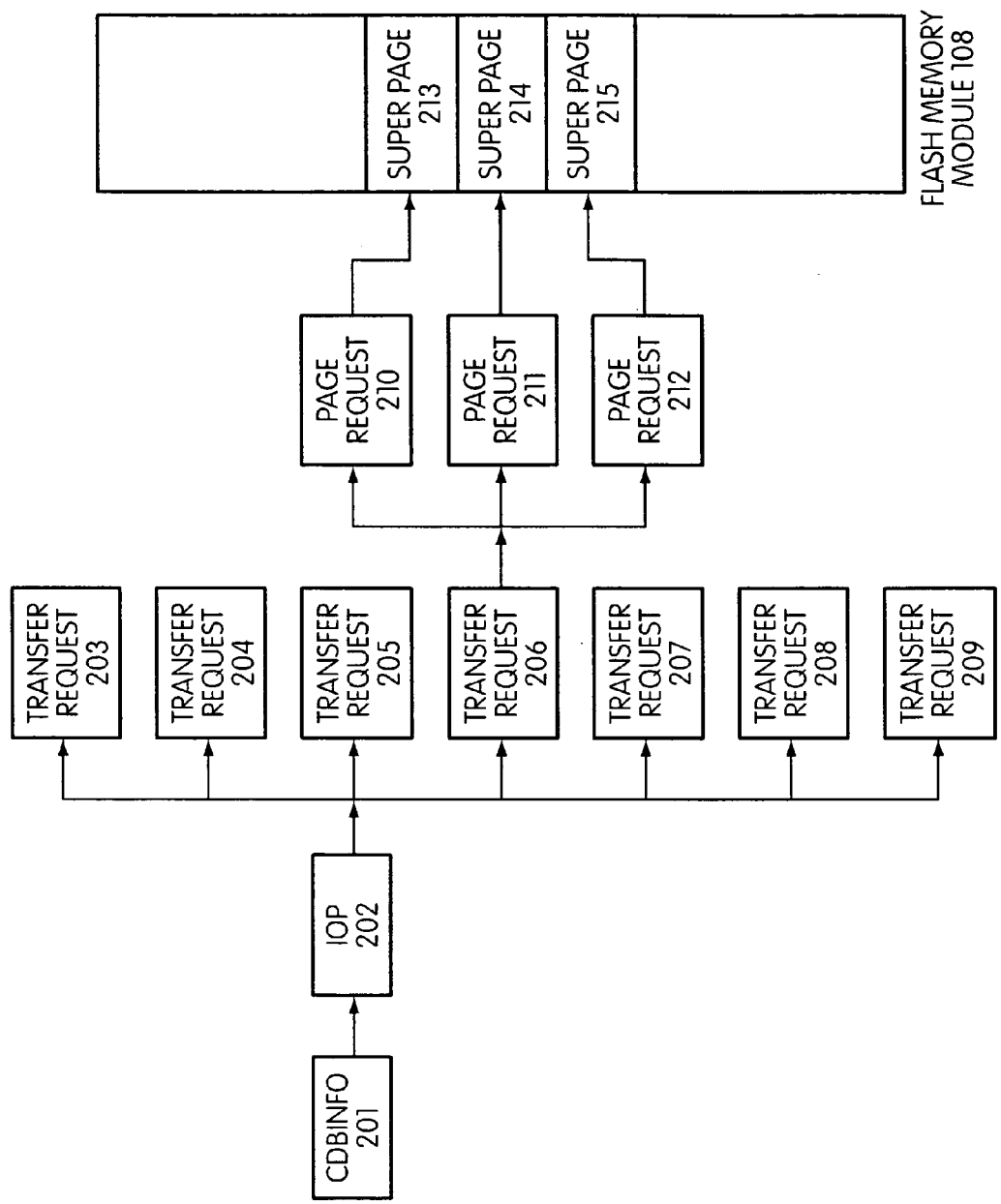
FIG. 2 illustrates a hierarchy of data structures used to translate host commands into flash reads and writes.

SSD Controller 106 operates by accepting commands from a host and breaking those commands into smaller tasks that eventually result in a sequence of reads and writes in Flash Memory Module 108. FIG. 2 illustrates this process at a high level.

When SSD Controller 106 receives a Host-initiated read or write command, it creates a data structure known as a "CDBinfo" (e.g., CDBinfo 201), which contains the Command Descriptor Block ("CDB") or other corresponding command-related information from the Host.

Among other information, the CDBinfo specifies the address range to be read from or written to, in Logical Block Addresses ("LBAs").

Based on the CDBinfo, SSD Controller 106 creates a data structure known as an "Input-Output Process" ("IOP") (e.g., IOP 202). Under most circumstances, a single IOP controls the entire transaction requested by the Host.

Each IOP can invoke up to seven data structures known as "Transfer Requests" (e.g., Transfer Requests 203-209). Each Transfer Request is designed to handle a portion of the LBA range specified by the IOP.

Each Transfer Request can invoke up to three data structures known as "Page Requests" (e.g., Page Requests 210, 211 and 212, invoked by Transfer Request 206; Page Requests invoked by the other Transfer Requests are not shown in FIG. 2). Each Page Request is designed to read from or write to a segment of Flash Memory Module 108 corresponding to a portion of the LBA range specified by the Transfer Request.

As FIG. 2 shows, the three illustrative Page Requests each accesses a region of Flash Memory Module 108 known as a "SuperPage" (e.g., SuperPages 213, 214 and 215). As is further described below, each SuperPage consists of four flash Pages, each of which is stored on a different Flash Die.

Each of these data structures is described in greater detail below.

C. Detailed System Overview.

Figure 3:
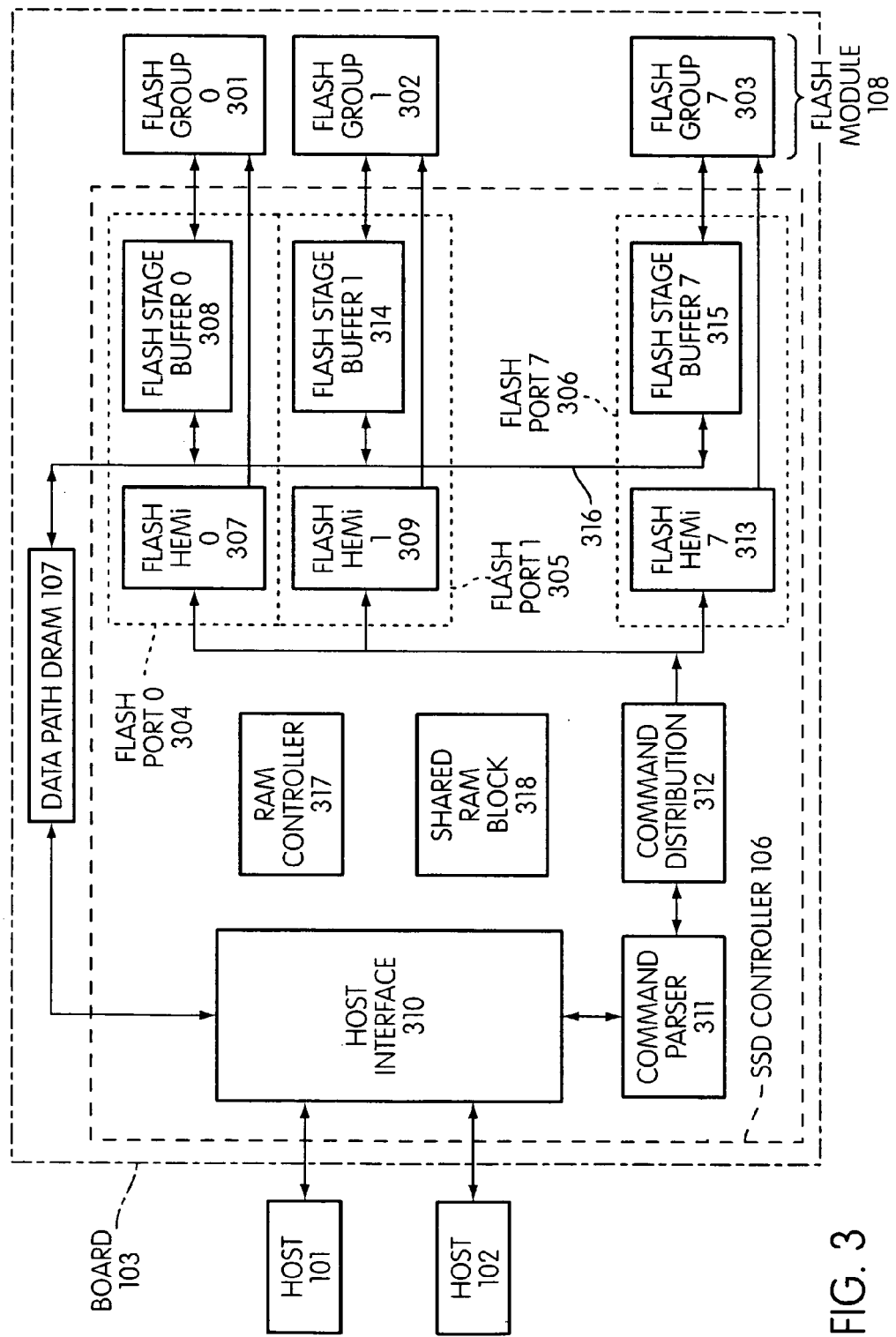
FIG. 3 illustrates the system of FIG. 1 in greater detail.

FIG. 3 provides additional detail to the overall system design illustrated in FIG. 1, though, as before, numerous elements and details are omitted for purposes of clarity. FIG. 3 shows Hosts 101 and 102 connected to Board 103, with Board 103 including SSD Controller 106, Data Path DRAM 107 and Flash Memory Module 108.

Flash Memory Module 108 is divided into eight Flash Groups, designated as Flash Groups 0-7. Of these, three are shown in the Figure: Flash Groups 0, 1 and 7, designated as 301, 302 and 303. In the currently preferred embodiment, Flash Memory Module 108 can hold between eight and twelve Flash Groups.

SSD Controller 106 also contains a number of Flash Ports equal to the number of Flash Groups contained in Memory Module 108, e.g., Flash Ports 304, 305 and 306. Each Flash Port communicates with one Flash Group (e.g., Flash Port 0 304 communicates with Flash Group 0 301). As with the Flash Groups, in the currently preferred embodiment, SSD Controller 106 can have a minimum of eight and a maximum of twelve Flash Ports and the embodiment illustrated contains eight, of which three are shown. As is described below, each Flash Port operates independently, thereby supporting parallel operations in the Flash Groups.

Each Flash Port includes a Flash HEMi and a Stage Buffer (e.g., Flash Port 0 304 contains Flash HEMi 0 307 and Flash Stage Buffer 0 308). "HEMi" stands for Hardware Execution MachIne. HEMi's are logic blocks that operate as dedicated, special-purpose microprocessors. The design and function of HEMi's is explained in greater detail below. Each Flash HEMi controls transfer operations for a single Flash Group (e.g., Flash HEMi 0 307 controls Flash Group 0 301, Flash HEMi 1 309 controls Flash Group 1 302, etc.)

Flash Stage Buffers (e.g., Flash Stage Buffer 0 308) are used to buffer data transfers between Data Path DRAM 107 and the Flash Groups. In the currently preferred embodiment, each Flash Stage Buffer is a dual port SRAM that can handle one read and one write concurrently, and is capable of holding 16 Kbytes of data, representing four flash pages. As is explained below, this constitutes a "SuperPage" of data.

As is described below, in the currently preferred embodiment, the data interface from each Flash Group is capable of transmitting 32 bits at a time (one doubleword), whereas Data Path DRAM 107 is capable of sending or receiving data 128 bits at a time (as is described above, in the current embodiment, the Data Path DRAM transmits and receives data in 64-bit chunks, but does so twice in each clock, thereby providing an effective data rate of 128 bits).

The Flash Stage Buffers buffer communications between the Flash Groups and the Data Path DRAM and therefore allow transfers to occur without requiring wait states on the part of the DRAM. In the currently preferred embodiment, in the case of transmissions from the Flash Group to the DRAM, the Flash Stage Buffers accept the data in doubleword chunks. Once a sufficient amount of data has been received (preferably an entire SuperPage), the Flash Stage Buffer then burst transfers the data to the Data Path DRAM in a DMA transfer that uses the entirety of the Data Path DRAM data bus. The Flash Stage Buffers are controlled by DMA logic that handles DMA transmissions to and from the DRAM (see discussion of FIG. 10, below).

As FIG. 3 shows, Hosts 101 and 102 communicate with Host Interface 310, which, as should be understood, includes Host Ports 104 and 105 (not shown). In general Hosts issue commands, provide data that is to be written into mass storage and request data from mass storage. As is understood by those of ordinary skill in the art, the details of the manner in which Hosts communicate with mass storage is protocol-dependent. Typically, however (and without limitation), Hosts communicate with mass storage using "frames," which contain commands and/or data. Typically, commands are contained in Command Descriptor Blocks ("CDBs"), which are familiar to those of ordinary skill in the art.

Host Interface 310 is designed to respond to CDBs in a manner transparent to the Host, meaning that from the perspective of Host 101, Host Interface 310 appears to constitute an interface to a conventional mass storage device.

Control flow proceeds as follows (each of the logic blocks and metadata structures mentioned is explained in greater detail below): Upon receiving a CDB requesting a read or write, Host Interface 310 generates a CDBinfo to handle the operation (e.g., CDBinfo 201). That CDBinfo is then passed to Command Parser Block 311.

Upon receiving a CDBinfo, Command Parser Block 311 performs coherency and other types of checks, which are described below, and then passes the CDBinfo to Command Distribution Block 312.

Command Distribution Block 312 evaluates the CDBinfo and creates an IOP (e.g., IOP 202) to carry out the requested transfer. Command Distribution Block 312 then generates one or more Transfer Requests (e.g., Transfer Requests 203-209), each to carry out a portion of the transfer required by the IOP. For each Transfer Request, Command Distribution Block 312 then determines which Flash Group contains the data to be read, or the address location to be written.

Command Distribution Block 312 then passes the Transfer Requests to the Flash Ports corresponding to the Flash Group containing the relevant flash memory addresses, e.g., Flash Port 0 304, Flash Port 1 305 and Flash Port 7 306.

When a Flash Port receives a Transfer Request from Command Distribution Block 312, the Flash HEMi for that Flash Port breaks the Transfer Request into Page Requests (e.g., Page Requests 210, 211 and 212) and uses the Page Requests to control actual read and write operations in the associated Flash Group, with each Page Request accessing up to a SuperPage of data.

Control flow in FIG. 3 for a read or write operation in Flash Group 0 thus proceeds as follows. Host 101→Host Interface 310→Command Parser Block 311→Command Distribution Block 312→Flash HEMi 0 307→Flash Group 0 301.

Data flow proceeds differently. In the case of a read, data is returned by the Flash Group to the Flash Stage Buffer contained in the connected Flash Port. For example, Flash Stage Buffer 0 308 is connected to Flash Group 0 301, Flash Stage Buffer 1 314 is connected to Flash Group 1 302 and Flash Stage Buffer 7 315 is connected to Flash Group 7 303.

From the Flash Stage Buffer, the data obtained from the Flash Group is written into Data Path DRAM 107 through Bus 316. From Data Path DRAM 107 it passes through Host Interface 310 to Host 101. Write operations proceed in the opposite direction: Host 101→Host Interface 310→Data Path DRAM 107→Flash Stage Buffer 0 308→Flash Group 0 301.

The fact that control flow and data flow follow different paths is illustrated by the lines connecting the various elements in FIG. 3. Thus, the arrows connecting the Flash HEMi's with the Flash Groups symbolize control flow between these elements, whereas the arrows connecting the Flash Groups with the Stage Buffers indicate data flow.

FIG. 3 also shows RAM Controller 317 and Shared RAM Block 318, each of which is described in greater detail below. In general, Shared RAM Block 318 contains memory used by the HEMi's, and RAM Controller 317 contains logic that controls Data Path DRAM 107 and Shared RAM Block 318 and arbitrates access to both of those resources.

D. Read and Write Overview.

Figure 4:
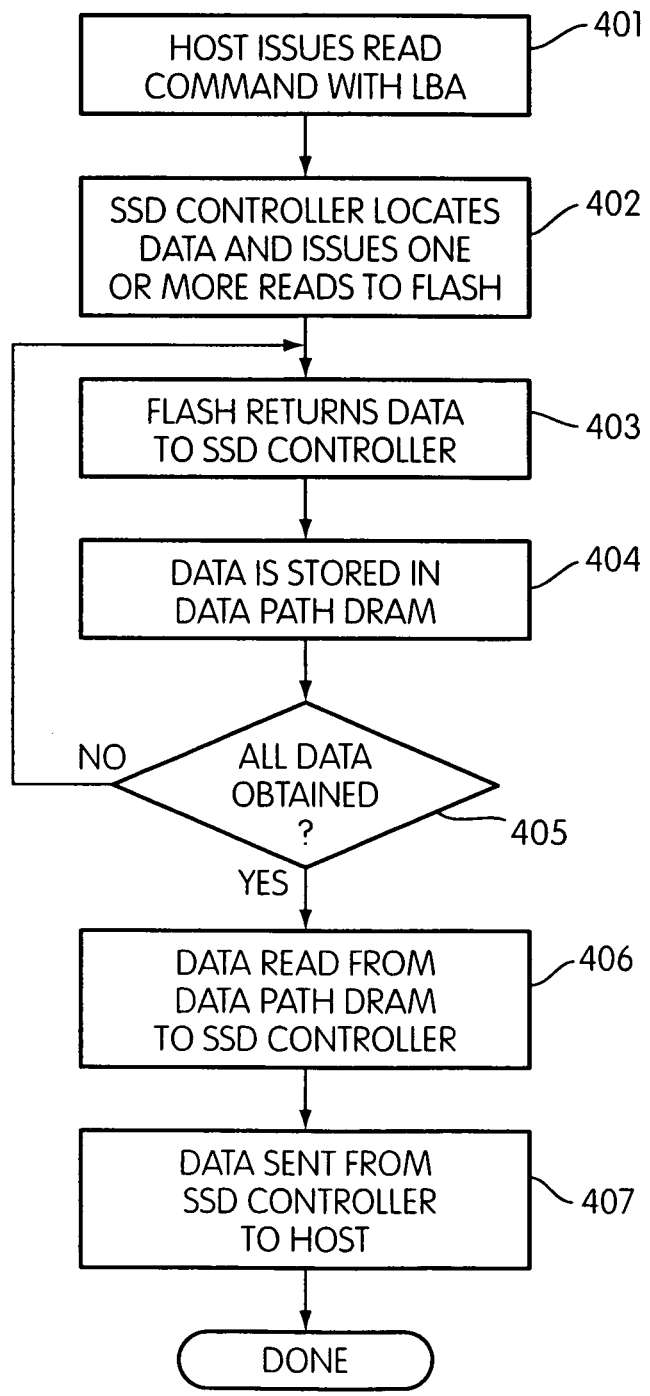
FIG. 4 illustrates a host read operation at a high level.

FIG. 4 illustrates the high-level data flow for a read operation handled by SSD Controller 106.

In Step 401, the Host (e.g., Host 101) issues a read command, including the LBA of the data.

In Step 402, SSD Controller 106 identifies the location of the requested LBA(s) in Flash Memory Module 108 and issues one or more read commands to the Flash Memory Module.

In Step 403, Flash Memory Module 108 performs a read operation and returns data to SSD Controller 106.

In Step 404, the returned data is passed through SSD Controller 106 and stored in Data Path DRAM 107.

In Step 405, a check is made to determine if all of the data requested by Host 101 has been obtained. If not, ("no" outcome to Step 405), control returns to Step 403 so that the additional data can be obtained from the Flash Memory Module and stored in the Data Path DRAM.

Once all data requested by the Host has been obtained from the Flash Memory Module and stored in the Data Path DRAM ("yes" outcome from Step 405), in Step 406, the data is read out of Data Path DRAM 107 and into SSD Controller 106.

In Step 407, the data is transmitted from SSD Controller 106 to Host 101, and the read operation requested by Host 101 is complete.

As should be understood, FIG. 4 describes the read operation using high-level conceptual steps, the details of which are explained below.

Figure 5:
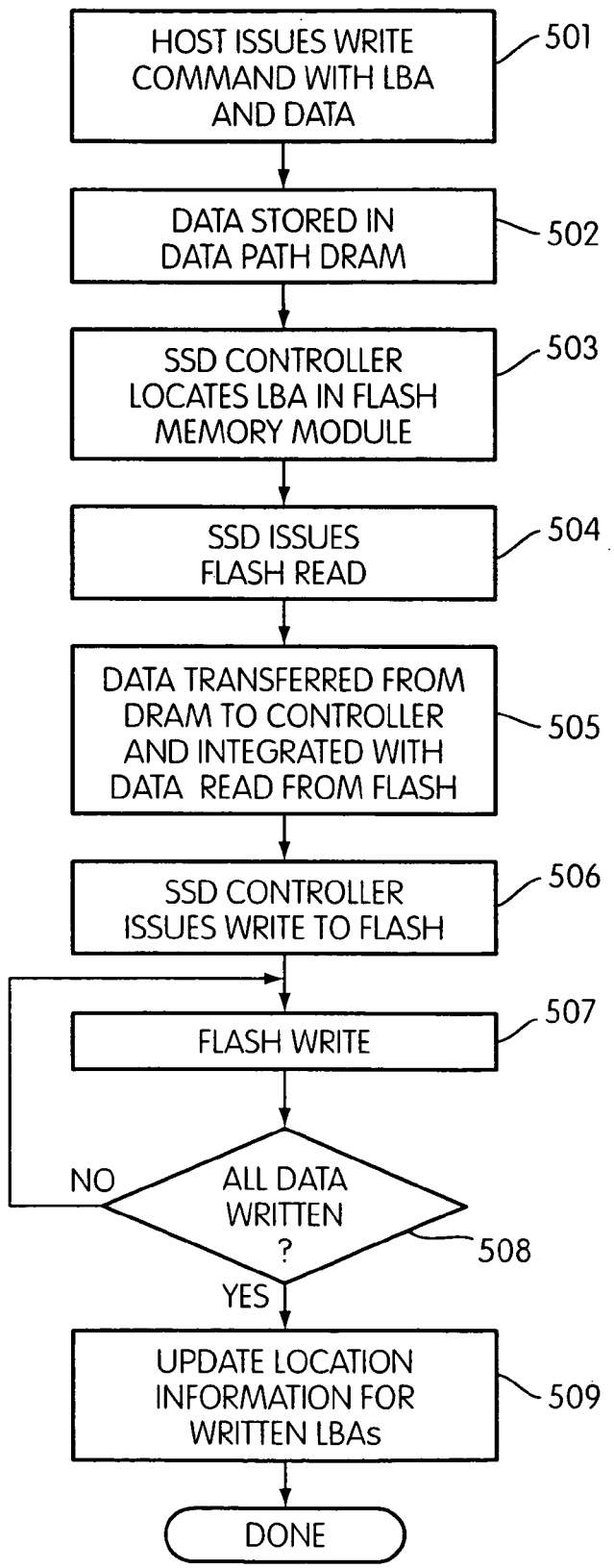
FIG. 5 illustrates a host write operation at a high level.

FIG. 5 uses similar high-level conceptual steps to illustrate a write operation, in which Host 101 is seeking to store data in memory.

In Step 501, Host 101 issues a write command, with an LBA, and provides the data to SSD Controller 106.

In Step 502, SSD Controller 106 stores the data to be written in Data Path DRAM 107.

In Step 503, SSD Controller 106 identifies the location of the LBA in Flash Memory Module 108.

In Step 504, SSD Controller 106 issues a read command to Flash Memory Module 108 sufficient to read the SuperPage containing the LBA. This read command does not store data into the DRAM, and therefore proceeds from Step 403 of FIG. 4 to Step 405, skipping Step 404, and loops through those two Steps until all of the data has been received.

In Step 505, the data from Data Path DRAM 107 is transferred to the Controller and integrated with the data read from the Flash Memory Module. As a result of this integration, the Controller now holds a SuperPage in which the new data has overwritten the old data stored at that LBA, but all other LBAs in the SuperPage are unchanged.

In Step 506, SSD Controller 106 issues a write command to Flash Memory Module 108.

In Step 507, Flash Memory Module 108 performs a write operation.

In Step 508, a check is done to determine if all information has been written in Flash Memory Module 108.

If additional write operations are required ("no" result from Step 508), control returns to Step 507.

If all data has been written to Flash Memory Module 108 ("yes" result from Step 508), in Step 509, SSD Controller 106 updates location information for the LBAs that were written. As is explained in detail below, because of the nature of flash memory, a write operation does not physically overwrite the existing SuperPage, but instead writes the updated SuperPage to a new location in Flash Memory Module 108, thereby requiring an update to the address translation information associated with the LBAs stored in that SuperPage.

The write operation then completes.

II. Flash Memory Architecture

A. Physical Memory Architecture.

Figure 6:
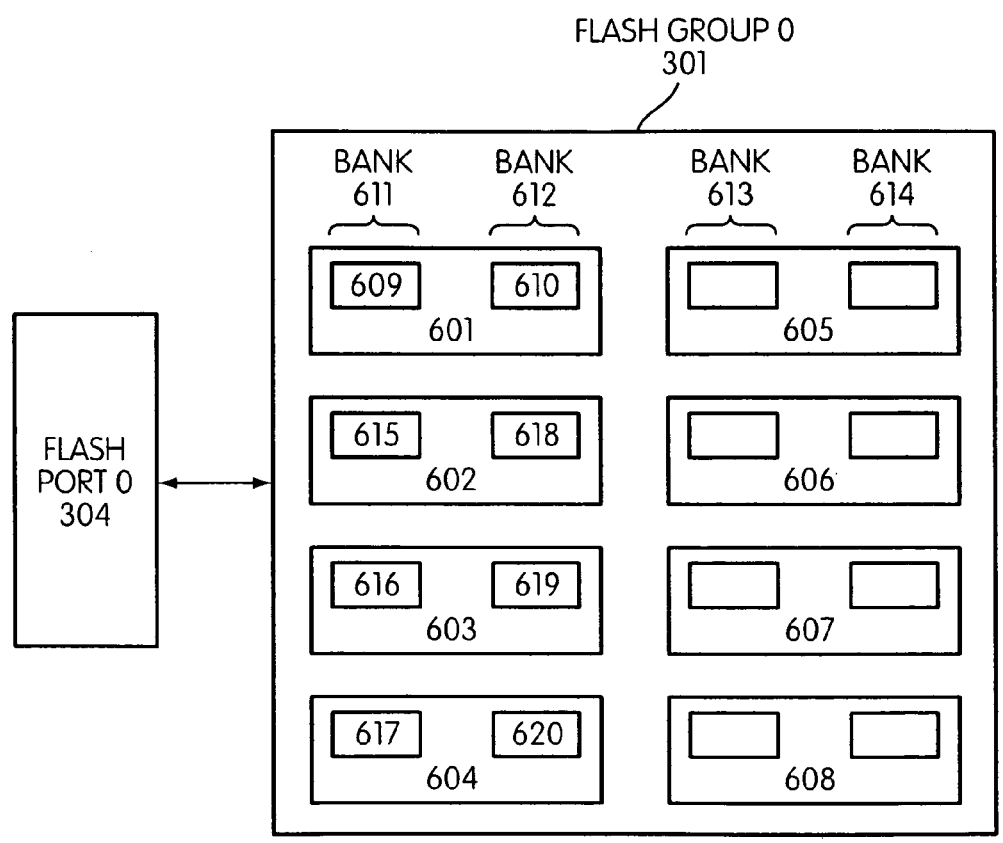
FIG. 6 illustrates an organization of flash memory.

FIG. 6 illustrates the organization of one Flash Group (e.g., Flash Group 0 301), and its relationship to its associated Flash Port (e.g., Flash Port 0 304). As should be understood, the details of this organization may differ in different embodiments.

Flash Group 301 consists of eight Flash Chips, designated as 601-608. Each Flash Chip includes two Dies; e.g., Flash Chip 601 contains Dies 609 and 610.

In one embodiment, each Die (e.g., Die 609) has a raw capacity of approximately 1.11 gigabytes, consisting of 8224 blocks, each made up of 64 pages, with each page consisting of 2212 bytes. When system and spare memory space is subtracted, this leaves a user data capacity of approximately 1 gigabyte per die, or 2 gigabytes per NAND flash chip. In a system including twelve Flash Groups and eight Banks per Flash Group, this provides a raw user memory space of approximately 384 gigabytes, but the total useable space for user data is approximately 300 gigabytes, since some space is devoted to spare and system functions that do not fall within the LBA address space made available to users. System space stores various types of system metadata, including SCSI mode pages, and also contains free space.

The use of 2 gigabyte NAND flash chips, each containing two 1 gigabyte Dies, is a reflection of the current state of the art in available flash memory technology. The described system can operate equally well with other flash memory sizes and configurations, including four dies contained in one flash memory chip, or one die per chip. Because the next generation of NAND flash chips will incorporate four Dies per chip, it is likely that Flash Group 301 will use such chips. The principles described herein are easily applicable to four-Die designs. For example, if each Die in a four-Die chip has its own CE and RB Pin, but all four Dies share common address/command/data pins, then each Die can be incorporated into a separate Bank. On the other hand, if each four-Die chip has two CE and RB Pins, with two Dies sharing each Pin, then from the perspective of SSD Controller 106, the two Dies that share common CS and RB Pins will appear indistinguishable from a single Die described above (e.g., Die 609).

The currently preferred embodiment also operates equally well with 1 Gigabyte NAND flash chips, each containing 2 half-gigabyte dies. In this configuration, only 4112 blocks are included per die. Other than the capacity, this configuration operates the same as the configuration described above.

Note that the flash memory chips themselves are of conventional design, and the illustration in FIG. 6 is not intended to convey details of the internal design of these chips, but instead to allow for an understanding of the organization of the chips and the manner in which the Dies interface with the rest of the system.

Flash Group 301 is divided into four Banks (611, 612, 613 and 614), each made up of four Dies. Thus, Bank 611 consists of Die 609 from Flash Memory 601, Die 615 from Flash Memory 602, Die 616 from Flash Memory 603 and Die 617 from Flash Memory 604. Bank 612 consists of Die 610 from Flash Memory 601, Die 618 from Flash Memory 602, Die 619 from Flash Memory 603 and Die 620 from Flash Memory 604. Banks 613 and 614 are similarly organized among the other Flash Memories and Dies.

FIG. 6 shows four Banks. In the currently preferred embodiment, each Flash Group contains between four and eight Banks, depending on the amount of capacity desired by the user.

Figure 7:
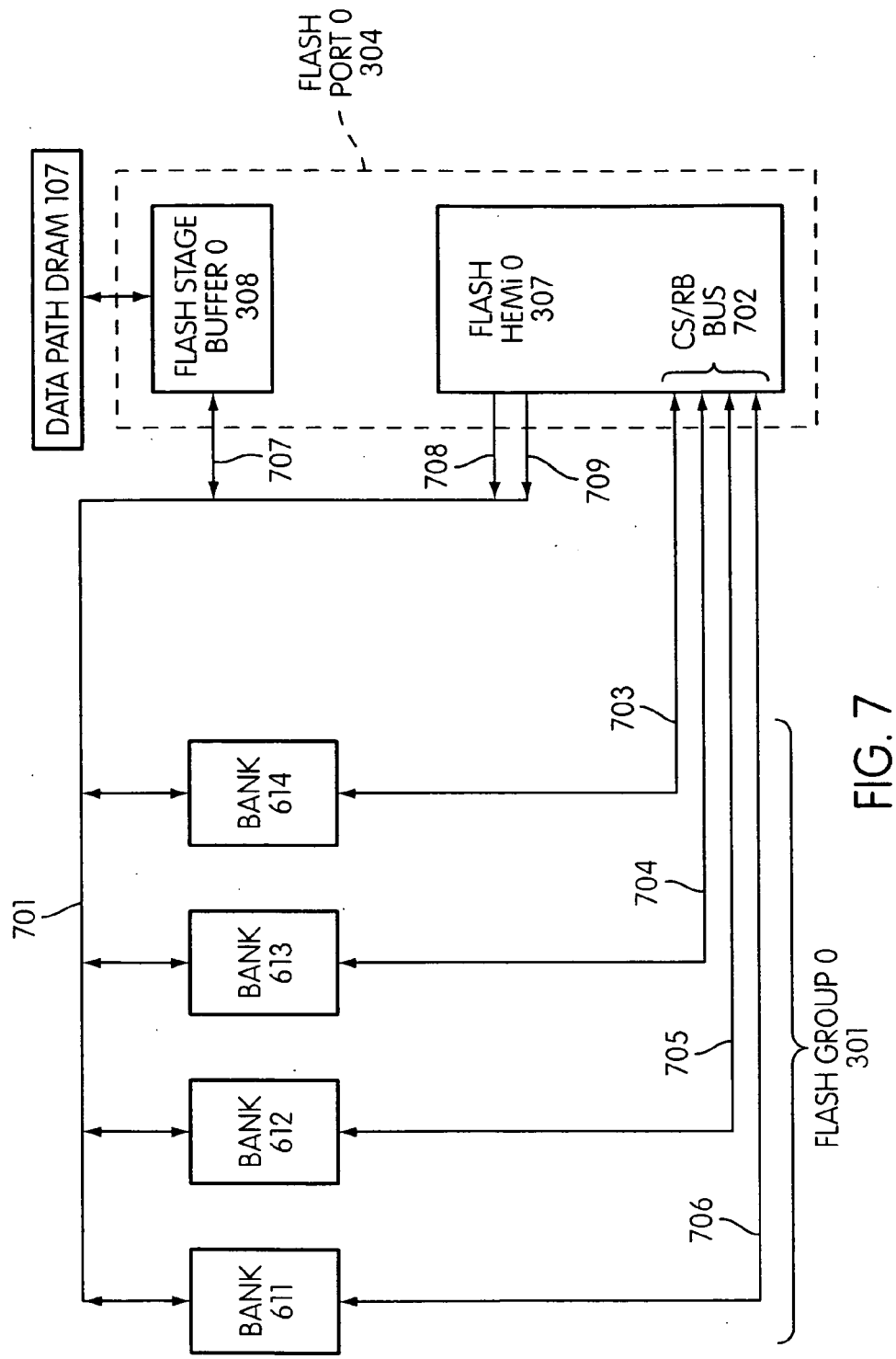
FIG. 7 illustrates a relationship between a flash memory group and a flash port.

FIG. 7 provides additional details regarding the interconnections between Flash Memory Module 108, SSD Controller 106 and Data Path DRAM 107. Although FIG. 7 shows Flash Group 0 301 and Flash Port 0 304, the same interconnections exist between all Flash Groups and their accompanying Flash Ports and Data Path DRAM 107.

As is shown in FIG. 7, Flash Group 0 301 is connected to Flash Port 0 304 by two buses, Flash Bus 701 and CS/RB Bus 702.

CS/RB Bus 702 consists of a separate line connecting Flash HEMi 307 to each of the Banks of Flash Group 301. In the embodiment shown, which has four Banks, CS/RB Bus 702 consists of four lines: Line 703, connecting Flash HEMi 307 with Bank 614, Line 704, connecting Flash HEMi 307 with Bank 613, Line 705, connecting Flash HEMi 307 with Bank 612, and Line 706, connecting Flash HEMi 307 with Bank 611. In an embodiment including a larger number of Banks (e.g., eight), CS/RB Bus 702 would consist of a correspondingly larger number of signals. As should also be understood, the signals from Flash HEMi 307 travel through pins on SSD Controller 106. FIG. 7 is not intended to show the physical details of the transmission paths, but instead illustrates the flow of data and control signals.

The lines of CS/RB Bus 702 carry Ready-Busy ("RB") signals from Flash Group 301 to Flash HEMi 307, and Chip Select ("CS") signals from Flash HEMi 307 to Flash Group 301.

Only one of the CS signals carried on CS/RB Bus 702 is active at any given time. The Bank connected to the currently active CS signal is connected to Flash Bus 701, and all other Banks are disconnected from that Bus (again, this is a logical rather than a physical concept; depending on the implementation, the "connected" Bank may communicate with the Flash Bus whereas all other Banks ignore the Flash Bus, even though a physical connection exists between the Flash Bus and all of the Banks).

Address and control information from Flash HEMi 307 is transmitted on Flash Bus 701 to each of the Banks. This includes Control Signals 708 (described below in connection with FIG. 8) and Address/Command Signals 709 (described below in connection with FIG. 9). Similarly, Bus 707 connects Flash Stage Buffer 308 to Flash Bus 701. Data is transmitted from Stage Buffer 308, on Bus 707, along Flash Bus 701 and to the Banks. Data is transmitted from the Banks to Stage Buffer 308 in the opposite direction.

As is further shown in FIG. 7, Data Path DRAM 107 is connected to Stage Buffer 308. Thus, data passes from Data Path DRAM 107 to Stage Buffer 308, and is then sent along Bus 701 to the Bank that has the currently active CS signal. Data from Flash Group 301 is transmitted to Data Path DRAM 107 along the opposite path.

Figure 8:
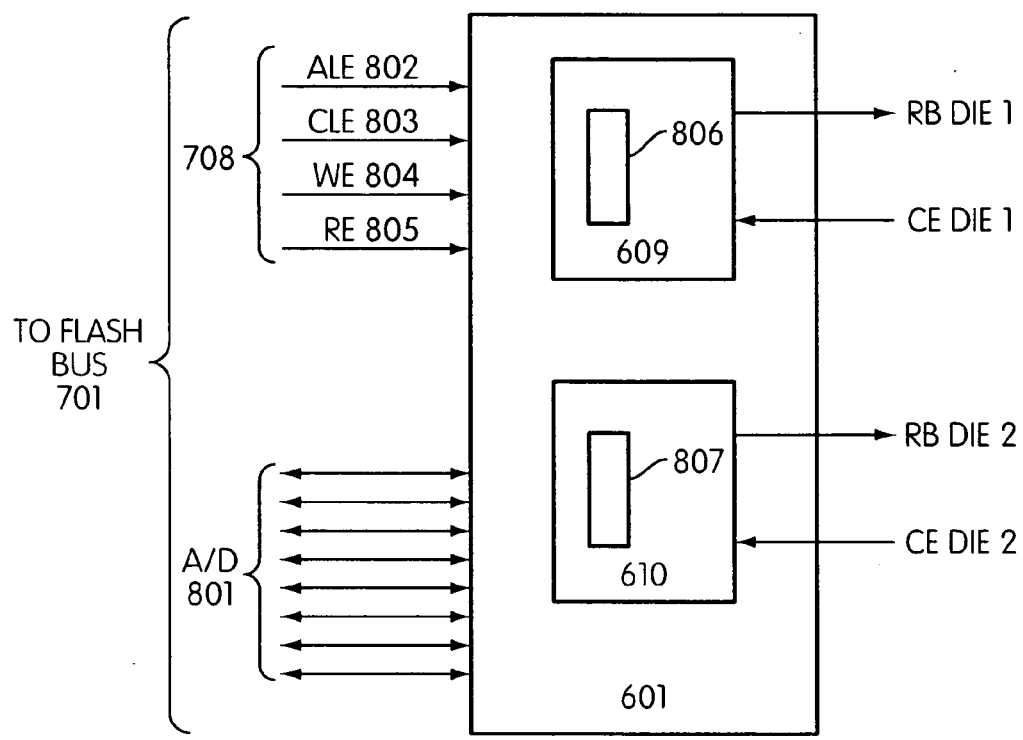
FIG. 8 illustrates input and output signals to a flash memory device.

FIG. 8 shows portions of the pin-out of a single flash memory chip, e.g., Flash Chip 601, which includes Dies 609 and 610. In the currently preferred embodiment, the Flash Chips use a standard NAND flash interface, typically consisting in relevant part of 8 bits of address/data (801), 4 bits of control (Address Latch Enable ("ALE") Signal 802, Command Latch Enable ("CLE") Signal 803, Write Enable ("WE") Signal 804 and Read Enable ("RE") Signal 805, which collectively are referred to as Control Signals 708), one Chip Enable pin per Die (this is connected to the CS signal from the Controller and the designations Chip Enable and Chip Select will sometimes be used interchangeably), and one Ready/Busy line per die. As is indicated, the A/D signals 801 and the ALE, CLE, WE and RE signals are all connected to Flash Bus 701, though these are not the only signals connected to that Bus.

As is shown in FIG. 8, ALE, CLE, WE, RE and both Chip Enable signals are inputs to Flash Memory 601. A/D Bus 801 is made up of eight bidirectional signals. Both RB signals are outputs.

All signals shown in FIG. 8, except for the two CE and two RB signals, are shared by both Dies. Thus, the same eight A/D pins 801 are shared by Dies 609 and 610. As should be understood from the discussion of FIG. 6, these Dies are each in separate Banks. For this reason, the sharing of pins does not create a conflict, since under no circumstances are these signals active for more than one Bank at a time.

As is typical of flash memory, each Die has an associated Flash Page Buffer that can hold one page of data that is being written into or read out of the corresponding Die. FIG. 8 shows these as Page Buffers 806 and 807.

Figure 9:
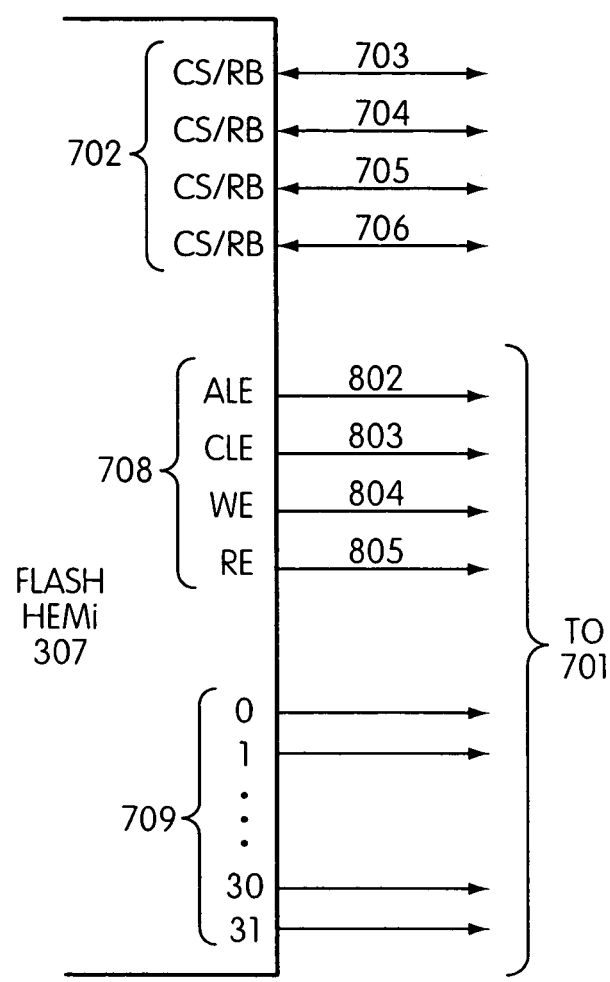
FIG. 9 illustrates input and output signals to a flash HEMi block.

FIG. 9 illustrates the portion of the signal output of a Flash HEMi (e.g., Flash HEMi 307) which is devoted to a Flash Memory Port (e.g., Flash Memory Port 0 304). As should be understood, Flash HEMi 307 also has additional inputs and outputs devoted to other functions. As is explained above, signals connecting Flash HEMi 307 with the Flash Group are routed through pins of SSD Controller 106. Neither those pins, nor the logic that handles the routing, are shown. As is true in other Figures showing signal routing, FIG. 9 is intended as a conceptual illustration, and is not intended to illustrate the details of actual physical layout.

This portion of Flash HEMi 307's interface is made up of signals devoted to the following functions:

1. Control Signals 708, made up of four control lines: ALE Signal 802, CLE Signal 803, WE Signal 804 and RE Signal 805. These signals are outputs from Flash HEMi 307.

2. CS/RB Bus 702, which is made up of CS/RB Lines 703-706. As is explained above, each Flash HEMi can control one Flash Memory Bank per connected CS/RB Line. Thus, in the embodiment illustrated in FIG. 9, Flash HEMi 307 controls four Flash Memory Banks (e.g., Banks 611, 612, 613, 614 shown in FIG. 6). In a system including eight Banks per Flash Group, each Flash HEMi would have eight signals devoted to this purpose (note that the logic necessary to support the extra four signals is present even if those signals are not in fact used).

CS/RB Bus 702 transmits CS signals from HEMi 307 to the Flash Banks, and transmits RB signals from the Flash Blanks to HEMi 307. Since the signals are multiplexed in this manner, each such Line may transmit only one type of signal at a time. The CS/RB signals are "one hot" signals, meaning that one and only one of these signals can be active at any given time.

Using the same signals for both CS and RB purposes saves pins on SSD Controller 106, and therefore reduces the cost and complexity of the SSD Controller. However, this limits the number of Banks that can be controlled by Flash HEMi 307, since one RB signal, and therefore one pin, is required for each bank. Because in the current embodiment SSD Controller 106 includes eight CS/RB pins for each Flash Port, in that embodiment a maximum of eight Banks may be controlled by each Flash HEMi.

3. 31 signals making up Address/Command Signals 709. This bus, which connects to Flash Bus 701, runs at the same 40 MHz speed as the flash memory chips and carries addresses and commands from Flash HEMi 0 307 to Flash Group 0 301. Address/Command Signals 709 can be thought of as four separate eight-bit buses (consisting of lines 0-7, 8-15, 16-23 and 24-31), each of which routes an eight-bit payload to a separate Die in a Flash Memory Bank. Thus, eight lines from Address/Command Bus 709 connect to A/D signals 801, shown in FIG. 8.

As should be clear from the foregoing, 44 pins of SSD Controller 106 are devoted to each Flash Port (keeping in mind that each Flash Port can support a maximum of eight Banks and therefore requires eight CS/RB pins, though only four such signals are shown in FIG. 9). Since SSD Controller 106 can support up to 12 Flash Ports, 528 pins of SSD Controller 106 are devoted to the flash interface, though some of these pins may be no-connects, if fewer than 12 Flash Ports are used. Note that, if separate CS and RB pins were required, an additional 96 pins would be needed for the flash interface (1 pin per Bank×8 Banks×12 Flash Ports). Combining the CS and RB signals onto a single pin therefore provides a very significant savings in terms of the number of required pins.

The embodiment shown in FIG. 9 is currently preferred, but various other embodiments are also possible. In a different embodiment, the eight CS/RB pins currently devoted to a particular Flash Group are connected to a mux or other similar logic device located in the Flash Group. The mux, in turn, has a set of output signals that connect to the CE inputs of all Flash Dies in a Bank, with each signal causing the CE inputs of a particular Bank to be selected. Because the eight SSD Controller CS/RB pins are capable of transmitting 256 separate states, in theory, it would be possible to use those pins to select among 256 separate Banks, by designing the mux or other logic so as to generate a signal along a different output line for each of the 256 possible input states. However, since in the current embodiment all of the Banks share the same A/D Bus, there would be little or no benefit in adding such a large number of Banks. Instead, in a more desirable embodiment, such a mux or other similar logic would be used to add a modest number of Banks (e.g., eight), or to reduce the number of CS/RB pins per Bank (e.g., from eight to four).

Note that in this alternate embodiment, because the number of CS/RB pins is less than the number of Banks, the CS/RB pins can no longer handle the RB signals for each Bank. In this embodiment, therefore, the SSD Controller CS/RB pins no longer handle the RB input. However, because standard flash chips support a software-only status check of the RB state, each Flash HEMi could check the RB state of the Banks using the A/D Bus.

This alternate embodiment therefore allows SSD Controller 106 to devote fewer pins to the flash memory interface or to support a larger number of Banks with the same number of pins, though at the cost of some additional logic complexity.

Figure 10:
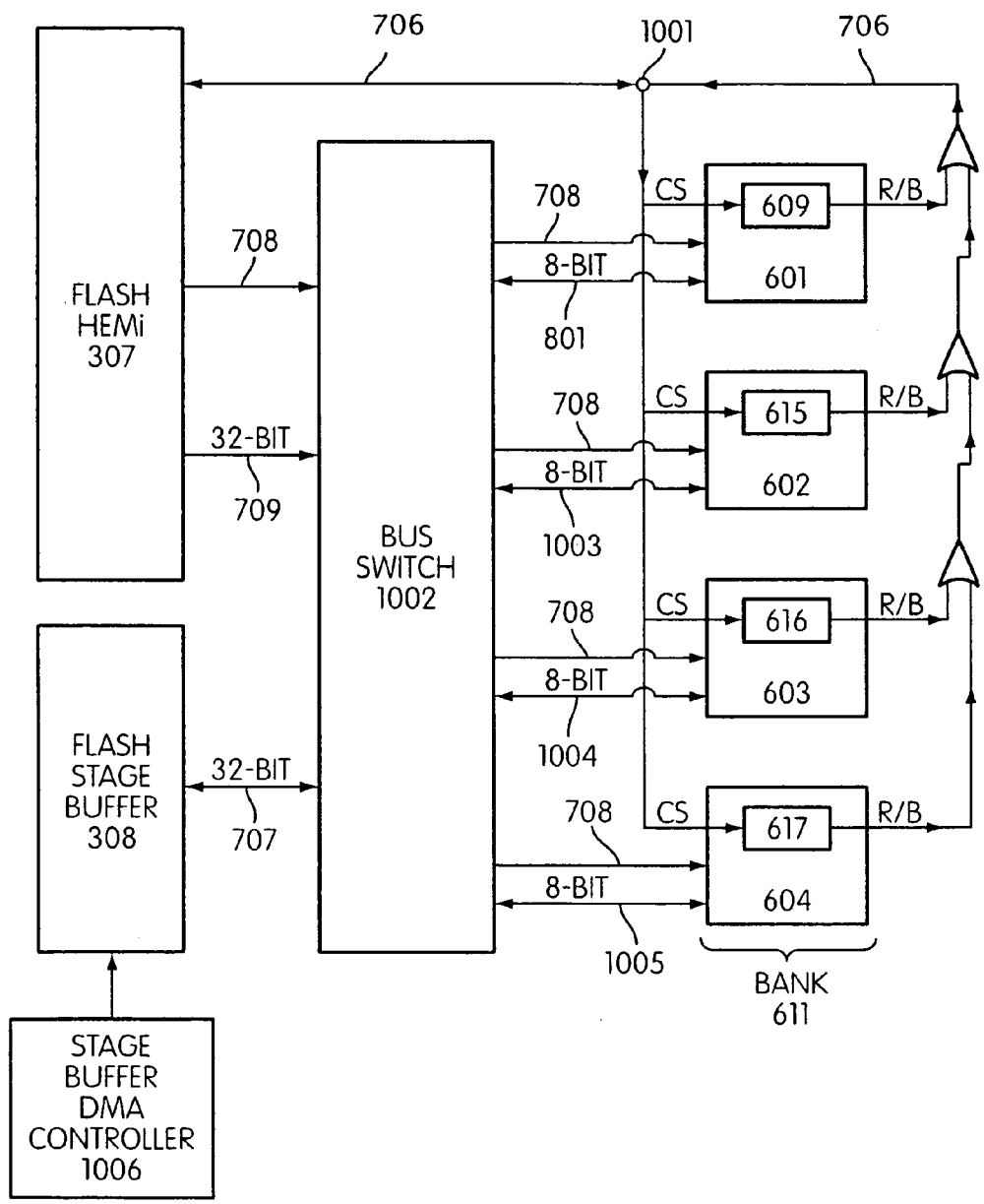
FIG. 10 illustrates connections between a flash port and a flash memory bank.

FIG. 10 illustrates the manner in which the Dies in a single Bank (e.g., Dies 609, 615, 616 and 617 in Bank 611) are connected together and to the associated Flash Port (e.g., Flash Port 0 304, containing Flash HEMi 307 and Stage Buffer 308).

As is shown in FIG. 6, Die 609 is one of two Dies in Flash Chip 601, Die 615 is one of two Dies in Flash Chip 602, Die 616 is one of two Dies in Flash Chip 603 and Die 617 is one of two Dies in Flash Chip 604. For ease of illustration, FIG. 10 only shows one of the two Dies in each Flash Chip. (As is described above, Memory Module 108 may well incorporate Flash Chips that have four Dies each (or more), though the principles of the design disclosed herein would remain the same.)

As is shown, Line 706 constitutes the CS/RB signal interface between Flash HEMi 307 and Bank 611. That Line carries the CS signal from Flash HEMi 307 to Bank 611, and the RB signal from Bank 611 to Flash HEMi 307. FIG. 10 illustrates this by showing arrows going in both directions between Flash HEMi 307 to Point 1001 on Line 706. From Point 1001, the signal path divides, and carries the CS signal as an input to the Dies (shown by arrows pointing into each Die with the label "CS") and carries the RB signal as an output from each of the Dies (shown by arrows pointing out of each Die with the label "RB"). As should be understood, Point 1001 is figurative in nature, and neither it nor the rest of the Figure are intended as a literal illustration of physical implementation.

As is shown, the RB output signals from each Die in the Bank are logically ORed together (or otherwise similarly combined), so that a Busy signal is sent from Bank 611 to HEMi 307 along Line 706 if any one of the four Dies in the Bank is outputting "Busy.". Line 706 also carries the CS signal from Flash HEMi 307 to each of the Dies in the Bank. When the CS signal devoted to the Bank is set by Flash HEMi 307, that signal is sent simultaneously to the CE pin of each Die in the Bank, thereby selecting each such Die simultaneously.

FIG. 10 also shows Address/Command Bus 709, which represents the connections between the A/D pins of Flash Chips 601-604 and the Address/Command signals of HEMi 307. As is shown, 32-bit Bus 709 carries signals from Flash HEMi 307 to Bus Switch 1002. Bus Switch 1002 represents logic that combines, divides and routes signals as described, and does not necessarily constitute a single physical switch.

Bus Switch 1002 divides the signals from Bus 709 into sub-buses. Signals 0-7 are transmitted to the A/D pins of Flash Chip 601 using 8-bit Bus 801 (also shown in FIG. 8), Signals 8-15 are transmitted to the A/D pins of Flash Chip 602 using 8-bit Bus 1003, Signals 16-23 are transmitted to the A/D pins of Flash Chip 603 using 8-bit Bus 1004 and Signals 24-31 are transmitted to the A/D pins of Flash Chip 604 using 8-bit Bus 1005. Note that the A/D pins are shared by both Dies in a Flash Chip, so that the signals transmitted to the Flash Chip pins would be received by the appropriate Die in a manner specific to the internal design of the Flash Chips.

FIG. 10 also shows the connections between Control Signals 708 of Flash HEMi 307 and each of the Dies. As is described above, these Control Signals consist of ALE, CLE, RE and WE, and they are transmitted from Flash HEMi 307 to the Flash Dies. Control Signals 708 are sent from Flash HEMi 307 to Bus Switch 1002. From Bus Switch 1002, an identical set of Control Signals (designated in each case as 708) is transmitted to each of the Flash Memory Chips. As with the A/D pins, the ALE, CLE, RE and WE pins are shared by both Dies in each Flash Memory Chip.

FIG. 10 also shows Flash Stage Buffer 308, which is connected to Bus Switch 1002 by 32-bit Bus 707. Unlike Bus 709, Bus 707 is bidirectional, and thus transmits data in both directions.

Transfers between Stage Buffer 308 and the Dies occur under the control of Stage Buffer DMA Controller 1006.

Note that Flash Stage Buffer 308 also connects to the RE and WE inputs of Flash Chips. These connections, which for clarity's sake are not shown in the Figures, are used to control DMA operations.

Bus Switch 1002 divides the signals from Bus 707 into four sets of eight-bit signals, and transmits those signals to Dies 609, 615, 616 and 617 using 8-bit Buses 801, 1003, 1004 and 1005. Similarly, Bus Switch 1002 receives data from Dies 609, 615, 616 and 617 on 8-bit Buses 801, 1003, 1004 and 1005, then transmits the entire 32-bit value to Stage Buffer 308 on Bus 707.

Switch 1002 thus multiplexes signals from Flash HEMi 307 and signals to and from Stage Buffer 308 on the same 8-bit Buses. Switch 1002 determines which set of signals to pass through to the 8-bit Buses depending on the particular stage of the read or write cycle, with address information from Flash HEMi 307 being connected to the Dies during one stage of the cycle, whereas data to or from Stage Buffer 308 is connected to the 8-bit Buses during a different stage of the cycle. (Again, as is described above, Switch 1002 is conceptual in nature and does not necessarily constitute a single dedicated switch. In addition, aspects of the functionality described in connection with Switch 1002 may be found in other logic blocks.)

FIG. 10 shows only a single Flash Memory Bank, 611. In an actual embodiment, Bus Switch 1002 would interface to each of the Flash Memory Banks in the Flash Group, and each interface would duplicate all of the signals output from Bus Switch 1002 to Bank 611 that are shown in FIG. 10, with the exception of Signal 706, which, as is explained above, is specific to Bank 611. As is also explained above, Flash Memory Switch 1002 connects Buses 707, 708 and 709 to each of the Flash Banks, but the only Bank that is responsive is the Bank associated with the currently active CS signal from Flash HEMi 307.

Note that Flash Bus 701 includes Buses 708, 801, 1003, 1004 and 1005.

Figure 11:
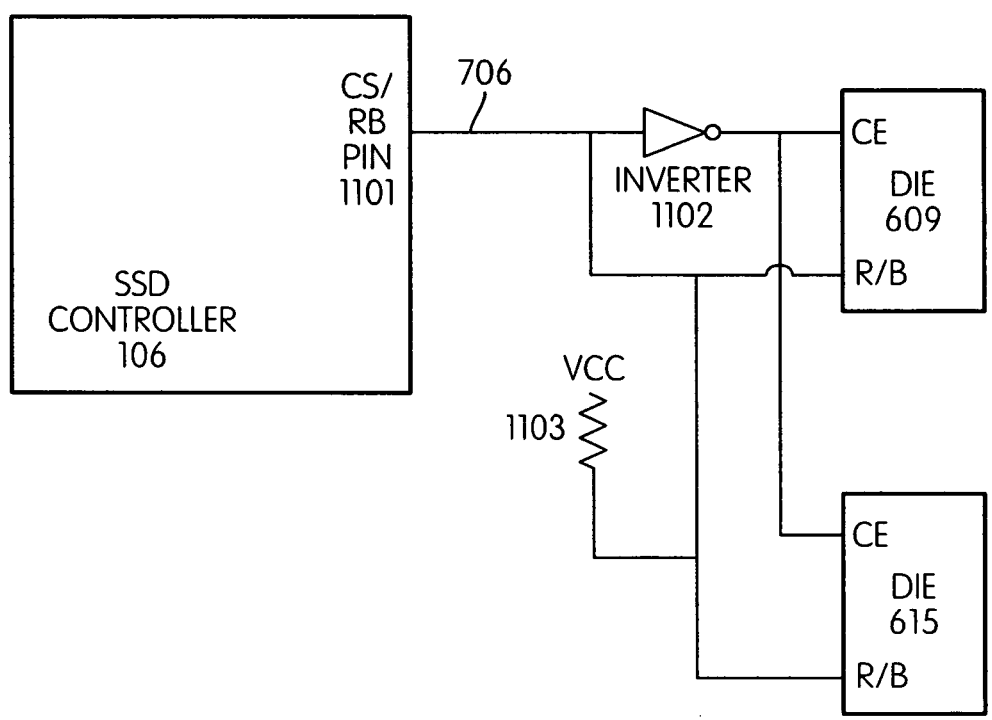
FIG. 11 illustrates multiplexing of CS and RB signals onto a single pin.

FIG. 11 shows the CS and RB logic related to Line 706 in greater detail. As is shown, SSD Controller CS/RB Pin 1101 connects to the RB and CE pins associated with Flash Dies 609 and 615. As is described above in connection with FIG. 6, Dies 609 and 615 are two of the four Dies in Bank 611. For purposes of illustration, the other two dies in the Bank are not shown, but are connected in the same manner as Dies 609 and 615.

SSD Controller 106 drives CS/RB Pin 1101 high to select Bank 611. This signal is inverted by Inverter 1102 and received low by the CE pins of the Dies in the Bank. These pins are active low.

CS/RB Pin 1101 is driven low by SSD Controller 106 when the Controller is driving another one of the CS pins in the same Flash Group high (thereby selecting another Bank in the Flash Group).

When Flash HEMi 307 wants to read the Ready-Busy state of Bank 611, SSD Controller 106 floats CS/RB Pin 1101. When the CS/RB Pin is floated by the SSD Controller, that Pin will receive a low input if any of the Flash Die RB pins is driving a low signal, indicating that the Bank is busy, since a low output on any of the Die RB pins will override Pullup 1103. If, on the other hand, the Bank is in the Ready state, the Flash Dies allow the RB pins to float. Because Pullup 1103 is connected to the RB pins, when all of those pins are floated, and when CS/RB Pin 1101 is floated, the Pin receives a high input signal, which indicates that the Bank is ready.

Thus, this circuit connects the R/B pins of the Banks together in an OR configuration, since all of the pins must be in the Ready state (floating) in order for a ready signal to be received by CS/RB Pin 1101, so that the circuit effectively ORs together the Busy state of the Pins. The use of Inverter 1102 allows SSD Controller 106 to drive the CS signal high to select a Bank, even though the Bank's CE pins are active low. This is necessary because the CS signal must be driven high in order to override the incoming RB signal. In this way, the RB input to SSD Controller 106 can be active high, but can still be overridden by a high output on CS/RB Pin 1101, since a high CS output will override a high RB input created by Pullup 1 103.

B. Logical Memory Architecture.

Hosts such as 101 and 102 typically organize memory in terms of Logical Block Addresses, or "LBAs." When a Host writes data to mass storage, the Host typically transmits a CDB that contains a write command and an LBA, though the details of Host communication vary depending on the specific protocol used by the Host. When the Host subsequently wishes to read that data, it issues a read command using the same LBA.

Typically, a Host's memory architecture divides data into millions of LBAs, with each LBA numbered sequentially, beginning with LBA 0. As is familiar to those of ordinary skill in the art, a Host will often communicate with a number of mass storage controllers, and will assign a subset of the Host's overall LBA range to each controller. In the current embodiment, SSD Controller 106 responds to an LBA range that begins with LBA 0 and ends with the highest LBA addressable by the Controller. Mapping that sequence of LBAs onto a larger Host LBA address space is the responsibility of the Host or a host bus adapter, and is transparent to SSD Controller 106.

Figure 12:
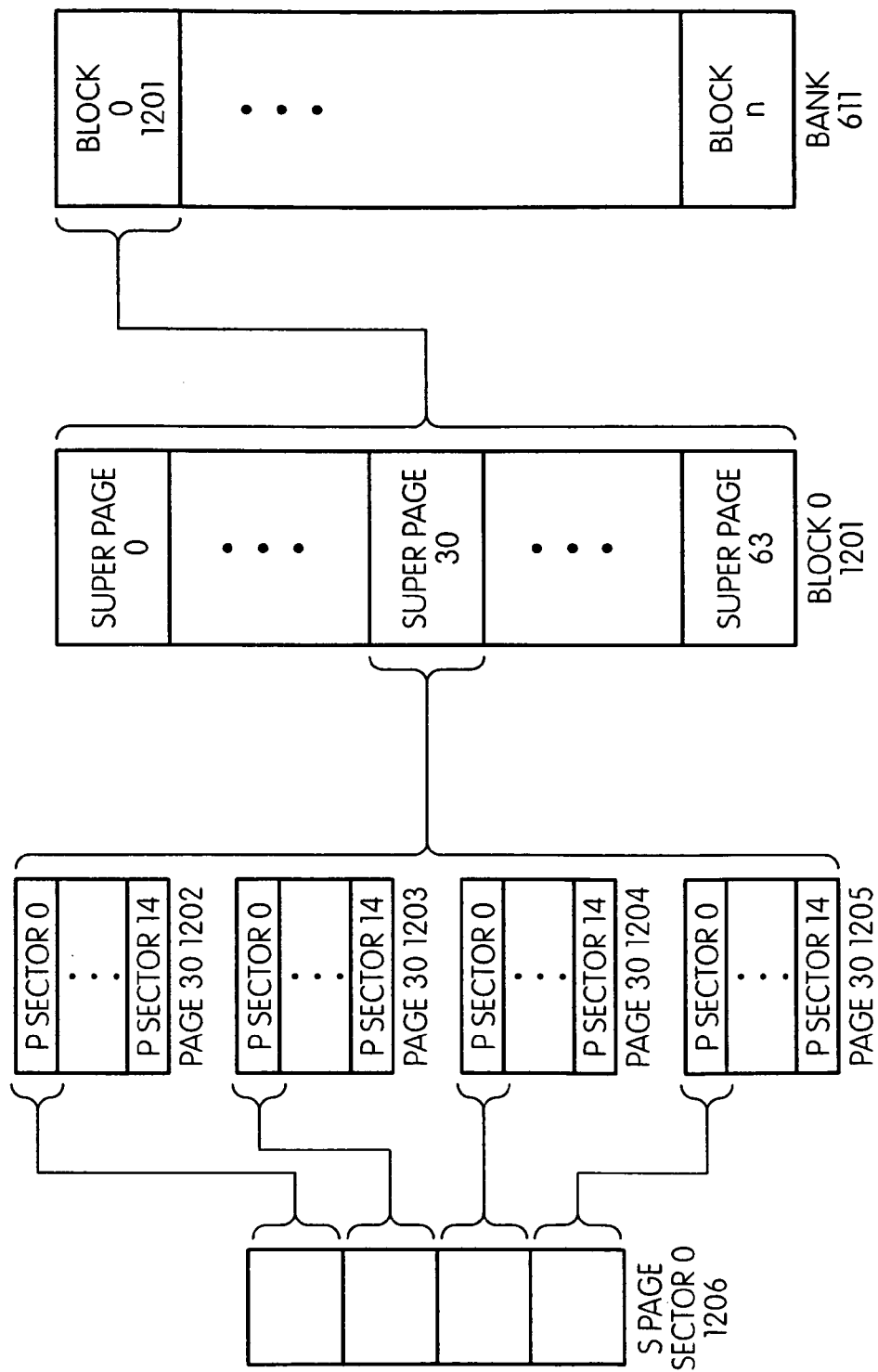
FIG. 12 illustrates a flash memory hierarchy.

FIG. 12 illustrates the memory hierarchy used in Flash Memory Module 108 in the currently preferred embodiment.

Each Flash Group is made up of a number of Banks (e.g., Bank 611). Each Bank consists of a number of Blocks, designated as Block 0-Block n (e.g., Block 0 1201). As is commonplace in flash memory systems, a Block represents a segment of flash memory that is erasable in a single operation.

The exact number of Blocks stored in a Bank is implementation-dependent. To take one example, in a system providing 300 gigabytes of available user data, the number of Blocks per Bank would ordinarily be in the range of 7,000-9,000, depending on various factors, including defect management and the amount of memory set aside for free space.

As is shown in FIG. 12, each Block consists of 64 SuperPages, designated as SuperPages 0-63. As is explained above, each SuperPage consists of four flash Pages (e.g., SuperPage 30 consists of Page 30 1202, Page 30 1203, Page 30 1204 and Page 30 1205). Pages 1202, 1203, 1204 and 1205 are stored at the same address location on four different Flash Memory Dies in the same Flash Bank. Thus, SuperPage 30 is spread across four separate Dies. As is standard in flash memory systems, each Page represents the smallest increment of the flash memory that can be read from or written to.

As is shown in FIG. 12, each Page stores fifteen memory segments known as PSectors, designated as PSectors 0-14.

FIG. 12 also shows an additional memory structure: SPage Sector 0 1206. As is shown, SPage Sector 0 consists of four PSector 0s, one on each Page.

SPage Sector 0 corresponds generally to a classic mass storage sector, but is physically spread across four PSectors, each of which is stored at the same address of a different Die on the same Bank.

The currently preferred embodiment also makes use of an additional memory structure that is not shown in FIG. 12: SuperBlocks, which are made up of the same Block on each Bank in the Flash Group (e.g., Block 0 1201 is part of SuperBlock 0 of the Flash Group).

In the described embodiment, the data and metadata associated with a particular LBA is stored in a single SPage Sector (e.g., SPage Sector 1206), and is referred to herein as the Sector Contents, made up of the Sector Data and the Sector Metadata.

Figure 13:
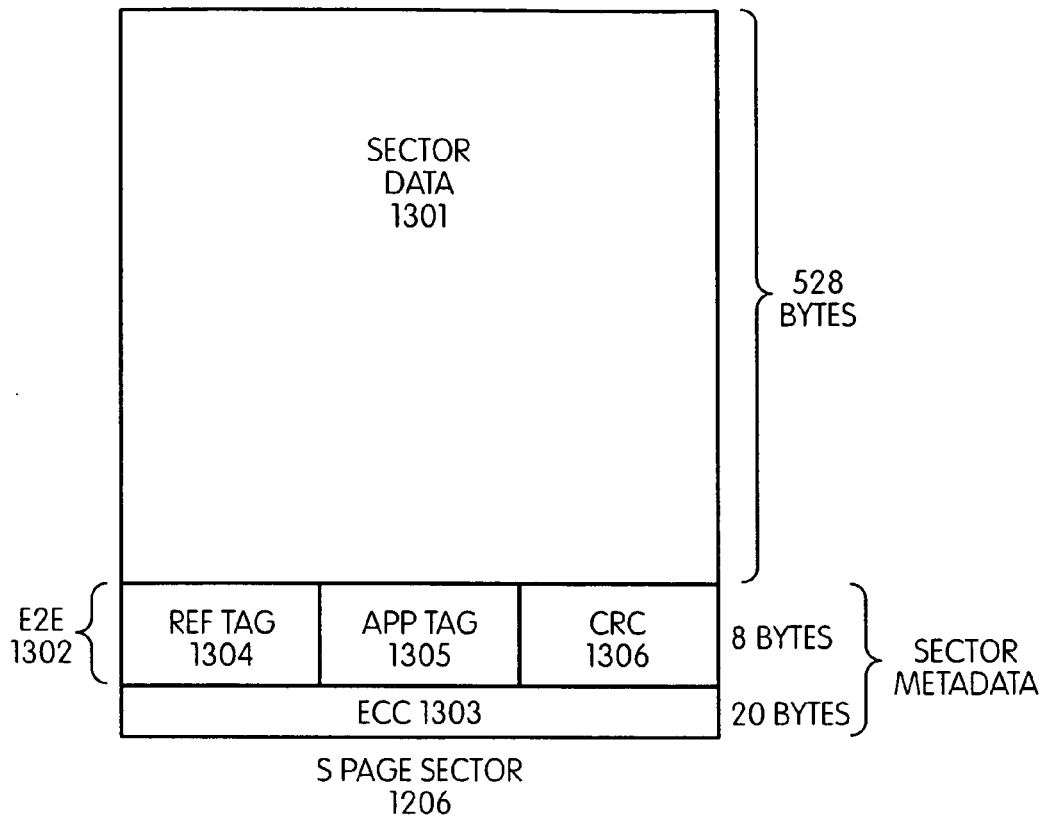
FIG. 13 illustrates the organization of an SPage sector.

FIG. 13 illustrates the organization of a SuperPage Sector, e.g., SPage Sector 1206. The entire SPage Sector consists of 556 bytes in flash memory. Each SPage Sector is divided into four PSectors, each consisting of 139 bytes, each on a different Flash Die.

In the example, shown, 528 bytes of SPage Sector 1206 is allocated to data, shown as Sector Data Field 1301. Different Host protocols associate differing amounts of data with a single address, so that, depending on the protocol used, Sector Data Field 1301 may be as small as 512 bytes.

As is shown in FIG. 13, in the currently preferred embodiment, each SPage Sector also includes 8 bytes of End-to-End ("E2E") information (Field 1302) and 20 bytes of ECC information (Field 1303). These Fields collectively constitute the Sector Metadata.

E2E information is specified by newer versions of the SCSI Protocol. This information can be used by Initiators to track data and insure that the data returned by a mass storage device matches the data requested. ECC information is used for error correction purposes.

E2E Field 1302 is further divided into RefTag Field 1304, AppTag Field 1305 and CRC Field 1306.

RefTag Field 1304 consists of four bytes and contains an address that may be associated by the Initiator with the Sector Data. RefTag support is not required by the SCSI Protocol (and was not part of earlier versions of the Protocol), so an Initiator may or may not use RefTags. If an Initiator does use RefTags, the value associated with RefTag Field 1304 is taken from the CDB that triggered the original write of the Sector Contents. Typically, this value is the same as the LBA, though the Initiator may assign a different RefTag. The Initiator may choose to have the RefTag value for each subsequent sector in the same write incremented, or to assign a single RefTag value for all sectors associated with a single write. If the incrementing option is chosen, SSD Controller 106 performs that operation, based on the initial RefTag value and the number of sectors received.

If the Initiator does not support the use of RefTags, SSD Controller 106 fills in RefTag Field 1304 with the LBA address. This field is used by SSD Controller 106 for internal error checking purposes whether or not the Initiator requests the use of RefTags.

The value stored in RefTag Field 1304 should match the RefTag value of any CDB that causes a subsequent read or write to any LBA assigned to this SPage Sector. (If no RefTag is assigned by the Initiator, the RefTag value should match the LBA based on the CDB.) If the two values do not match, this indicates some type of error, which may result from a mistake in the received RefTag, data corruption in RefTag Field 1304, or a problem in the address translation tables used by SSD Controller 106 to select SPage Sector 1206 as the appropriate target for the read or write. Such a condition, if detected, results in the issuance of an appropriate SCSI sense code to the Host, indicating a transaction failure (or other similar communication, depending on the protocol being used).

AppTag Field 1305 consists of two bytes, and is used for Initiator-specified information relating to the particular application that created the associated Sector Data. AppTag information is supported by the SCSI Protocol, but is not required. If this information is not supplied by the Initiator, AppTag Field 1305 is filled in with a default value chosen so that it will not overlap any valid AppTag value assigned by an Initiator that does support the use of AppTags.

As with the RefTag value, the AppTag information for data received from the flash memory can be checked against an AppTag supplied by the Initiator as part of a read command, with a mismatch indicating an error.

CRC Field 1306 consists of two bytes, and contains Cyclic Redundancy Check ("CRC") data that is used to check the integrity of the data and metadata stored in SPage Sector 1206. As with the RefTag and AppTag information, the CRC tag can be checked against a value received from the Initiator, to determine whether the data and metadata are correct.

The SCSI Protocol allows an Initiator to request checking of any or all of the three E2E values.

ECC Field 1303 contains Error Correcting Code ("ECC") information that can be used to correct errors in the LBA Data and Sector Metadata. ECC checking used in the preferred embodiment is described below in connection with FIG. 31.

Returning to FIG. 12, in the currently preferred embodiment, each Page (e.g., Page 1202) consists of 2212 bytes of flash memory space, and includes 15 PSectors, designated in each case as PSector 0-14, plus metadata (not shown).

In the currently preferred embodiment, each of the four PSectors that make up an SPage Sector stores one-quarter of the Sector Contents that are stored in that SPage Sector. That data is allocated among the PSectors on a byte-interleaved basis. Thus, the first byte of the first doubleword of the Sector Contents is written into the first byte of PSector 0 of Page 1202, the second byte of the first doubleword is written into the first byte of PSector 0 of Page 1203, the third byte of the first doubleword is written into the first byte of PSector 0 of Page 1204, the fourth byte of the first doubleword is written into the first byte of PSector 0 of Page 1205, the first byte of the second doubleword is written into the second byte of PSector 0 of Page 1202, etc.

As should be understood from this explanation, the Sector Contents stored in SPage Sector 0 are spread among the four PSectors 0. Thus, each of the four Pages stores one-quarter of the Sector Contents, or 139 bytes (556/4).

Figure 14:
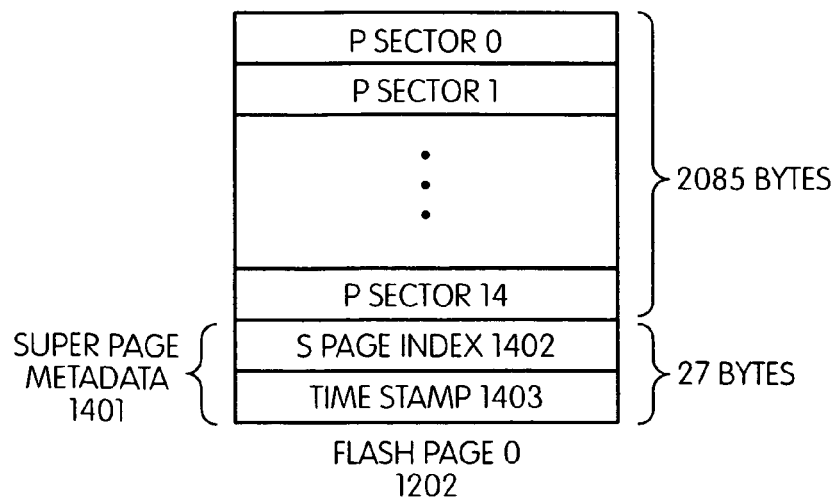
FIG. 14 illustrates the organization of a flash page.

FIG. 14 illustrates Flash Page 1202 in additional detail, showing elements that are not shown in FIG. 12. In a typical flash architecture, a flash page consists of 2048 bytes of data and/or metadata plus an additional 64 "spare" bytes used for other purposes, adding up to a total of 2212 bytes. In the currently preferred embodiment, on the other hand, although each Page consists of 2212 bytes, 2085 of those bytes are used for Sector Contents (15×139), and the extra 27 bytes store metadata associated with the SuperPage. FIG. 14 shows PSectors 0-14, consisting of 2085 bytes, and SuperPage Metadata 1401, which consists of 27 bytes per flash page. As with the PSectors, the SuperPage Metadata is spread across all four Flash Pages that make up a SuperPage, so that Super-Page Metadata Field 1401 stores one-quarter of the metadata associated with the SuperPage.

SuperPage Metadata 1401 consists of SPage Index 1402 and Time Stamp 1403. SPage Index 1402 stores an index into a table known as the "Forward Table," which contains physical location information for LBAs. The Forward Table is described below, in connection with FIG. 33.

Time Stamp 1403 contains a time stamp representing the time when the SuperPage was written.

The SPage Index and Time Stamp are written redundantly into each of the four Flash Pages that make up a SuperPage. The redundancy is necessary because this metadata is not protected by the ECC mechanisms that protect other information.

SuperPage Metadata 1401 is filled in by the Flash HEMi when the SuperPage is written. The Flash HEMi derives the SPage Index from the Page Request that initiates the write, and derives the Time Stamp information from an internal clock. The SuperPage Metadata is used for reconstructing open SuperBlocks following an unanticipated power loss. Power loss reconstruction is described below in connection with FIG. 58.

FIG. 15 illustrates the manner in which Sector Contents are organized among Blocks 0 and 1 of a Bank. As should be understood, the same organization would be followed for all remaining Blocks stored in the Bank.

Each SPage Sector stores the Sector Contents associated with a single LBA, and the SPage Sectors of a SuperPage store Sector Contents associated with fifteen contiguous LBAs. As is explained below, however, the fifteen contiguous LBAs associated with one SuperPage may have no relationship with the fifteen contiguous LBAs associated with the next SuperPage.

This organization is illustrated by identifying LBAs by letter. Thus, LBA(A) indicates a particular address, and LBA (A+14) indicates an LBA address that is fourteen higher than LBA (A) (e.g., if LBA(A) were LBA(0), then LBA (A+14) would be LBA(14). However, there is no relationship between LBA(A) and LBA(B), for example, other than that each will be evenly divisible by fifteen. Thus, LBA(A) might represent LBA(9,000), whereas LBA(B) might represent LBA(60).

Note that the LBAs stored in each SuperPage will change during operation. For example, at one point, SPage Sector 0 of SuperPage 1 of Block 0 might store the Sector Contents associated with LBA(0) (B=0), whereas at another point it might store the Sector Contents associated with LBA(900) (B=900). The manner in which the association of LBAs and SuperPages and Blocks changes in use is described below.

FIG. 16 illustrates the manner in which the Host address space is mapped onto Flash Memory Module 108 during initialization. As is described above, Hosts typically issue reads and writes using LBAs, which isolate the Host from the details of the physical memory organization.

In the currently preferred embodiment, each Flash Group is the same size, and each stores data corresponding to the same number of LBAs (or other Host addressing scheme). In the current embodiment, LBAs are distributed among the Flash Groups in sets that are multiples of 45, since, as is described below, 45 LBAs is the maximum number that can be handled by a single Transfer Request. The currently preferred embodiment uses a stripe size of 90 LBAs, so that LBAs 0-89 are assigned to Flash Group 0, 90-179 to Flash Group 1, 180-269 to Flash Group 2, etc., until the last Flash Group has been reached, at which point the LBA assignments loop back to Flash Group 0. A variety of other striping algorithms is possible. In an alternate embodiment, the user could be allowed to specify the stripe size, though it would be preferable for this to be done in multiples of the number of LBAs that can be handled by a Transfer Request.

FIG. 16 shows a simplified version of the flash memory space. This simplified version is made up of three Flash Groups, designated 0-2. In this simplified example, a Block consists of two SuperPages, designated as SP0 and SP1. Thus, Block 0, Bank 0 of Flash Group 0 consists of the data written into the slots designated 1601. As can be seen, in this simplified example, each Bank contains only a single Block.

As is described above, a SuperBlock consists of the same Block on each Bank. In the simplified architecture shown in FIG. 16, therefore, SuperBlock 0 of Flash Group 0 consists of Block 0 from each Bank, designated in FIG. 16 as 1602 (i.e., the entire Flash Group, in the simplified example).

As is described below, SuperPage 0 of Block 0 of each SuperBlock contains a data structure known as the SuperBlock Metadata Table. This is shown as "SMT" in SP0 of Bank 0 of each Flash Group.

All of the other boxes in the table represent LBA ranges stored in a particular SuperPage. Thus, Flash Group 0, Bank 1, SuperPage 0 contains LBAs 0-14, Flash Group 0, Bank 1, SuperPage 1 contains LBAs 300-314, etc.

As can be seen, the LBAs are assigned in "stripes" of 90 LBAs each. The first such stripe (LBAs 0-89) is assigned to Flash Group 0, SuperPage 0 on Banks 1-6. The next stripe of 90 LBAs (90-179) is assigned to Flash Group 1, SuperPage 0 on Banks 1-6. The next stripe (LBAs 180-269) is assigned to Flash Group 2, SuperPage 0, on Banks 1-6.

At this point, since the last Flash Group has been reached (in this simplified example), the next stripe is written to Flash Group 0, picking up where the previous stripe left off. Thus, LBAs 270-284 are written to Flash Group 0, SuperPage 0 of Bank 7. Since there are no further SuperPage 0s available in Flash Group 0, allocation of the stripe continues with SuperPage 1 of Bank 0 and continues through SuperPage 1 of Bank 4.

The allocation from this point is straightforward, except for boundary cases when the end of a SuperBlock is reached. For example, a new stripe begins with SuperPage 1 of Bank 5 of Flash Group 0. Since only three SuperPages are left in the SuperBlock, the stripe continues on SuperPage 1 of Bank 5 of Flash Group 1. In this way, LBAs are allocated to every SuperPage in each SuperBlock, despite the fact that the SuperBlocks do not hold an even number of stripes.

This method of allocating LBAs tends to maximize flash memory parallelism. Because each Flash Group operates independently, it is advantageous to stripe LBAs across Flash Groups, since this maximizes the likelihood that a single transaction will address data held on more than one Flash Group, thereby allowing multiple flash reads or writes relevant to the transaction to occur simultaneously. Because a Transfer Request can only address LBAs on a single Flash Group, it is sensible to specify stripe sizes in increments of 45 (the maximum number of LBAs that can be addressed by a Transfer Request), to minimize the number of Transfer Requests required for a transaction. In the current embodiment, a stripe is made up of two such 45-LBA increments, since this represents six SuperPages. As is described below, a Flash Group can handle five simultaneous write operations, on five separate Banks. Using a stripe size of 90 LBAs tends to maximize parallel usage of the flash interface, since a large transfer can execute five simultaneous writes on each Flash Port, and can execute on multiple Flash Ports in parallel. This organization therefore contributes to the ability of SSD Controller 106 to handle large Host-initiated reads or writes quickly, using a high degree of parallelism.

Thus, a hypothetical transfer involving LBAs 0-190 as shown in FIG. 16 could occur using one IOP and five Transfer Requests. A first Transfer Request could handle LBAs 0-44, a second Transfer Request could handle LBAs 45-89, a third Transfer Request could handle LBAs 90-134, a fourth Transfer Request could handle LBAs 135-179 and a fifth Transfer Request could handle LBAs 180-190. Note that this transfer involves three different Flash Groups, thereby allowing for a high degree of parallelism. In addition, since (as is explained below), Page Requests that target different Banks can operate in parallel even on the same Flash Group, the Page Requests issued by each Transfer Request in this example could also operate in parallel, since each Page Request targets a different Bank.

The allocation of LBAs to Flash Groups is permanent. The allocation to Banks within a Flash Group, however, may change over time. As is explained below, when a Host write is received for an LBA, thus requiring that the SuperPage containing that LBA be invalidated and the new data (and any non-overwritten old data from the SuperPage) be written to a new SuperPage, the Flash HEMi attempts to use a new SuperPage from the same Bank as the old SuperPage. Occasionally, however, this is not possible and the Flash HEMi will move the LBAs to a SuperPage on another Bank. This will tend to affect the performance of the flash memory system, since, if enough such alterations occur, stripes of data could be concentrated on a single or a relatively small number of Banks, therefore reducing the opportunity for parallel operations. However, in practice, the shifts from Bank to Bank tend to occur in a patternless fashion, so that even after significant operation the LBA groups in a given stripe tend to be spread across the Banks, so that a high degree of parallelism may be maintained.

III. Hardware Details

A. Host Interface.

Figure 17:
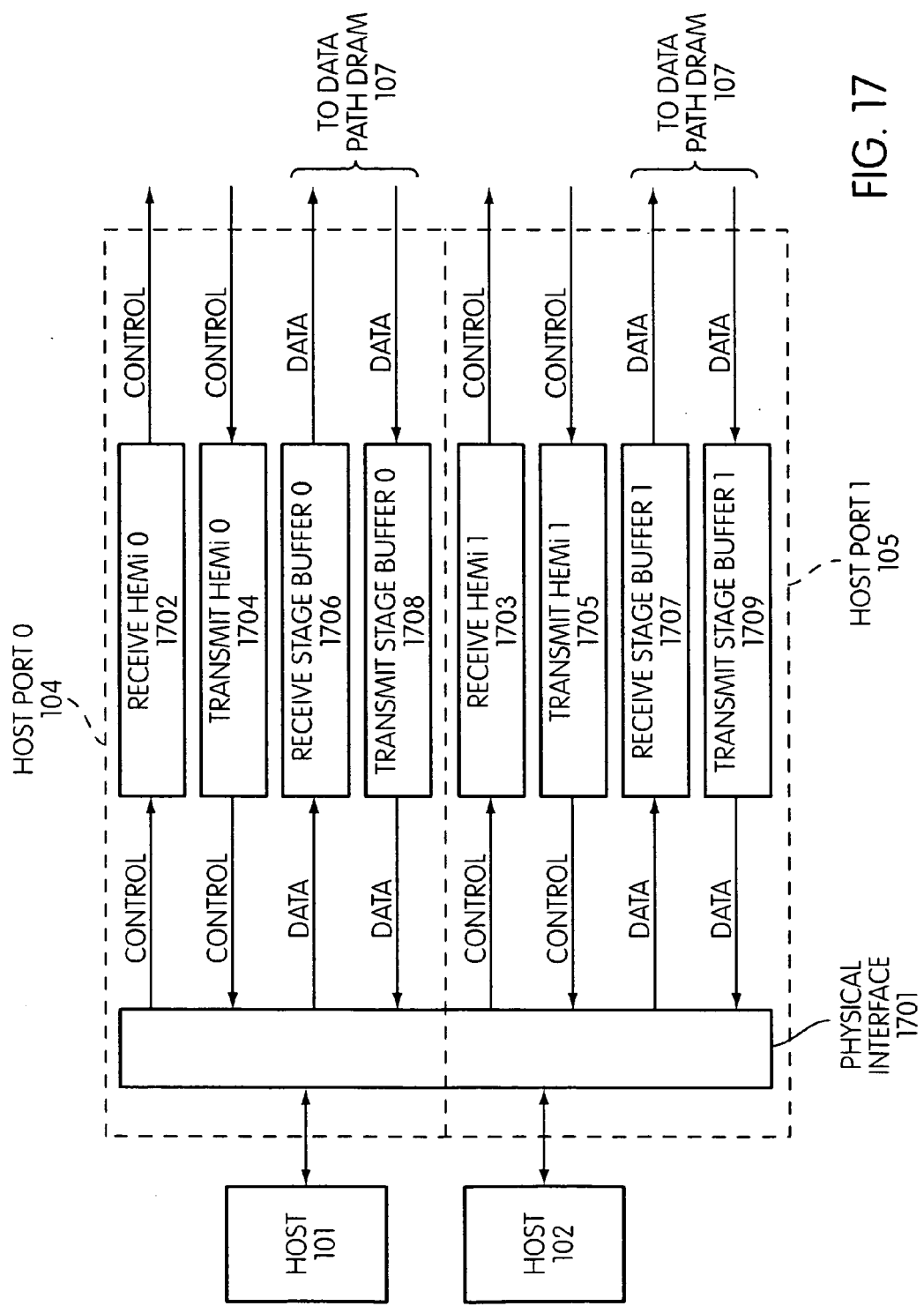
FIG. 17 illustrates data and control flow through host ports.

FIG. 17 shows Host Interface 310 in greater detail than is shown in FIG. 3. Host Interface 310 consists of Physical Interface 1701 and two separate Host Ports, designated as Host Port 0 104 and Host Port 1 105. Physical Interface 1701 is further described below, but for present purposes it is sufficient to understand that it routes signals between Hosts 101 and 102 and Host Ports 104 and 105. Each Host Port is capable of interfacing to a separate Host.

In general, Host Interface 310 performs the following functions on the receive side:
Receive frames
Deconstruct frames into constituent features
Pass command information on to the next stage
Pass data on to the Data Path DRAM In general, Host Interface 310 performs the following functions on the Transmit side:
Receive data from Data Path DRAM 107 and organize the data for transmission to the Host
Generate frames for transmission to the Host
Transmit frames, including data frames, to the Host
Each Host Port includes a Receive HEMi (1702 and 1703), a Transmit HEMi (1704, 1705), a Receive Stage Buffer (1706, 1707) and a Transmit Stage Buffer (1708, 1709).

As is shown, each Receive HEMi receives control information from one of the Hosts through Physical Interface 1701, and communicates control information to other elements of SSD Controller 106. "Control" information, in this context, means commands, control signals and addresses, but does not include data. Note that the control information received from the Host by each Receive HEMi may differ from the control information communicated by the Receive HEMi's.

Each Transmit HEMi receives control information from other SSD Controller elements and communicates control information to one of the Hosts through Physical Interface 1701. Again, the control information transmitted to a Host by a Transmit HEMi may differ from the control information received by the Transmit HEMi.

Each Receive Stage Buffer receives data from one of the Hosts through Physical Interface 1701 and transmits that data on to Data Path DRAM 107. The Receive Stage Buffers are 16 Kbytes, which allows them to accept up to 4 FC_AL ("Fibre Channel Arbitrated Loop") data frames.

Each Transmit Stage Buffer receives data from Data Path DRAM 107 and transmits that data on to one of the Hosts through Physical Interface 1701. The Transmit Buffers are 4 Kbytes, which allows them to store one outgoing frame and one incoming frame from Data Path DRAM 107.

Figure 18:
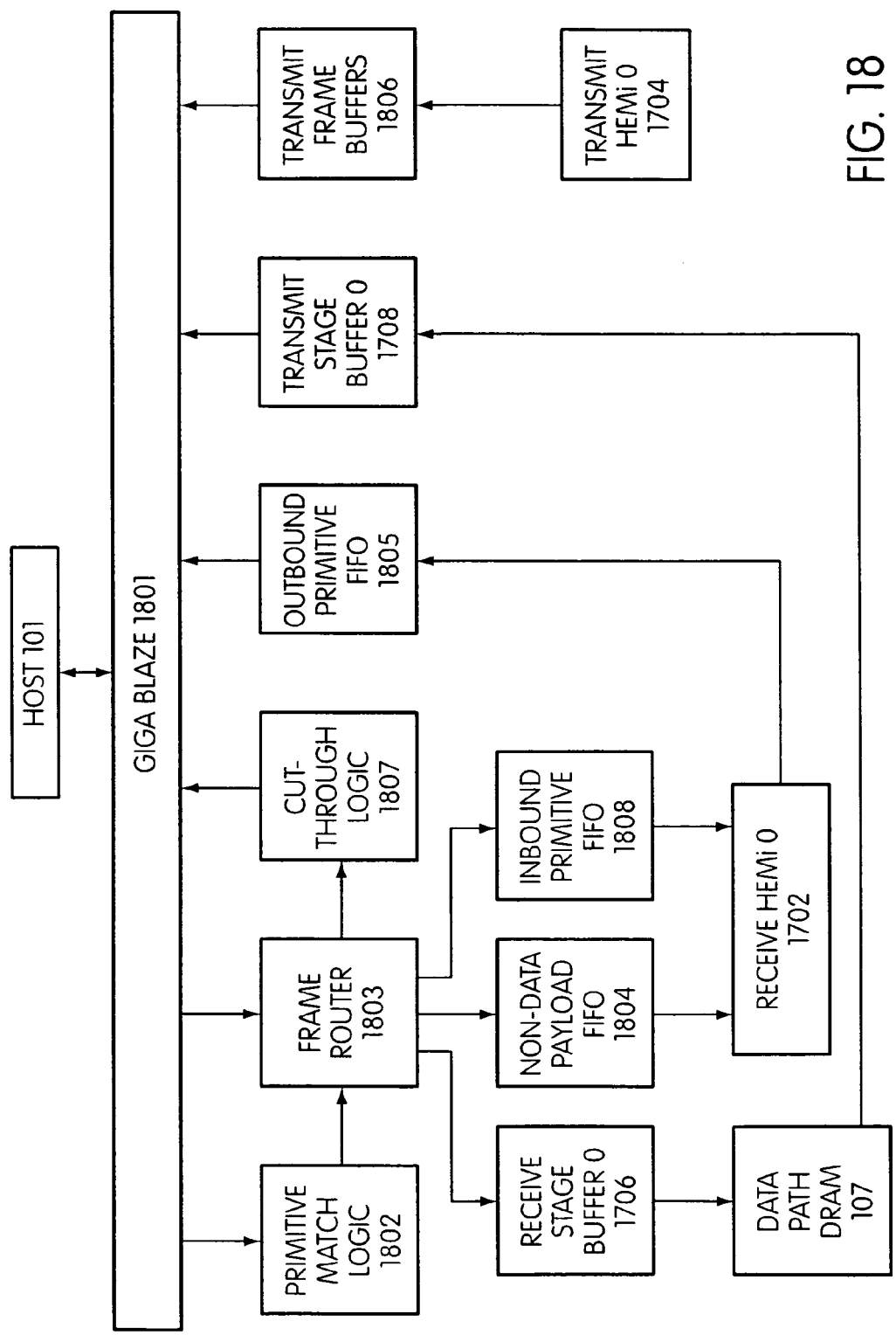
FIG. 18 illustrates a host port.

FIG. 18 shows certain additional details regarding Host Port 0 104. As is understood by those of ordinary skill in the art, communications between SSD Controller 106 and Host 101 are organized according to the dictates of the particular protocol used by the Host. In general, the relevant protocols (e.g., SAS, SATA, Fibre Channel) specify that communication to and from the Host take place using frames, which consist of defined groups of commands and data.

Since the precise frame format used differs among the various relevant protocols, SSD Controller 106 must be modified for each protocol. SSD Controller 106 has been designed, however, so that the modifications are minimal, amounting to different firmware for the Receive and Transmit HEMi's, and a different physical connector. All other aspects of SSD Controller 106 are unchanged for the various protocols. This is a significant advantage of the pipelined and modular design of SSD Controller 106, and also of the design of Host Interface 310.

Though the specific details of the frame organization differ from protocol to protocol, certain aspects of the SATA protocol will be used to illustrate the design and operation of Host Port 0 104. In this protocol, a frame consists of a Start of Frame ("SOF") primitive, a frame header (metadata specified by the protocol, but generally including information necessary to identify the payload and possibly the Initiator), a payload (e.g., data, command, etc.), a CRC value for validation of the entire frame, and an End of Frame ("EOF") primitive. The receive side of Host Port 0 104 is responsible for receiving the frame, dividing it into its constituent parts, and taking whatever action is needed to either route data to its intended destination and/or set up the transaction. The transmit side of the Host Port is responsible for receiving relevant data and command information from other elements of SSD Controller 106 and packaging that information into a frame for transmission to Host 101.

Direct communication with the Host is handled by GigaBlaze 1801, which is a transceiver core available from LSI Corporation, headquartered in Milpitas, Calif., under the designation 0.11 micron GigaBlaze® Gflx™ x1 Core. This core contains an 8b/10b encoder, a serializer/deserializer and a phy, which performs physical conversion between received bits and voltage levels. GigaBlaze 1801 has two serial ports capable of attaching to 3G SATA, 3G SAS, 4g FC_AL and 4G FC buses. The details of the internal operation of GigaBlaze 1801 are not relevant herein, except that it handles the physical interface to the Host. In the example shown, GigaBlaze 1801 is connected to Host 101. Note that, although FIG. 18 only shows one of the two Host Ports on SSD Controller 106, the other Host Port is identical, and contains its own GigaBlaze.

As is shown in FIG. 18, GigaBlaze 1801 is connected to Primitive Match Logic 1802. The Primitive Match Logic is designed to allow the same physical level protocol to interface with various different logical level protocols that handle frames and primitives differently. When GigaBlaze 1801 receives a primitive from Host 101, GigaBlaze 1801 routes that primitive to the Primitive Match Logic, which is described in detail below in connection with FIG. 19.

The Primitive Match Logic controls Frame Router 1803, which receives frames from GigaBlaze 1801 and routes portions of the frames under the control of the Primitive Match Logic. Data is routed to Receive Stage Buffer 0 1706, headers are routed to Non-Data Payload FIFO 1804 and primitives are routed to Inbound Primitive FIFO 1808.

Receive HEMi 0 1702 uses information in the Header and Primitive FIFO's to identify actions to be taken. Data routed to the Receive Stage Buffer is sent via DMA transfer to Data Path DRAM 107.

Receive HEMi 1702 generates primitives and routes them to Outbound Primitive FIFO 1805. These generated primitives include ACK (acknowledging correct receipt of a frame), NAK (indicating that a frame was not received correctly) and RRDY (reporting frame credit to an Initiator). Primitives on Outbound Primitive FIFO 1805 are inserted into transmissions to Host 101 immediately, and may be inserted in the middle of other transactions (e.g., an outbound data frame).

The transmit side of the Host Port shown in FIG. 18 is made up of Transmit HEMi 1704, Transmit Stage Buffer 0 1708 and Transmit Frame Buffers 1806. Transmit Stage Buffer 0 1708 contains data received from Data Path DRAM 107 that is to be transmitted to Host 101 as part of a frame responsive to a read command. Transmit Frame Buffers 1806 consist of one or more buffers that hold metadata used to construct frames. The Transmit Frame Buffers operate similarly to the receive-side buffers, though, as should be understood, they are used to construct frames, rather than to deconstruct them.

Cut-Through Logic 1807 helps interface SSD Controller 106 to Fibre Channel networks. If SSD Controller 106 is connected to a Fibre Channel network, Primitive Match Logic 1802 evaluates received primitives to determine if the primitives are intended for SSD Controller 106.

Primitives determined not to be intended for SSD Controller 106 are sent to Cut-Through Logic 1807. The Cut-Through Logic then passes the primitives to the GigaBlaze to be returned to the Fibre Channel network, for transmission on to the next node on the network.

The physical connectors required for the various different protocols (SAS, SATA and Fibre Channel) are incompatible. In the currently preferred embodiment, a different version of SSD Controller 106 will exist for each protocol. However, because the Primitive Match Logic operates correctly with each of the protocols (see below), the only difference required for each protocol is the use of a different physical connector, though different firmware may also be required for the Receive and Transmit HEMi's. In a different embodiment, SSD Controller 106 could incorporate three different physical connectors, one for each protocol, and thereby allow the same physical controller to be used with any of the protocols.

Figure 19:
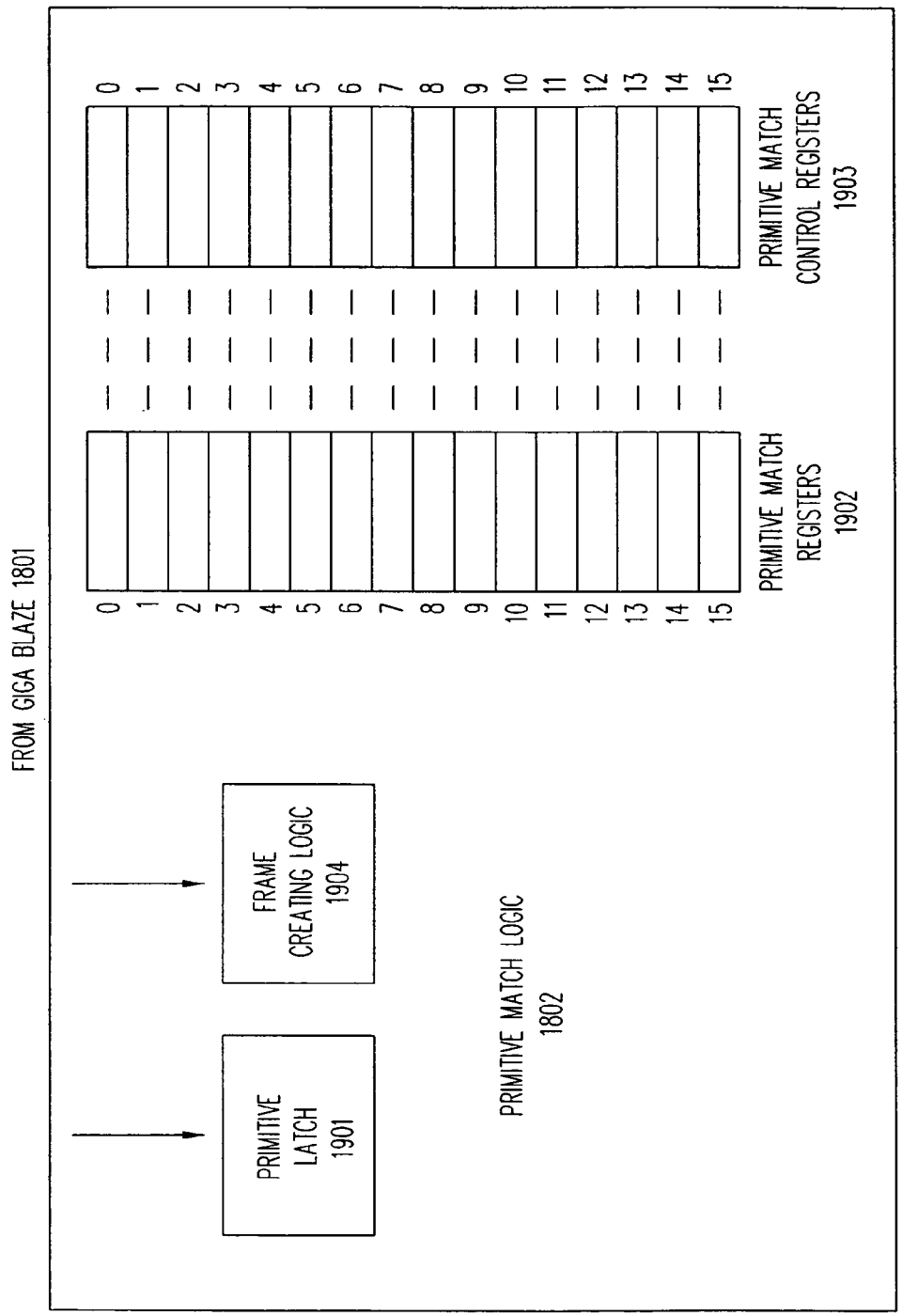
FIG. 19 illustrates primitive match logic.

Primitive Match Logic 1802 is shown in greater detail in FIG. 19. This logic includes a state machine that matches received primitives and identifies actions to be taken based on the matched primitive and on the current state.

Primitives received from a Host are transmitted from Gigablaze 1801 to Primitive Latch 1901. The primitives are then matched against the bit patterns contained in Primitive Match Registers 1902, which consists of sixteen registers. If no match is found, the value from Primitive Latch 1901 is routed directly onto Inbound Primitive FIFO 1808.

Primitive Match Control Registers 1903 consists of sixteen registers, one for each of the Primitive Match Registers. The Primitive Match Control Registers contain bits that indicate which bits in the associated Primitive Match Register must match the value in Primitive Latch 1901 in order for an overall match to be found. For example, these bits may require that the first byte match, with no requirement that any other bits match. These bits from the Primitive Match Control Registers therefore act as a mask, allowing multiple received primitives to match a single Primitive Match Register. This is useful in cases where the same action is to be taken for a class of received primitives, and is also useful in screening out portions of primitives that represent data rather than commands.

Other bits in Primitive Match Control Registers 1903 indicate actions to be taken if the value in the corresponding register in Primitive Match Registers 1902 matches Primitive Latch Register 1901. For example, these bits can control Frame Router 1803 so that some of the data following the primitive is moved into Non-Data Payload FIFO 1804 and data following that is moved into Receive Stage Buffer 1706. This would generally occur in the case of an SOF primitive received in connection with a data frame.

The Primitive Match Control Registers operate as a state machine. For example, certain bits can set a counter (not shown) that can cause a certain number of subsequent primitives to be operated on by the current Control Register, rather than a Control Register chosen through the Primitive Match Registers. In addition, the Primitive Match Control Registers can alter the values contained in various other registers that are not shown.

As should be understood, Primitive Match Logic 1802 contains logic that performs comparisons between the value in Primitive Latch 1901 and Primitive Match Registers 1902, and that implements the control functions required by Primitive Match Control Registers 1903.

As is explained below in connection with FIG. 28, Primitive Match Registers 1902 and Primitive Match Control Registers 1903 are loaded by the associated Receive HEMi, using data overlays. These overlays are used to customize Primitive Match Logic 1802 for different protocols (e.g., SAS, SATA), since each protocol has its own set of primitives. In addition, overlays can be used to handle different sets of primitives, or different states, within a single protocol. The values used by the Receive HEMi to load the Primitive Match and Primitive Match Control Registers are taken from an initialization firmware code load. Thus, in many cases it will be possible to update Primitive Match Logic 1802 for new protocols or modifications to existing protocols by a modification to the Receive HEMi firmware, without any alteration to the hardware.

The use of different overlays in the primitive match logic thus allows SSD Controller 106 to respond to different protocols without requiring individualized logic for each protocol.

Primitive Match Logic 1802 also contains Frame Cracking Logic 1904. This logic block receives the initial dword in a frame and evaluates that dword to determine the nature of the frame (e.g., data, command). Based on the type of frame, the Frame Cracking Logic routes the frame appropriately. For example, if the frame is a command frame, the Frame Cracking Logic routes the entire frame to Non-Data Payload FIFO 1804, whereas if the frame is a data frame, the Frame Cracking Logic routes the header portion to the Non-Data Payload FIFO, and routes the data portion to the appropriate Receive Stage Buffer.

As is described above, the Primitive Match Logic is advantageous in that it allows SSD Controller 106 to handle different protocols, involving different frame encodings, without the need for software or significant hardware changes. In addition, by routing data to a specialized data FIFO, contained in the Receive Stage Buffers, while metadata and command information are routed to different FIFOs (e.g., Non-Data Payload FIFO 1804 and Inbound Primitive FIFO 1808), the Receive Host Port design allows for more efficient transfers of data, since the data FIFO contains only data and does not contain commands or metadata, and allows data to be transferred to the Data Path DRAM via DMA transfers in parallel with Receive HEMi operations on header and primitive metadata, thereby increasing overall system performance.

As is described above, SSD Controller 106 can be used for a variety of different protocols, requiring only a modification to HEMi firmware and a different physical connector. The protocols described above are all relatively similar. SSD Controller 106 can also be adapted easily for protocols with significant differences from those described above. In one embodiment, for example, SSD Controller 106 can be adapted for use with lane-oriented protocols such as PCI Express. As is understood by those of skill in the art, in PCI Express systems, external devices transmit and receive data and metadata using "lanes," each of which carries a portion of the transmission, with doublewords of data striped across the lanes. The number of lanes is implementation-dependent, but SSD Controller could be adapted for use with a 4-lane PCI Express system by adding two additional GigaBlazes (as should be understood, each GigaBlaze would be a version designed for the PCI Express interface), two additional Receive HEMi's and two additional Transmit HEMi's. One GigaBlaze, one Receive HEMi and one Transmit HEMi would be devoted to each lane. In this embodiment, SCSI HEMi 2001 (see below) is not used. That HEMi can instead be used as an additional RdWr HEMi.

In this embodiment, a device driver operating on the external Host is responsible for formatting PCI Express transmissions into IOPs. Most of the Host Port logic is therefore unnecessary (e.g., Primitive Match, various FIFO's, etc.). The Receive and Transmit HEMi's are responsible for destriping and restriping the data, respectively. Once a received IOP has been destriped, it can then be handed directly to a RdWr HEMi (see below). Processing then proceeds as per the other protocols described above.

Although use of SSD Controller 106 with a lane-oriented protocol such as PCI Express requires some additional modifications, these modifications are relatively minor, and easily accommodated as a result of the Controller's modular design. Addition and subtraction of HEMi's is relatively simple, and because different stages of the Controller pipeline operate independently, changes at one stage (e.g., the Host Port), do not require changes at other stages (e.g., the Flash Ports).

SSD Controller 106 can similarly be designed for use with the iSCSI protocol, though this requires addition of one or more TCP/IP stacks to the Host Port, with the Receive HEMi(s) responsible for extracting CDBs from that stack, and Transmit HEMi(s) responsible for encoding frame information as required by the TCP/IP protocol.

B. Command Parser.

Figure 20:
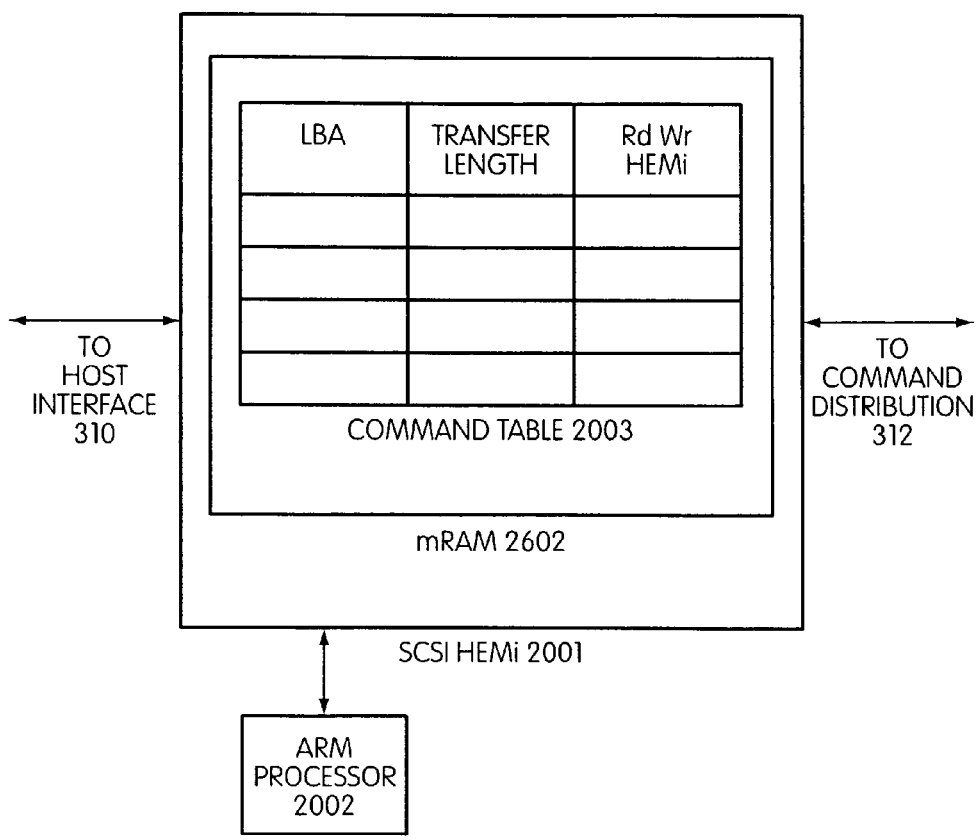
FIG. 20 illustrates a command parser block.

FIG. 20 shows additional detail about Command Parser Block 311 from FIG. 3. As is described in connection with FIG. 3, Command Parser Block 311 communicates with Host Interface 310 and with Command Distribution Block 312.

Command Parser Block 311 includes SCSI HEMi 2001. SCSI HEMi 2001 receives Host commands from Receive HEMi's 1702 and 1703. SCSI HEMi 2001 determines if the Host command is a read/write, or some other type of command. If the command is other than a read/write command, SCSI HEMi 2001 hands the command off to ARM Processor 2002, which handles non-read/write commands. ARM Processor 2002 is further described below.

If SCSI HEMi 2001 determines that the command is a read/write command, it validates the command to insure coherency, meaning that, if the read or write command relates to the same data as a read or write command that is currently being processed by Command Distribution Block 312, the second command is deferred until certain processing of the first command is completed.

Read/write coherency is not required by the SCSI protocol, which allows for reads and writes to be reordered. However, as is described below, SSD Controller 106 breaks Host-initiated commands into multiple suboperations, and these suboperations may be handled out of order.

If SSD Controller 106 were to allow more than one command to operate on the same data at the same time, it is possible that portions of the second command would be carried out before the first command had completed. For example, if SSD Controller 106 were to receive a write command for a particular block of LBAs and subsequently were to receive a read command for an overlapping block of LBAs, and if the read command were allowed to begin operation before the write command had finished, it is possible that the read command might result in the return of some data that had already been updated by the write command, and some data that had not been updated.

For this reason, SSD Controller 106 keeps track of currently active commands in two locations: in SCSI HEMi 2001 and in the Flash HEMi's (described below).

SCSI HEMi Command Table 2003, which is stored in an internal memory of the HEMi known as its mRAM (see below in connection with FIG. 26), contains the LBA and transfer length of every Host read and write command that has been sent by SCSI HEMi 2001 to Command Distribution Block 312 but has not yet been sent on to the Flash HEMi's.

As is described below, the Command Distribution Block contains several HEMi's known as RdWr HEMi's. Command Table 2003 contains the identification of the RdWr HEMi working on each command. SCSI HEMi 2001 uses this information to balance out the workload among the RdWr HEMi's, sending new commands to RdWr HEMi's with relatively fewer currently active commands When a new command is received, SCSI HEMi 2001 checks Command Table 2003 to determine if any of the LBA addresses affected by that command are already present. If a match is found, SCSI HEMi 2001 stalls execution of the new command until the previous command is removed from the Table. Commands are removed from Command Table 2003 once the RdWr HEMi to which the command has been dispatched reports that it has created and dispatched all necessary Transfer Requests corresponding to the command (the process by which RdWr HEMi's dispatch such Transfer Requests is described below). At that point, the new command is no longer stalled. As should be understood, at this point the earlier command is still executing, but that command is now subject to coherency checking at the Flash HEMi level (described below).

Thus, SSD Controller 106 enforces read/write coherency at two points in the pipelined execution of a Host command: SCSI HEMi 2001 stalls a new command that conflicts with an existing command's LBA range until the existing command has been sent to the Flash HEMi's, and each Flash HEMi enforces coherency on its own operations, so that it stalls execution of a new command covering the same range as an existing command until the existing command is complete.

This two-stage system of coherency enforcement is advantageous, since it allows processing of conflicting commands to proceed as long as they are at different stages in the pipeline. Thus, the RdWr HEMi's can be setting up a second conflicting command at the same time as the first conflicting command is operating in the flash memories, thereby improving overall system performance.

As is described above, Command Parser Block 311 also contains ARM Processor 2002, which controls certain internal administrative operations and is responsible for handling host-initiated commands other than reads or writes. In the currently preferred embodiment, ARM Processor 2002 is an ARM7TDMi-s available from ARM Holdings plc of Cambridge, UK. As should be understood, however, the functions of ARM Processor 2002 can be handled by a variety of logic devices.

Although the exact nature of Host commands handled by ARM Processor 2002 is protocol-dependent, in one embodiment, these commands include the following:

Test Unit Ready
Read Capacity
Mode Select
Mode Sense
Log Select
Log Sense
Report Luns
Send Diagnostic
Request Sense
Write Buffer
Read Buffer C. Command Distribution.

Figure 21:
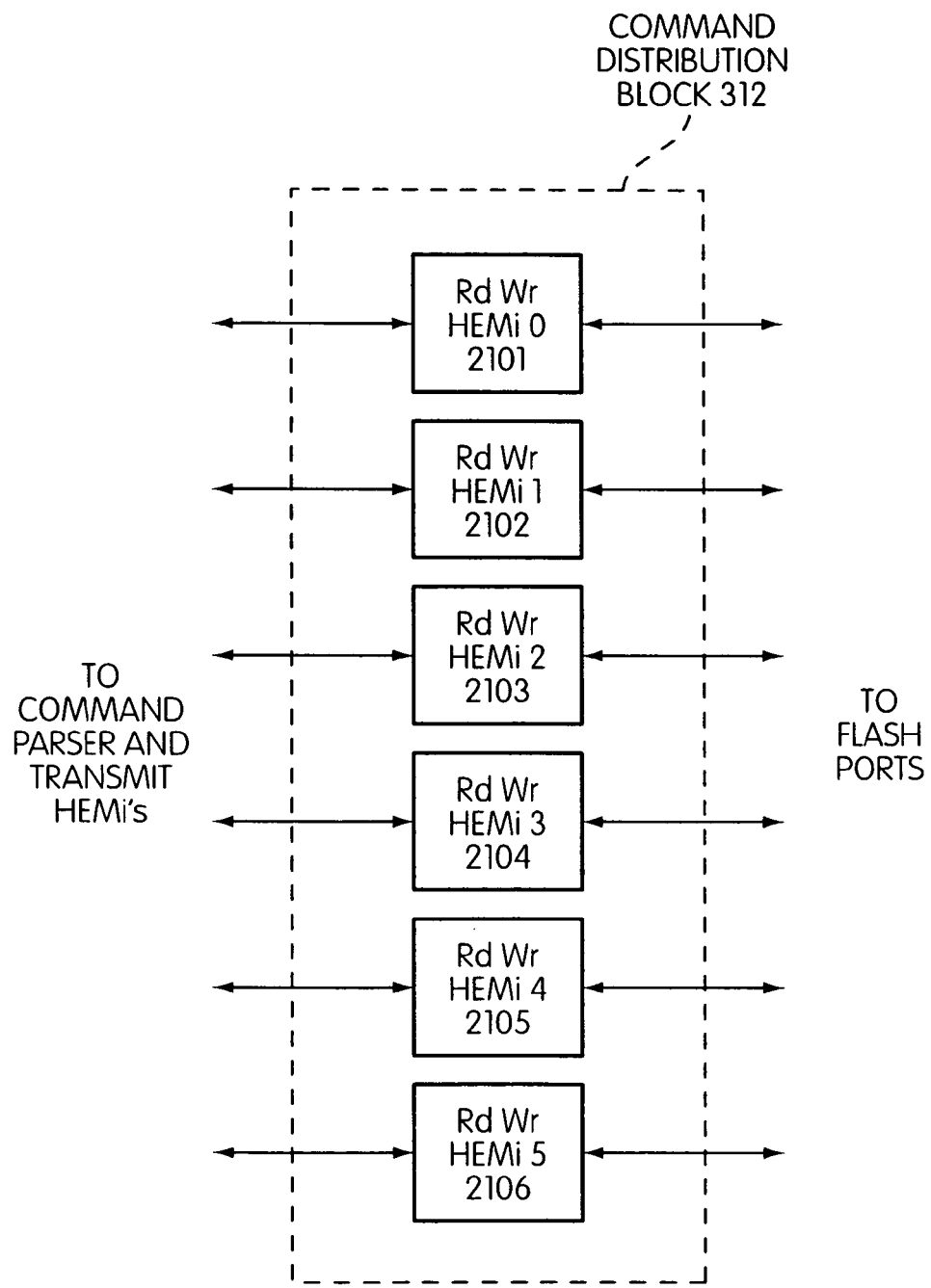
FIG. 21 illustrates a command distribution block.

FIG. 21 illustrates Command Distribution Block 312 in greater detail. As is shown, Command Distribution Block 312 constitutes a group of RdWr HEMi's, designated as 2101-2106. In the currently preferred embodiment, Command Distribution Block 312 consists of six RdWr HEMi's. However, because of the modular design of SSD Controller 106, the number of RdWr HEMi's can be increased or decreased without requiring any significant redesign of the rest of the Controller. A larger number of RdWr HEMi's increases performance, but at the cost of greater expense and complexity.

As FIG. 21 shows, SCSI HEMi 2001 passes information to each of the RdWr HEMi's. In general, this consists of CDBinfos, which SCSI HEMi 2001 allocates to a particular RdWr HEMi based on the relative workload of that HEMi compared to the other RdWr HEMi's.

The RdWr HEMi's generate IOPs based on the CDBinfos, then generate Transfer Requests as required by the IOPs, and transmit those Transfer Requests to a particular Flash Port based on the flash address of the data to be transferred. RdWr HEMi's also communicate with Transmit HEMi's; in the case of Host writes, the responsible RdWr HEMi sends a communication to the Transmit HEMi indicating that the Transmit HEMi should inform the Host that the Controller is ready for the data associated with the write.

D. Crossbar; Shared RAM; DRAM.

Figure 22:
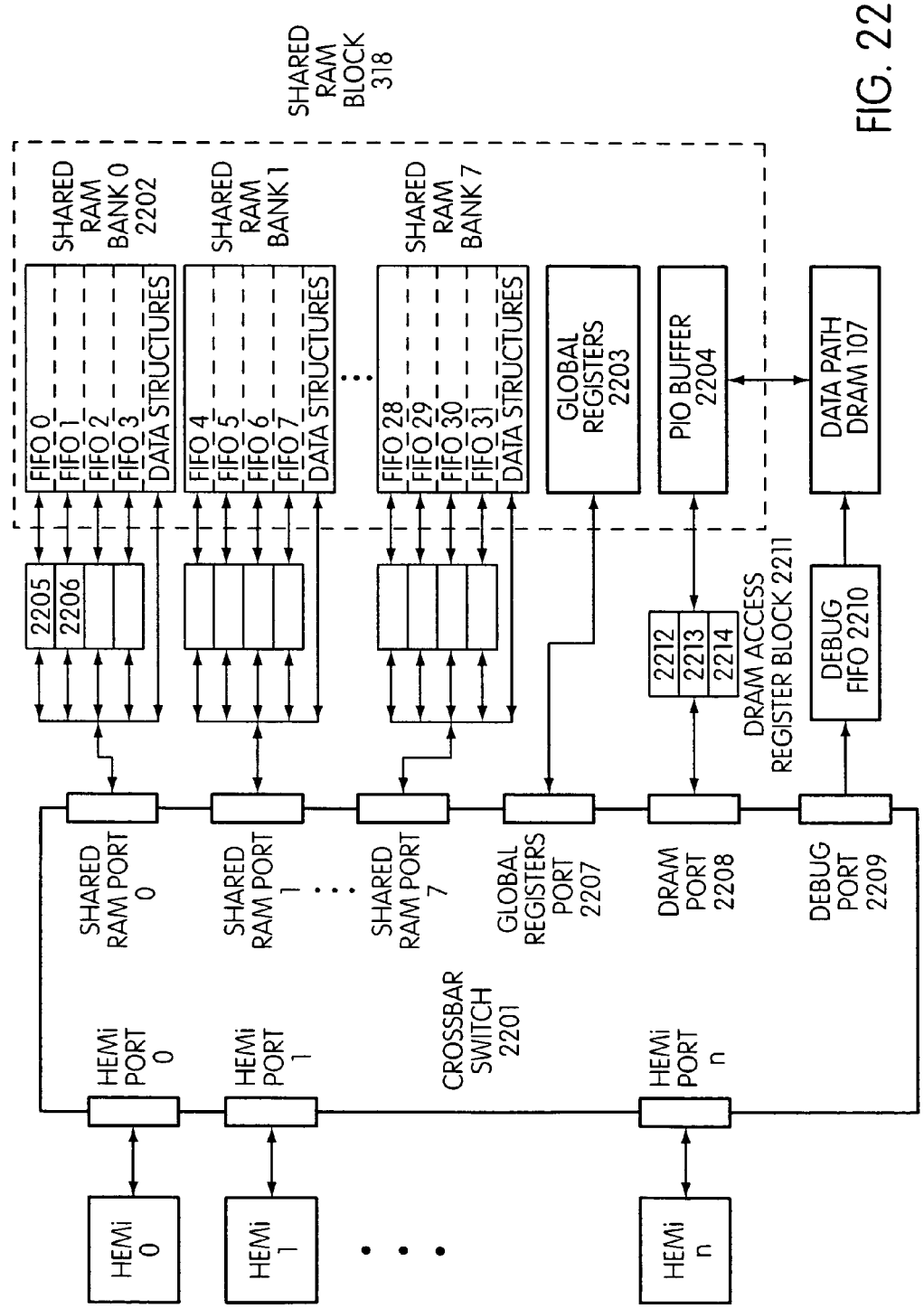
FIG. 22 illustrates connections between HEMi's and shared RAM data structures through a crossbar switch.

Preceding Figures have illustrated the interconnections between functional blocks in terms of data and control flow and have not attempted to show physical connections. FIG. 22 illustrates the manner in which many of the functional blocks of SSD Controller 106 are physically interconnected in the current embodiment.

FIG. 22 shows Crossbar Switch 2201. As is commonly understood by those of ordinary skill in the art, a crossbar switch operates so as to connect any element on one side of the switch with any element on the other side of the switch. Crossbar Switch 2201 connects elements on its HEMi side with elements on its Shared RAM side, in a manner that will be explained below.

The HEMi side of Crossbar Switch 2201 has two-way connections to each of the HEMi's contained in SSD Controller 106. (The HEMi's shown in FIG. 22 are actually a combination of the HEMi and tightly coupled logic that is associated with each HEMi, logic that is further described elsewhere herein).

As is described elsewhere herein, the number of HEMi's may differ depending on implementation decisions (e.g., the Controller may include between eight and twelve Flash HEMi's).

In the current embodiment, the Shared RAM Side of Crossbar Switch 2201 is connected to ten RAM banks, designated as Shared RAM Bank 0 (2202) through Shared RAM Bank 7, Global Registers 2203 and PIO Buffer 2204 and collectively designated as Shared RAM Block 318. In the currently preferred embodiment, each Shared RAM Bank consists of 4 Kbytes of RAM storage space. Crossbar Switch 2201 is designed to connect to a larger number of Shared RAM Banks, therefore supporting modular expandability, as is explained below.

All ten of the Shared RAM Banks share an address space, though, as is explained above, certain of these Banks have a specialized function.

As is shown in FIG. 22, CrossBar Switch 2201 includes a Port for each of the Shared RAM Banks. Each Shared RAM Bank includes four FIFO's and a Data Structures section, and each of the FIFO's is controlled by an associated FIFO Register Block (e.g., Register Block 2205 controls FIFO 0, Block 2206 controls FIFO 1, etc.)

As is illustrated by the arrows connecting Shared RAM Port 0 with Shared RAM Bank 0, Shared RAM Port 0 is the only input or output path to FIFO's 0-3 or the Data Structures section of Shared RAM Bank 0, with the path to and from the FIFO's proceeding through the associated Registers. As is explained below, reads or writes to the FIFO's take place through the associated Register Block, whereas reads or writes to the Data Structures section access that section without going through the associated Registers.

In the currently preferred embodiment, only 27 of the FIFO's are actually used (23 for HEMi Worklists, four for freelists). The other five are available for expanding the number of HEMi's supported by the system.

Crossbar Switch 2201 Global Registers Port 2207 is connected to Global Registers 2203, which consists of a RAM bank made up of registers that perform a variety of functions, including controlling GigaBlaze 1801 and setting up DRAM Controller 2305 (described below in connection with FIG. 23).

Crossbar Switch DRAM Port 2208 is connected to PIO ("Programmed IO") DRAM Buffer 2204, which in turn is connected to Data Path DRAM 107. PIO DRAM Buffer 2204 is a 64-doubleword FIFO contained in a bank in Shared RAM, which is used to buffer communications between the HEMi's and the Data Path DRAM. Such buffering is needed because the Data Path DRAM runs at a higher clock speed and is capable of reading and writing four doublewords at a time, whereas the HEMi's are only capable of reading and writing a single doubleword at a time. In order to avoid slowing Data Path DRAM operations, PIO DRAM Buffer 2204 buffers data transfers to and from the DRAM. When the HEMi's are writing data to the Data Path DRAM, PIO DRAM Buffer 2204 stores the data, a doubleword at a time, until the write is complete or the buffer is full, at which point it bursts the data to the Data Path DRAM. When the HEMi's are reading data from the Data Path DRAM, PIO DRAM Buffer 2204 stores four doublewords of data from the Data Path DRAM at a time, and once all of the necessary data is available (or the PIO Buffer is full) the HEMi's read that data in a burst a doubleword at a time. Again, as should be understood, data is actually transferred between the DRAM and one of a number of buffers.

Note that the connection from Crossbar Switch 2201 to PIO Buffer 2204 is not used for data transfers between the Data Path DRAM and the Flash Port Stage Buffers or the Host Interface Transmit and Receive Stage Buffers, but is instead used only for communication with the HEMi's. Transfers to and from the various Stage Buffers do not travel through Crossbar Switch 2201

Crossbar Switch Debug Port 2209 is connected to Debug FIFO 2210. Debug FIFO 2210 is a large SRAM bank that acts as a FIFO for debug information from the HEMi's. Debug FIFO 2210 accepts information from the HEMi's a doubleword at a time, and stores that information in a FIFO structure that is 4 doublewords wide. Once Debug FIFO 2210 reaches a set capacity threshold, it arbitrates for access to a DRAM port, and, once it has gained such access, it burst writes the debug information into DRAM 107, 4 doublewords at a time.

As is customary with crossbar switches, Crossbar Switch 2201 can simultaneously connect multiple elements from the HEMi side with multiple elements on the Shared RAM side, limited only by the number of Ports on each side.

Crossbar Switch 2201 is capable of connecting each HEMi to each Shared RAM Bank, as well as the other resources on the Shared RAM side of the switch. As should be understood, however, the switch does not connect HEMi's directly to each other, nor does it connect Shared RAM Banks directly to each other. Communication between HEMi's is accomplished indirectly, by using Crossbar Switch 2201 to leave information in the Shared RAM Banks.

Thus, when (as is described below), SCSI HEMi 2001 generates an IOP as a result of a received CDB, and passes that IOP to a RdWr HEMi, this is handled by SCSI HEMi 2001 storing a pointer to the IOP location in a worklist for the RdWr HEMi, the worklist also being stored in one of the Shared RAM Bank FIFOs. The RdWr HEMi then receives the IOP by checking the worklist, identifying the location containing the IOP, and copying the IOP from that location into its own internal memory. Communication among other HEMi's proceeds in a similar fashion. The details of the data structures contained in the Shared RAM Banks, and the manner in which the HEMi's use those data structures to transfer information, are described below.

DRAM Access Register Block 2211 controls accesses to Data Path DRAM 107. As is explained above, HEMi's do not directly access Data Path DRAM 107, but instead use PIO Buffer 2204 for this purpose. These are DMA transfers, which require the HEMi to supply only the starting address and the size of the transfer.

Address Register 2212 stores the starting location in the Data Path DRAM for the transfer. Transfer Count Register

2213 stores the number of transfers required. Data Register 2214 stores the data to be sent to PIO Buffer 2204, or received from the PIO Buffer.

A read from Data Path DRAM 107 begins by the HEMi placing the DRAM address in Register 2212 and placing the size of the transfer (in quad-doublewords) into Transfer Count Register 2213. Those actions cause DRAM DMA Engine 2302 (see below) to transfer data, in four doubleword chunks, into PIO Buffer 2204. As each transfer takes place, the DRAM DMA Engine decrements Transfer Count Register 2213, and the DMA transfer ends when Transfer Count Register 2213 reaches zero.

After the DMA transfer completes, the data is automatically read from the PIO Buffer to Data Register 2214, in doubleword increments.

A write from the HEMi to Data Path DRAM 107 operates similarly.

Note that Address Register 2212 increments each time Transfer Count Register 2213 decrements. This is not necessary for the transfer currently taking place, since the DRAM DMA Engine only requires the initial address plus the transfer count. However, incrementing Address Register 2212 results in the ending address for the transfer being held in that Register once the transfer is complete, and this may be useful in setting up future transfers.

Figure 23:
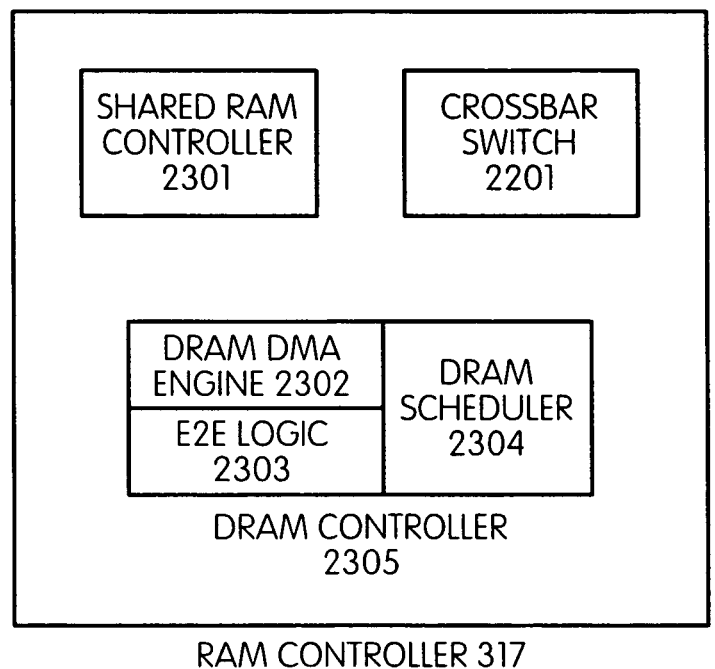
FIG. 23 illustrates a RAM controller.

RAM Controller 317 is illustrated in FIG. 23. In general, the RAM Controller controls and arbitrates access to Shared RAM Block 318 and Data Path DRAM 107.

RAM Controller 317 includes the following logic blocks (as should be understood, and as is true of other hardware diagrams herein, the illustration in FIG. 23 is conceptual in nature and is not intended to convey details of the actual physical layout):

Shared RAM Controller 2301.

Crossbar Switch 2201.

DRAM Controller 2305, consisting of logic purchased from Denali Software, Inc. of Palo Alto, Calif., that manages the physical interface into Data Path DRAM 107.

DRAM Controller 2305 includes DRAM DMA Engine 2302. DMA Engine 2302 handles DMA transfers between Data Path DRAM 107 and the various Buffers that communicate with the DRAM (e.g., Receive Buffer 1706, Transmit Buffer 1708, Flash Stage Buffer 308, PIO Buffer 2204, Debug FIFO 2210). DMA Engine 2302 receives from a HEMi the starting address and transfer count of a DMA transfer and controls the transfer from there, with no requirement of additional information from the HEMi.

E2E Logic 2303 performs three types of tasks relating to E2E tags, which are described above, in connection with FIG. 13: (a) attaching E2E tags to each sector of data that is being sent to the flash; (b) checking tag values against expected values and generating an error condition if the values don't match, and (c) stripping E2E tags from data that is being transmitted back to the Host, if the Initiator does not use these values (and therefore does not expect them).

The E2E tags attached to each sector of data are RefTag 1304, AppTag 1305 and CRC 1306. As is explained above, for data received from Initiators that support E2E, these values are taken from, or calculated based on, information received from the Initiator, and for data received from Initiators that do not support E2E, these values are generated internally.

E2E Logic 2303 is capable of checking RefTag, AppTag or CRC values. These checks are described above in connection with FIG. 13. E2E Logic 2303 performs these checks whenever data is transferred between Data Path DRAM 107 and a Flash Stage Buffer, or transferred between Data Path DRAM 107 and a Receive Buffer or Transmit Buffer. The Initiator specifies which of these fields are to be checked, unless the Initiator does not support E2E. If the Initiator does not support E2E, the checks performed are based on parameters selected by the user at initialization. Note that the RefTag value is always checked for internal error-checking purposes, even if the Initiator does not support E2E and the user does not ask for this check to be done.

E2E Logic 2303 attaches E2E tags to each sector of data that passes from Data Path DRAM 107 to the Flash Stage Buffers. As is explained above, in connection with FIG. 13, the RefTag information is taken from information supplied by the Initiator, if the Initiator supports E2E. The Initiator can require that the RefTag be incremented for each sector of data, in which event E2E Logic 2303 performs the increment operation prior to attaching the RefTag. If the Initiator does not support E2E, E2E Logic 2303 inserts the LBA into RefTag Field 1304. If the Initiator supports E2E, the AppTag and CRC fields are filled in with information supplied by the Initiator. If the Initiator does not support E2E, the AppTag is filled in with a default value, and the CRC field is either filled in with a default value or with an internally calculated CRC value, depending on an option chosen by the user at the time of initialization.

DRAM Scheduler 2304 consists of an ordered list of every channel that can access Data Path DRAM 107. These channels are described below in connection with FIG. 25. Since the DRAM only has a single input/output port, only one channel can access it at a time. DRAM Scheduler 2304 rotates through each channel, checking whether that channel requires access to the DRAM, and, if so, allowing that channel to connect to the DRAM port. Once that access has completed, DRAM Scheduler 2304 moves to the next channel in the list. In this way, DRAM Scheduler 2304 arbitrates accesses to the DRAM port in a round-robin fashion.

Figure 24:
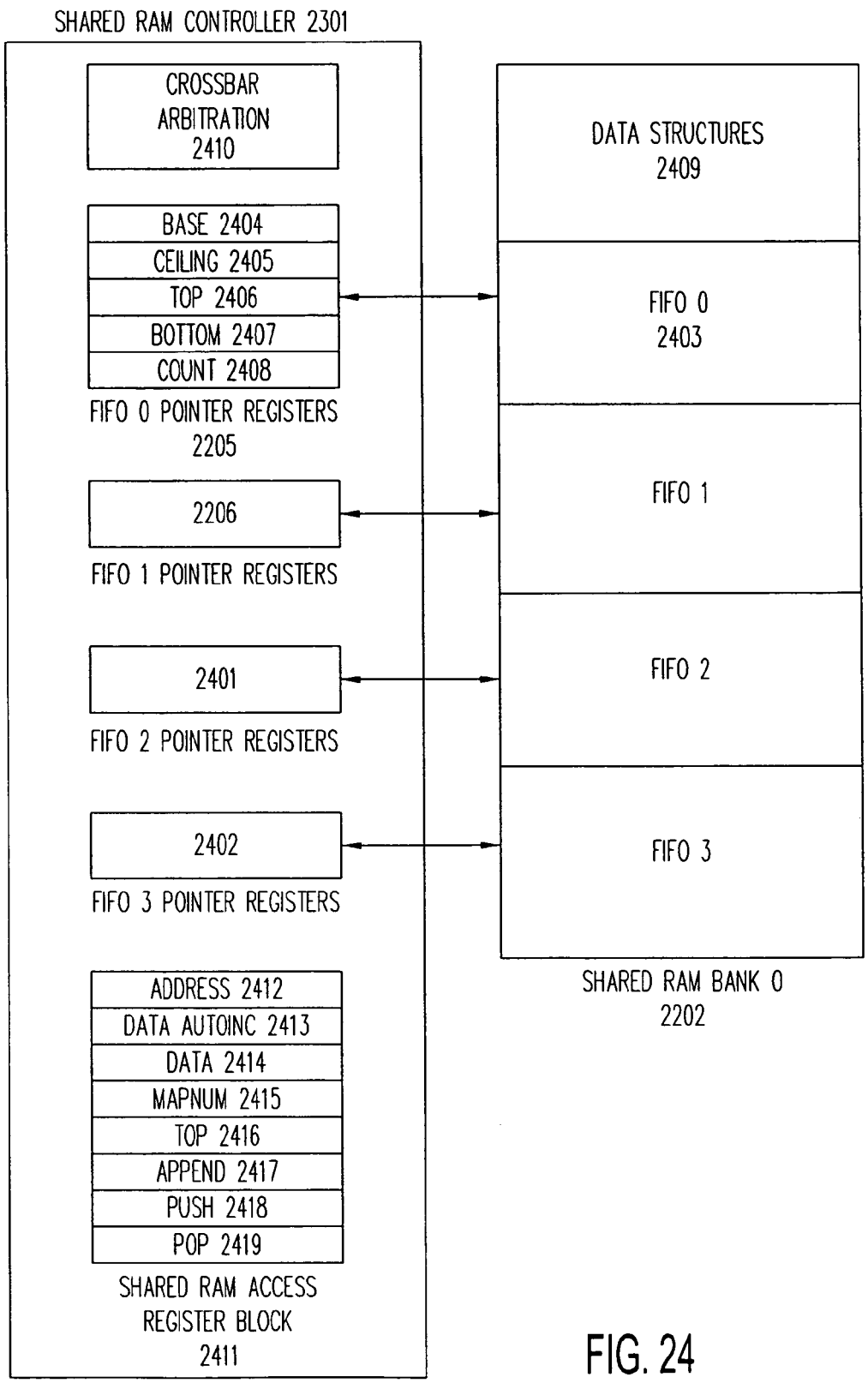
FIG. 24 illustrates the relationship between a shared RAM controller and a shared RAM bank.

FIG. 24 shows certain aspects of Shared RAM Controller 2301 and the relationship between register blocks contained in Shared RAM Controller 2301 and FIFO's contained in the Shared RAMs. In particular, FIG. 24 shows FIFO Pointer Registers 2205, 2206, 2401 and 2402, which correlate to FIFO's 0-3, contained in Shared RAM Bank 0 2202. Shared RAM Controller 2301 contains four Pointer Register blocks per Shared RAM Bank, for a total of 32, though some of these may be unused. Note that, for purposes of clarity, the portions of Shared RAM Controller 2301 that control Shared RAM Banks other than Bank 0 are not shown.

As is shown in FIG. 23, FIFO 0 Pointer Registers 2205 are associated with FIFO 0 (2403), which is contained in Shared RAM Bank 0 2202. Pointer Registers 2205 consist of the following registers:

Base Register 2404 contains a pointer to the address location within Shared RAM Bank 2202 that constitutes one boundary of the portion of Shared RAM Bank 2202 that is dedicated to FIFO 2403. Ceiling Register 2405 contains a pointer to the address location within Shared RAM Bank 0 that constitutes the other boundary of the portion of Shared RAM Bank 0 that is dedicated to FIFO 2403. These registers define the location and size of FIFO 0. In the currently preferred embodiment, they are set at initialization, and not changed during operation. In an alternative embodiment, these values may be reset dynamically, thereby allowing more efficient allocation of space within Shared RAM Bank 2202, but at the cost of adding complexity.

FIFO 2403 is a First-In, First-Out memory structure. As such, it has a top, which represents the entry that was most recently inserted, and a bottom, which represents the oldest entry. FIFO 2403 wraps around, and the location of the current top and the current bottom will change during use.

Top Register 2406 contains a pointer to the address location within Shared RAM Bank 2202 that constitutes the current top of FIFO 2403. Bottom Register 2407 contains a pointer to the address location within Shared RAM Bank 2202 that constitutes the current bottom of FIFO 2403.

Count Register 2408 contains a value representing the number of currently active elements in FIFO 2403. This same information can be derived by comparing Top Register 2406 and Bottom Register 2407, but a performance advantage is derived from having this information available without the need for a calculation. Count Register 2408 is automatically incremented whenever an item is added to FIFO 2403, and automatically decremented whenever an item is removed.

As is shown in FIG. 24, Shared RAM Controller 2301 also contains FIFO Pointer Registers 2206, 2401 and 2402, corresponding to FIFO's 1-3, though the individual registers are not shown.

Shared RAM Bank 0 also contains Data Structures 2409. As is explained in connection with FIG. 41, a variety of non-FIFO data structures are stored in Shared RAM, including the Initiator Table, CDBinfo Table, IOP Table, Transfer Request Table and Global Variables.

Note that each Freelist and its associated Table must be stored on the same Shared RAM Bank (see below in connection with FIG. 41).

Shared RAM Controller 2301 also contains Crossbar Arbitration Logic 2410. As is described above, Crossbar Switch 2201 has one Port for each HEMi and connects those Ports with eight Shared RAM Ports (one for each Shared RAM Bank), Global Registers, the Debug FIFO r and the Data Path DRAM. This requires some means of arbitrating among the HEMi's (23 in the current embodiment) for access to the Shared RAM and DRAM ports.

This arbitration is handled by Crossbar Arbitration Logic 2410. This logic uses a fair arbitration algorithm to arbitrate among HEMi's if more than one HEMi requires access to the same Port. In the currently preferred embodiment, this arbitration proceeds in a round-robin fashion, starting with the HEMi that most recently obtained access to the Port, and counting upwards through the HEMi's until reaching the first HEMi that desires access, wrapping around from the highest-numbered HEMi (HEMi 22 in the current embodiment) to HEMi 0. Thus, if HEMi's 5 and 10 require access to a particular Shared RAM Port, and the most recent HEMi having access to that Port was HEMi 15, HEMi 5 would be awarded the access, since Crossbar Arbitration Logic 2410 would count upwards from 15, wrapping around after 22, and HEMi 5 would be the first HEMi it would reach that required access to the Port. As should be understood, a variety of other arbitration algorithms could be used.

Crossbar Arbitration Logic 2410 also contains a mechanism to place a hold on a Port at the request of a HEMi that has obtained access to the Port. This allows a HEMi to complete a transaction that should not be interrupted.

Note that the design illustrated in FIG. 24 allows for modular expandability, in that the capacity of a system may be increased by adding a single Flash Port at a time. Doing so requires adding a Flash Port, flash memory, and a Flash HEMi as well as adding one Shared RAM for each four HEMi's that are added (to hold the HEMi Worklists (see below)), plus four sets of FIFO Pointer Registers for each Shared RAM. Adding Shared RAM also adds space that can be allocated to additional CDBinfos, IOPs and Transfer Requests. In addition, it is relatively easy to add a new Shared RAM Port to Crossbar Switch 2201.

This type of expansion requires a minor redesign of the layout of the Shared RAM Banks, in order to spread the data across the newly added Banks, but this can be handled by modifying the data used to initialize the Shared RAM Banks. No changes are required to the HEMI's or the HEMi firmware.

This modular design allows for expansion from a simple system containing two to three Flash Ports to a much larger system containing up to 23 Flash Ports with no requirement of any software or major hardware changes. Thus, the same architecture can be used for an inexpensive workstation design, involving only two to three HEMi's, or a much larger system.

Shared RAM Controller 2301 also includes Shared RAM Access Register Block 2411, which is used by HEMi's for accesses to Shared RAM Block 318. Block 2411 includes the following registers:

Shared RAM Address Register 2412 contains the address in Shared RAM of the doubleword that is the subject of the access. The high order bits of this address indicate the particular Shared RAM Bank to be selected, and the low order bits indicate the location in that Bank.

Shared RAM Data Autoinc Register 2413 holds a doubleword of data that is read from or to be written to the address stored in the Address Register. Use of the Shared RAM Data Autoinc Register causes the value in Address Register 2412 to automatically increment. On a read, Address Register 2412 increments once the data is copied into Register 2413. On a write, Address Register 2412 increments once the data is written out of Register 2413.

This Autoinc Register is used with Repeat Count Register 2702 (see below in connection with FIG. 27) bfor DMA-type block transfers of data. The number of transfers required is written into Repeat Count Register 2702 and the initial address is written into Address Register 2412. Data Autoinc Register 2413 will then repeat the read or write for the number of iterations indicated in the Repeat Count Register, with each repetition causing Address Register 2412 to increment, so that the next access is to the next doubleword in Shared RAM.

Shared RAM Data Register 2414 performs the same function as the Data Autoinc Register, but does not cause Address Register 2412 to increment. Register 2414 is used for multiple accesses to the same memory location, e.g., reading a variable and then modifying it.

Mapnum Register 2415 is used to select one of the FIFO's in Shared RAM Block 318.

Top Register 2416, Append Register 2417, Push Register 2418 and Pop Register 2419 each hold a doubleword of data. These registers are used for four different types of access to the FIFO selected by Mapnum Register 2415. A HEMi can read the value from the top of the FIFO without modifying the location of the top value in the FIFO or it can "pop" the top value from the FIFO, thereby causing the FIFO top to point to the next value in the FIFO. These operations result in the returned value being written into Top Register 2416 or Pop Register 2419, respectively.

A HEMi can also "push" a value onto the top of the FIFO, so that the new value becomes the new top of the FIFO, or add a value onto the bottom of the FIFO. For these operations, the data to be written is placed by the HEMi into Push Register 2418 or Append Register 2417, respectively.

The ability to place information at the top or the bottom of FIFO's provides additional flexibility. For example, this allows more important tasks to be placed at the top of a Worklist and less important tasks to be placed at the bottom.

Figure 25:
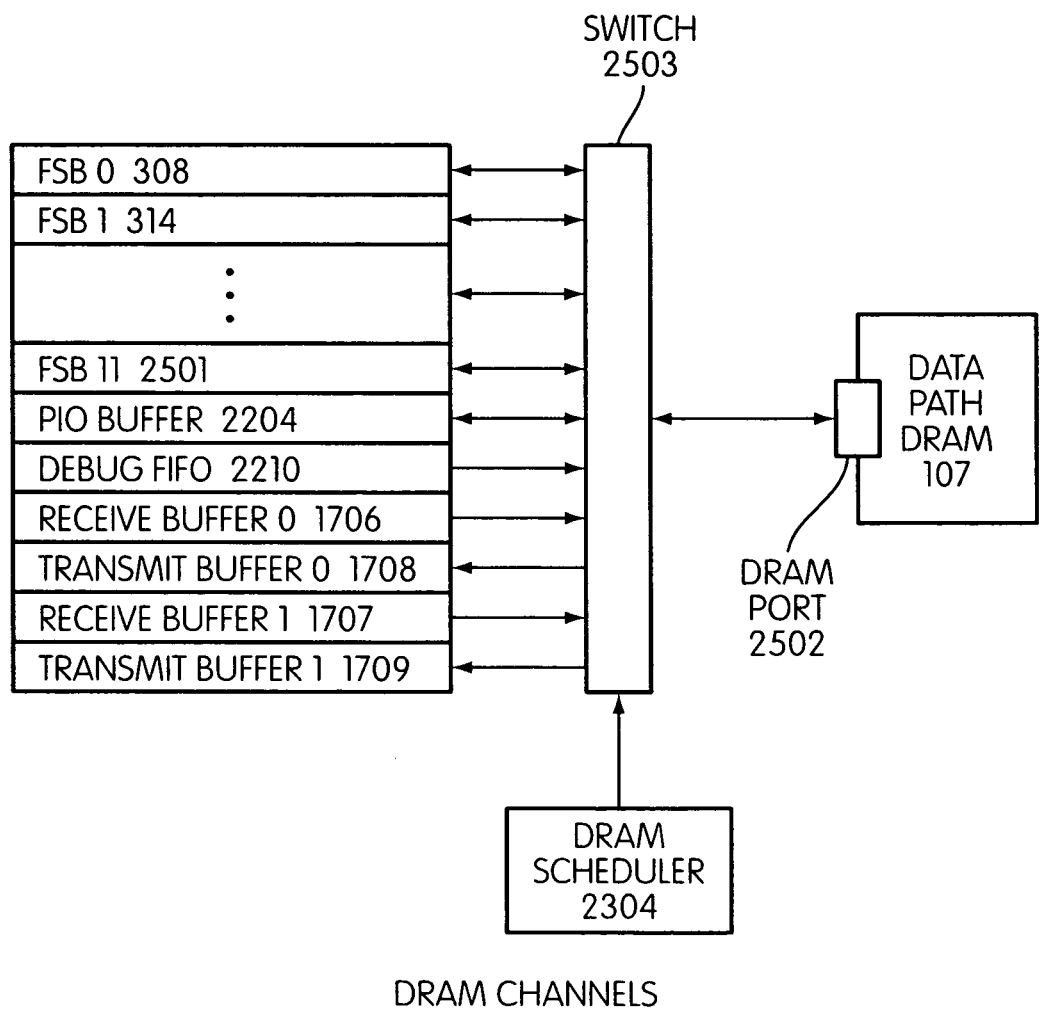
FIG. 25 illustrates DRAM channels.

FIG. 25 illustrates the input and output paths to and from Data Path DRAM 107. In the current embodiment, SSD Controller 106 may include 18 resources that require access to the DRAM (depending on configuration): up to 12 Flash Stage Buffers (shown as FSB 0 308, FSB 1 314 and FSB 11 2501, with the Flash Stage Buffers between 1 and 11 not shown for purposes of clarity; as is explained above, particular implementations of SSD Controller 106 may have fewer than 12 Flash Ports, and therefore fewer than 12 Flash Stage Buffers), PIO Buffer 2204, Debug FIFO 2210, Receive Stage Buffer 0 1706, Transmit Stage Buffer 0 1708, Receive Stage Buffer 1 1707 and Transmit Stage Buffer 1 1709.

The paths between these resources and the Data Path DRAM are referred to herein as "channels." As should be understood, although each of the resources is necessarily connected to the DRAM by a physical transmission path, channels are conceptual in nature and are do not necessarily reflect actual bus structures.

In the current embodiment, Data Path DRAM 107 has a single input/output port, designated as DRAM Port 2502, though other memories that may be used for this purpose may have a larger number of ports. As is explained above, DRAM Scheduler 2304 arbitrates among the channels, assigning access to channels that need access to DRAM Port 2502 in a round-robin fashion. In an alternate embodiment, other arbitration schemes could be used. For example, access could be prioritized according to the type of data being transferred, or the resource seeking access to the DRAM, e.g., Debug FIFO 2210 could be prioritized below Flash Stage Buffer accesses.

FIG. 25 illustrates the connection between the channels and DRAM Port 2502 as proceeding through Switch 2503. Operating under the control of DRAM Scheduler 2304, Switch 2503 connects one of the channels to DRAM Port 2502 at a time. The arrows shown in FIG. 25 illustrate the directionality of the allowed connections, e.g., Flash Stage Buffer 308 can read from or write to the DRAM, Debug FIFO 2210 can write to but not read from the DRAM and Transmit Buffer 1708 can read from but not write to the DRAM.

Switch 2503 is conceptual in nature and does not necessarily represent a single, large switch. Instead, this functionality may consist of a number of logic gates disposed at different locations. The exact physical design of this functionality is implementation-specific.

When a channel gains access to DRAM Port 2502, the movement of data between that channel and the DRAM occurs in a burst, made up of transfers each of which consists of four doublewords. That burst continues until the read or write is complete, or until the resource connected to the channel is full (for a transfer from the DRAM) or empty (for a transfer to the DRAM). Once the burst is terminated, that channel loses its access through Switch 2503, and DRAM Scheduler 2304 gives access to the next channel requiring that access.

E. HEMi's.

As is described above, SSD Controller 106 contains a number of processors referred to herein as HEMi's. As used herein, the term "processor" or "microprocessor" refers to any distinct logic block that includes an ALU capable of performing at least basic arithmetic and/or logical operations, a memory specific to the processor that holds data, and control logic that controls operations of the ALU, the control logic consisting of hardware, software and/or firmware. As used herein, "HEMi" refers to the particular processors used in the currently preferred embodiment, though, as should be understood, many details of the internal HEMi design are irrelevant herein and are omitted for purposes of clarity. In addition, although the HEMi design constitutes the currently preferred processor embodiment, as those of ordinary skill in the art understand, many other processor designs are possible.

In the current embodiment, SSD Controller 106 may contain up to 23 HEMi's, designated as follows (note that in this embodiment the numbering system includes gaps):

HEMi 0 Receive HEMi for Host Port 0 (1702).
HEMi 1: Transmit HEMi for Host Port 0 (1704)
HEMi 2: Receive HEMi for Host Port 1 (1703)
HEMi 3: Transmit HEMi for Host Port 1 (1705)
HEMi 8: SCSI HEMi (2001)
HEMi's 9-14: RdWr HEMi's (2101-2106)
HEMI's 15-26: Flash HEMi's (e.g., 307, 309, 313)

Figure 26:
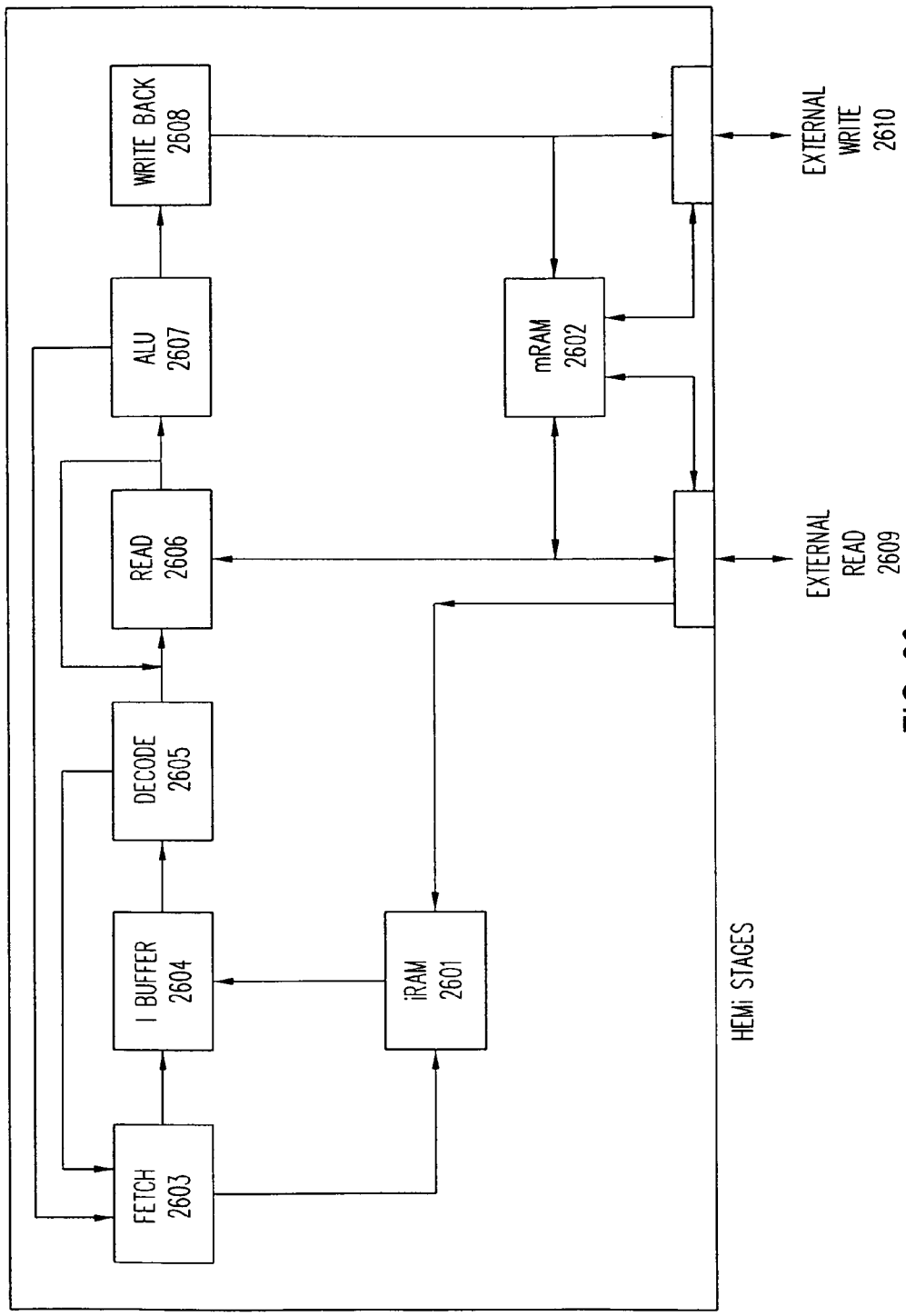
FIG. 26 illustrates HEMi stages.

Certain aspects of the internal functioning of the HEMi's are illustrated in FIG. 26. In the currently preferred embodiment, all HEMi's share the same hardware elements, but are customized for different functions through the use of different firmware overlays and through being connected to different tightly-coupled elements, both of which are described in greater detail below.

Each HEMi includes iRAM 2601, which is an instruction RAM capable of holding firmware to implement 1,000 56 bit VLIW instructions. These instructions are each able to read 1-2 Shared RAM or register locations, perform ALU operations, and write back or branch on the result.

As is described below, Data Path DRAM 107 stores up to eight different firmware overlays for each type of HEMi, and these overlays are copied into iRAM 2601 when needed based on the function being performed. This allows each HEMi to implement a much larger number of instructions than would be possible if the firmware were limited to the size of the iRAM.

HEMi instructions are fetched based on a 16-bit address. 3 bits of the address select the firmware overlay, and 13 bits constitute the address of the instruction in iRAM 2601. A firmware swap is triggered if the 3 firmware overlay bits of the instruction being fetched do not match the overlay that is currently stored in iRAM 2601.

In general, swapping firmware overlays is avoided by aggregating together the firmware that supports instructions needed to perform common tasks. For example, a single firmware overlay can handle most common operations necessary for reads and writes. Other firmware overlays handle, for example, initialization and error correction handling.

Each HEMi also includes two KByte mRAM 2602, which serves as a storage space for data being used by the HEMi.

As FIG. 26 shows, each HEMi includes a six-stage pipeline made up of Fetch Stage 2603, IBuffer Stage 2604, Decode Stage 2605, Read Stage 2606, ALU Stage 2607 and Write Back Stage 2608. In the currently preferred embodiment, each of these Stages constitutes a logical block within the HEMi, though in an alternate embodiment these could represent HEMi states, independent of the underlying processor hardware used to generate the state.

The Fetch Stage determines the iRAM address of the firmware associated with the instruction to be executed. That address is then passed to the iRAM, as is indicated by the arrow between Fetch Stage 2603 and iRAM 2601.

The firmware at that address is then loaded into a buffer, as is indicated by the arrow between iRAM 2601 and IBuffer Stage 2604.

The firmware is then handed off to Decode Stage 2605 (as shown by the arrow between IBuffer Stage 2604 and Decode Stage 2605). The Decode Stage decodes the instruction and performs jumps and calls. It transmits jumps and calls back to Fetch Stage 2603 (indicated by the arrow from Decode Stage 2605 to Fetch Stage 2603). In the case of straight-line instruction execution, Decode Stage 2605 passes parameters to Read Stage 2606. These parameters include the location from which data is to be retrieved for the required operation.

Read Stage 2606 reads 1 or 2 memory or register locations as required by the instruction. In the case of a read to two locations, Read Stage 2606 repeats, as is indicated by the arrow looping back from the output of Read Stage 2606 to its input. As indicated by the arrow pointing to Read Stage 2606 from External Read 2609, sources for the information include mRAM 2602 and external memory or registers (indicated conceptually by External Read 2609). Information may also come from internal registers that are not shown in FIG. 26.

Read Stage 2606 passes the obtained information to ALU Stage 2607, for operation by the HEMi's ALU. Results from the operation are passed to Fetch Stage 2603 (in the case of a conditional branch) or to Write Back Stage 2608.

Write-Back Stage 2608 writes the results of the ALU operation into a location specified by the instruction. As is indicated by the arrow pointing out of Write Back Stage 2608, results may be written into mRAM 2602 or to an external resource (indicated conceptually by External Write 2610).

Figure 27:
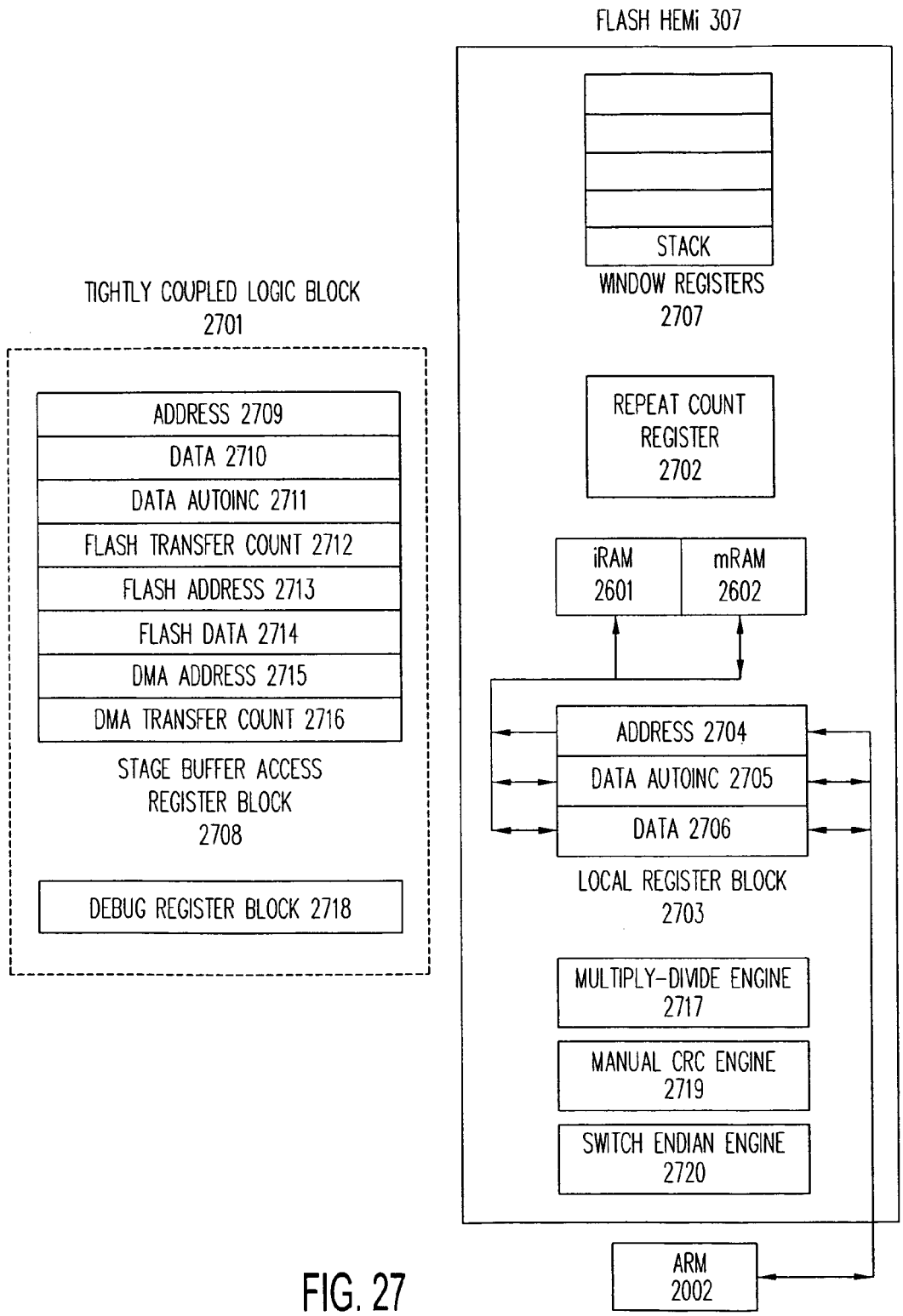
FIG. 27 illustrates a flash HEMi and its tightly coupled logic block.

FIG. 27 illustrates aspects of the HEMi design not shown in FIG. 26, including registers used for access to various memory ranges and logic that is tightly coupled to the HEMi (Tightly Coupled Logic Block 2701). As should be understood, both the HEMi and the tightly coupled logic may include registers and other components that are not shown herein. In addition, the register sets themselves have been simplified for purposes of illustration.

FIG. 27 illustrates Flash HEMi 307 and its Tightly Coupled Logic Block 2701. As is described above, the internal design of all HEMi's is the same. However, different types of HEMi's have different Tightly Coupled Logic Blocks. Block 2701 is specific to Flash HEMi's. Differences in tightly coupled logic for other types of HEMi's are described below.

HEMi 307 includes Repeat Count Register 2702, which holds a value used to calculate the number of times an operation should be repeated. Loading a value into the Repeat Count Register causes the next instruction executed by the HEMi to be repeated the specified number of times, with each repetition causing the value in the Repeat Count Register to be decremented.

A value of "1" can be forced into Repeat Count Register 2702, thereby ending the loop, under various circumstances:

(a) If a conditional branch instruction is looping as a result of the Repeat Count Register, and the condition occurs, so that the branch is taken, the Repeat Count Register is automatically forced to "1," which has the effect of causing the next instruction to occur once. As should be understood, in the conditional branch case, this next instruction would be the first instruction in the branch.

(b) When a flag associated with the Repeat Count Register is set, any action that increments certain FIFO count registers from zero to one forces a value of one into the Repeat Count Register. The FIFO count registers are those associated with the Worklist for the HEMi (e.g., Count Register 2408, described in connection with FIG. 24) and the Receive Buffer Count Register (described below in connection with FIG. 28).

This capability is used to force the HEMi's out of sleep mode when they have a task to perform. When a HEMi has no work to perform, it enters a sleep mode, in which a nop is repeated a set number of times, following which the HEMi wakes up, checks its Worklist, and, if no tasks are present on the Worklist, resumes executing nops. This is accomplished by loading a set number into Repeat Count Register 2702 and then executing a nop.

When a HEMi is in sleep mode, writing a task into the HEMi's Worklist (see below) causes the HEMi to wake up. This is accomplished by a signal from the relevant Count Register, which forces a "1" into Repeat Count Register 2702, thereby causing the HEMi to wake up and take appropriate action after the next nop is executed.

This use of the Repeat Count Register to force repeated nops allows the HEMi to go into low-power sleep mode without the need for any specialized sleep mode logic. In addition, this allows for very fine granularity in terms of how long the HEMi will remain in sleep mode. For example, if the HEMi is going into sleep mode because it has no current work to accomplish, a maximum value is written into the Repeat Count Register. In the currently preferred embodiment, this value is slightly over 1 million, and causes the HEMi to remain in sleep mode (unless earlier woken up) for approximately 4 milliseconds.

In another example, when a HEMi begins a multiply or divide operation, the Repeat Count Register can be used to force 32 nops, since such an operation takes 32 HEMi cycles. This allows the HEMi to go into low-power sleep mode while waiting for the results of the multiply or divide, which, as is described below, are handled by logic that can operate independently of the operation of the rest of the HEMi.

Note that the flag described above is used so that the Repeat Count will be forced to one only if it is executing nops, since otherwise a code loop might be interrupted. For this reason, the flag is set when a nop follows the Repeat Count, but is not set for other instructions.

HEMi 307 also includes Local Register Block 2703, which controls access to the HEMi's iRAM 2601 and mRAM 2602.

Local Address Register 2704 holds an address in local memory. This address may be in either iRAM or mRAM, depending on the high-order bits of the address. Local Data Autoinc Register 2705 holds a doubleword of data read from or to be written to local memory. Writing from this register causes Local Address Register 2704 to increment. By writing a value into Local Address Register 2704, loading a value into Repeat Count Register 2702, and executing a move from mRAM into Register 2705 and from Register 2705 into another location (these moves can be performed in one instruction), the HEMi can perform a DMA-like move of a sequence of doublewords from successive addresses in the mRAM. Each loop causes Register 2704 to automatically increment and Repeat Count Register 2702 to automatically decrement, and the moves continue until Repeat Count Register 2702 reaches zero. Note that if the target is similarly using a data-autoinc register, the move would be stored in successive addresses in the target, again, without the need for additional logic or instructions.

Local Data Register 2706 holds a doubleword of data read from or to be written to local memory, but this register does not cause an address increment.

ARM 2002 communicates with Local Register Block 2703 through a dedicated port. ARM 2002 is the only source that is able to write addresses into Local Address Register 2704 corresponding to iRAM 2601. ARM 2002 uses this capability to control the process of overlaying new firmware into iRAM 2601.

HEMi 307 also includes Window Registers 2707, which consist of five registers each of which holds an address in the HEMi's mRAM 2602. Four of these Registers are used to set up windows in mRAM consisting of 128 doublewords each. These windows are used for manipulation of data structures such as Transfer Requests and Page Requests. For example, if a Flash HEMi is required to operate on a Page Request, the address of that Page Request in MRAM can be loaded into one of the Window Registers. Accesses to particular areas of the Page Request can then be handled as an offset from the value in the Window Register, thereby simplifying the process of address calculation when repeated operations are required on a data structure.

The fifth Window Register is used for the mRAM stack, which stores local variables and function arguments. The stack window register operates similarly to the other four Window Registers, except that the HEMi's have special stack-related instructions that automatically increment or decrement the value in the stack Window Register and provide an automated mechanism for adding an offset to the stack window address, thereby allowing one clock stack manipulation.

The HEMi's internal registers, including Local Register Block 2703 and Window Registers 2707 are "hazard checked." Because the HEMi is a pipelined processor, if a write operation immediately precedes a move operation without such protection, the write may actually occur after the move. Thus, if a write instruction writes a value into a register, and the immediately subsequent instruction moves the register's contents to another location, the pipeline could result in moving the register's old contents, prior to the write. Hazard checking avoids this possibility by checking for such cases and delaying the subsequent instruction until the proper data has been loaded.

Multiply/Divide Engine 2717 is used to perform multiply and divide operations. Because the Multiply/Divide Engine can operate independently from the rest of the HEMi, the HEMi can write the values to be operated on into registers in Multiply/Divide Engine 2717 and then go into a sleep mode while the operation takes place, thereby saving power. This sleep mode is described above.

Manual CRC Engine 2719 generates a CRC value for information written in by the associated HEMi.

Switch-Endian Engine 2720 is a 32-bit register that automatically swaps the byte order of data written into the register. This is used because different protocols have different byte orderings. Data is stored in flash in little-endian format, but for certain protocols is received and must be transmitted in big-endian format.

Each HEMi also has an associated block of tightly coupled logic, e.g., Tightly Coupled Logic Block 2701. Tightly Coupled Logic Block 2701 illustrates logic that is tightly coupled to each Flash HEMi. As is described below, the logic blocks tightly coupled to other types of HEMi's differ in some respects from Tightly Coupled Logic Block 2701. Thus, even though the internal design of all HEMi's is identical, the use of different tightly coupled logic, plus the use of different firmware, allows each type of HEMi to be customized for its particular tasks.

Tightly Coupled Logic Block 2701 consists of resources that are "tightly coupled" to HEMi 307, meaning that HEMi 307 is the only HEMi that can access these resources, these resources share an address space, and accesses to these resources occur on a no-wait state basis.

Although in the currently preferred embodiment, the Tightly Coupled Logic is external to the HEMi, in an alternate embodiment some or all of this Logic could be incorporated into the HEMi itself.

Tightly Coupled Logic Block 2701 includes Stage Buffer Access Register Block 2708, which controls accesses to the Flash Stage Buffer associated with the Flash HEMi (e.g., Flash Stage Buffer 308.

Address Register 2709, Data Register 2710 and Data Autoinc Register 2711 operate similarly to the corresponding registers in Shared RAM Access Register Block 2411.

The Flash HEMi's use this access path to the Stage Buffers to modify Time Stamp information stored in SuperBlock Metadata Tables passing through the Stage Buffer, and during rebuilds required after an unexpected loss of power (the rebuild process is described below, in connection with FIG. 58).

Flash Transfer Count Register 2712, Flash Address Register 2713 and Flash Data Register 2714 control DMA operations between the Flash Group and the Flash Stage Buffer. Register 2713 contains the flash address to be accessed. Register 2712 contains the number of reads or writes, in doublewords. Register 2714 contains data received from, or to be sent to, the flash.

DMA Address Register 2715 and DMA Transfer Count Register 2716 are used to control the Stage Buffer side of a DMA transfer between Data Path DRAM 107 and the Stage Buffer. Register 2715 holds the Stage Buffer address for the transfer, and Register 2716 holds the number of doublewords to be transferred between the Stage Buffer and the PIO Buffer. Writing a value into Register 2716 causes a DMA transfer between the Stage Buffer and the PIO Buffer to begin.

In general, a HEMi can use internal move commands to move data between internal locations, Tightly Coupled Logic and certain external locations. Thus, for example, when it a new firmware overlay is needed, ARM Processor 2002 sets up the DRAM address for the overlay in DRAM Address Register 2212 (as is described below, firmware overlays are stored in the DRAM), sets up the iRAM address for the overlay in Local Address Register 2704, places the number of transfers from the DRAM in Transfer Count Register 2213 and places the number of doublewords needed for the transfer in Repeat Count Register 2702. The DMA transfer from DRAM through the PIO Buffer and to Data Register 2214 proceeds as is described above. Internal HEMi logic causes the data from Register 2214 to be written to Local Data Autoinc Register 2705, and from there to the iRAM location pointed to by Local Address Register 2704. Repeat Count Register 2702 is then decremented, the Local Address Register increments, and the process repeats. ARM 2002 uses this capability at system boot time to load the initial firmware overlay into each HEMi's iRAM.

To take another example, copying an IOP from Shared RAM (see below in connection with FIG. 41) into the HEMi's mRAM only requires four HEMi commands:

Write Shared RAM Address Register, Shared RAM Address; this writes the address of the IOP in Shared RAM into Register 2412.

Write Local Address Register, mRAM Address; this writes the address in mRAM where the IOP is to be stored into Register 2704

Write Repeat Count Register, # Dwords in IOP; this loads Repeat Count Register 2702 with the number of doublewords contained in the IOP.

Move Local Data-Autoinc Register, Shared RAM Data-Autoinc Register; this moves the value from Register 2413 to Register 2705. The value in Register 2413 is the doubleword in Shared RAM pointed to by Register 2412. Moving that value to Register 2705 causes it to be transferred to the MRAM location pointed to by Address Register 2704. Specifying the two Data Autoinc registers automatically causes the associated Address Registers to be incremented once the move occurs. As is described above, this move instruction repeats until the value in the Repeat Count Register reaches zero.

In this way, the HEMi can accomplish DMA-like accesses that occur automatically and with a minimum number of commands.

Tightly Coupled Logic Block 2701 also includes Debug Register Block 2718, which includes registers relevant to transfers to and from Debug FIFO 2210.

As is noted above, Tightly Coupled Logic Block 2701 is specific to Flash HEMi's. Tightly Coupled Logic Blocks associated with other HEMi's do not include Stage Buffer Access Register Block 2708.

The Tightly Coupled Logic Block for Receive and Transmit HEMi's (e.g., Receive HEMi 0 1702 and Transmit HEMi 0 1704) include additional registers designed to support Host Port operations. These registers are shown in FIG. 28.

The Tightly Coupled Logic Blocks for Receive HEMi's contain registers that are used for communication with and control of receive functions relating to the Host Port, including the following:

Receive Buffer Access Register Block 2801: this is used to set up DMA transfers from the Receive Stage Buffer to Data Path DRAM 107. This block includes DMA Address Register 2802, which holds the DRAM address for the transfer and DMA Transfer Count Register 2803, which holds the number of transfers to be made.

Receive Buffer Count Register 2804: this gives the number of entries in the Receive Stage Buffer data FIFO. Writing a value to this Register causes the Receive HEMi to wake up if it is in sleep mode.

Primitive FIFO Access Register Block 2805: this set of registers communicates with Inbound Primitive FIFO 1808. These registers include Top Register 2806 (reads from the FIFO without changing the top of the FIFO), Pop Register 2807 (reads the top item from the FIFO and moves the FIFO top to the next item), Count Register 2808 (contains the number of items in the FIFO) and Append Register 2809 (adds items to the end of the FIFO).

Non-Data Payload Access Register Block 2810: this set of registers communicates with Non-Data Payload FIFO 1804. These registers include Top Register 2811, Pop Register 2812, Count Register 2813 and Append Register 2814, which operate the same as the similarly named registers in the Primitive FIFO Access Register Block.

Header Size Register 2815: this indicates how long the current header is. This value allows the Receive HEMi to differentiate between one header and the next on the Non-Data Payload FIFO.

Primitive Match Register Block 2816: these registers are used to load values into Primitive Match Logic 1802 to customize the Primitive Match Logic for a particular protocol. Use and customization of Primitive Match Logic 1802 is explained above in connection with FIG. 19.

As is described above, Primitive Match Logic 1802 contains two sets of registers: Primitive Match Registers 1902 and Primitive Match Control Registers 1903. Primitive Match # Register 2817 points to one of sixteen registers in each set, resulting in the value stored in Primitive Match Load Register 2818 being loaded into the corresponding register in Primitive Match Registers 1902 and the value stored in Primitive Match Control Load Register 2819 being loaded into the corresponding register in Primitive Match Control Registers 1903.

WWN Hash Engine 2830 is used to generate a 24-bit hash of a received 64-bit Worldwide Name value. This hash is used internally so that received frames (which may contain the 24-bit hash value of the sender's WWN) may be matched with Initiator Table 4108 (see below), which contains the 64-bit value.

Figure 28:
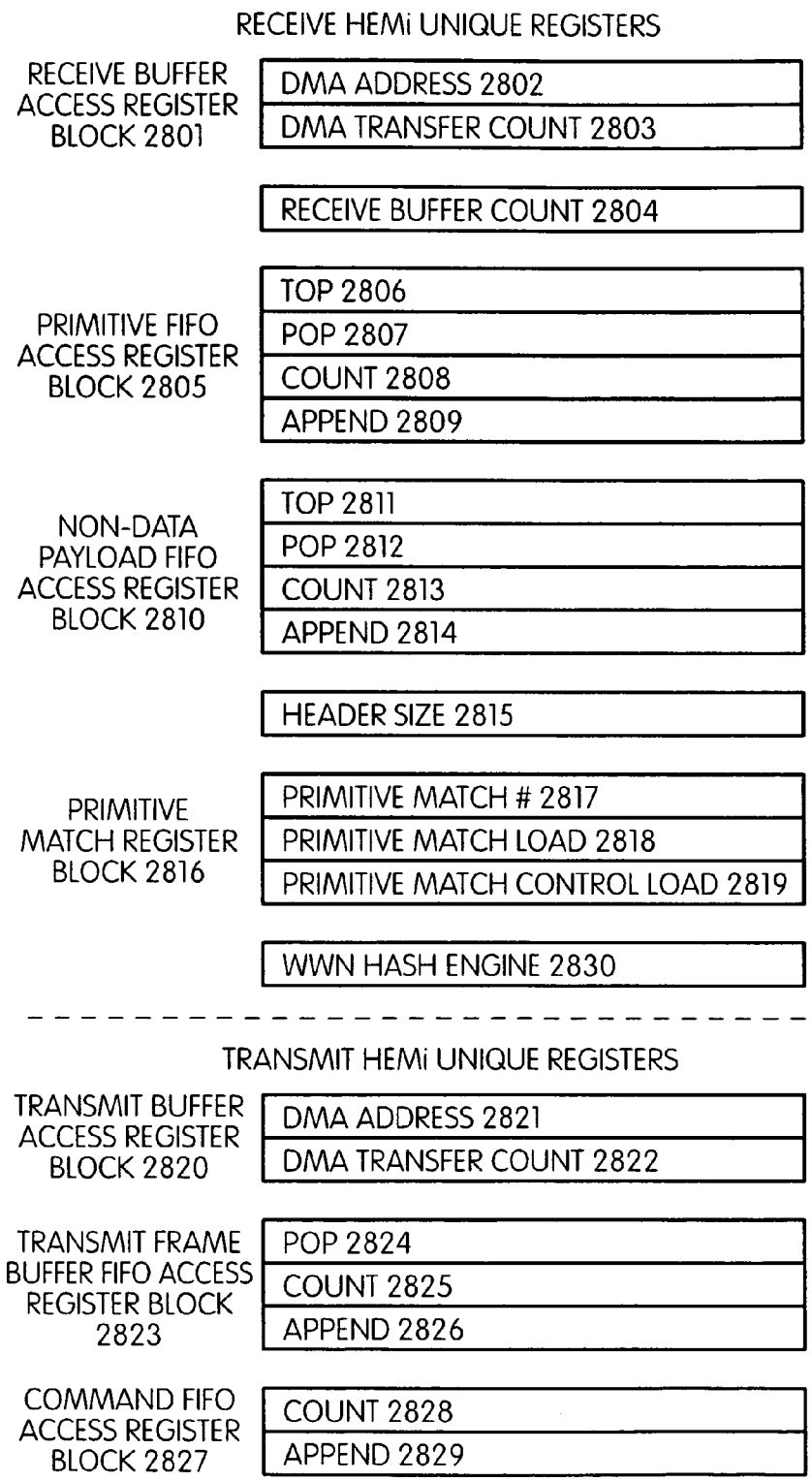
FIG. 28 illustrates receive HEMi and transmit HEMi unique registers.

FIG. 28 also shows unique Transmit HEMi tightly coupled registers:

Transmit Buffer Access Register Block 2820: this is used to set up the Transmit Stage Buffer side of DMA transfers from Data Path DRAM 107. This Register Block includes DMA Address Register 2821 and DMA Transfer Count Register 2822.

Transmit Frame Buffer FIFO Access Register Block 2823: this set of registers communicates with a FIFO which is part of the Transmit Frame Buffers 1806. These registers include Pop Register 2824, Count Register 2825 and Append Register 2826.

Command FIFO Access Register Block 2827: this set of registers communicates with a FIFO which is part of the Transmit Frame Buffers 1806. These registers include Count Register 2828 and Append Register 2829.

Figure 29:
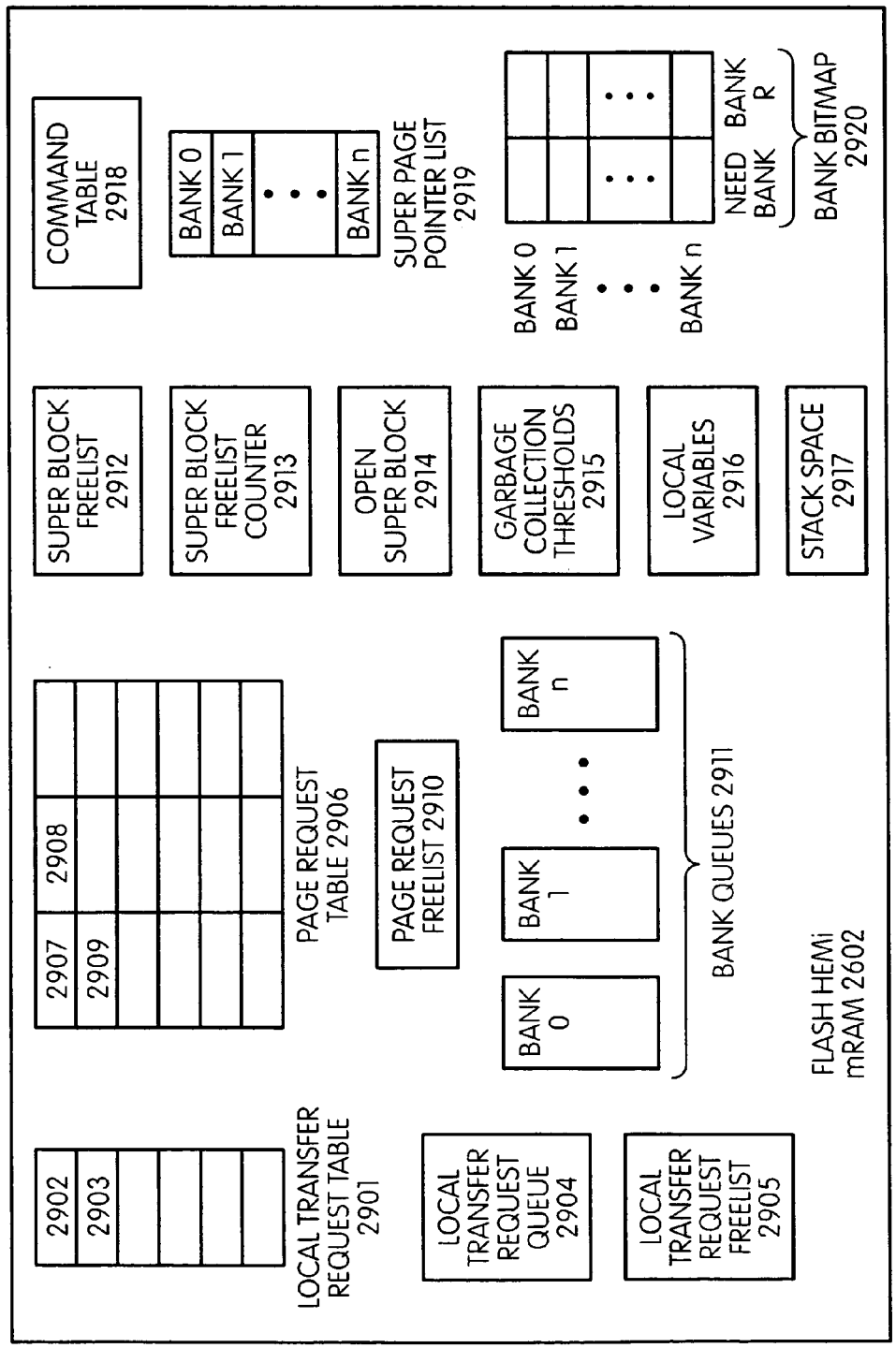
FIG. 29 illustrates the contents of a flash HEMi mRAM.

FIG. 29 illustrates the contents of the MRAM of a Flash HEMi, e.g., HEMi 307:

1. Local Transfer Request Table 2901. This contains space for holding up to six Transfer Requests. These can be a combination of Transfer Requests that have been copied from Shared RAM into this Flash HEMi's mRAM and Local Transfer Requests, issued in connection with internal operations such as garbage collection (see below). For example, Slot 2902 can store one Transfer Request, and Slot 2903 can store a second Transfer Request.

2. Local Transfer Request Queue 2904. This is a FIFO queue of Transfer Requests that are stored in Table 2901 and are queued up to be worked on by the Flash HEMi.

As is explained below, in general, Transfer Requests are placed on this Queue when the Page Requests associated with the Transfer Request have completed and the Transfer Request itself is ready to enter into a done state.

3. Local Transfer Request Freelist 2905. This holds a list of pointers to slots in Local Transfer Request Table 2901 that are empty and are therefore capable of holding new Transfer Requests.

4. Page Request Table 2906. This contains space for holding up to eighteen Page Requests. Each Transfer Request can invoke three Page Requests, so Page Request Table 2906 contains space for the eighteen Page Requests that can be invoked by the six Transfer Requests that can fit into Flash HEMi Transfer Request Table 2901. In the example shown, Page Request Table 2906 includes Page Requests in Slots 2907 and 2908, which hold Page Requests for the Transfer Request in Flash HEMi Transfer Request Table 2901 Slot 2902, and the Page Request in Slot 2909 is for the Transfer Request in Slot 2903. In this example, the other Page Request slots are empty, meaning that the space has been allocated but is not currently filled by valid Page Requests.

5. Page Request Freelist 2910. This is a list of all Page Request slots in Page Request Table 2906 that are free, meaning they do not currently hold valid Page Requests. This list therefore represents new Page Requests that the Flash HEMi can issue.

6. Bank Queues 2911. This is a set of FIFO queues of Page Requests that are stored in Table 2906. There is a separate Page Request Queue for every Bank in the Flash Group. Once a Page Request is ready for execution, it is appended to the end of the Bank Queue for the Bank holding the address that the Page Request is required to read from or write to. The Flash HEMi rotates among the Bank Queues in order. When it rotates to a Bank Queue that contains a Page Request, it evaluates the top Page Request on the Queue to determine if the resources necessary for continued execution of the Page Request are available. If the resources are available, the Flash HEMi carries out those tasks required by the Page Request that are possible given the available resources and then rotates to the next Bank Queue. In this way, the Flash HEMi handles the Page Requests in a round-robin fashion, but without the need for any arbitration logic. Page Requests that have completed processing are removed from the Bank Queue. This process is explained in greater detail in connection with FIG. 53.

In the current embodiment, the Bank Queues are FIFOs, and Page Requests are handled in the order received. In an alternate embodiment, high priority Page Requests are added to the top of a Bank Queue, rather than being appended to the bottom. In this embodiment, a priority bit may be set in the Page Request, based on a priority bit in the calling Transfer Request that identifies a particularly significant transaction.

8. SuperBlock Freelist 2912. This contains identifiers for the SuperBlocks contained in the Flash Group controlled by this Flash HEMi that are free, and therefore available to be written.

9. SuperBlock Freelist Counter 2913. This contains the number of SuperBlocks on Freelist 2912. This number is separately tracked as a performance optimization, so that it does not have to be calculated as needed.

10. Open SuperBlock Pointer 2914. This holds the designation for the SuperBlock that is currently open for writing.

11. Garbage Collection Thresholds 2915. In the current embodiment, this holds two variables, both used for garbage collection purposes: the Critical Threshold and the Non-Critical Threshold. Use of these variables in garbage collection is described below.

12. Local Variables 2916. In the current embodiment, this holds various local variables used by the HEMi.

13. Stack Space 2917. This holds a stack used by the HEMi for processing tasks.

14. Command Table 2918. This holds a list of commands and LBA ranges affected by all Transfer Requests that are currently being handled by the Flash HEMi.

As is described above, SSD Controller 106 enforces read/write coherency to insure that operations do not complete out of order. Command Table 2918 is used by the Flash HEMi to enforce coherency at the Flash Port level. When a Transfer Request is popped from the Flash HEMi's Worklist, and copied into Local Transfer Request Table 2901, the LBA range affected by the Transfer Request is checked against Command Table 2918. If an overlap exists, execution of the Transfer Request is stalled until the earlier Transfer Request has been completed, at which point its entry is removed from Command Table 2918 and the hold placed on the later Transfer Request is removed. Once a Transfer Request has been cleared for execution in the Flash HEMi, the LBA range affected by that Transfer Request is added to Command Table 2918.

15. SuperPage Pointer List 2919. This list contains one entry for each Bank in the Flash Group associated with this Flash HEMi. For each Bank, the associated entry points to the next free SuperPage in the currently open SuperBlock. When a SuperBlock is initially opened up, and contains no data, Banks 1-7 point to SuperPage 0 and Bank 0 points to SuperPage 1 (SuperPage 0 of Bank 0 of each SuperBlock contains the SuperBlock Metadata Table, and is therefore not available for normal writes).

The Flash HEMi uses these counters to allocate SuperPages to Page Requests that include a write command and therefore require a free SuperPage. When a SuperPage has been allocated to a Page Request (this occurs during Page Request initialization), the entry in SuperPage Pointer List 2919 for the Bank containing that SuperPage is incremented.

Note that List 2919 may, in one embodiment, be contained in the same data structure as the Open SuperBlock 2914 information.

16. Bank Bitmap 2920. This table holds two bits for each Bank. One of the bits indicates whether or not the Page Request at the top of the Bank Queue needs the Bank to operate. The second bit indicates whether the R/B signal for the Bank is in the Ready state. The Flash HEMi checks this bitmap in determining whether to begin servicing a Page Request.

Figure 30:
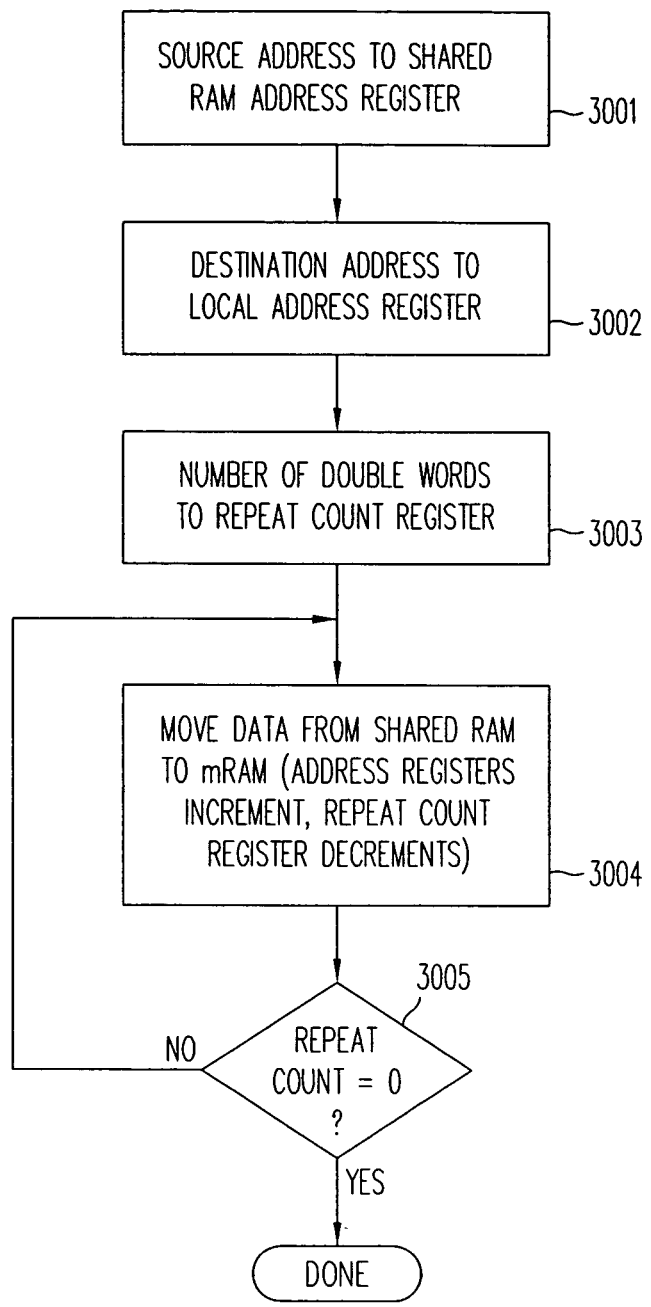
FIG. 30 illustrates the transfer of a data block from shared RAM.

Use of Shared RAM Access Register Block 2411 to access Shared RAM is illustrated in FIG. 30, which shows a sequence of steps used for transferring a data block (e.g., a Transfer Request) from Shared RAM.

In Step 3001, the address of the desired data in Shared RAM is written into Shared RAM Address Register 2412. In this example, this is the address of the Transfer Request in Transfer Request Table 4111 (see below).

In Step 3002, the HEMi MRAM address to which the data is to be transferred is written into Local Address Register 2704. In this case, the address points to an empty slot in Local Transfer Request Table 2901.

In Step 3003, a value is written into Repeat Count Register 2702 that corresponds to the number of doublewords that will be required to complete the transfer.

In Step 3004, the HEMi executes a command that causes a read from Shared RAM to Shared RAM Data Autoinc Register 2413 and from there to Local Data Autoinc Register 2705. The read from Shared RAM occurs at the address specified in Shared RAM Address Register 2412. The read to the Local Data Autoinc Register causes the data to be written to the location in mRAM specified by Local Address Register 2704. The use of the two Data Autoinc Registers causes the respective Address Registers to automatically increment. Execution of the command causes Repeat Count Register 2702 to decrement. Note that the HEMi design allows this step to be handled with a single instruction.

In Step 3005, Repeat Count Register 2702 is checked to determine if it contains a value of zero.

If Repeat Count Register 2702 has a value of zero ("yes" outcome to Step 3005), the transfer is complete, and the process ends.

If Repeat Count Register 2702 has a value that exceeds zero ("no" outcome to Step 3005), this indicates that additional transfers are needed. Control returns to Step 3004 for transfer of the next doubleword.

Note that the loop between Steps 3004 and 3005 continues without further intervention by the Flash HEMi. The incrementing Address Registers, and the Repeat Count register, which forces a repeat of the executing instruction, allow the HEMi to transfer data quickly and efficiently in a DMA-like burst.

F. ECC Handling.

SSD Controller 106 generates and checks Error Correction Code ("ECC") information when data is written to and read from Flash Memory Module 108. (As is described above, Data Path DRAM 107 also has an internal ECC capability, but SSD Controller 106 does not control this capability, and interfaces with it only in the case of a reported error, which causes SSD Controller 106 to issue an error message.)

Figure 31:
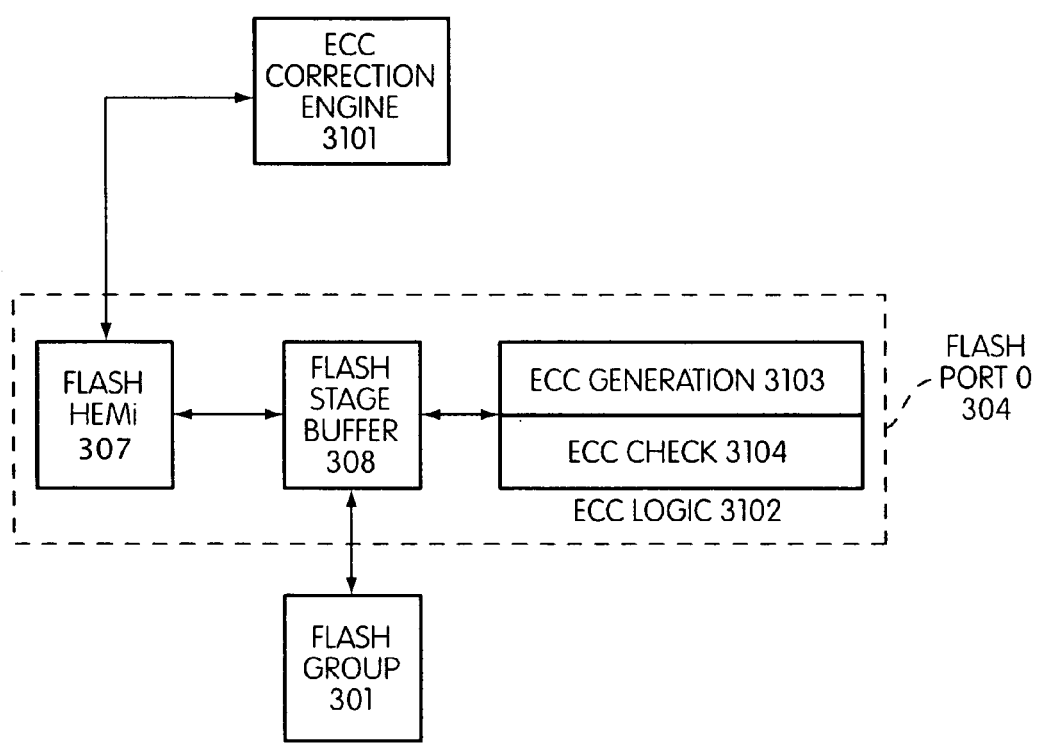
FIG. 31 illustrates ECC logic.

The ECC process is illustrated in FIG. 31, which shows Flash Port 0 304. As is described above, Flash Port 0 includes Flash HEMi 0 307 and Flash Stage Buffer 0 308, and is connected to Flash Group 0 301.

FIG. 31 also shows ECC Correction Engine 3101. As is explained above, SSD Controller 106 includes a number of Flash Ports, each with an associated Flash Group. However, in the current embodiment, SSD Controller 106 only includes a single ECC Correction Engine, which is shared among the Flash Ports. Since only one ECC Correction Engine exists, when a Flash HEMi requires the ECC Correction Engine, it must first check if the ECC Correction Engine is busy. If the ECC Correction Engine is not busy, the Flash HEMi may use it. If the ECC Correction Engine is busy, the Flash HEMi must append its ID to an ECC Correction FIFO contained in Global Registers 2203 (see FIG. 22). That FIFO includes an ordered list of all Flash HEMi's that require access to the ECC Correction Engine. A HEMi is awarded access to the ECC Correction Engine when its ID comes to the top of the FIFO.

In a different embodiment, SSD Controller 106 may include more than one ECC Correction Engine, up to a total of one for each Flash Port. This embodiment increases cost and complexity, but allows for faster performance if a large volume of errors must be corrected. In this embodiment, Flash HEMi's are not required to wait for access to the ECC Correction Engine. In other alternate embodiments, there may be one ECC Correction Engine for a given number of Flash Ports (e.g., two or four).

As is shown in FIG. 31, Flash Port 0 304 includes ECC Logic 3102. ECC Logic 3102 further consists of ECC Generation 3103 and ECC Check 3104.

ECC Generation 3103 generates ECC bits for a sector of data at a time. It does so when data is being transferred between Flash Stage Buffer 308 and Flash Group 301. On a write from the Stage Buffer to the Flash Group, the ECC information is stored along with the data, the ECC information being stored in ECC Field 1303 of the SPage Sector (see FIG. 13). On a read from the Flash Group to the Stage Buffer, the ECC information is used by ECC Check 3104, as is described below.

In the currently preferred embodiment, ECC Generation 3103 generates twelve ECC symbols per sector, thus using 12 ECC bytes per sector, using the Hamming algorithm. This requires a little less than 20 bytes for storage, and it is for this reason that SPage Sector ECC Field 1303 consists of 20 bytes. The amount of ECC generated per sector is programmable, based on a register in ECC Logic 3102 that is set at initialization. In an alternate embodiment, by setting the ECC size to zero, and rearranging or eliminating the space taken up by other fields, it would be possible to shrink the size of an SPage Sector and therefore allow each SuperPage to hold 16 sectors (and therefore handle 16 LBAs).

When data is read from Flash Group 301, ECC Generation 3103 generates a new set of ECC bits for each sector. ECC Check 3104 then compares the newly-generated ECC bits against the contents of ECC Field 1303. The results of this comparison are conveyed using a flag, which indicates either that the ECC bits matched, or that an error was discovered. Methods for generating and checking ECC information are well-known in the art and will not be further described herein.

When ECC Check 3104 discovers an ECC error, Flash HEMi 307 copies the Sector data and metadata (including ECC Field 1303) from Stage Buffer 308 into ECC Correction Engine 3101. The ECC Correction Engine uses the contents of ECC Field 1303 to attempt to correct errors introduced into the data during the course of writing to or reading from Flash Group 301. Again, the details of ECC correction processes are well-understood in the art and are not described herein. In the currently preferred embodiment the ECC Correction Engine is capable of correcting twelve errors per sector, based on the approximately 20 bytes of ECC information.

If ECC Correction Engine 3101 is successful in correcting the data, Flash HEMi 307 takes the output from ECC Correction Engine 3101 and writes it back into Stage Buffer 308, with the corrected data then being used for the ultimate transmission to the Host. (As should be understood from the discussion in connection with FIG. 27 above, although two transfers are involved, the HEMi design allows for each doubleword of data to be transferred from ECC Correction Engine 3101 to Stage Buffer 308 using a single HEMi instruction). If the number of errors is too great for ECC Correction Engine 3101 to correct, a second-level error correction protocol is invoked. This protocol has two stages. In the first stage, the read from the Flash Group to the Stage Buffer is repeated one or more times, initiating the error correction cycle again with the same sector. This is done because errors sometimes result from cells that are at the threshold between reporting one state and another, and a reread may generate additional valid bits. If the ECC Correction Engine is able to correct the data the second (or subsequent) time, the corrections are made, the physical sector is marked as "bad," and the data is rewritten into another sector.

In a second stage of the second-level error correction protocol, the data is read repeatedly and OR'd together with the results of earlier reads. As a result of the OR operations, if a "1" is encountered at a bit position during any of the reads, that "1" will be maintained, even if the value at that bit position is read as "0" during earlier or later reads. This procedure is used because flash memory errors commonly result from a leakage of charge from a flash cell, causing the value in the cell to be read as a "0" rather than a "1" (e.g., read disturbs). Because the leakage may result in the cell having an intermediate charge level, between 0 and 1, different reads may result in different values being returned. The OR process maximizes the number of 1s received from the reads. Once the OR process has completed a set number of times, the value is returned to ECC Correction Engine 3101 to determine if the data can now be corrected.

The OR process may actually increase data corruption, if that corruption resulted from charge increasing on a cell, such that a "0" value is intermittently read as a "1." This case is relatively rare, however, though it makes sense to use the OR process only after the first stage of the second-level error correction (reading without OR'ing) has failed.

If ECC Correction Engine 310 1 is ultimately unable to correct the data, the Flash HEMi issues an error message that is sent through the Host Port to the Initiator associated with the data.

In the currently preferred embodiment, the corrected data is not written back into the flash unless the number of errors exceeds a threshold. The threshold is set based on the number of correctable errors (12 per sector, in the current embodiment), minus a guardband calculated based on the likelihood of additional errors being introduced on a subsequent read. In the currently preferred embodiment, the inventors have determined that the number of errors found in a sector read is very unlikely to be greater than three more (or three less) than the number of errors found in the immediately preceding read of that sector. Thus, for example, if on a read a sector has three correctable errors, on the next read it is highly likely to have six or fewer correctable errors.

As should be understood, this behavior means that, if a sector has nine or fewer correctable errors on a read, it is highly likely that on the next read the sector will have twelve or fewer errors, meaning that the errors will be correctable on the next read. This, in turn, means that it is unnecessary to write the corrected data back to the flash. Avoiding such writes is significant, since writing corrected data to the flash requires that the entire SuperPage be rewritten.

In the current embodiment, the guardband is set at four, rather than three, to further minimize the possibility that uncorrectable errors will be found on a subsequent read. Thus, the threshold of correctable errors discovered on a read is set at eight. If more than eight errors are discovered, the write handler is called and the SuperPage containing the sector is rewritten to the flash, including the corrected data. If fewer than eight errors are discovered, the SuperPage is not rewritten, since it is anticipated that the number of errors will still be correctable in the next read.

In an alternate embodiment, a SuperBlock containing errors may be identified for preferential garbage collection, since the presence of errors in certain sectors may mean that adjoining sectors also contain errors. Preferential garbage collection involves a certain amount of inefficiency, since the selected SuperBlock will probably contain more valid data than the SuperBlock that would have been selected without the preference (see below for a discussion of garbage collection), but this inefficiency is much less than the inefficiency imposed by immediately rewriting any SuperPage found to contain errors.

IV. Metadata Structures

A. DRAM Structures.

Figure 32:
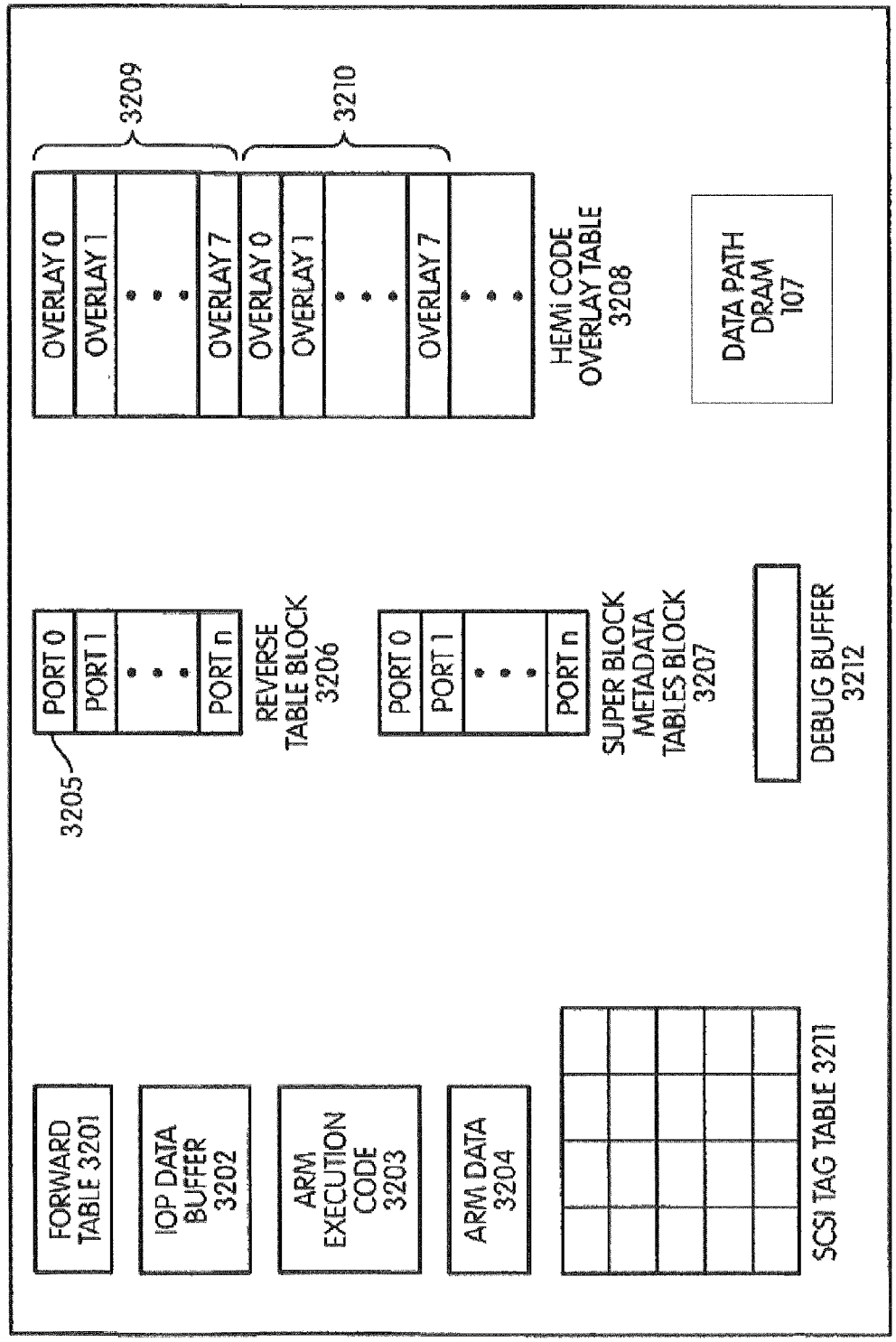
FIG. 32 illustrates the contents of a data path DRAM.

FIG. 32 illustrates data structures found Data Path DRAM 107, each of which is set up and initialized at system initialization. These include the following structures:

Forward Table 3201, which is used to translate between LBA addresses and flash memory addresses. This Table is described in greater detail in connection with FIG. 33.

IOP Data Buffer 3202, which stores data being transferred between Host Interface 310 and Flash Memory Module 108.

ARM Execution Code 3203, which stores software executed by ARM Processor 2002. In the currently preferred embodiment, this software is written in the C++ programming language.

ARM Data 3204, which constitutes a memory space used by ARM Processor 2002 during processing Reverse Table Block 3206, which is used for garbage collection and for recovering from a power loss. Reverse Table Block 3206 contains a separate table for each Flash Port, e.g., Table 3205 contains the Reverse Table for Flash Port 0. Reverse Table 3205 is described in greater detail in connection with FIG. 34.

SuperBlock Metadata Tables Block 3207, which contains metadata tables for the currently open SuperBlock for each Flash Port. These tables are further described in connection with FIG. 35.

HEMi Code Overlay Table 3208, which contains firmware that is loaded into each HEMi at initialization. This Table contains eight code overlays for each type of HEMi, e.g., Entry 3209 contains eight firmware overlays for the two Receive HEMi's, Entry 3210 contains eight firmware overlays for the two Transmit HEMi's, etc. These overlays are swapped into and out of the HEMi iRAMs as necessary, in a manner explained in greater detail above.

SCSI Tag Table 3211, which contains one row for each currently active Initiator, and one column for each of the 65,536 possible values allowed for a SCSI Tag according to the SCSI Protocol. When a CDB is received containing a particular SCSI Tag, the bit is set in the SCSI Tag Table location corresponding to that Initiator and that SCSI Tag. When execution of the CDB has completed, that bit is cleared. This allows SSD Controller 106 to check to make sure that all received SCSI Tags are unique, and that an Initiator never has two active CDBs with the same SCSI Tag.

Debug Buffer 3212. This is a circular buffer that stores debug data received from Debug FIFO 2210. This debug data is collected during normal system operation, in response to debug commands in HEMi firmware. Information collected includes the basic command flow of CDBs received and data structures generated as a result (CDBInfo, IOP, Transfer Requests). In the case of a detected error, additional debug information is collected in order to identify the type of error and the nature of the response made to the error, if any.

FIG. 33 shows Forward Table 3201. Forward Table 3201 is used to translate LBA addresses received from Hosts 101 and 102 into actual physical flash memory addresses in Flash Memory Module 108.

Forward Table 3201 is indexed by LBA, and contains one entry for each fifteen LBAs that the system can support. As is shown in FIG. 33, the first entry in Forward Table 3201 relates to LBAs 0-14, the second entry to LBAs 15-29, the third entry to LBAs 30-44, etc. Note that the number of LBAs per entry is the same as the number of LBAs that can be stored in a SuperPage. In a different embodiment, involving larger or smaller SuperPages, the number of LBAs per Forward Table entry would likewise become larger or smaller.

The size of Forward Table 3201 is dependent on the total memory size of Flash Module 108. In the currently preferred embodiment, a 300 Gigabyte Flash Module can store approximately 600 million LBAs, thereby requiring approximately 40 million possible entries in Forward Table 3201. The size of Forward Table 3201 would be correspondingly larger or smaller for larger or smaller quantities of memory.

For each LBA entry, Forward Table 3201 includes information that can be used to identify the location of the corresponding data on the physical flash memory chips: Port, Bank, Block and Page.

In addition, Forward Table 3201 contains a field designated "User," which can store information that a particular customer may find useful. In one embodiment, the user field stores the number of times the associated LBAs have been accessed (read or written) during a predefined maintenance period (e.g., one month). Users may use this information to determine whether a particular group of LBAs contains information that is used more or less often. Information used often may be moved into a faster, higher cost memory. Information not used very often may be moved into slower, archival memory.

In operation, Forward Table 3201 operates as follows: an LBA is received from a Host, e.g., LBA23. The LBA is divided by 15, with the whole-number quotient used to obtain an index into Forward Table 3201. For example, for LBA23, dividing by 15 gives a quotient of "1," meaning that the physical address information for that LBA is found by indexing one row into the Forward Table. This is the row labeled LBA15-29 in FIG. 33.

The selected row identifies the Port at which the LBA information is stored, and therefore the Flash HEMi and Flash Group used to access the information. The selected row further identifies the particular Bank at which the information is stored, and therefore the CS signal used by the selected Flash HEMi to select the information.

The selected row also identifies the Block in which the information is found. Note that this is the same block on each chip of the Bank.

Finally, the selected row identifies the Page in which the information is found. For example, the row may identify Page 1 of Block 1. (As should be understood, in this example, the LBA would actually be stored in SuperPage 1 of Block 1.)

As is described above, each SuperPage includes fifteen SPage Sectors, each of which can store contents relating to a single LBA. Once the SuperPage has been identified from Forward Table 3201, the actual SPage Sector in the SuperPage is obtained by taking the remainder from the division described above. In the example given, the remainder is eight (23/15=1, remainder 8). The requested LBA information would thus be found in the ninth PSector slot in each selected Page (ninth, rather than eighth because the Table begins with LBA 0).

Figure 34:
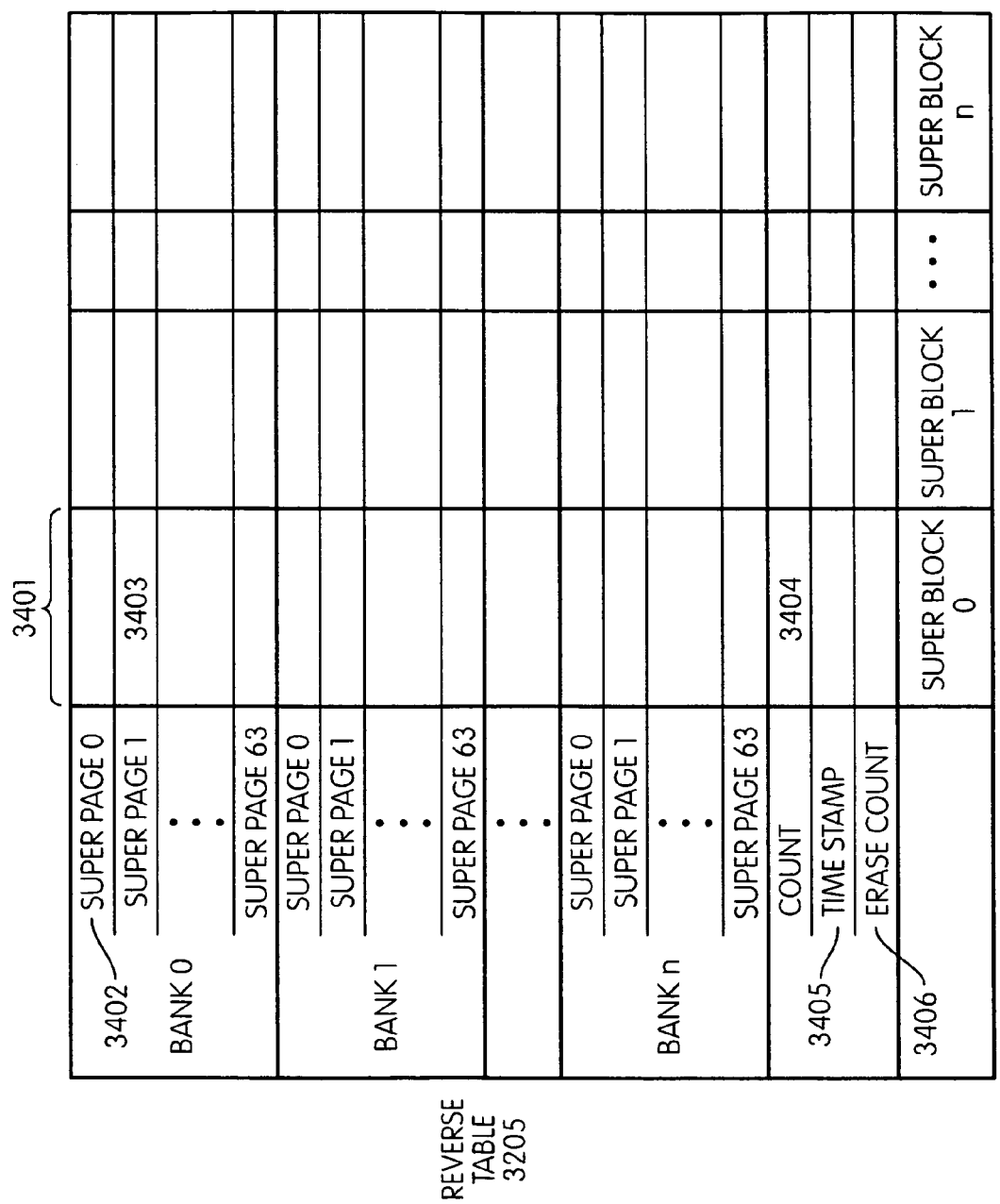
FIG. 34 illustrates a reverse table.

FIG. 34 shows Reverse Table 3205. As is described above, Data Path DRAM 107 contains one Reverse Table for every Flash Memory Group.

As is described above, each Block consists of 64 Super-Pages, each of which is made up of memory space from four Pages, one from each Die in the Bank. As is also described above, a SuperBlock consists of the same Block from each Bank in the Group. For example, SuperBlock 0 of a particular Flash Group consists of all Block 0s from all Banks in that Group.

Column 3401 represents SuperBlock(0), with rows for SuperPages 0-63 of Bank 0, SuperPages 0-63 of Bank 1, etc., with each group of 64 SuperPages on one Bank representing a Block.

Each of the SuperPage rows in Table 3205 (e.g., Row 3402) contains an entry for the same SuperPage in every Super-Block (e.g., SuperPage 0 of SuperBlocks 0-*n*).

Each SuperPage field in Reverse Table 3205 contains a single Valid bit. When set to "1," the Valid bit indicates that the SuperPage either contains currently valid, programmed data (i.e., the SuperPage has been written with data that remains valid), or has been erased and is available to be written (i.e., contains a value of 0xffffffff, which is the default state after an erase). When set to "0," the Valid bit indicates that the Super-Page contains invalid data, meaning that it cannot be read from and is not available to be written to. A SuperPage is invalidated when the LBAs stored on that SuperPage are subjected to a later write. Because flash memory does not allow direct overwrites, when an LBA on a SuperPage is overwritten, the new data, plus any old data that remains valid on the SuperPage, are copied to a new SuperPage, and the old SuperPage is marked invalid, meaning that it is no longer to be used (pending garbage collection, which is described below).

Thus, for example, a "1" in Field 3403 would indicate that SuperPage 1 of Block 0 of Bank 0 of the Flash Group either contains valid data or has been erased and is available for writing, whereas a "0" in that field would indicate that the data in SuperPage 1 of Block 0 of Bank 0 of the Flash Group is invalid.

Reverse Table 3205 also contains a Count row. Each entry in this row contains a number representing the total number of SuperPages in the SuperBlock that are currently invalid. Thus, Field 3404 stores a number representing the number of currently invalid SuperPages in SuperBlock 0.

The Count can be calculated by adding up the number of "0" Valid bits in the column. The Count is separately maintained, however, as a performance optimization, since maintaining the total count in a separate field avoids the necessity for calculating this number when it is needed. The Count is used for garbage collection purposes, in a manner described in greater detail below.

Reverse Table 3205 also contains a Time Stamp row, shown as Row 3405. This contains a Time Stamp indicating the time when each SuperBlock was originally closed for writing. This field's uses include the rebuilding process, which is described below in connection with FIG. 58.

Reverse Table 3205 also contains an Erase Count row, shown as Row 3406. This contains a count of the number of times the SuperBlock has been erased, and can be used, for example, to prioritize SuperBlocks with higher erase counts for garbage collection.

FIG. 35 illustrates SuperBlock Metadata Table 3501, which contains metadata information relating to one Super-Block. A SuperBlock Metadata Table is stored in SuperPage 0 of Bank 0 of each SuperBlock (e.g., the SuperBlock Metadata Table for SuperBlock 0 of Port 0 is stored in SuperPage 0 of Block 0 of Port 0). In addition, the SuperBlock Metadata Table for the SuperBlock that is currently open for writing for each Flash Group is stored in SuperBlock Metadata Tables Block 3207 of DRAM 107.

SuperBlock Metadata Table 3501 contains one row for each SuperPage in the SuperBlock, organized by Bank. Thus, Row 3502 contains information for SuperPage 0 of Bank 0. This is followed by Row 3503, which contains information for SuperPage 1 of Bank 0, and on through SuperPage 63 of Bank 0, followed by Row 3504, which contains information for SuperPage 0 of Bank 1, and so on until the last Bank (designated as Bank n in FIG. 35) is reached.

SuperBlock Metadata Table 3501 stores three types of metadata for each SuperPage: a SuperPage Time Stamp, Defect Flag, and LBA.

SuperPage Time Stamp Column 3505 contains the time when the SuperPage was written. This information is also appended to the end of the SuperPage, and is used for rebuilding purposes in the event of a loss of data, in a manner described below.

Defect Flag Column 3510 contains a single bit indicating whether the SuperPage has been marked as "defective." A SuperPage is identified as defective if any page from the SuperPage is indicated as being defective during a flash read or a write. If this occurs during a read, in one embodiment, the SuperBlock is forced into garbage collection. If this occurs during a write, in one embodiment a different SuperPage is used for the write. Either way, the Defect Flag is set.

LBA Column 3511 contains the LBA address of data written into the SuperPage. As is explained above, each Super-Page contains data from a group of 15 consecutive LBAs. LBA Column 3511 identifies the first LBA in this group.

SuperPage 0 of Bank 0 is a special case, since it contains the SuperBlock Metadata Table for the SuperBlock, and therefore does not hold data corresponding to any LBAs. For this reason, the LBA field associated with this SuperPage does not contain LBA information.

SuperBlock Metadata Table 3501 also contains four fields that are not specific to particular SuperPages, but contain metadata relevant to the entire SuperBlock: SuperBlock Time Stamp 3506, Erase Count Field 3507, Open Flag 3508 and Closed Flag 3509.

SuperBlock Time Stamp 3506 contains a time stamp reflecting the time when the SuperBlock was closed for writing. As is described below, this field is used for power loss recovery.

Erase Count Field 3507 contains the number of times the SuperBlock has been erased. As is described below, this field may be used for wear leveling purposes.

Open Flag 3508 is set when the SuperBlock is opened for writing.

Closed Flag 3509 is set when the SuperBlock is closed. As is described below, the Open and Closed Flags are used for power loss recovery.

When a SuperBlock is open for writing, its Metadata Table is copied from flash into DRAM 107. As each SuperPage is written, the LBA field corresponding to that SuperPage is written with the appropriate LBA, and the SuperPage Time Stamp entry in Column 3505 is written with the time the SuperPage was written. Similarly, if a SuperPage is discovered to be defective, the Defect field corresponding to that SuperPage is filled in.

When a SuperBlock is closed, the associated SuperBlock Metadata Table is written from DRAM 107 into SuperPage 0 of Block 0 of Bank 0 of the Flash Group containing the SuperBlock, and is then overwritten in SuperBlock Metadata Tables Block 3207 by the SuperBlock Metadata Table for the next SuperBlock to be opened.

The SuperBlock Metadata Table is written into flash on three separate occasions:

1. When the SuperBlock is erased and placed on the Freelist. At this point, the Metadata Table is written into flash, though only the defect and erase count data are valid.

2. When the SuperBlock is opened. At this point, the table is copied into the Stage Buffer. The Flash HEMi sets the Open Flag and writes the table back into flash (though, as should be understood, a copy remains in the Stage Buffer, and only a portion of the Table needs to be written in flash). This allows the open SuperBlock to be identified in the event of an unanticipated power loss.

3. When the SuperBlock is closed. At this point, the filled-in table is copied back into flash. Prior to that occurring, the Flash HEMi sets the Closed Flag. These two flags therefore indicate all possible states of a SuperBlock: free (both Flags unset), open (Open Flag set, Closed Flag unset) and closed (both flags set).

Figure 36:
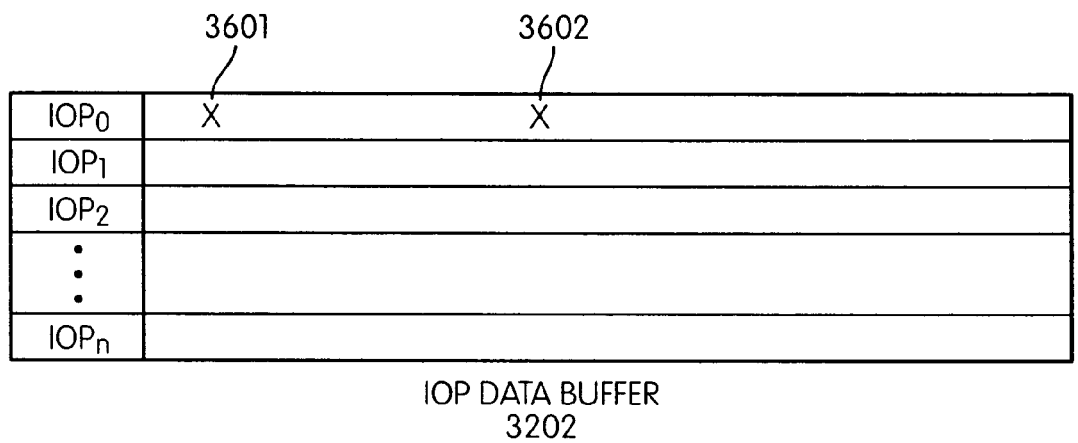
FIG. 36 illustrates an IOP data buffer.

FIG. 36 illustrates IOP Data Buffer 3202. As is shown in FIG. 32, IOP Data Buffer 3202 is stored in Data Path DRAM 107. This buffer is used to buffer data received by Data Path DRAM 107 from Host Interface 310 or from Flash Memory Module 108.

IOP Data Buffer 3202 contains one row for each IOP that can be supported by SSD Controller 106 (in the currently preferred embodiment, this is 60). Each row is large enough to hold 315 SPage Sectors, which is the maximum amount of data that can be returned for an IOP (7 Transfer Requests×3 Page Requests×15 LBAs).

On a write operation, IOP Data Buffer 3202 holds data received from a Host. On a read operation, the Data Buffer holds data received from the Flash Memory. In either case, the data is stored in LBA order. This makes it easier to calculate the exact location for data relating to a particular Transfer Request and a particular Page Request. For example, data relating to the first Page Request of the first Transfer Request issued by the IOP will always be found at the beginning of that IOP's entry in Data Buffer 3202 (the first location for IOP(0) is shown as Location 3601). Data relating to the second Page Request of the first Transfer Request will always be found at an offset from the beginning of that entry (e.g., Location 3602), the offset calculated based on the number of LBAs to be transferred by the first Page Request (note that, if the initial LBA of the transfer falls within a SuperPage, the first Page Request will transfer less than a full SuperPage).

Thus, IOP Data Buffer 3202 operates to isolate the data flow to and from Hosts 101 and 102 from the fact that Host-initiated read and write operations are divided into Transfer Requests and Page Requests which may complete at different times, or out of order. Despite the out-of-order nature of the data transfers, IOP Data Buffer 3202 stores the data in the LBA order expected by the Host.

On a Host-initiated read, IOP Data Buffer 3202 holds the data returned by Transfer Requests until all of the requested data are present, at which point the data are read out to the Host Interface, in LBA order. On a Host-initiated write, IOP Data Buffer 3202 holds the data received from the Host (again in LBA order) until all of that data has been received, at which point the data are transferred to the Flash Stage Buffers. This mechanism allows SSD Controller 106 to accept and transmit data to and from Hosts in the order expected by the Hosts, even though the Host-initiated data transfer operations are internally divided into much smaller flash reads and writes, and also allows the Data Path DRAM to operate at maximum speed despite the fact that other elements in the Controller transfer data at slower rates.

B. Transaction Structures.

As is described above, SSD Controller 106 uses four types of data structures to control read and write operations in Flash Memory Module 108: CDBinfos, IOPs, Transfer Requests and Page Requests.

As is commonplace in systems based on the SCSI Protocol, a read or write is initiated by the receipt of a Command Descriptor Block ("CDB") from a Host (other protocols include similar mechanisms, but CDBs will be used for illustrative purposes). SSD Controller 106 stores the CDB in a structure known as a CDBinfo. The controller can handle a maximum of 144 CDBinfos at one time, though, as is explained in greater detail below, 16 of these are reserved for special purposes, so that 128 standard Host-initiated read/write commands can be handled at one time, though some of these may be "on hold" pending availability of necessary resources.

SSD Controller 106 handles Host-initiated read and write commands by dividing those commands into a hierarchy of moves. The system begins by generating an IOP to handle the CDBinfo. A total of 60 IOP's may be active at one time. Each IOP can issue seven Transfer Requests (though a maximum of only 120 Transfer Requests can be active at one time), each of which can issue three Page Requests. Each Page Request causes movement of a maximum of one SuperPage of data and metadata (e.g., SuperPage 213). As is explained above, each SuperPage stores Sector Contents associated with 15 LBAs.

This architecture is designed to allow a single IOP to handle most Host-initiated transfers that include 256 consecutive LBAs. As is explained below, depending on where the first and last LBAs to be transferred fall within a SuperPage, and where they fall within a data stripe, it is possible that the first and/or last Page Request will only transfer one LBA, and also possible that the first and/or last Transfer Request will only transfer one SuperPage. Thus, in certain circumstances, the first and/or last Transfer Request in the sequence might actually transfer the Sector Contents associated with only a single LBA. Thus, a single IOP is capable of handling a minimum of 225 LBAs, and a maximum of 315. In practice, however, situations in which an IOP can handle fewer than 256 LBAs are relatively rare, so that in the current architecture a single IOP will almost always be able to handle a transaction involving 256 LBAs.

The system can handle transfers of larger numbers of LBAs, as is required by the SCSI Protocol, by repeatedly invoking the same IOP. However, based on experience, the inventors believe that 256 LBAs will be the largest move actually encountered under normal operating conditions. Note that each LBA corresponds to a standard hard drive sector, and IDE drives generally are only able to transfer 256 sectors at a time. Given that existing Hosts are designed to comply with this 256 sector limit, it is likely that a single IOP will be able to handle the vast majority of Host-initiated transfers encountered.

Figure 37:
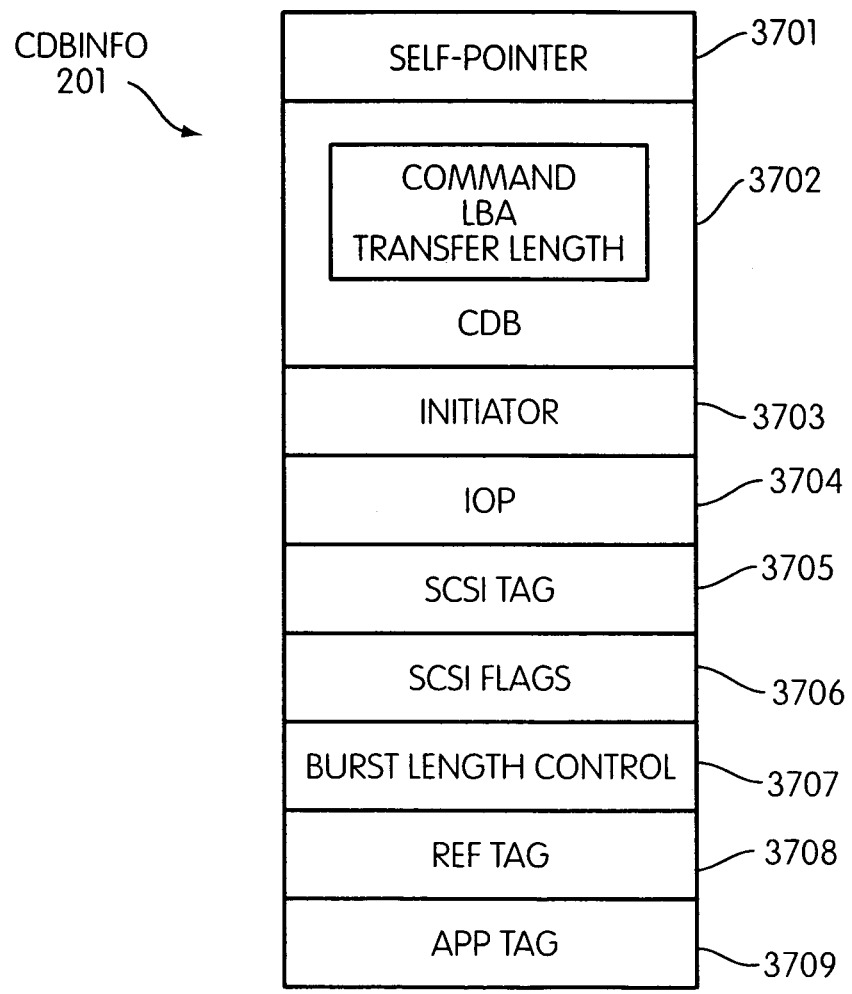
FIG. 37 illustrates a CDBinfo.

FIG. 37 illustrates the structure of an exemplary CDBinfo, e.g., CDBinfo 201.

Self Pointer 3701 identifies the location of this particular CDBinfo in CDBinfo Table 4109, which is described below in connection with FIG. 41. This value is passed to other data structures that need to identify this CDBinfo.

Self Pointer 3701 is used to call CDBinfo 201, and is copied for that purpose by operations that wish to use the CDBinfo. In addition, Self Pointer 3701 is used for error checking. At all times, Self Pointer 3701 should point to CDBinfo 201. If it does not point to itself, this indicates that an operation has overwritten the CDBinfo with incorrect data. Note that this description is also true of Self-Pointers contained in other types of data structures.

CDB Field 3702 contains a copy of the CDB (or similar data structure) obtained from the Host. The format of a CDB is specified by the Host protocol, but CDBs always contain at least the command, the LBA for the data transfer, and the transfer length.

Initiator Field 3703 contains a pointer to the Initiator entry in Shared RAM Initiator Table 4108 (see FIG. 41) corresponding to the Initiator responsible for the CDB. This information is derived from metadata supplied by the Host with the CDB. That metadata is compared to Initiator Table 4108. If a match is found, a pointer to the matched location in Initiator Table 4108 is placed in the Initiator Field. If no match is found, a new Initiator is popped off of Initiator Freelist 4112 (see FIG. 41), the new Initiator is entered in Table 4108, and the pointer to the new Initiator is placed in Initiator Field 3703.

IOP Field 3704 points to the IOP generated to carry out the transaction required by the CDBinfo.

SCSI Tag 3705 contains the SCSI (or Queue) Tag received from the Initiator. As is understood in the field, the SCSI Tag is part of the information received from an Initiator when a connection is initially formed. This information must be returned to the Initiator in any response to the CDB.

SCSI Flags 3706 contain flags required by the SCSI Protocol.

Figure 42:
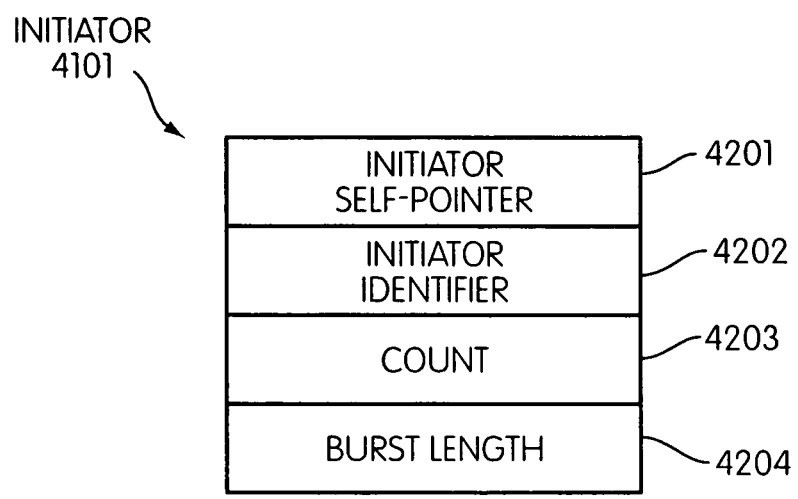
FIG. 42 illustrates initiator information.

Burst Length Control Field 3707 contains burst length control information copied from Initiator Info Burst Length Field 4204, which is described below in connection with FIG. 42.

RefTag Field 3708 contains the RefTag (if any) received in connection with the CDB, the use of which is explained above.

AppTag Field 3709 contains the AppTag and the AppTag Mask (if any) received in connection with the CDB, the use of which are explained above.

Figure 38:
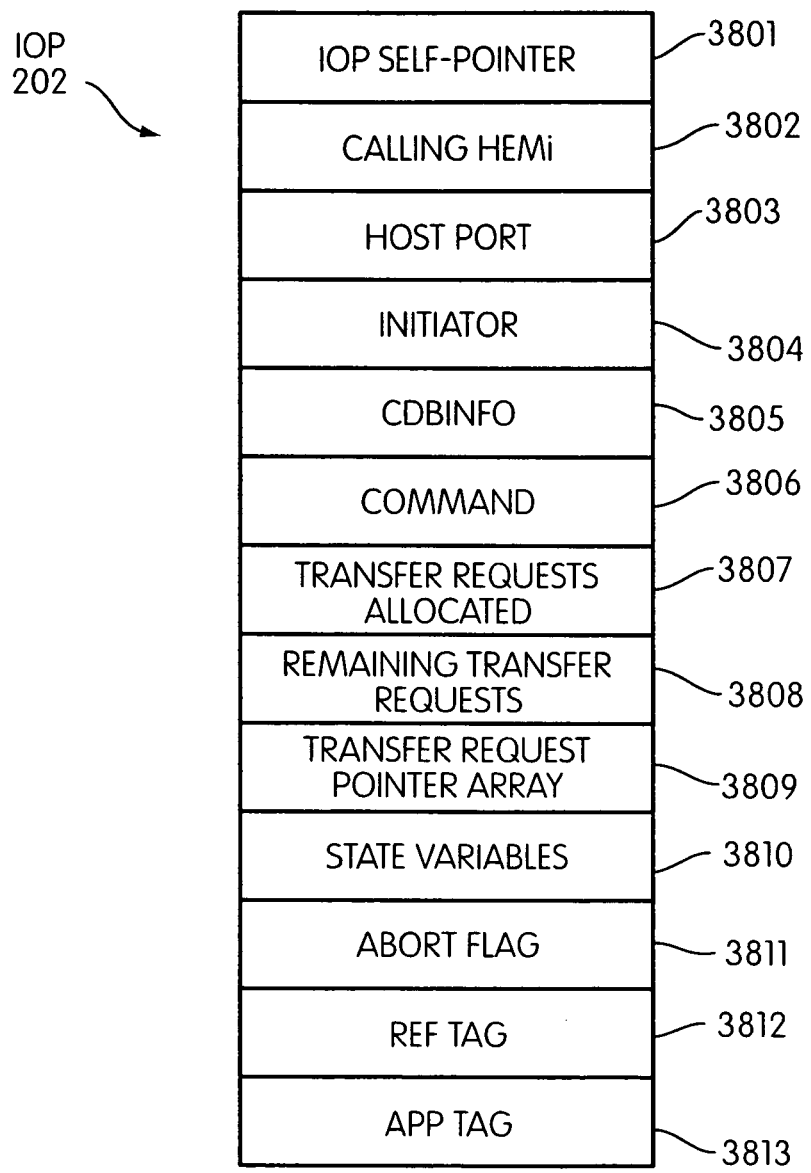
FIG. 38 illustrates an IOP.

FIG. 38 illustrates the internal structure of IOPs such as IOP 202. As is described below, IOPs are stored in IOP Table 4110 of Shared RAM Block 318 (see FIG. 41, below), and, when an IOP is in use by a HEMi, the IOP is also copied into that HEMi's mRAM.

In the currently preferred embodiment, each IOP is a 32-dword data structure containing the following fields:

Self Pointer 3801. This contains the address within Shared RAM IOP Table 4110 (see below) at which this IOP is located. This field is set at initialization. This is the only field in the IOP that contains valid data when the IOP is on IOP Freelist 4103 (see below).

Calling HEMi Field 3802 contains an identifier for the HEMi that is currently operating on this IOP. This is the only HEMi authorized to modify any data in IOP 202 (with the exception of Abort Flag 3811, which is further described below).

Host Port Field 3803 identifies the Host Port (0 or 1) at which the original Host command that caused invocation of the IOP was received. As is explained below, this is the Port to which the IOP must be sent when the command is complete.

Initiator Field 3804 contains a pointer to the Initiator entry in Shared RAM Initiator Table 4108 (see below) corresponding to the Initiator originally responsible for the CDB that led to the invocation of this IOP.

CDBinfo Field 3805 contains a pointer to the CDBinfo in Shared RAM CDBinfo Table 4109 (see below) that caused this IOP to be called.

Command Field 3806 identifies the type of command the IOP is designated to carry out. In one embodiment, IOPs are only generated for Host read or write commands. In a different embodiment, IOPs may also be generated for other types of commands. In this embodiment, the IOP is transmitted to ARM Processor 2002 for handling of non-read/write commands.

Transfer Requests Allocated Field 3807 contains the number of Transfer Requests the IOP has allocated for the current read or write operation. When the IOP is initialized by a RdWr HEMi, that HEMi calculates the number of Transfer Requests necessary to perform the read or write command designated by the CDBinfo, and enters that number into this field. In the currently preferred embodiment, this number is set to a maximum of seven.

Remaining Transfer Requests Field 3808 contains the number of Transfer Requests allocated by the IOP that have not yet completed. When the IOP is initially set up, this field contains the same value as Transfer Requests Allocated Field 3807. As each Transfer Request completes, Remaining Transfer Requests Field 3808 is decremented.

Transfer Request Pointer Array 3809 contains an entry for each Transfer Request allocated by the IOP. For each such Transfer Request, Transfer Request Pointer Array 3809 contains a pointer to the Flash HEMi that is handling the Transfer Request, and a pointer to the Transfer Request itself, in Transfer Request Table 4111 (see below). The pointer to the Transfer Request is copied from the Transfer Request's Self Pointer (see below) when the Transfer Request is popped off the Transfer Request Freelist 4104 (see below).

Transfer Request Pointer Array Field 3809 is used to identify the Transfer Requests that should be returned to Transfer Request Freelist 4104 when execution of the IOP is complete. This field is also used to identify Transfer Requests that should be aborted if IOP Abort Flag 3811 is set. Abort operations are further described below.

State Variables Field 3810 contains information used to track the state of the IOP, including information about whether the command is complete, whether an error has occurred, etc. This field also indicates whether the IOP is new or "re-entrant." As is described above, if a CDB requires a transfer of more data than can be handled by a single IOP, the transfer is broken up into segments, and the same IOP is called repeatedly to handle each segment. State Variables Field 3810 tracks where the IOP is in this process.

Abort Flag 3811. This flag indicates that operation of the IOP should be aborted. It is the only portion of the IOP that can be written to by any HEMi other than the HEMi identified in Calling HEMi Field 3802.

RefTag Field 3812 contains the RefTag, the use of which is described above.

AppTag Field 3813 contains the AppTag Mask and the AppTag, the use of which are described above.

Figure 39:
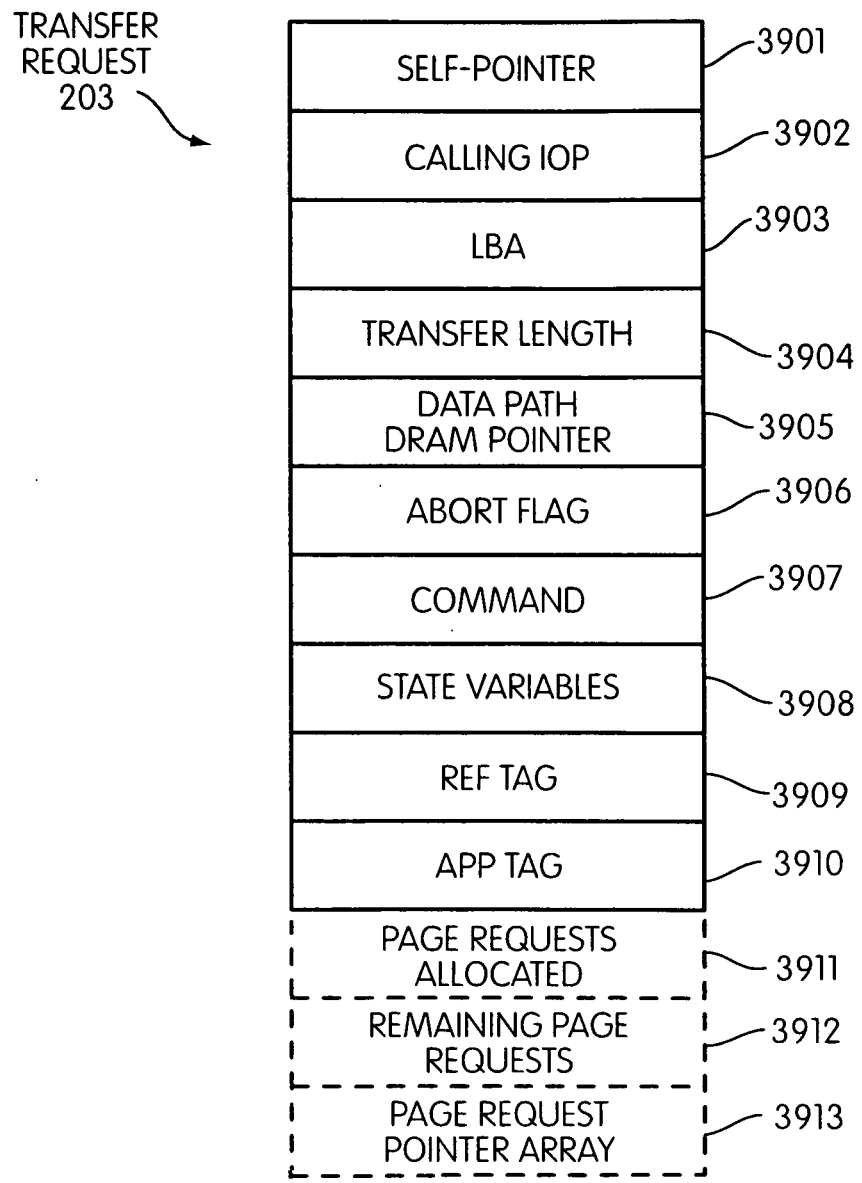
FIG. 39 illustrates a transfer request.

FIG. 39 illustrates the internal structure of Transfer Requests such as Transfer Request 203. At initialization, a space consisting of 16 32-bit Dwords is allocated in Transfer Request Table 4111 (see below) for each Transfer Request. In the currently preferred embodiment, only 14 of these Dwords are used. The additional two Dwords are reserved for future expansion.

Transfer Requests are data structures that are created by RdWr HEMi's and used by Flash HEMi's. They contain the following fields:

Self Pointer 3901. This identifies the location of this particular Transfer Request in Transfer Request Table 4111 (see below). It is passed to other data structures that need to identify this Transfer Request, e.g., Page Requests that are required to identify the calling Transfer Request.

Calling IOP Field 3902. This contains the identification of the IOP that caused this Transfer Request to be created, and is taken from IOP Self Pointer 3801.

LBA Field 3903. This contains the starting LBA for the transfer. For example, if the calling IOP requires a read from LBAs 0-100, LBA Field 3903 for a first Transfer Request would read "0", LBA Field 3903 for a second Transfer Request would read "45" and LBA Field 3903 for a third Transfer Request would read "90" (as is explained above, each Transfer Request can handle a maximum of 45 LBAs).

Transfer Length Field 3904. This contains the number of LBAs to be transferred.

Data Path DRAM Pointer 3905. This contains a pointer to the address in IOP Data Buffer 3202 to which data is to be written or from which data is to be read for this Transfer Request. As is explained above, IOP Data Buffer 3202 is organized by IOP, and contains space for data read from Flash Memory Module 108 or to be written to the Flash Memory Module Abort Flag 3906. This flag indicates that operation of the Transfer Request should be aborted. The Abort Flag is checked by Transfer Requests prior to transferring data to insure that data is not transferred for a command that has been aborted. Abort handling is further described below.

Command Field 3907. This identifies the nature of the required command. Possible states include Read, Write, Format, Move and Erase.

State Variables 3908. These contain variables used to track the current state of the Transfer Request. When a Flash HEMi begins operation on a Transfer Request, it checks these variables to determine what type of execution is required. For example, a "Done" state variable tells the Flash HEMi that the Transfer Request is finished, and that a clean-up routine (described below) should commence.

RefTag Field 3909. This stores the RefTag for the first Sector that is subject to the Transfer Request. This information is taken from RefTag Field 3812 of the calling IOP, though adjusted as necessary for Transfer Requests other than the first Transfer Request called by the IOP.

AppTag Field 3910. This stores the AppTag and AppTag Mask. This information is taken from AppTag Field 3813 of the calling 10P.

Page Requests Allocated Field 3911 contains the number of Page Requests that the Transfer Request has allocated for the current read or write operation. In the currently preferred embodiment, this number is set to a maximum of three.

Remaining Page Requests Field 3912 contains the number of Page Requests allocated by the Transfer Request that have not yet completed. This field initially contains the same value as Page Requests Allocated Field 3911. As each Page Request completes, the Flash HEMi decrements Remaining Page Requests Field 3912.

Page Request Pointer Array 3913. This field contains a pointer to each Page Request allocated to handle the transfer required by the Transfer Request.

Page Requests Allocated Field 3911, Remaining Page Requests Field 3912 and Page Request Pointer Array Field 3913 are not included in Transfer Requests stored in Transfer Request Table 4111 in Shared RAM (see below). Instead, these fields are added to a Transfer Request when the Transfer Request is stored in the MRAM of a Flash HEMi, in a process explained in greater detail below.

Figure 40:
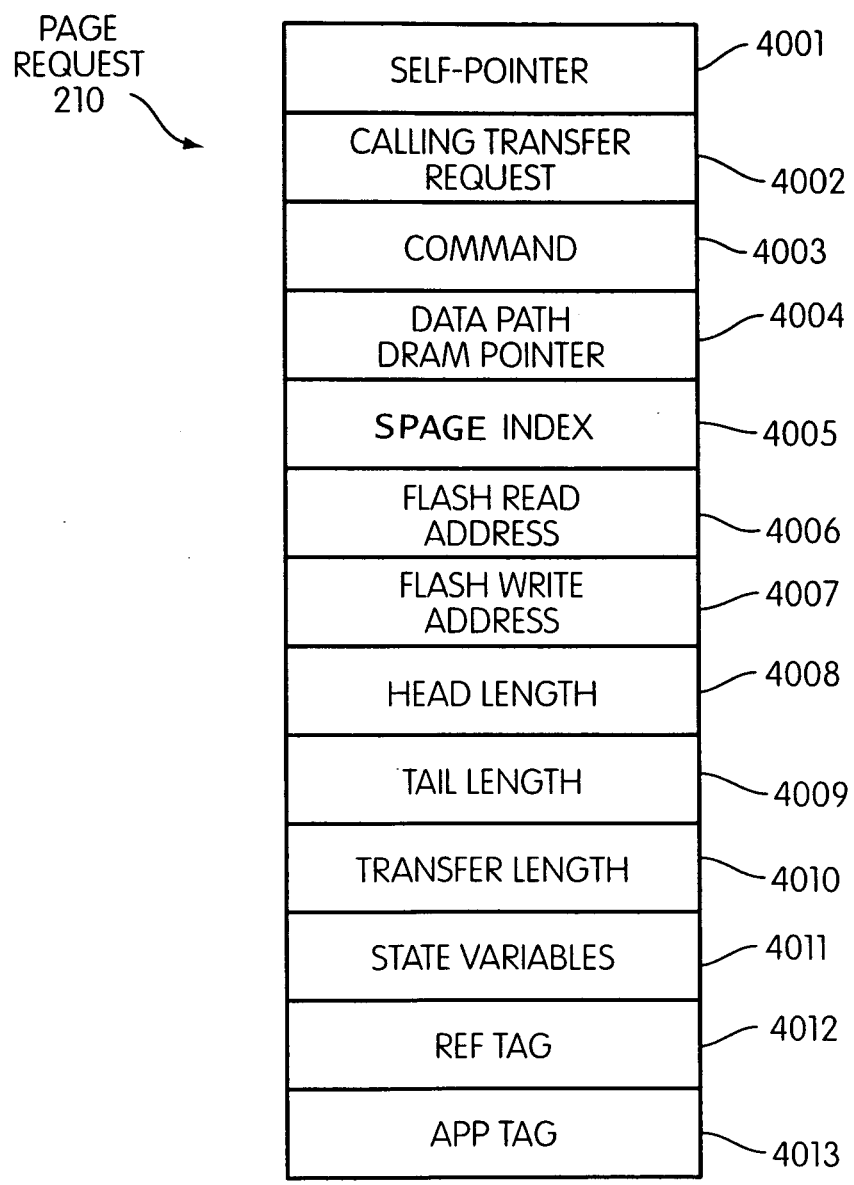
FIG. 40 illustrates a page request.

FIG. 40 illustrates the structure of Page Requests such as Page Request 210. Page Requests are stored in the mRAM of Flash HEMi's. When a Flash HEMi receives a Transfer Request from a RdWr HEMi, the Flash HEMi sets up the Page Request(s) necessary to carry out the Transfer Request, and populates Transfer Request Page Request Pointer Array 3913 with information identifying those Page Requests. Each Page Request includes the following fields:

Page Request Self Pointer 4001. This points to the location of the Page Request in Page Request Table 2906 in the mRAM of the Flash HEMi that holds the Page Request.

Calling Transfer Request 4002. This contains an identifier for the Transfer Request that called this Page Request, copied from Transfer Request Self Pointer 3901.

Command Field 4003, which is derived from Command Field 3907 of the calling Transfer Request. Possible values in this field include the following:
Read
Write
Read/Modify/Write
Erase Note that the Read/Modify/Write state is set if Command Field 3907 in the Transfer Request is a "write," and Transfer Length Field 4010 (see below) of the Page Request indicates that the write is for less than a full page. As is explained below, in this case a Read/Modify/Write is needed, because a flash write occurs a full page at a time, and if the Page Request is to write less than a full SuperPage, the remainder of the old SuperPage must be copied and written into the new SuperPage.

Data Path DRAM Pointer Field 4004. This is derived from Transfer Request DRAM Pointer Field 3905, but is modified to reflect where the data relating to this particular Page Request should be placed in or found in the DRAM space allocated to the Transfer Request (e.g., data relating to the first Page Request would be found at the beginning of the Transfer Request space, data relating to the second Page Request would be offset into the Transfer Request space, etc.)

SPage Index Field 4005 stores the index into Forward Table 3201 representing the LBA range being handled by this Page Request. This information is generated based on Transfer Request LBA Field 3903, modified as necessary to reflect other Page Requests initiated as a result of the same Transfer Request.

Flash Read Address Field 4006. This contains the address in the Flash Memory Group at which a read is to occur, and identifies that location by Bank, Block and Page. This information is derived from Forward Table 3201. When a Flash HEMi receives a Transfer Request, the Flash HEMi uses the information in LBA Field 3903 from the Transfer Request to find flash address information corresponding to the LBA in Forward Table 3201. As is explained above, an LBA is converted into a physical flash address by dividing the LBA by fifteen to find a row in the Forward Table, and using the remainder from the division to identify the physical location of the sector.

Flash Write Address Field 4007. This contains the Flash Group address to be used for a write by the Page Request, and is calculated based on the SuperPage to be used for the write. The manner in which that SuperPage is chosen is described below. The Page Request includes both a read address and a write address field because a read-modify-write requires both.

Head Length Field 4008. In cases of partial transfers in which the transfer begins in the middle of a SuperPage, this field holds the offset in LBAs between the beginning of the SuperPage and the location where the transfer is supposed to begin. This field is calculated by taking the LBA used to determine the Flash Read Address or Flash Write Address (see above) and dividing that LBA by 15. The remainder from that division is used for the Head Length Field.

Tail Length Field 4009. In cases of partial transfers in which the transfer ends in the middle of a SuperPage, this field holds the offset in LBAs between the end of the SuperPage and the location where the transfer is supposed to end. This field is calculated by adding the value in Head Length Field 4008 to the value in Transfer Length Field 4010, and subtracting the resulting value from "15."

Transfer Length Field 4010. This specifies the length of the transfer required of this Page Request. This information is generated by the Flash HEMi based on Transfer Length Field 3904 of the Transfer Request, and on the portion of the transfer that this particular Page Request will be required to handle. Note that Head Length Field 4008, Tail Length Field 4009 and Transfer Length Field 4010 will always add up to the number of LBAs in a single SuperPage (in the current embodiment, this is 15).

State Variables Field 4011. This field is made up of a series of flags used to keep track of the current state of Page Request 210. Examples of the use of State Variables are described in connection with FIGS. 51 and 53. Multiple flags may be set at the same time, though certain combinations are illegal. In the currently preferred embodiment, this field includes the following flags, though, as should be understood, the exact flags used are implementation-dependent, and differing sets of state flags could be used to obtain the same results:

Command: this indicates that the Page Request is prepared to issue a command to the Flash Memories Ready/Wait: this indicates that the Page Request is ready to proceed and is waiting for resources to be available.

Need stage buffer: this indicates that the Page Request needs the Flash Stage Buffer to proceed Flash transfer done: this indicates that the flash read or write required by the Page Request is complete.

$1^{st}$, $2^{nd}$: this indicates the current phase of the transaction. For example, in a read/modify/write, the Page Request is required to issue different commands to the Flash Memories during different phases of the transaction. This field allows the Page Request to keep track of where it is in that process.

Page Request done: this indicates that the Page Request has completed all necessary operations.

Data Transfer error: this indicates that a transfer handled by the Page Request resulted in an error.

RefTag Field 4012 stores the RefTag of the first sector of data addressed by the Page Request. This information is derived from RefTag Field 3909 of the calling Transfer Request, though offset as necessary for Page Requests other than the first Page Request called by the Transfer Request.

AppTag Field 4013 stores AppTag and AppTag Mask information taken from AppTag Field 3910 of the calling Transfer Request.

C. Shared RAM Structures.

Figure 41:
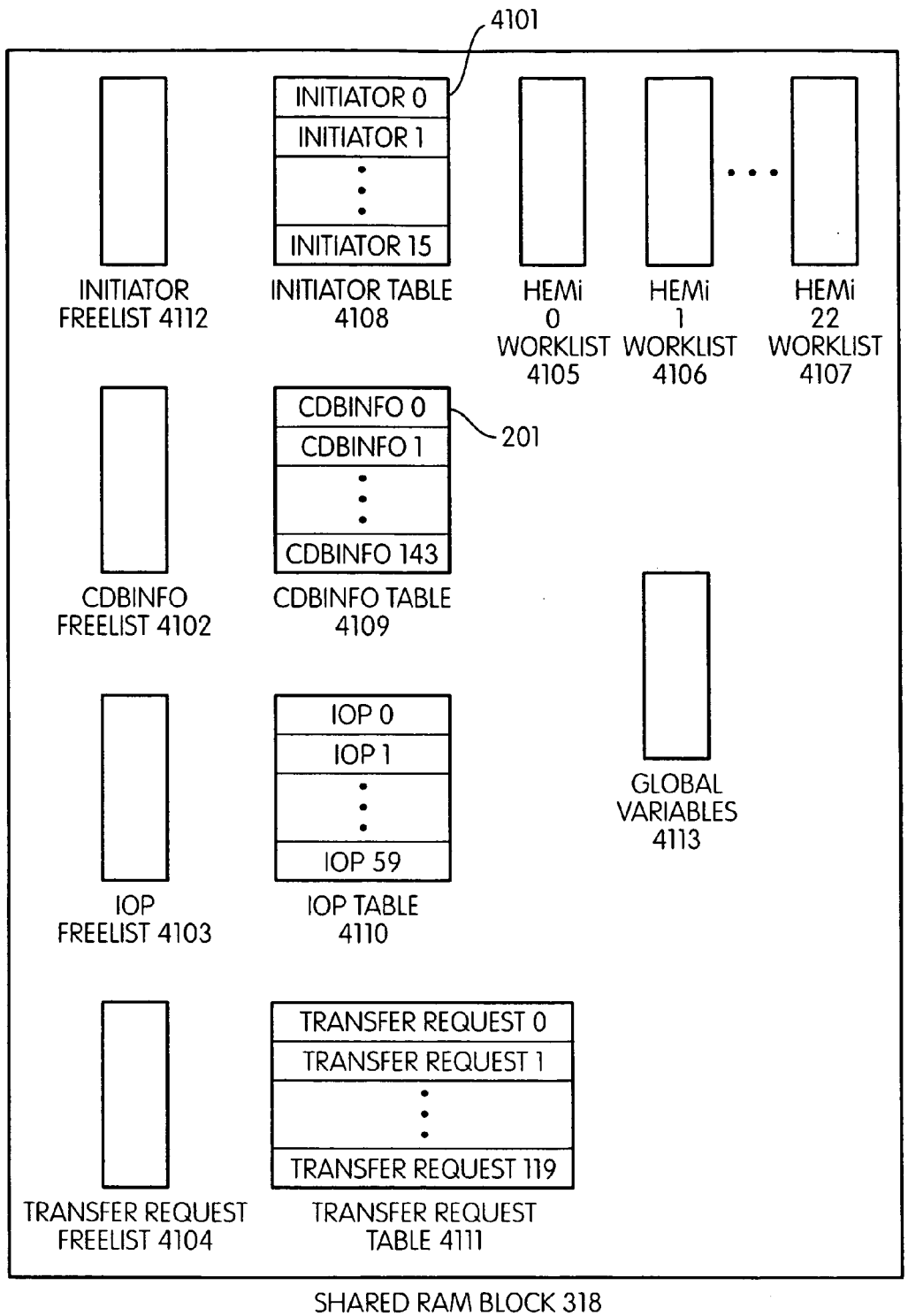
FIG. 41 illustrates the contents of a shared RAM block.

FIG. 41 illustrates the information stored in Shared RAM Block 318.

Shared RAM Block 318 contains two data structures relating to Initiators: Initiator Freelist 4112 and Initiator Table 4108.

In the current embodiment, SSD Controller 106 is capable of responding to commands from sixteen simultaneously active Initiators. Thus, Initiator Table 4108 contains sixteen slots, each of which contains space for information related to a single Initiator, indicated as Initiators 0-15, e.g., Initiator Info Block 4101, which is further described below in connection with FIG. 42. Although the SCSI Protocol requires that SSD Controller 106 respond to at least sixteen active Initiators, in an alternate embodiment, SSD Controller 106 could be designed to respond to a larger number of Initiators than is required by the protocol, by increasing the size of Initiator Table 4108 and Initiator Freelist 4112.

Initiator Freelist 4112 is a 16-deep FIFO queue that contains pointers to empty slots in Initiator Table 4108. When a new Initiator initially seeks to communicate with SSD Controller 106, the pointer from the top of Initiator Freelist 4112 is popped off the queue, and the slot in Initiator Table 4108 referenced by that pointer (e.g., Slot 4101) is used for storage of information about the new Initiator. If Initiator Freelist 4112 is empty, this indicates that SSD Controller 106 cannot handle any additional Initiators. SSD Controller 106 may respond to this condition by providing status information through Host Interface 310.

As should be understood, the manner in which Initiator information is communicated to SSD Controller 106 is protocol-specific. In general, however, this information is communicated in a data structure that is provided before the Initiator first begins initiating commands directed at the SSD Controller. The information in that data structure is used to populate that Initiator's entry in Initiator Table 4108.

Shared RAM Block 318 contains two data structures relating to CDBinfos: CDBinfo Table 4109 and CDBinfo Freelist 4102.

CDBinfo Table 4109 contains slots for 144 CDBinfos, designated as CDBinfos 0-143. Each of these slots can store a single CDBinfo, e.g., CDBinfo 201. Information stored in a CDBinfo is described in connection with FIG. 37.

Freelist 4102 is a 144-deep FIFO queue that contains pointers to empty slots in CDBinfo Table 4109. When a new CDBinfo is required, a pointer is popped from the top of Freelist 4102. The information for the new CDBinfo is then written into the empty slot in CDBinfo Table 4109 pointed to by the popped pointer. When processing of a CDBinfo is completed, that CDBinfo is erased, and a pointer to the slot containing that CDBinfo in CDBinfo Table 4109 is added to Freelist 4102, thereby freeing up the space so that it can be used for a new CDB.

The SCSI protocol requires that SSD Controller 106 guarantee the ability to handle CDBs under special circumstances, even if resources would not otherwise be available. These requirements, which affect the manner in which Freelist 4102 is controlled, are discussed in detail below in connection with FIGS. 46 and 47.

Shared RAM Block 318 contains two data structures relating to IOPs: IOP Table 4110 and IOP Freelist 4103. These operate similarly to the corresponding CDBinfo structures. IOP Table 4110 contains a slot for each of the 60 IOPs that SSD Controller 106 can handle at one time. The format of the IOP information contained in each slot of IOP Table 4110 is described in connection with FIG. 38. IOP Freelist 4103 is a 60-deep FIFO queue that contains pointers to slots in IOP Table 4110 that are free (not filled in with a valid IOP).

Shared RAM Block 318 contains two data structures relating to Transfer Requests: Transfer Request Table 4111 and Transfer Request Freelist 4104. These operate similarly to the corresponding IOP structures. Transfer Request Table 4111 contains a slot for each of the 120 Transfer Requests that SSD Controller 106 can handle at one time. The format of this information is described in connection with FIG. 39. Transfer Request Freelist 4104 is a 120-deep FIFO queue that contains pointers to slots in Transfer Request Table 4111 that are free (not filled in with a valid Transfer Request).

Shared RAM Block 318 also contains one Worklist for each HEMi contained in SSD Controller 106. Although the described embodiment includes 23 HEMi's, each of which has an associated Worklist in Shared RAM Block 318, FIG. 41 only shows three of these: 4105, 4106 and 4107. As should be understood, the number of HEMi's varies among implementations, and Shared RAM Block 318 will always contain one Worklist for each HEMi.

Each HEMi Worklist is a queue of tasks to be operated on by the associated HEMi. In general, the HEMi Worklists contain pointers to CDBInfos in CDBInfo Table 4109, IOPs in IOP Table 4110 and Transfer Requests in Transfer Request Table 4111, and the presence of such a pointer on a HEMi Worklist indicates that the associated HEMi is required to perform processing tasks relating to the identified CDBinfo, IOP or Transfer Request. HEMi's communicate with each other by placing pointers on HEMi Worklists.

In the current embodiment, the Worklists are FIFO's, and are controlled by FIFO Pointer Registers, as described in connection with FIG. 24 (e.g., Pointer Registers 2205). Tasks are popped off the Worklists in the order received, with no attempt to prioritize specific tasks. In an alternate embodiment, tasks are prioritized by, for example, including a priority bit in an IOP. Transfer Requests invoked by an IOP with the priority bit set may also include a priority bit. Such high-priority Transfer Requests can be added to the top of HEMi Worklists, instead of appended to the bottom, so that such Transfer Requests become the next Transfer Request to be handled by the HEMi, even if other Transfer Requests are already on the Worklist.

Once a CDBinfo, IOP or Transfer Request is moved to a HEMi Worklist, no other HEMi is able to modify that structure (with the exception of abort-related information).

Shared RAM Block 318 also contains Global Variables 4113. These store variables used by HEMi's in processing FIG. 42 illustrates the structure of the entries in Initiator Table 4108. Each such entry (e.g., Initiator 0 4101) contains an Initiator Self-Pointer Field (4201), which points to the location of the Initiator in Table 4108.

Initiator Identifier Field 4202 contains information identifying this particular Initiator. This information is received from the Host, and is used in communications between the Host and SSD Controller 106, so that the Host can route communications from SSD Controller 106 to the proper Initiator. Initiator Identifier field 4202 is populated by the Receive HEMi that receives the first request from a Host indicating that a new Initiator has requested access to SSD Controller 106 (the format of such requests is specific to particular protocols, e.g., SAS, FCAL, etc., and is understood by those of ordinary skill in the art). Upon receiving such an indication, the Receive HEMi pops an Initiator off Initiator Freelist 4112 and populates the Initiator Identifier field with the identification information received from the Host. In the currently preferred embodiment, the Initiator Identifier includes a Worldwide Name received as part of the Initiator's Open frame.

Count Field 4203 contains the number of CDBs received from this Initiator that have not yet completed. When a CDB is received, the Receive HEMi identifies the Initiator and increments Count Field 4203 for that Initiator. Count Field 4203 is decremented as part of the clean-up process when an IOP finishes executing.

When Count Field 4203 reaches 0, this indicates that this Initiator has no remaining commands in the system. At that point, in one embodiment, the Initiator information is erased, and the data structure is returned to Initiator Freelist 4112. In an alternate embodiment, Initiators are only returned to the Freelist when the Freelist is empty and a new Initiator is required.

Burst Length Field 4204 contains burst length control information received from the Host as part of the metadata received when the Initiator is initially set up. Burst length control information, which is specified by the SCSI Protocol, is used to set the maximum length of a burst data transfer. If a transfer to or from an Initiator would exceed the maximum length, SSD Controller 106 must interrupt the transfer, allow transfers to or from other Initiators to take place, and then resume the transfer. This is handled by the Transmit HEMi that is handling the transfer. After the limit is reached, the Transmit HEMi disconnects the transfer and then immediately attempts to reconnect.

V. Operation

A. Write Performance.

The primary performance bottleneck for a high-capacity solid state drive is the interface to the flash memory. SSD Controller 106 is therefore designed to maximize use of this interface. It does so by breaking transactions up into relatively small chunks, and executing the chunks with a high degree of parallelism, with the intent of keeping the flash interface busy as much as is possible. Thus, Flash Memory Module 108 contains a number of Flash Groups, each of which has an independent interface to the rest of the system, plus an associated Flash Port allowing each Flash Group to operate independently and in parallel. Within each Flash Group, memory is broken into Banks, each of which can operate in parallel. Although only one Bank per Flash Group can communicate with SSD Controller 106 at a time, small portions of transactions are fed to multiple Banks, allowing Banks to carry out internal flash operations while the flash interface is used for other purposes. This, plus the use of multiple buffers, allows transactions to complete far faster than would be possible if reads or writes had to occur in sequence.

Typical contemporary single-level cell flash memory chips that operate at 40 MHz take approximately 200 microseconds to perform a page write operation. (As is understood by those of ordinary skill in the art, a flash memory write operation often involves a read-modify-write.) In addition, it takes approximately 50 microseconds to move a SuperPage of data from the Stage Buffer into the Flash Chip Buffers. This means that a Flash Group can pipeline five consecutive write operations to different Banks, and thereby keep the flash interface completely occupied: each write operation requires the bus for 50 microseconds, and then operates internally for 200 microseconds, during which four other write operations can use the bus. Thus, data can be written to a complete stripe of 90 LBAs in 500 microseconds.

Figure 43:
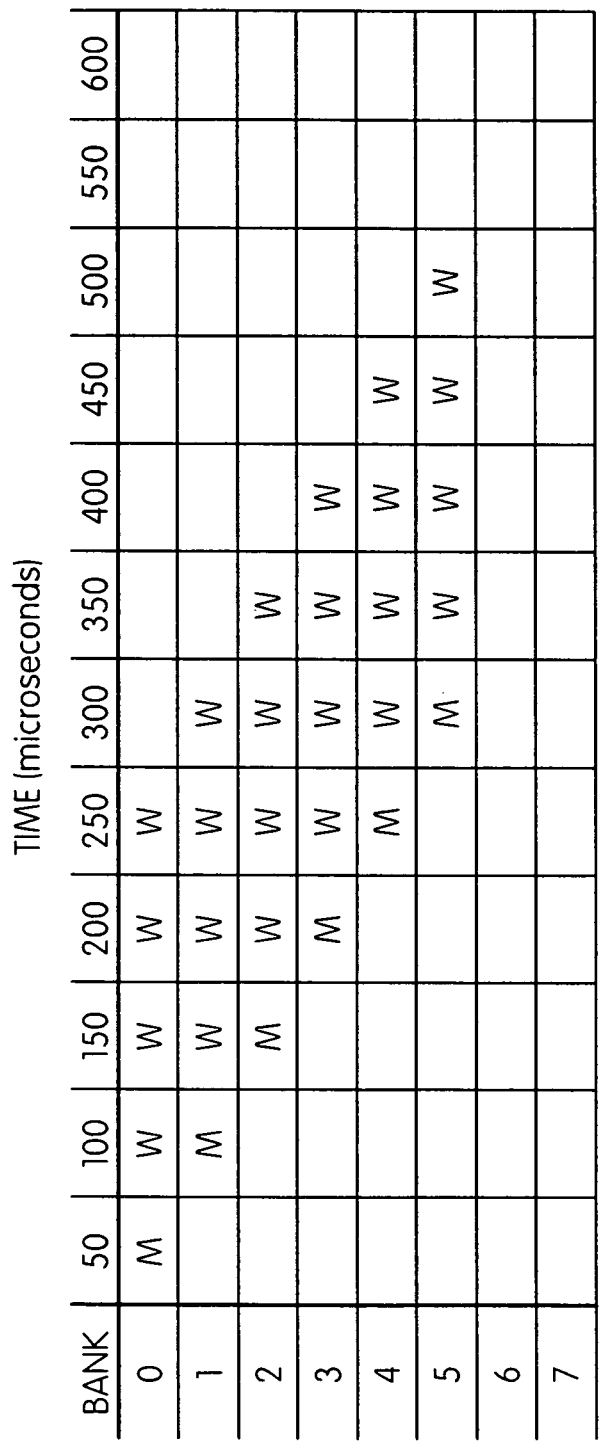
FIG. 43 illustrates SLC flash write timing.

This is illustrated in FIG. 43, which contains a table cross-referencing Banks 0-7 of one Flash Group and Time, in 50 microsecond increments. This table shows a six-SuperPage write to SuperPages on Banks 0-5, consisting of 90 LBAs.

In the first 50 microsecond period, Bank 0 uses the bus to move a SuperPage of data from the Stage Buffer to the Bank 0 Flash Page Buffers. This is illustrated as an "M" in FIG. 43. In the next four 50 microsecond periods, the Flash Dies on Bank 0 perform an internal write operation from their Page Buffers to the flash memory (illustrated as a "W" in FIG. 43).

Because Bank 0 does not need the bus after the initial period, Bank 1 is able to move data from the Stage Buffer to the Bank 1 Page Buffers during the second 50 microsecond period (designated as Time 100). Bank 1 can then begin the internal flash write operation, turning the bus over to Bank 2. Writes to Banks 3, 4 and 5 proceed similarly.

As can be seen, this six-SuperPage write takes 500 microseconds. The flash bus is in use during 300 microseconds of that period. Because the flash write operations can occur in parallel to bus operations, a write that would take 1,500 microseconds if it occurred serially (6×250) is accomplished in approximately one-third the time.

In addition, after 300 microseconds, the flash bus is free, thereby allowing other transactions to gain access to the bus and thereby allowing multiple transactions to overlap.

FIG. 43 shows write operations, since the latency involved in such operations is considerably higher than for read operations, which take approximately 100 microseconds (50 microseconds to read the data to the Flash Page Buffers and 50 microseconds to move the data to the Stage Buffer). Thus, the described architecture is designed to maximize performance for writes, although it also tends to increase performance for reads, though to a lesser extent, given that it is only possible to overlap two read operations on the same Flash Group (one reading from the flash, one moving the data to the Stage Buffer).

Because this same degree of performance occurs in parallel on each Flash Port, and because data is striped across the Flash Groups, large transactions can occur much more rapidly than would be possible without the use of this parallel pipelined architecture. Thus, in theory, a system containing 12 Flash Groups could write 1080 LBAs (12×90) in a 500 microsecond period. This theoretical maximum is unlikely to be achieved often in the real world, since it requires each of the writes to line up perfectly in terms of Banks and Flash Groups. Nevertheless, as should be apparent, the parallelism and pipelining of the described architecture masks flash-induced latencies and allows sequences of reads and writes to be handled with considerably higher performance than conventional hard drives or flash memory devices.

Because the described architecture includes considerable performance headroom beyond that which is necessary for a system incorporating standard SLC flash chips, it can be adapted for slower-speed MLC flash without major modification. As is understood in the art, MLC ("multi-level cell") flash stores two (or more) bits per flash cell. MLC chips are therefore cheaper for a given amount of storage. However, MLC chips are slower on reads and writes.

FIG. 44 shows a 90 LBA write on a single Flash Group made up of MLC flash chips that require 350 microseconds for a page write (typical performance for MLC chips currently in the market). As can be seen, the entire write is accomplished in 600 microseconds. Although this exceeds the 500 microseconds shown in FIG. 43 for SLC devices, the difference is only 100 microseconds for six complete page writes despite the fact that MLC chips take an additional 100 microseconds for each write. As before, this write can be accomplished in parallel across multiple Flash Groups. This parallelism is sufficient to largely mask the additional latency of the MLC chips, such that the responsiveness of the system across the Host interface will be completely acceptable to the Host whether SLC or MLC chips are used.

B. Read and Write Handling.

Figure 45A:
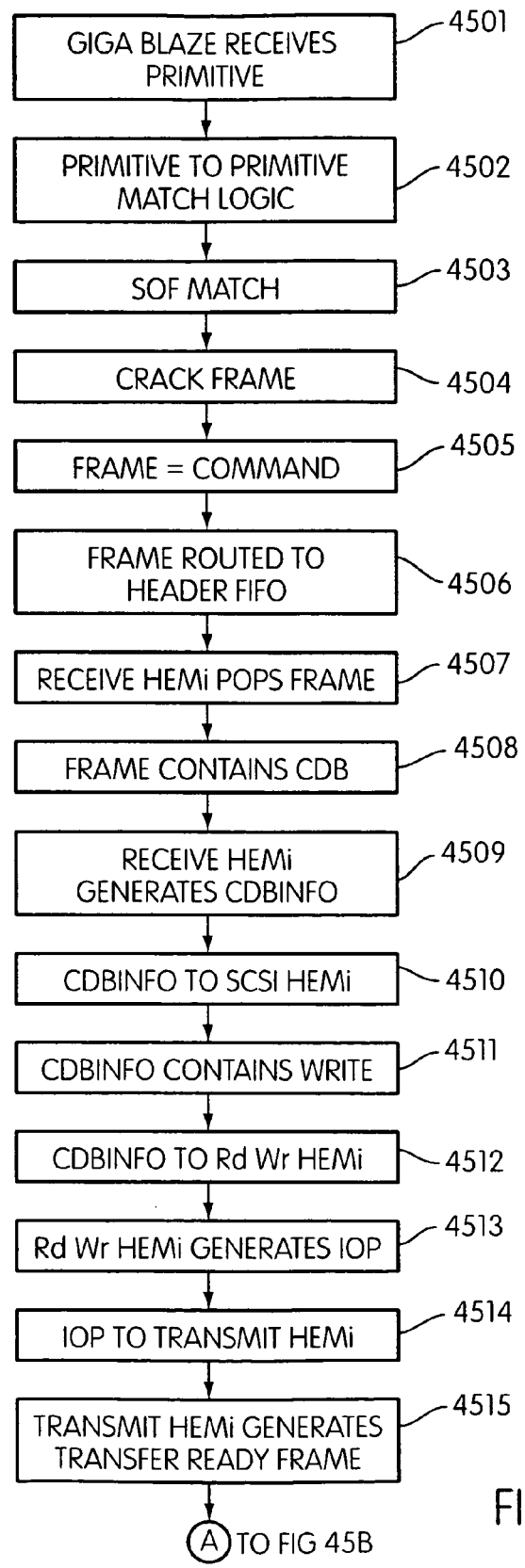
FIG. 45 illustrates steps followed by a host port when a host command is received.
Figure 45B:
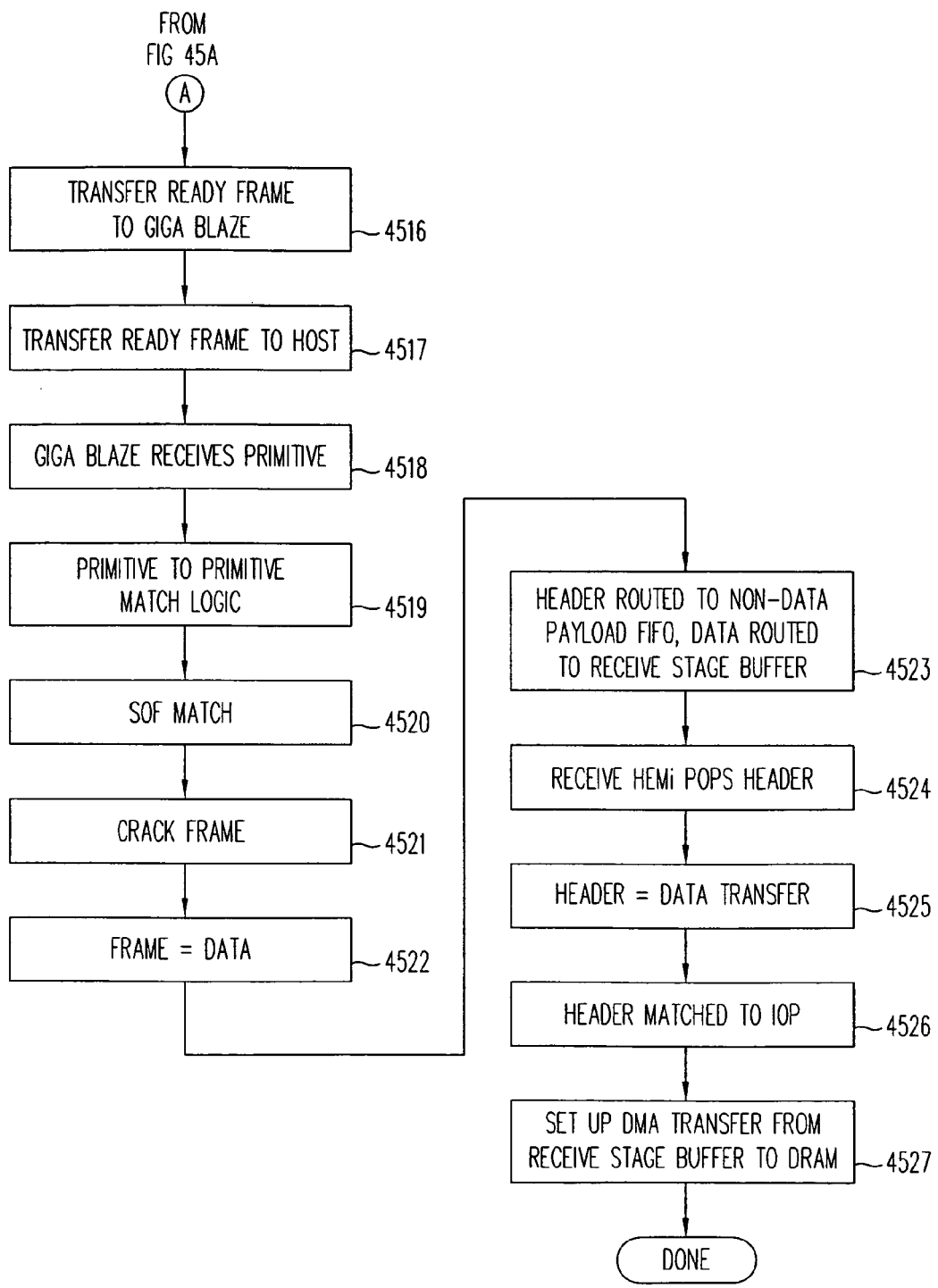

FIG. 45 contains a flowchart that illustrates the steps followed by a Host Port (e.g., Host Port 0 104) when a Host-initiated write command is received. This flowchart assumes that the initial frame received is a write and proceeds on that basis. For this reason, numerous steps required in an actual implementation (e.g., to determine if a received command is a read or a write and branch accordingly) are not illustrated.

In Step 4501, GigaBlaze 1801 receives a primitive from the Host.

In Step 4502, GigaBlaze 1801 sends the primitive to Primitive Match Logic 1802.

In Step 4503, the Primitive Match Logic identifies the primitive as a Start of Frame ("SOF") primitive, indicating that it is followed by a frame. (As should be understood, this description is conceptual in nature, and will not attempt to describe the specific nature of the primitives received. As should also be understood, the nature of the communications depends to some extent on the specific protocol, and details of this process differ depending on the protocol being used.)

In Step 4504, under control of the register from Primitive Match Control Registers 1903 that corresponds to the register from Primitive Match Registers 1902 that matched the received primitive, Frame Cracking Logic 1904 evaluates the first double-word of the frame.

In Step 4505, the Frame Cracking Logic determines that the frame is a command frame.

In Step 4506, Frame Router 1803, operating under control of Primitive Match Logic 1802, routes the frame to Non-Data Payload FIFO 1804. This is done under the control of the Primitive Match Control Registers and the Frame Cracking Logic.

In Step 4507, the Receive HEMi for the Host Port (e.g., Receive HEMi 1702) pops the command frame from the Header FIFO.

In Step 4508, the Receive HEMi evaluates the frame and determines that it contains a CDB.

In Step 4509, as a result of determining that the frame contains a CDB, the Receive HEMi generates a CDBinfo.

In Step 4510, the Receive HEMi sends the CDBinfo to SCSI HEMi 2001.

In Step 4511, SCSI HEMi 2001 determines that the CDB contains a write command.

In Step 4512, based on the determination that the CDB contains a write command, SCSI HEMi 2001 sends the CDBinfo to a RdWr HEMi.

In Step 4513, the RdWr HEMi generates an IOP based on the CDBinfo.

In Step 4514, the RdWr HEMi sends the IOP to a Transmit HEMi (e.g., 1704). In Step 4515, the Transmit HEMi generates a transfer ready frame, designed to indicate to the Host that SSD Controller 106 is now ready to receive data frames containing the data to be written.

In Step 4516, the Transmit HEMi sends the transfer ready frame to GigaBlaze 1801.

In Step 4517, the GigaBlaze sends the transfer ready frame to the Host.

In Step 4518, the GigaBlaze receives a primitive sent by the Host in response to the transfer ready frame, which signals the beginning of the first data frame.

In Step 4519, GigaBlaze 1801 sends the primitive to Primitive Match Logic 1802.

In Step 4520, the Primitive Match Registers match the primitive as an SOF.

In Step 4521, under control of the Primitive Match Control Registers 1903, Frame Cracking Logic 1904 evaluates the first double-word of the frame.

In Step 4522, the Frame Cracking Logic determines that the frame is a data frame.

In Step 4523, Frame Router 1803, operating under control of Primitive Match Logic 1802, routes the header portion of the frame to Non-Data Payload FIFO 1804, and routes the data portion of the frame to Receive Stage Buffer 1706. This is done as a result of the initial match of the primitive in the Primitive Match Control Registers, plus the identification of the frame as a data frame. In this case, the Primitive Match Control Registers cause the Routing Logic to route a set number of double-words to the Non-Data Payload FIFO, and then to route subsequent double-words to the Stage Buffer.

In Step 4524, the Receive HEMi pops the header from the Non-Data Payload FIFO.

In Step 4525, the Receive HEMi evaluates the header and determines that it represents a data frame.

In Step 4526, the Receive HEMi checks the Target Port Transfer Tag ("TPTT") portion of the header. This field, which is received with all frames, contains data that ties together frames that are associated with a single transaction, e.g., a command frame containing a write command and data frames containing the data to be written. The TPTT information is copied into IOPs created as a result of incoming commands. The Receive HEMi uses this information to associate the received data frame with the IOP created in Step 4513.

In Step 4527, the Receive HEMi sets up a DMA transfer of the data contained in the Receive Stage Buffer to a location in Data Path DRAM 107 specified by the IOP. The manner in which the write operation proceeds subsequently is described below.

Figure 46A:
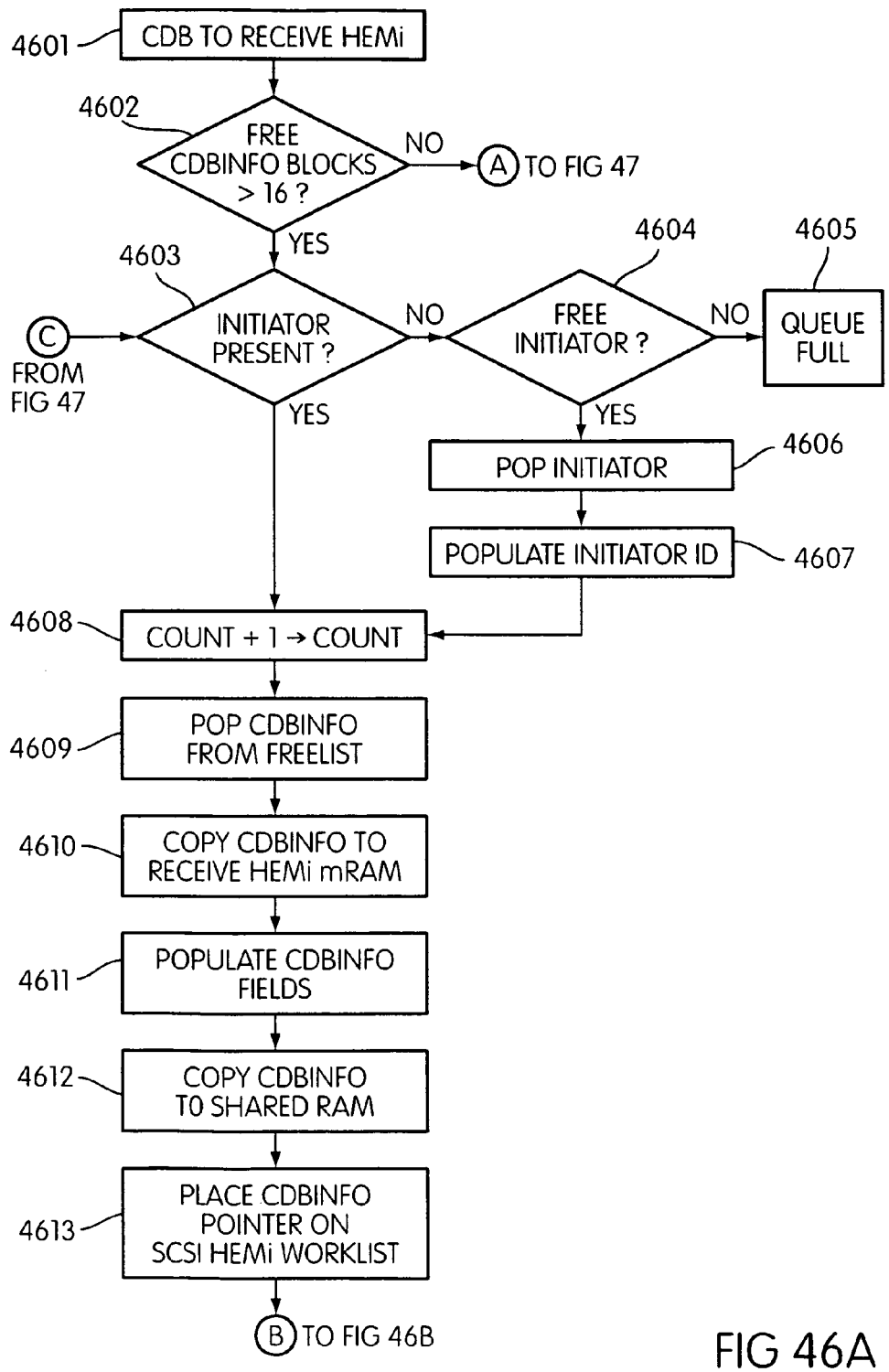
FIG. 46 illustrates the initial phases of handling of a CDB.
Figure 46B:
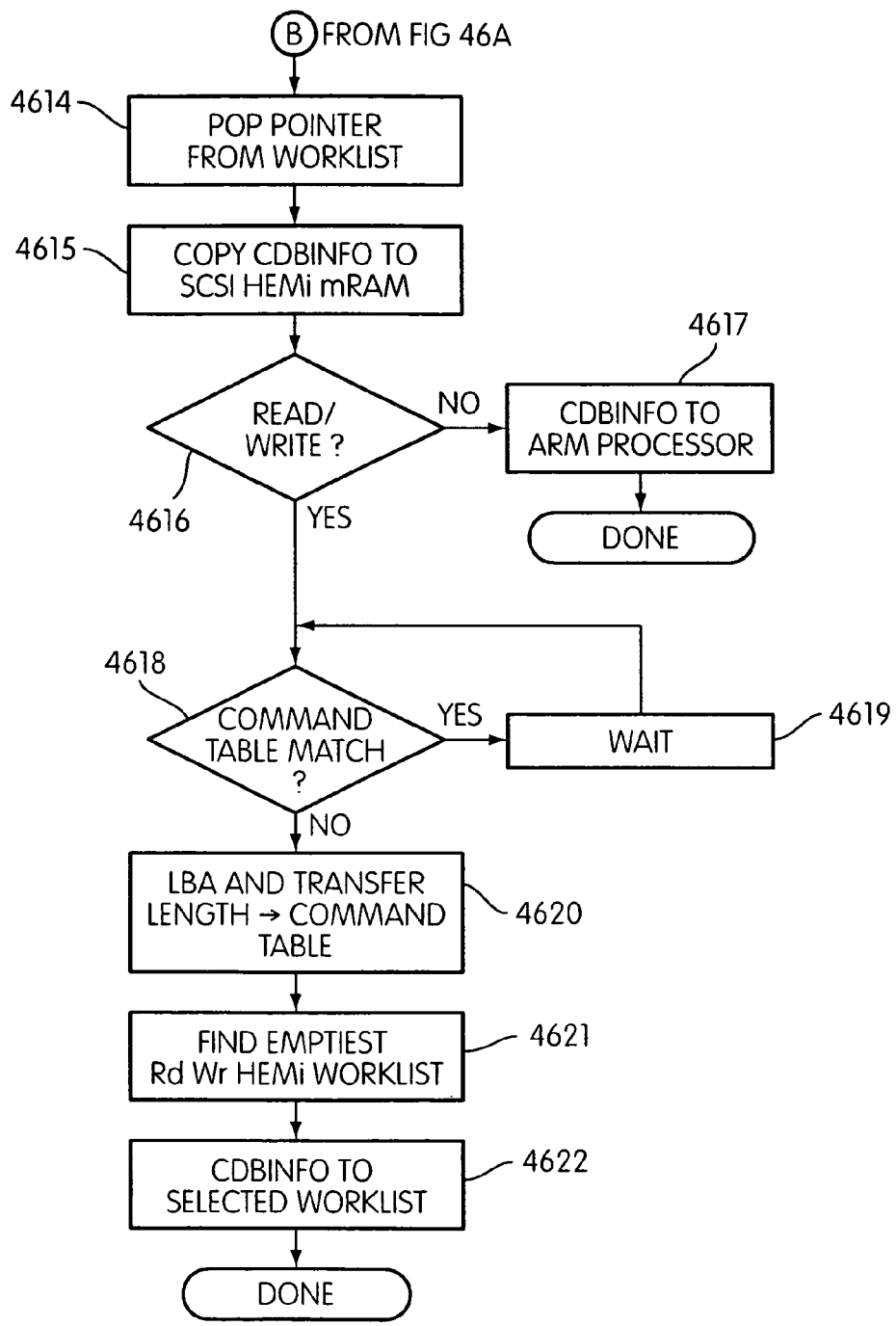

FIG. 46 contains a flowchart that illustrates the initial phases of handling of a CDB by SSD Controller 106. This flowchart illustrates this process from receipt of the CDB from the Host through passing of the CDBinfo to a RdWr HEMi.

As should be understood, and as is true of all flowcharts used herein, FIG. 46 illustrates this process from an algorithmic perspective and is not intended to describe implementation details nor specific software steps. Moreover, ordering of certain of the steps is arbitrary, in the sense that a later step does not depend on the results of an earlier step. The manner in which such steps are ordered in an actual embodiment is implementation dependent.

In Step 4601, Host 101 transmits a CDB through Physical Interface 1701 to Receive HEMi 1702. As is described above, the CDB is accompanied by metadata, including an identification of the Initiator. Receive HEMi 1702 temporarily stores the CDB and metadata in its mRAM.

In Step 4602, Receive HEMi 1702 accesses Shared RAM Block 318 through Crossbar Switch 2201 and checks CDBinfo Freelist 4102 to determine if more than 16 CDBinfos are available.

If 16 or fewer are available ("no" outcome to Step 4602), then processing proceeds to the flowchart illustrated in FIG. 47, which relates to special case handling discussed in greater detail in connection with that Figure.

If more than 16 CDBinfos are available ("yes" outcome to Step 4602), in Step 4603, Receive HEMi 1702 accesses Shared RAM Block 318 through Crossbar Switch 2201 and checks Initiator Table 4108 to see if the Initiator identified in the metadata is already present. Note that this step is also reached as one of the outcomes to the flowchart shown in FIG. 47.

If the Initiator is not in Initiator Table 4108 ("no" outcome to Step 4603), in Step 4604, Receive HEMi 1702 checks Initiator Freelist 4112 to determine if a free Initiator is available.

If no free Initiator is available ("no" outcome to Step 4604), in Step 4605, Receive HEMi 1702 invokes a queue full routine. In the currently preferred embodiment, the manner in which SSD Controller 106 handles this situation is dependent on parameters that are settable by the user at initialization. The user may decide that a queue full report should be made in this situation, which has the effect of causing the Initiator to retry the command until resources are available. Alternatively, the user may decide to require a "scrub" of Initiator Table 4108 to determine if the table contains any Initiators that have a Count Field 4203 of zero, meaning that they have no active commands. Such Initiators may be scrubbed from the Table, thereby freeing up room for the new Initiator. If a scrub opens up an Initiator, processing can continue. Otherwise, a queue full report is made.

If a free Initiator is available ("yes" outcome to Step 4604), in Step 4606, Receive HEMi 1702 pops an Initiator from Initiator Freelist 4112.

In Step 4607, Receive HEMi 1702 populates Initiator Identifier Field 4202, using identification information received in the metadata that accompanied the CDB.

In Step 4608, Receive HEMi 1702 adds one to Count Field 4203 for the Initiator. This step is performed whether the Initiator was already present in Initiator Table 4108 ("yes" outcome to Step 4603) or not (from Step 4607).

In Step 4609, Receive HEMi 1702 pops the top CDBinfo (e.g., CDBinfo 201) from CDBinfo Freelist 4102.

In Step 4610, Receive HEMi 1702 copies the CDBinfo from CDBInfo Table 4109 into its own mRAM. Note that at this point the CDBinfo is empty, with the exception of Self-Pointer Field 3701.

In Step 4611, Receive HEMi 1702 populates the fields of the CDBinfo as follows:

In CDB Field 3702 it places a copy of the CDB received from Host 101.

In Initiator Field 3703 it places a copy of Self-Pointer 4201 from the entry for this Initiator in Initiator Table 4108.

In SCSI Tag Field 3705, SCSI Flags Field 3706, RefTag Field 3708 and AppTag Field 3709 it places metadata received from Host 101 in the transmission that included the CDB. The nature of this metadata is described in connection with FIG. 37.

In Burst Length Control Field 3707 it places a copy of the information contained in Burst Length Control Field 4204 of the Initiator Info associated with the Initiator identified in Initiator Field 3703.

In Step 4612, Receive HEMi 1702 accesses Crossbar Switch 2201 and copies the populated CDBinfo 201 into the slot in CDBinfo Table 4109 pointed to by Self-Pointer Field 3701.

In Step 4613, Receive HEMi 1702 places a copy of Self-Pointer Field 3701 in the Worklist for SCSI HEMi 2001.

If the Worklist for SCSI HEMi 2001 was previously empty, placing the pointer into that Worklist wakes up the SCSI HEMi. If other tasks were already present on the Worklist, the SCSI HEMi completes those tasks. Either way, at some point the pointer to CDBinfo 201 is at the top of the Worklist and, in Step 4614, SCSI HEMi 2001 uses Crossbar Switch 2201 to access its Worklist and pop the pointer.

In Step 4615, SCSI HEMi 2001 uses Crossbar Switch 2201 to access the location of CDBinfo 201 in CDBinfo Table 4109, and copies that CDBinfo into its own mRAM.

In Step 4616, SCSI HEMi 2001 reads the Command portion of the CDB from CDB Field 3702 of CDBinfo 201 to determine if it is a data transfer (read or write).

If the Command is other than a read or a write ("no" outcome to Step 4616), in Step 4617, SCSI HEMi 2001 passes the CDBinfo to ARM Processor 2002, which is responsible for handling commands other than reads or writes. At that point, the process described in FIG. 46 ends.

If the Command is a read or a write ("yes" outcome to Step 4616), in Step 4618, SCSI HEMi 2001 compares the LBA and Transfer Length fields of the CDB stored in CDB Field 3702 of CDBinfo 201 to Command Table 2003, which, as is described above, is stored in the mRAM of SCSI HEMi 2001.

By this comparison, SCSI HEMi 2001 determines whether any of the LBAs required to be transferred by the CDB are already identified in the Command Table. A match indicates that some or all of the LBAs that are the subject of the new CDB are already the subject of an existing transfer. As is described above, SSD Controller 106 is required to maintain coherency, so that LBAs are not subject to inconsistent commands.

If SCSI HEMi 2001 finds a Command Table match ("yes" outcome to Step 4618), in Step 4619 it stalls execution of the CDBinfo and returns to Step 4618. This loop continues until a match no longer exists.

If no match is found ("no" outcome to Step 4618), in Step 4620, SCSI HEMi 2001 places the LBA and Transfer Length from CDB Field 3702 into Command Table 2003.

In Step 4621, SCSI HEMi 2001 accesses the Count Register for each of the RdWr HEMi Worklists (e.g., Count Register 2408) in order to determine which of those Worklists contains the fewest tasks.

In Step 4622, SCSI HEMi 2001 places a pointer to CDBinfo 201 on the identified Worklist, e.g., the Worklist for RdWr HEMi 2101, and the process described in FIG. 46 completes.

Note that the Initiator-related steps that follow Step 4602 and precede Step 4609 are only necessary for protocols that allow more than one Initiator (e.g., SAS and Fibre Channel). For protocols that only allow a single Initiator (e.g., SATA), these steps are unnecessary. Instead, for SATA-based systems, Controller 106 sets up an Initiator when the initial Set Features command is received. As is understood in the art, the Set Features command includes the burst length information needed for Burst Length Field 4204. After the Initiator is set up, processing of CDB's proceeds as shown in FIG. 46, though, as should be understood, the answer to Step 4603 is always "yes," and processing proceeds to Step 4608 (which is unnecessary but harmless) and then to Step 4609. This allows for the use of a common code base for SATA, SAS and Fibre Channel.

In an alternate embodiment, a slightly different code base is used for SATA systems, with no Initiator at all. In such an embodiment, the FIG. 46 processing would skip from Step 4602 to Step 4609. In yet another embodiment, a variable is set based on the protocol being used, and processing skips from 4602 to 4609 if that variable identifies the SATA protocol.

As is described above, if 16 or fewer CDBinfos are available on CDBinfo Freelist 4102 when a CDB is received, a special handling routine is invoked. Two special cases must be checked for, and handled, if they exist.

First, SSD Controller 106 is required by the SCSI Protocol to guarantee that at least one CDB can be handled after SSD Controller 106 has reported that it is out of resources. This capability is generally intended to allow a Host to issue a Request Sense CDB asking for information about an error condition, though the Protocol requires that the Controller respond correctly to any CDB issued under these circumstances.

A second special case exists if customer requirements mandate that SSD Controller 106 be able to support sixteen active Initiators at the same time, meaning that it must be able to support at least one active CDB for each possible Initiator up to sixteen.

This customer requirement means that, if there are fewer than sixteen currently active Initiators, SSD Controller 106 must maintain enough CDBinfos in reserve to allocate one CDBinfo to each additional Initiator that may become active (up to sixteen). Note that this feature is implementation-dependent, since certain customers may not require it. In one embodiment, the feature is enabled by a variable set at initialization. In another embodiment, slightly different code bases are used for systems requiring this feature and those that do not.

Figure 47:
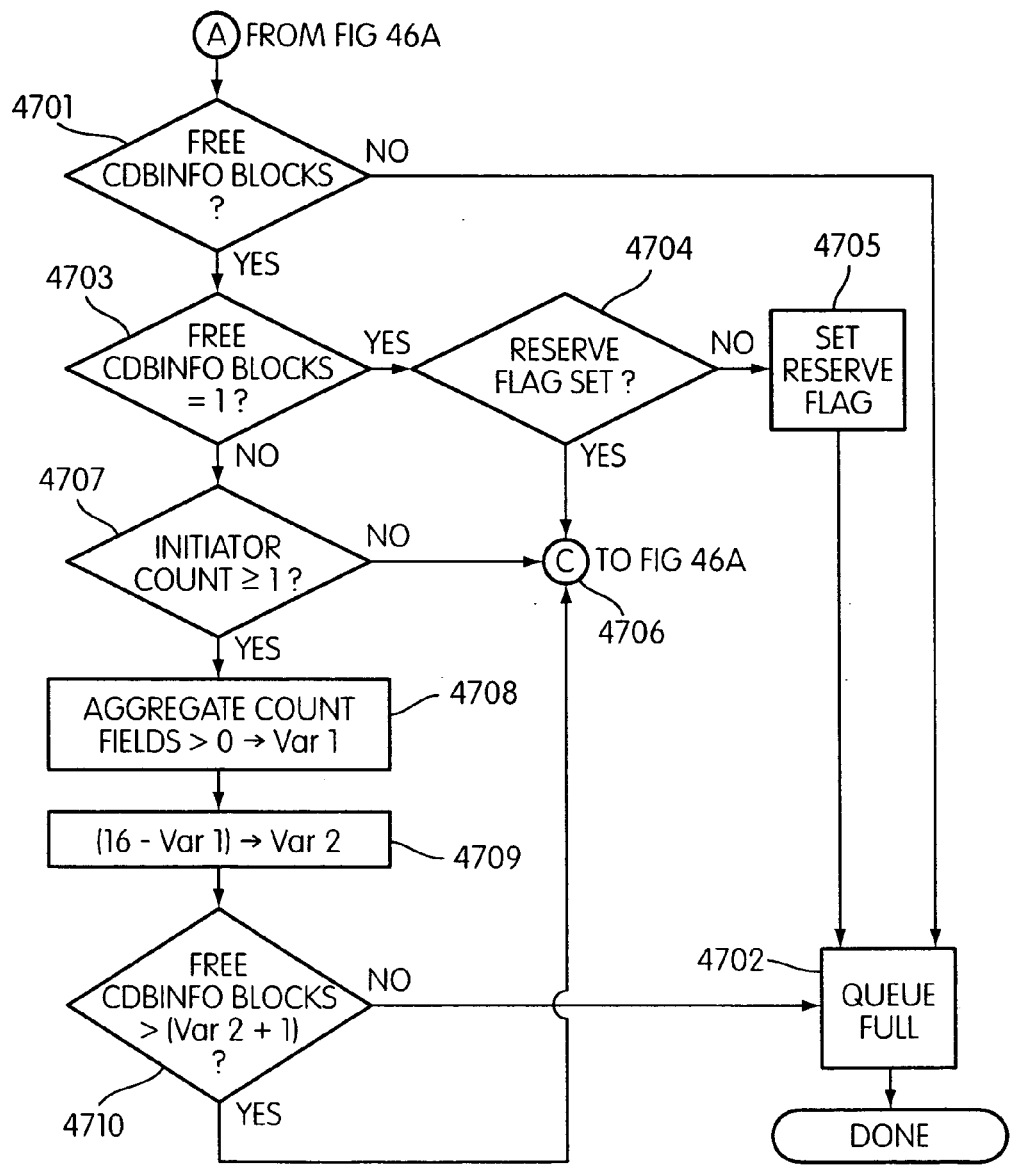
FIG. 47 illustrates special-case CDB handling.
Figure 48A:
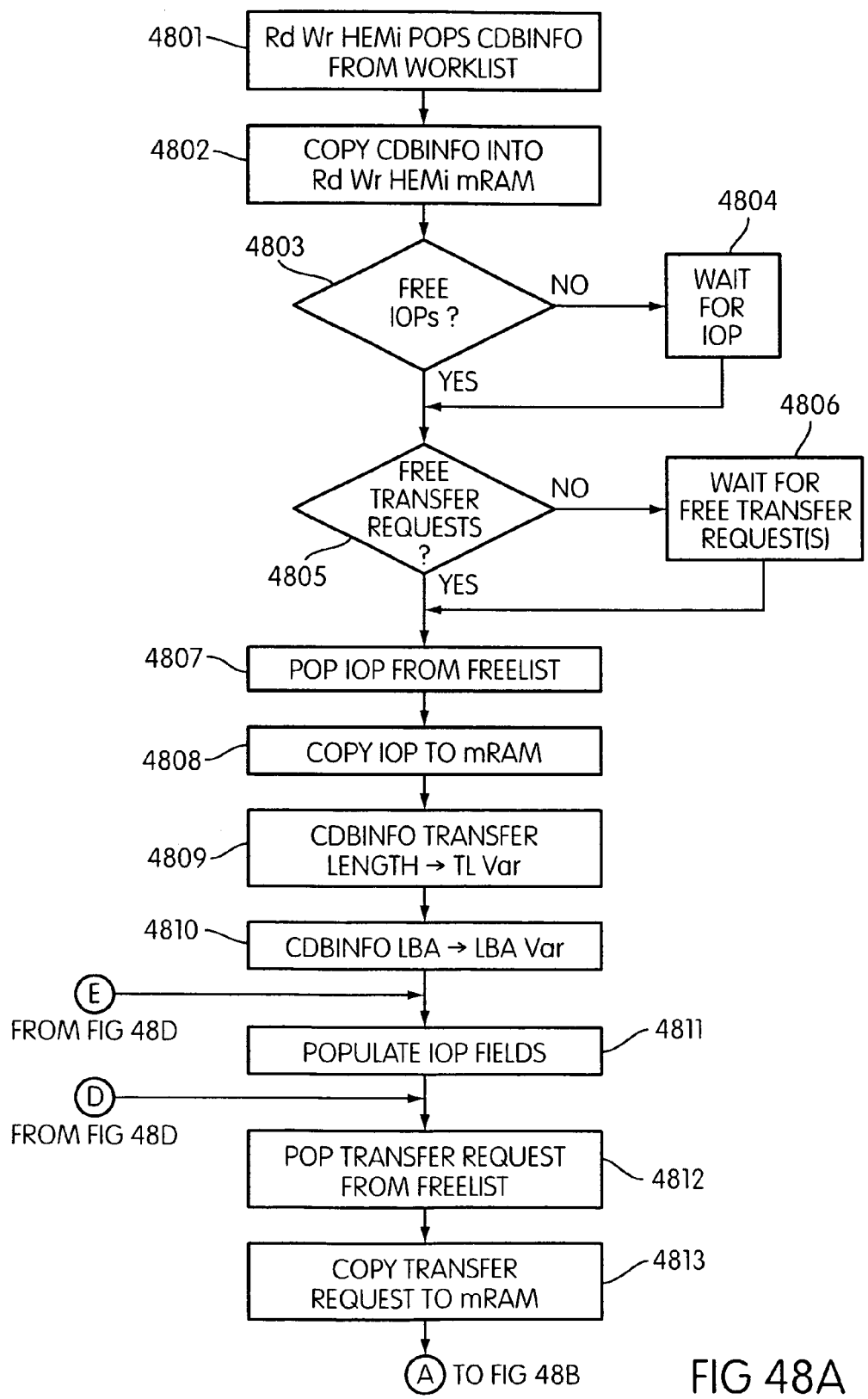
FIG. 48 illustrates the manner in which IOPs and transfer requests are set up based on a CDBinfo.
Figure 48B:
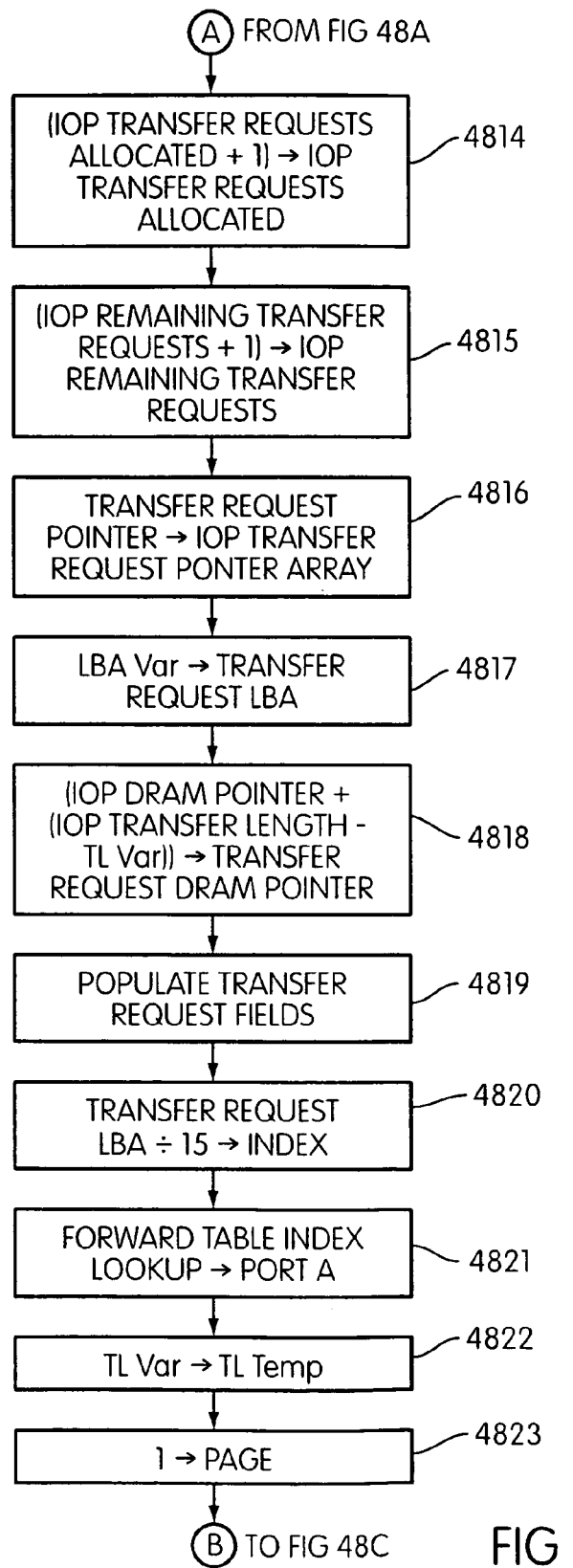
Figure 48C:
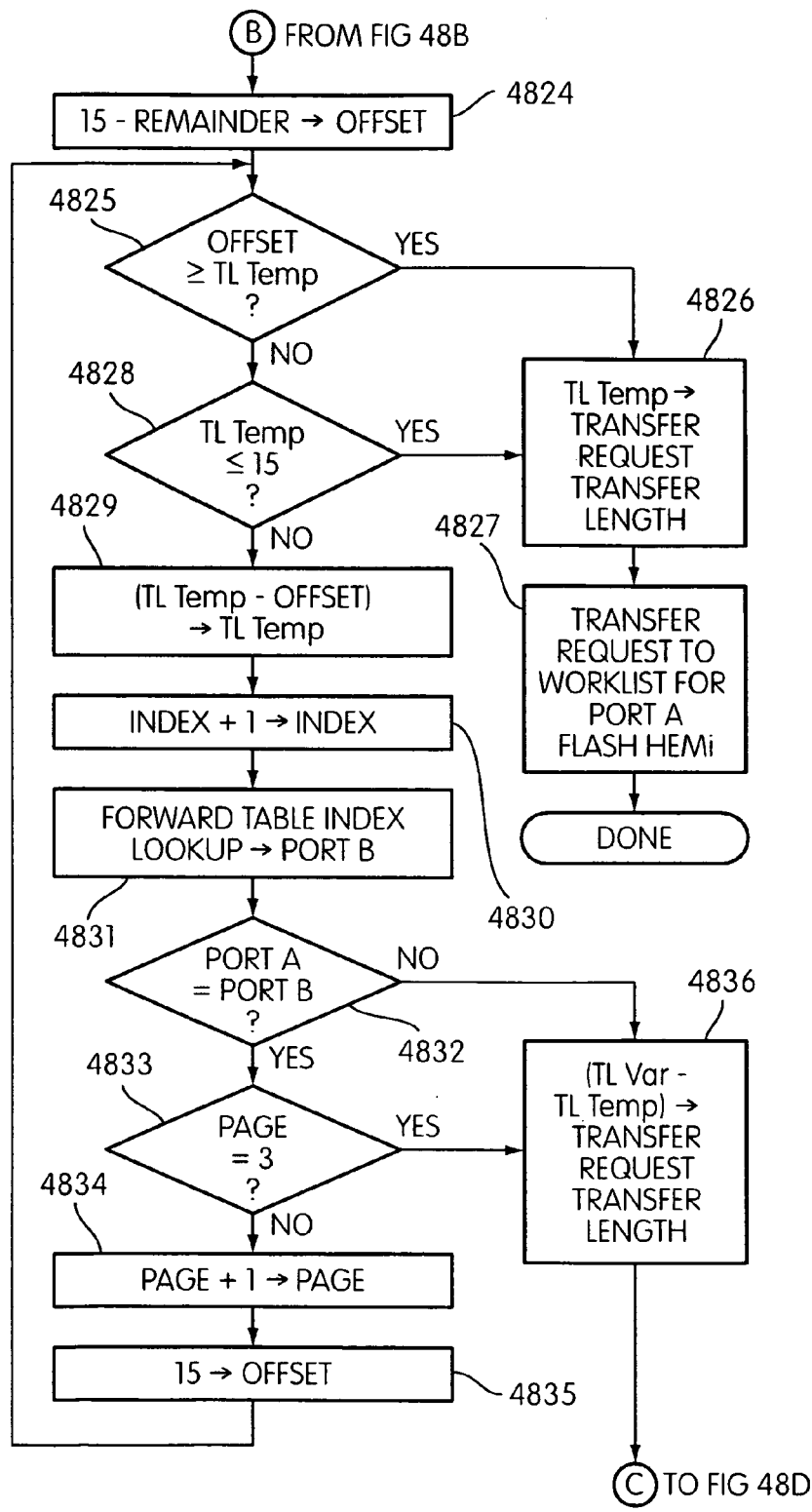
Figure 48D:
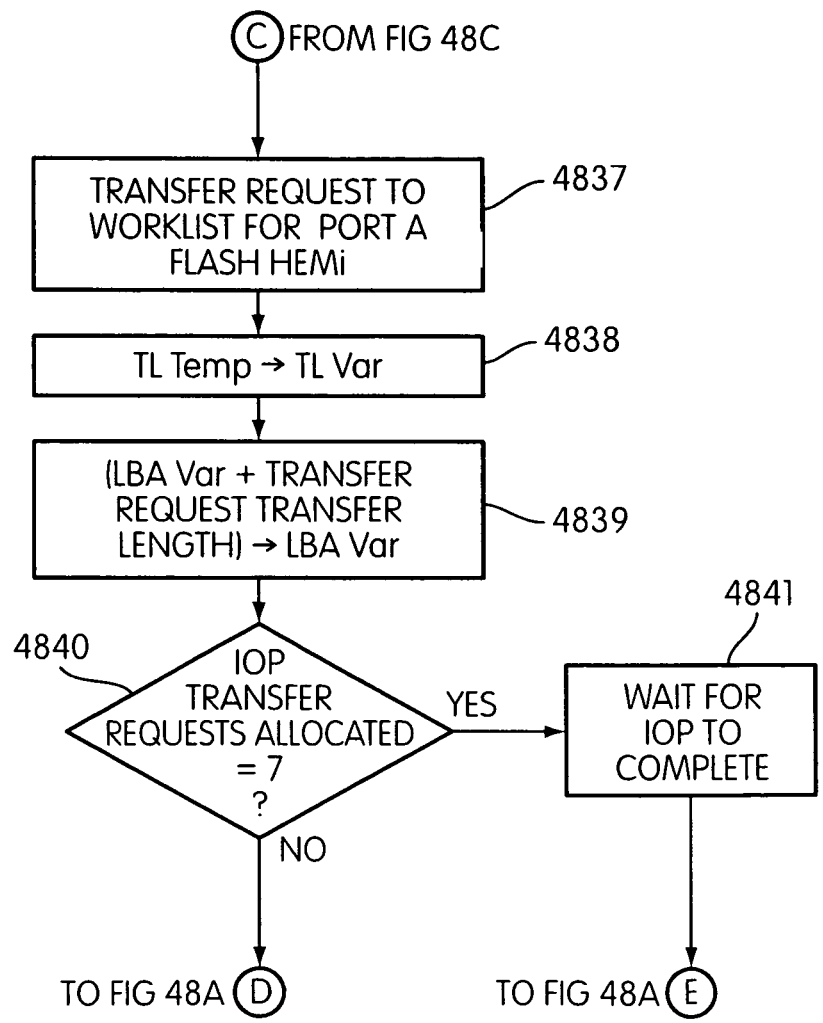

In one embodiment, both of these special cases may be handled as is shown in FIG. 47. Note that these steps are carried out by a Receive HEMi, following a "no" outcome to Step 4602 in FIG. 46.

In Step 4701, CDBinfo Freelist 4102 is examined to determine if there are any free CDBinfos.

If no free CDBinfos exist ("no" outcome to Step 4701), processing proceeds to Step 4702, which invokes a queue full routine. Although the details depend on the protocol being used, in general this involves returning a queue full message to the Host.

If there are free CDBinfos ("yes" outcome to Step 4701), in Step 4703, Freelist 4102 is examined to determine if there is only a single free CDBinfo on the Freelist.

If there is only one CDBinfo on the Freelist ("yes" outcome to Step 4703), in Step 4704 a Reserve Flag is checked. This flag is set to "0" on initialization, and is also set to "0" whenever a CDBinfo is added to Freelist 4102. The Reserve Flag indicates whether the current CDB has the right to use the last CDBinfo on the Freelist. As is described above, the SCSI Protocol requires that one additional CDB be accepted after a queue full is returned, meaning that if only one CDBinfo remains on the Freelist, the first CDB must trigger a queue full indication, and the second CDB is allowed to use the CDBinfo.

If the Reserve Flag is not set ("no" outcome to Step 4704), in Step 4705, the Reserve Flag is set. Processing then continues to Step 4702, which initiates a queue full routine.

If the Reserve Flag is set ("yes" outcome to Step 4704), in Step 4706 processing returns to FIG. 46, Step 4603, following which the reserve CDBinfo will be assigned to the CDB.

If the number of free CDBinfos on Freelist 4102 is greater than one ("no" outcome to Step 4703) processing proceeds to Step 4707, in which Count Field 4203 of the Initiator responsible for the CDB is evaluated to determine if this Initiator already has at least one current CDB (Count Field≥1).

If the Initiator does not have any active CDBs (or if this is a new Initiator) ("no" outcome to Step 4707), then processing proceeds to Step 4706 and from there to FIG. 46, Step 4603, following which a CDBinfo will be popped for this Initiator, since the system guarantees that the Initiator will be allowed at least one active CDB.

If the Initiator already has active CDBs ("yes" outcome to Step 4707), then the system is not required to guarantee a CDB to the Initiator, and processing proceeds to Step 4708, in which the number of entries in Initiator Table 4108 that have a Count Field 4203 with a value of at least one is placed in a variable called "Var1." This number represents the number of currently active Initiators each of which has at least one active command.

In Step 4709, Var1 is subtracted from 16, and the result is placed in a variable called "Var2." This represents the number of additional Initiators that must be guaranteed a CDBinfo.

In Step 4710, the number of entries on Freelist 4102 is compared to Var2. If the number of free CDBinfos is at least two greater than Var2 ("yes" outcome from Step 4710), then processing proceeds to Step 4706, and from there to FIG. 46, Step 4603, following which a CDBinfo is popped, since enough CDBinfos are available to meet the guarantee.

If the number of free CDBinfos is less than two greater than Var2 ("no" outcome to Step 4710), then in Step 4702 the system reports queue full. This is necessary because enough free CDBinfo's must be maintained to allow future servicing of the number of Initiators represented by Var2, plus one additional CDBinfo that has to remain in reserve.

Thus, the flowchart shown in FIG. 47 checks for the two special cases described above.

FIG. 48 contains a flowchart illustrating the manner in which IOPs and Transfer Requests are set up based on a CDBinfo.

In Step 4801, a RdWr HEMi (e.g., RdWr HEMi 2101) uses Crossbar Switch 2201 to access its Worklist and pops the pointer to a CDBinfo (e.g., CDBinfo 201).

In Step 4802, RdWr HEMi 2101 uses Crossbar Switch 2201 to access the location in CDBinfo Table 4109 corresponding to the pointer and finds CDBinfo 201 at that location.

RdWr HEMi 2101 copies CDBinfo 201 into its mRAM.

In Step 4803, RdWr HEMi 2101 determines if any IOPs are present on IOP Freelist 4103.

If no IOPs are present on the Freelist ("no" outcome to Step 4803), in Step 4804 RdWr HEMi 2101 waits for an IOP to finish executing, then restarts processing once a free IOP is present on the Freelist.

If IOPs are present on the Freelist ("yes" outcome to Step 4803), in Step 4805, RdWr HEMi 2101 uses Crossbar Switch 2201 to access Shared RAM, and determines if enough Transfer Requests are present on Transfer Request Freelist 4104 to handle the number of Transfer Requests required by the IOP.

If insufficient Transfer Requests are present on the Freelist ("no" outcome to Step 4805), in Step 4806 RdWr HEMi 2101 waits for Transfer Requests to free up, then proceeds to Step 4807.

If Transfer Requests are present on the Freelist ("yes" outcome to Step 4805), in Step 4807 RdWr HEMi 2101 pops the top IOP pointer off the Freelist. This pointer is copied into IOP Field 3704 of the CDBinfo.

In Step 4808, RdWr HEMi 2101 copies the IOP pointed to by the top pointer on the Freelist (e.g., IOP 202) from IOP Table 4110 into its mRAM. At this point, the only information contained in the IOP is Self-Pointer 3801.

In Step 4809, RdWr HEMi 2101 copies the Transfer Length value from CDB Field 3702 from the CDBinfo into a variable named "TLvar." This variable stores the current transfer length throughout the rest of the described algorithm. (As should be understood, in this and other cases, this description is conceptual in nature, and a real implementation may or may not include a variable with this name.)

In Step 4810, RdWr HEMi 2101 copies the LBA value from CDB Field 3702 from the CDBinfo into a variable named "LBAvar." This variable stores the LBA at which the current transfer is to begin throughout the rest of the described algorithm.

In Step 4811, RdWr HEMi 2101 populates IOP 202 as follows:
  In Calling HEMi Field 3802 it places its own identifier.
  In CDBinfo Field 3805 it places the CDBinfo pointer it earlier popped off of its Worklist.
  In Initiator Field 3804 it places the Initiator pointer taken from Initiator Field 3703 of CDBinfo 201.
  It sets State Variables Field 3810 to indicate the current status of the IOP.
  It zeroes out Abort Flag 3811.
  In RefTag Field 3812 and AppTag Field 3813 it copies the contents of RefTag Field 3708 and AppTag Field 3709 of CDBinfo 201.

In Step 4812, RdWr HEMi 2101 pops the top Transfer Request pointer off the Freelist.

In Step 4813, RdWr HEMi 2101 copies the Transfer Request pointed to by the top pointer on the Freelist from Transfer Request Table 4111 into its MRAM. At this point, the only information contained in the Transfer Request is Self-Pointer 3901.

In Step 4814, RdWr HEMi 2101 increments IOP Transfer Requests Allocated Field 3807 to reflect the new Transfer Request.

In Step 4815, RdWr HEMi 2101 increments IOP Remaining Transfer Requests Field 3808 to reflect the new Transfer Request.

In Step 4816, RdWr HEMi 2101 copies Transfer Request Self-Pointer 3901 into IOP Transfer Request Pointer Array 3809.

In Step 4817, RdWr HEMi 2101 copies the value from LBAvar into Transfer Request LBA Field 3903. This is the location that will be used by the Transfer Request for the beginning of the transfer.

In Step 4818, RdWr HEMi 2101 populates Transfer Request DRAM Pointer Field 3905 with a value calculated by subtracting TLvar from IOP Transfer Length and adding the result to a pointer to the space in IOP Data Buffer 3202 that is devoted to this IOP. This result indicates where in the IOP's DRAM space the data relating to this Transfer Request will be stored. This value will increase for each succeeding Transfer Request by an amount equal to the size of the transfer handled by the immediately preceding Transfer Request.

In Step 4819, RdWr HEMi 2101 populates certain Transfer Request Fields as follows:
  In Calling IOP Field 3902 it places the pointer to the IOP that it popped off IOP Freelist 4103.
  In LBA Field 3903 it places a copy of the value currently in LBAvar, indicating the starting LBA for the transfer.
  Abort Flag 3906 is cleared.
  In Command Field 3907 it places the type of command required. In this example, that command is a read.
  RefTag Field 3909 and AppTag Field 3910 are populated with information taken from Fields 3812 and 3813 of IOP 202.

In Step 4820, the RdWr HEMi divides the Transfer Request LBA value by 15 and places the quotient into a variable titled "Index."

In Step 4821, the RdWr HEMi uses Index to perform a lookup in Forward Table 3201.

This lookup yields the row corresponding to the SuperPage containing the LBA identified in the Transfer Request LBA Field. The Port Field from that row is placed into a variable titled "Port A."

In Step 4822, the value in TLVar is copied into a variable titled "TLTemp."

In Step 4823, a variable titled "Page" is initialized to a value of 1. As is described above, each Transfer Request can handle a maximum of three SuperPages, each of which can handle a block of 15 LBAs. This variable keeps track of the number of such LBA blocks allocated to this Transfer Request.

In Step 4824, the remainder from the division performed in Step 4820 is subtracted from 15, and the result is placed in a variable titled "Offset." As is described above, each SuperPage contains 15 LBAs, and the first LBA in a transfer may be offset into the middle of the SuperPage. As is also described above, each Transfer Request can initiate three Page Requests, each of which can handle a single SuperPage. As a result, if the first LBA is offset into a SuperPage, one of the Page Requests issued by the Transfer Request will handle fewer than fifteen LBAs. Step 4824 deals with this case.

In Step 4825, the value in Offset is compared to the value in TLTemp.

If Offset is greater than or equal to TLTemp ("yes" outcome to Step 4825), this means that the transfer will complete in the LBA range that can be handled by the Transfer Request.

In Step 4826, the value in TLTemp is written into the Transfer Request Transfer Length Field 3904.

In Step 4827, the Transfer Request is placed on the Worklist for the Flash HEMi responsible for the Port identified in the Port A variable. Processing then ends, since all Transfer Requests necessary for the IOP have been allocated.

If TLTemp is greater than Offset, ("no" outcome to Step 4825), in Step 4828, TLTemp is evaluated to determine if it is less than or equal to 15.

If TLTemp is less than or equal to 15 ("yes" outcome to Step 4828), this means that the transfer will complete with this Transfer Request, and processing continues to Step 4826, which proceeds as described above.

If TLTemp is greater than 15 ("no" outcome to Step 4828), in Step 4829 Offset is subtracted from TLTemp, and the result is stored back into TLTemp. This step repeatedly decrements TLTemp to reflect the LBAs that are to be assigned to the Transfer Request currently being set up. That value is then used to calculate the Transfer Request Transfer Length Field.

In Step 4830, the value in the variable Index is incremented.

In Step 4831, a Forward Table lookup is performed based on the new Index value. As should be understood, this yields the row after the row provided by the previous lookup, and therefore the next block of 15 LBAs. The Port value from that row is written into a variable titled "Port B." This represents the SuperPage storing that next block of LBAs.

In Step 4832, Port A and Port B are compared. If they are equal ("yes" outcome to Step 4832), this means that the SuperPage containing the next block of 15 LBAs is stored in the same Flash Group as the previous SuperPage. This means that the current Transfer Request can, in theory, handle the next block of LBAs.

In Step 4833, the Page variable is compared to 3. If the Page variable is less than 3 ("no" outcome to Step 4833), this means that the Transfer Request can handle an additional block of 15 LBAs, so processing proceeds to set up the next iteration through the Transfer Request loop.

In Step 4834, the Page variable is incremented to reflect the fact that a new block of LBAs will be allocated to the Transfer Request in the next loop.

In Step 4835, the value 15 is written into the Offset variable. No offset is required for any SuperPage after the first SuperPage, since LBA ranges for the next two SuperPages will begin at an even multiple of 15. This is handled by setting Offset to 15, for purposes of the calculation in Step 4825, and for purposes of decrementing TLTemp in Step 4829. Processing then loops to Step 4825, and proceeds for the next block of LBAs.

If the value in Port B is different than the value in Port A ("no" outcome to Step 4832), this means that the next block of LBAs is on a different Port than the previous block assigned to the Transfer Request. Since a Transfer Request can only operate on LBAs in one Flash Group, the current Transfer Request must end at this point. Similarly, the Transfer Request must also end if the Page variable equals three ("yes" outcome to Step 4833), since this means that the Transfer Request has already been assigned three SuperPages worth of LBAs.

In either case, processing proceeds to Step 4836, in which TLTemp is subtracted from TLVar, and the result, which contains the number of LBAs assigned to the Transfer Request, is stored in Transfer Request Transfer Length Field 3904.

In Step 4837, the Transfer Request is appended to the Worklist for the Flash HEMi assigned to the Flash Group associated with the Port identified in the Port A variable.

In Step 4838, the value of TLTemp is stored in TLVar. This sets up TLVar for use in generating the next Transfer Request.

In Step 4839, LBAVar is added to the value in the Transfer Request Transfer Length Field, and the result is stored back into LBAVar. This sets up LBAVar for use in generating the next Transfer Request.

In Step 4840, the RdWr HEMi analyzes the IOP Transfer Requests Allocated Field 3807 to see if it equals "7."

If seven Transfer Requests have been allocated ("yes" outcome to Step 4840), the IOP cannot allocate any further Transfer Requests. As is described above, this case is handled by allowing the IOP to complete, and then reissuing the IOP with LBA and Transfer Length values modified as a result of the previous execution of the IOP. Thus, in Step 4841, the first iteration of the IOP completes, at which point processing loops to Step 4811, at which the IOP Fields are populated for the next execution of the IOP.

If fewer than seven Transfer Requests have been allocated ("no" outcome to Step 4840), processing loops back to Step 4812 and begins the process of issuing the next Transfer Request. Note that the new Transfer Request will obtain LBA and Transfer Length values that have been adjusted based on the immediately preceding Transfer Request.

Figure 49A:
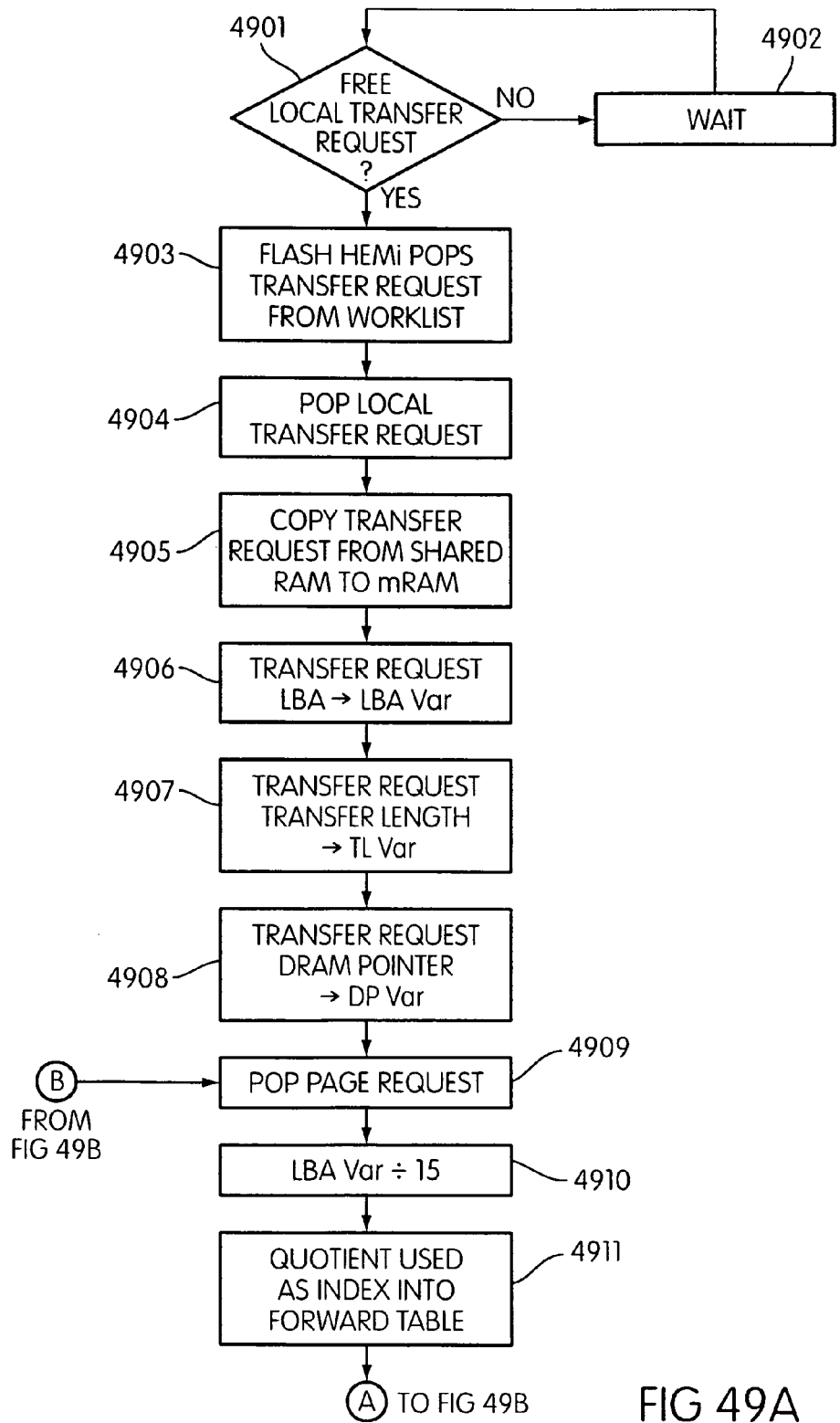
FIG. 49 illustrates the manner in which a flash HEMi sets up page requests
Figure 49B:
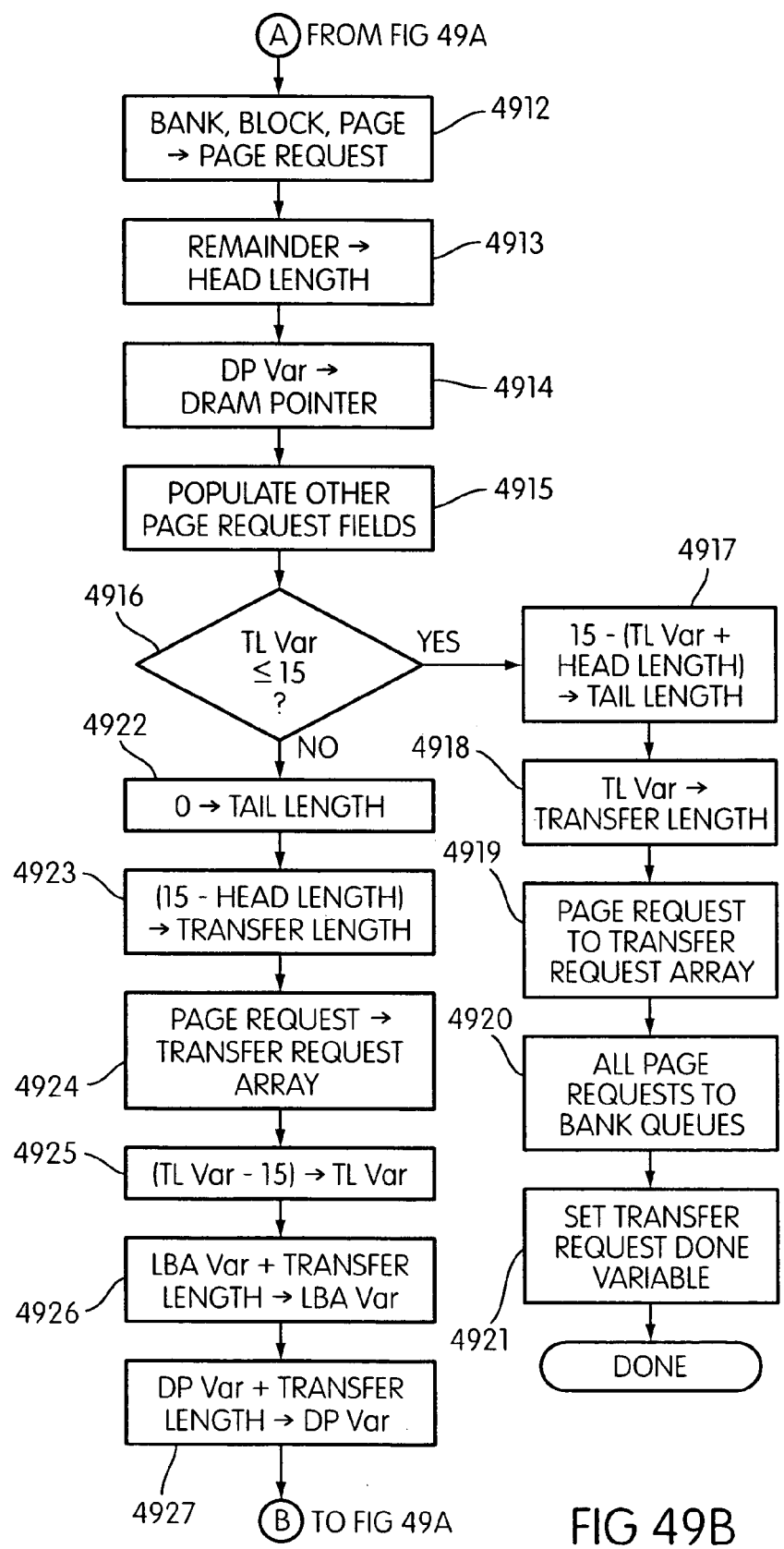

FIG. 49 illustrates the manner in which a Flash HEMi (e.g., Flash HEMi 307) sets up Page Requests for a read or write operation, based on a Transfer Request that is present on the Flash HEMi's Worklist.

In Step 4901, Flash HEMi 307 checks its Local Transfer Request Freelist 2905 to determine if Local Transfer Request Table 2901 contains at least one free slot.

If not ("no" outcome from Step 4901), in Step 4902, Flash HEMi 307 waits, and then returns to Step 4901. This wait may be for a specified period, or may be until other tasks have finished executing.

Once free local Transfer Requests are available, ("yes" outcome from Step 4901), in Step 4903 Flash HEMi 307 uses Crossbar Switch 2201 to access its Worklist and pops the Transfer Request from the Worklist.

In Step 4904, Flash HEMi 307 pops the pointer to the next free local Transfer Request from Local Transfer Request Freelist 2905.

In Step 4905, Flash HEMi 307 uses Crossbar Switch 2201 to access Transfer Request Table 4111 in Shared RAM Block 318 and copies the Transfer Request pointed to by the Worklist from that Table into the Slot from Local Transfer Request Table 2901 pointed to by the pointer popped off of Local Transfer Request Freelist 2905.

In Step 4906, the value from Transfer Request LBA Field 3903 is copied into a variable known as LBAvar.

In Step 4907, the value from Transfer Request Transfer Length Field 3904 is copied into a variable known as TLvar.

In Step 4908, the value from Transfer Request Data Path DRAM Pointer Field 3905 is copied into a variable known as DPvar.

In Step 4909, the Flash HEMi pops a Page Request from its Page Request Freelist 2910. Note that no check is needed to determine if a free Page Request exists, since the mRAM of Flash HEMi 307 contains eighteen Page Requests, which is the maximum that can be required by the six local Transfer Requests that Flash HEMi 307 can handle at one time.

In Step 4910, the value in LBAvar is divided by 15.

In Step 4911, the result from Step 4910 is used as an offset into Forward Table 3201. This lookup results in Bank, Block and Page address information for the location of the LBA in Flash Memory. Note that the Port information from the Forward Table is unnecessary, since that information was used in the FIG. 48 flowchart to send the Transfer Request to this Flash HEMi, which only controls a single Port.

In Step 4912, the Bank, Block and Page address information from the Forward Table lookup is stored in Page Request Flash Read Address Field 4006. Note that the read address is needed for write operations that write to less than a full page, since such write operations require a read-modify-write. In the case of a Page Request write with a Transfer Length of 15, indicating that a full page is to be written, Steps 4910-4913 are skipped.

In Step 4913, the remainder from Step 4910 is copied into Head Length Field 4008. This represents the offset into the SuperPage, if any, at which the transfer is to begin.

In Step 4914, the value from DPvar is copied into Data Path DRAM Pointer Field 4004.

This indicates the location in Data Path DRAM 107 from which the Page Request is to read data, or to which the Data Request is to write data.

In Step 4915, other Page Request fields are populated, based on the Transfer Request. These fields are described above, in connection with FIG. 40. Those fields are populated as follows:

Calling Transfer Request Field 4002 is filled in with the pointer to the calling local Transfer Request (the value popped off of Local Transfer Request Freelist 2905).

Command Field 4003 is filled in based on Command Field 3907 of the Transfer Request. In the case of a Transfer Request write, the Command Field is filled in with a plain write if the write covers the entire 15 LBAs of a SuperPage (Transfer Length=15), or with a read-modify-write if the write covers less than a complete SuperPage.

If Command Field 4003 identifies the transaction as a write or a read-modify-write, Flash Write Address Field 4007 is filled in with the physical address of the SuperPage to be written. The manner in which that SuperPage is identified is described in connection with FIG. 54.

State Variable Field 4011 is also initialized in Step 4915.

In Step 4916, TLvar is compared to the value "15."

If TLvar is less than or equal to 15 ("yes" result from Step 4916), this means the current Page Request represents the last Page Request required by the Transfer Request.

In Step 4917, Tail Length Field 4009 is set to 15−(TLvar+ Head Length). This represents a partial transfer that does not include LBAs at the end of a SuperPage. Note that the Tail Length Field is set to 0 for all Page Requests other than the last Page Request for a Transfer Request.

In Step 4918, Transfer Length Field 4010 is set to TLvar.

In Step 4919, a pointer to the Page Request is placed onto Page Request Pointer Array 3913 of the Transfer Request.

In Step 4920, each pointer from Page Request Pointer Array 3913 is copied onto the Queue in Bank Queues 2911 corresponding to the Bank obtained in the lookup in Step 4911.

In Step 4921, the Transfer Request "Done" variable is set in Transfer Request State Variables 3908 for the calling Transfer Request. This variable will be checked the next time the Transfer Request is popped off Local Transfer Request Queue 2904, and will indicate the need for a clean-up routine.

The process described in FIG. 49 then ends.

If TLvar is greater than 15 ("no result from Step 4916), this means the current Page Request is not the last Page Request for the Transfer Request. In Step 4922, Tail Length Field 4009 is set to "0."

In Step 4923, Page Request Transfer Length Field 4010 is set to 15 minus the value placed in Head Length Field 4008. This represents the offset into the SuperPage for a transfer that does not begin at the beginning of a SuperPage.

In Step 4924, a pointer to the Page Request is placed onto Page Request Pointer Array 3913 of the Transfer Request.

In Step 4925, 15 is subtracted from TLvar

In Step 4926, the value from Transfer Length Field 4010 is added to LBAvar.

In Step 4927, the value from Transfer Length Field 4010 is added to DPVar. Processing then loops back to Step 4909, for a new Page Request.

This loop continues until the last Page Request required by the Transfer Request has been transferred onto the Bank Queues.

FIG. 50 illustrates the Flash HEMi execute loop. This loop handles execution of Transfer Requests and Page Requests.

In Step 5001, the Flash HEMi checks the Flash Port to determine if it's free (i.e., not currently in use for a transfer to or from the Flash Group).

If the Flash Port is not free ("no" outcome to Step 5001), the Page Request handlers cannot operate. In Step 5002, the Flash HEMi checks to determine if any Transfer Requests are present on Local Transfer Request Queue 2904.

If the Queue contains Local Transfer Requests ("yes" outcome to Step 5002), in Step 5003 the Flash HEMi handles the Local Transfer Request on the top of the Queue.

Following Step 5003, or if the Queue contains no Local Transfer Requests ("no" outcome to Step 5002), in Step 5004, the Flash HEMi checks to see if any Transfer Requests are present on the Flash HEMi's Worklist (e.g., Worklist 4107).

If the Worklist contains a pointer to a Transfer Request ("yes" outcome to Step 5004), in Step 5005, the Flash HEMi checks to see if Local Transfer Request Freelist 2905 contains any free Local Transfer Requests.

If Local Transfer Requests are available ("yes" outcome to Step 5005), in Step 5006, the Flash HEMi handles the Transfer Request on the top of the Worklist, which involves copying the Transfer Request into the Flash HEMi's MRAM and generating Page Requests (see FIG. 49).

Following Step 5006, or if there are no Transfer Requests on the Worklist ("no" outcome to Step 5004) or if there are no free Local Transfer Requests ("no" outcome to Step 5005), in Step 5007 the Flash HEMi checks its current state to determine whether it needs to go into sleep mode. For example, if Step 5007 has been reached as a result of a "no" outcome to Steps 5001, 5002 and 5004, then the Flash HEMi cannot operate on any Page Requests or Transfer Requests and therefore will go into sleep mode. As is explained above, by going into sleep mode, the Flash HEMi saves power, and allows itself to react quickly if a Transfer Request is added to the Worklist.

In a different embodiment, the Flash HEMi does not go into sleep mode when other tasks are not available, but instead calls a patrol function handler. The patrol function, which is described below, checks SuperPages for errors, and, if necessary, corrects the errors.

In Step 5008, the Flash HEMi calculates the sleep period needed. This is based on current state, and is designed to wake the Flash HEMi up before any executing tasks complete. Thus, for example, if the Flash Port is being used by a Stage Buffer to Flash transfer, the Flash HEMi checks Flash Transfer Count Register 2712 to determine how long the remaining portion of the transfer will take, and then sets the sleep mode period so that the sleep mode will end before the transfer does. As is explained above, sleep mode is set by repeating a series of nops, so the number of nops used is determined based on the sleep period required.

In Step 5009, the Flash HEMi goes into sleep mode. When it emerges from sleep mode, processing returns to Step 5001.

If the Step 5001 check indicates that the Flash Port is free ("yes" outcome to Step 5001), in Step 5010 the Flash HEMi checks Bank Bitmap 2920 to determine if there are any Banks that are (a) needed by a Page Request at the top of a Bank Queue (Need Bank Flag set) and (b) Ready (Bank R Flag set).

If not ("no" outcome to Step 5010), processing proceeds to Step 5002 to determine if any Transfer Requests need to be handled.

If there are Banks that are both needed and Ready ("yes" outcome to Step 5010), in Step 5011 the current Bank is set to the lowest Bank that meets both criteria. For example, if Bank Bitmap 2920 indicated that Banks 0, 2 and 4 all had both Flags set, Step 5011 would select Bank 0.

In Step 5012, the State Variables Field of the Page Request at the top of the selected Bank Queue (Queue 0 in the example given) is checked to determine if the Page Request requires certain resources (e.g., a DMA channel)). If the Page Request requires resources ("yes" outcome to Step 5012), in Step 5013 the Flash HEMi determines whether the resources are available. Note that no check is needed for the Flash Port, since its availability was confirmed in Step 5001.

If the necessary resources are available ("yes" outcome to Step 5013), or if no resources are required ("no" outcome to Step 5012), processing proceeds to 5014, in which the Command Field contained in the Page Request at the top of the selected Bank Queue is checked to determine if the command is a Read, a Read-Modify-Write or an Erase, and the appropriate Page Request handler is called and executed.

Step 5015 is reached after the Page Request handler returns. In this step, a return value from the handler is checked to determine if the handler has used the Flash Port.

If the handler used the Flash Port ("yes" outcome to Step 5015), further Page Requests cannot be executed, since the Flash Port is now busy, and processing proceeds to Step 5007, for a determination of whether the Flash HEMi can go into sleep mode.

If the handler did not use the Flash Port ("no" outcome to Step 5015), or if insufficient resources were available for a Page Request ("no" outcome to Step 5013), in Step 5016, the Flash HEMi checks Bank Bitmap 2920 to determine if a higher-numbered Bank is both needed and Ready. In the example given above, in which Banks 0, 2 and 4 were needed and Ready and Bank 0 was handled, the outcome to Step 5016 would be "yes," since Bank 2 is higher than Bank 0 and is needed and Ready. If, on the other hand, Step 5014 had handled Bank 4, the outcome to Step 5015 in this example would be "no," since, even though Banks 0 and 2 remain needed and Ready, there are no Banks higher than 4 that are in that condition.

If there is a higher-numbered Bank that is both needed and Ready ("yes" outcome to Step 5016), in Step 5017, the current Bank is set to that higher-numbered Bank. Processing then returns to Step 5012, where the resource check is invoked for the Bank selected in Step 5017.

If there is no higher-numbered Bank that is both needed and Ready ("no" outcome to Step 5016), processing returns to Step 5004, to handle any Transfer Requests on the Worklist. Note that processing does not return to the top of the loop (Step 5001), in order to insure that the Page Request handler loop will periodically be interrupted so as to allow Transfer Requests to be handled on a regular basis even if there are always Page Requests that are ready for handling.

This loop continues indefinitely, as long as the system is powered up.

The Page Request read handler is illustrated in FIG. 51. This flowchart shows the steps that are taken in Step 5014 if the Page Request contains a read command.

In Step 5101, Page Request State Variables Field 4011 is checked to determine which state the Page Request is in. In general, a Page Request read proceeds through three states: Command, Need Stage Buffer and Flash Transfer Done. Following each state, the handler returns to Step 5015 of the execution loop illustrated in FIG. 50. Note that the Page Request remains on the top of the Bank Queue after the Command and Need Stage Buffer stages, so that following such a return, the Flash HEMi execution loop will return later to this same Page Request.

If the Command state is set ("command" outcome to Step 5101), in Step 5102 the Flash HEMi asserts the CS signal for the Flash Bank associated with the Bank Queue that the Page Request was popped from (e.g., asserting CS on Line 703).

In Step 5103, the Flash HEMi asserts CLE Signal 803 and places the first opcode of the read command on Bus 709. The Flash HEMi knows to use that opcode based on the presence of the read command in Page Request Command Field 4003. Assertion of the CLE Signal requires the Flash Dies in the Bank selected by the CS signal to enable their command latches, so that the bits sent on Bus 709 will be latched in as commands.

In Step 5104, the Flash HEMi asserts ALE Signal 802 and places the physical address for the read on Bus 709. That address for the flash pages is obtained from Flash Read Address 4006. If the transfer begins at an offset into the pages, rather than at the beginning, that offset is taken from Head Length Field 4008 and is sent as part of the address. The offset is used to set the location in the Page Buffers from which the transfer to Bus 709 will begin. Note that there is no reason to send an offset at the end of the page (tail length), since Transfer Length Field 4010 is used to halt the transfer once the proper number of bytes has been sent.

Because the CS Signal for the correct Bank remains asserted, the Flash Dies on that Bank receive the ALE Signal. That signal causes them to latch the bits on Bus 709 into their address latches. As is explained above, all four Dies receive the same address, and this is the starting address of a page of data in each of the Dies. As is also explained above, the four pages at the same address in each Die of a Bank constitute a SuperPage, and a SuperPage represents 15 Sectors, constituting contents associated with 15 consecutive LBAs.

In Step 5105, the Flash HEMi asserts CLE Signal 803 and places the second opcode of the read command on Bus 709. Assertion of the CLE Signal requires the Flash Dies in the Bank selected by the CS Signal to enable their command latches, so that the bits sent on Bus 709 will be latched in as commands. When the Flash Dies receive the second read opcode, they automatically begin reading from flash memory to the Page Buffers, from the address previously specified.

In Step 5106, the Flash HEMi updates Page Request State Variables Field 4011. Among other updates, the current State is set to Need Stage Buffer.

In Step 5107, the return value is set to Flash Port not busy, since the series of steps carried out for the Command state used the Flash Port, but that use was very short and is complete.

The Page Request read handler then returns to FIG. 50, Step 5015.

The second time the handler is called for this Page Request, as a result of Step 5014, the State as checked in Step 5101 is Need Stage Buffer.

In Step 5108, the Stage Buffer is checked to determine if it is free. If not ("no" outcome to Step 5108), the Page Request read handler returns without taking any action. If the Stage Buffer is free, ("yes") outcome to Step 5108, in Step 5109, the Stage Buffer is assigned to this process.

In Step 5110, the Flash HEMi sets up a DMA transfer from the flash memory Page Buffers (which contain the values read from the flash memory as a result of the flash read) to the Stage Buffer.

In Step 5111, the Flash HEMi updates Page Request State Variables Field 4011. Among other updates, the current State is set to Flash Transfer Done. This reflects the fact that the flash transfer will occur independently of the Flash HEMi, since this is a DMA transfer. The next time the handler is called, the flash transfer will be complete In Step 5112, the return value is set to Flash Port busy, since the DMA transfer between the Flash Page Buffers and the Stage Buffer will occupy the Flash Port for a period of time after the Page Request read handler returns.

The Page Request read handler then returns to FIG. 50, Step 5015.

The third time the handler is called for this Page Request, as a result of Step 5014, the State as checked in Step 5101 is Flash Transfer Done.

In Step 5113, the Flash HEMi determines whether the ECC check automatically performed as part of the transfer to the Stage Buffer identified any errors in the read data.

If errors were detected ("yes" outcome to Step 5113), in Step 5114 an error handler is called. The manner in which the handler proceeds depends on the nature and number of the detected errors. If the number of detected errors is too large for correction, the error handler might cause the data to be read a second time, in hopes that a second read would yield better data (as is possible if the state of one or more flash cells is close to the threshold between valid data and an error). If the number of detected errors can be corrected, the error handler can cause the data to be corrected by ECC Correction Engine 3101 (see discussion in connection with FIG. 31).

In Step 5115, the Flash HEMi sets up a DMA transfer from the Stage Buffer (which contains the values read from the Flash Page Buffers as a result of the Need Stage Buffer State processing) to Data Path DRAM 107.

In Step 5116, the Page Request read handler waits. Because a DMA transfer to DRAM is very fast, the read handler does not return at this point, but stalls temporarily.

In Step 5117, the Flash HEMi checks to see if Transfer Count Register 2716 has a value of zero, indicating that the DMA transfer is complete. If not ("no" outcome to Step 5117), Wait Step 5116 is repeated. Once the DMA transfer is finished ("yes" outcome to Step 5117), in Step 5118, the Stage Buffer is released for use by other operations.

In Step 5119 the Page Request is popped off of the Bank Queue. This is done because no further processing of this Page Request is necessary, and the next Page Request on the Bank Queue can now be handled.

In Step 5120, the Flash HEMi decrements Transfer Request Remaining Page Requests Field 3912, reflecting the fact that the Page Request has completed.

In Step 5121, the Flash HEMi checks to determine if the Remaining Page Requests Field has reached zero.

If the Field has reached zero ("yes" outcome to Step 5121), this means that all Page Requests for the Transfer Request have been completed. In Step 5122, the Transfer Request is appended to Local Transfer Request Queue 2904, so that it will be handled by the Flash HEMi execution loop. Note that at this point the Transfer Request has a State of Done (see FIG. 49, Step 4921), so that once it is popped off the Local Transfer Request Queue, a clean-up process will be initiated (see below).

Step 5123 is reached if additional Page Requests remain for the Transfer Request ("no" outcome to Step 5121), or when Step 5122 completes. In Step 5123, the return value is set to Flash Port not busy.

The Page Request read handler then returns to FIG. 50, Step 5015.

FIG. 52 illustrates certain aspects of a flash read operation in greater detail.

In Step 5201 the Flash HEMi drives one of the lines in CS/RB Bus 702 low. This signal is subsequently inverted, causing the signal to be received as high on the Chip Enable pins of the four Flash Memory Chips of the selected Flash Memory Bank In Step 5202, the Flash HEMi drives CLE Signal 803 high. This informs the Dies on the selected Bank that the next set of signals will consist of a command.

In Step 5203, the Flash HEMi drives the eight bits that constitute the first phase of the Read command on Bus 709. As is conventional in flash memory devices, the first phase of a read command instructs the Flash Dies to prepare to receive a read address. The first phase of the command constitutes eight bits, and four copies are driven in parallel on 32-bit Bus 709. For example, if the first Read command were opcode 08, the information on Bus 709 would be 08080808, and one copy of the command would be delivered to each Die. Because CLE has previously been driven high, and received on the CLE pins of each Die in the selected Bank, each Die in the Bank latches the command into its command latch.

In Step 5204, the Flash HEMi asserts CLE low and ALE Signal 802 high. This prepares the Flash Dies to receive an address In Step 5205, the Flash HEMi sends one byte of the address to be read. This is done by sending four copies of the address byte on Bus 709. This causes that byte to be latched into the address latch of each Flash Die on the selected Bank.

In Step 5206, the Flash HEMi determines whether all address bytes have been sent. If not ("no" outcome to Step 5206), processing returns to Step 5205 to send the next address byte.

In the currently preferred embodiment, each address is made up of five bytes, so this loop would repeat four times.

In the current embodiment, five address strobes are sufficient to provide a complete address for the Flash Dies. However, typical flash memory chips ignore address strobes that exceed the address bits that the chip requires. For this reason, the Flash Dies could be replaced by smaller and less expensive flash memory chips without requiring any redesign of the addressing mechanism, since, although smaller flash memory chips would require fewer address bytes (e.g., four bytes rather than five), those chips would ignore any unnecessary address bytes received, so that they could be incorporated into the system without requiring that the number of address cycles be reduced. Similarly, by increasing the number of address cycles, and thus the number of address bytes, the system can be designed to handle flash memory chips of any arbitrary size, without requiring any address-related redesign for smaller chips.

Once the entire address has been sent ("yes" outcome to Step 5206), processing continues with Step 5207, in which CLE is asserted and ALE is deasserted In Step 5208, the second phase of the read command is sent on the A/D Bus. Conventionally, the second phase of a read command causes the flash memory chips to begin a read from the Flash Dies to the Page Buffers.

In Step 5209, the Flash Dies each set their Ready/Busy pin to Busy. As is described above, these pins are each connected to one CS/RB line that is further connected to a pin of SSD Controller 106. This causes the Flash HEMi to recognize that the Flash Memory Bank is busy and unable to receive additional commands. The manner in which the Busy signal is asserted is described in detail in connection with FIG. 11.

In Step 5210, each Flash Die fetches data from the requested flash memory address into the Die's internal Page Buffer.

In Step 5211, the R/B signal from the Flash Bank transitions to a "ready" state, which means that all four Ready/Busy pins from the Dies have transitioned from the "busy" state to the "ready" state, indicating that the requested data is present in the Page Buffer of each chip and is available to be read out onto Bus 709.

In Step 5212, the Flash HEMi asserts RE. As is conventional, this causes the Page Buffers of the Dies on the affected Bank to read a single byte each onto Bus 709. Those four bytes constitute a doubleword. That doubleword is transferred to the Stage Buffer. In Step 5213, Flash Transfer Count Register 2712 is decremented. This register holds the number of doublewords that are to be transferred. If the read is to transfer only a portion of a page, the Flash Transfer Count Register halts the transfer at the appropriate point, even though additional data may be present in the Page Buffers. That additional data is overwritten the next time the Page Buffers are used.

In Step 5214, the Flash Transfer Count Register is checked to determine if it has reached zero. If not ("no" outcome to Step 5214), processing returns to Step 5212, to clock out the next doubleword.

If the Flash Transfer Count is zero ("yes" outcome to Step 5214), the transfer from flash is done. At this point the data is in the Stage Buffer. As is described above, it is then transferred from the Stage Buffer to the Data Path DRAM, and from there through the Host Port to the Host.

FIG. 53 illustrates the execution of a Page Request write handler as part of Step 5014 of FIG. 50. As is understood by those of ordinary skill in the art, a flash write does not overwrite a flash page with new data, but instead replaces an old flash page with a new flash page containing the new data and invalidates the old page. Thus, if a write only alters part of a page, the unaltered portion of the page must be copied into the new page, in an operation known as a read-modify-write.

The Page Request write handler begins with Step 5301, which checks Page Request State Variables 4011. In the case of a read-modify-write operation, the State begins with the State Variables set to Command.

Processing following identification of the Command State (Steps 5302-5307) is similar to processing following identification of the Command State in the read handler (FIG. 51, Steps 5102-5107) and will not be further described herein (as should be understood, in an actual software embodiment these two groups of steps could be combined into a single software routine). This processing ends with the State Variables set to Need Stage Buffer and Stage 1. At this point, the Flash has been set up to read the SuperPage that contains the LBAs that are subject to the write. The write handler exits, and control returns to the Flash HEMi Execute Loop (FIG. 50, Step 5015).

Processing of the Need Stage Buffer 1 State (Steps 5308-5312) is similar to processing following identification of the Need Stage Buffer State in the read handler (FIG. 51, Steps 5108-5112). Note that although the entirety of the affected Pages are present in the Flash Page Buffers, only the Sectors containing LBAs that are unchanged in the write are copied into the Stage Buffer. This processing ends with the State Variables set to Need Stage Buffer 2. The write handler exits, and control returns to the Flash HEMi Execute Loop (FIG. 50, Step 5015).

Processing following identification of the Need Stage Buffer 2 State in Step 5301 begins with Step 5313, in which a determination is made regarding whether ECC Logic 3102 detected any ECC errors in the data read from flash.

If an error was detected, ("yes" outcome to Step 5313), in Step 5314 an error handler is called. The manner in which the handler proceeds depends on the nature and number of the detected errors. If the number of detected errors is too large for correction, the error handler might cause the data to be read a second time, in hopes that a second read would yield better data (as is possible if the state of one or more flash cells is close to the threshold between valid data and an error). If the number of detected errors can be corrected, the error handler can cause the data to be corrected by ECC Correction Engine 3101 (see discussion in connection with FIG. 31).

If no errors were detected ("no" outcome to Step 5313), in Step 5315, the DRAM to Stage Buffer DMA transfer is set up. Once the DMA transfer is set up by the Flash HEMi, it proceeds automatically without any further intervention by the HEMi. Note that this transfer only includes data corresponding to LBAs that are changed in the write, and this data is merged with the data received from the flash, so that following this Step the Stage Buffer holds an entire SuperPage (four Pages) of data, including the newly written LBAs and the old data for LBAs from the SuperPage that were not overwritten.

Steps 5316 and 5317 are identical to Steps 5116 and 5117 in FIG. 51 and will not be further described.

In Step 5318, the CS signal is set. This Step is identical to Step 5102 in FIG. 51.

In Step 5319, CLE is set and the first write opcode is sent to the flash. This Step operates similarly to Step 5103 in FIG. 51.

In Step 5320, ALE is set and the address for the write is sent to the flash. This Step is identical to Step 5104 in FIG. 51.

In Step 5321, the Flash HEMi sets up a DMA transfer from the Stage Buffer to the flash.

This transfer then takes place automatically, with no further involvement by the Flash HEMi. In Step 5322, the Flash HEMi updates the Page Request State Variables to indicate that the next State is Flash Transfer Done.

In Step 5323, the return value is set to Flash Port busy, following which the write handler exits, and control returns to the Flash HEMi Execute Loop (FIG. 50, Step 5015). At this point, the SuperPage of data is being transferred from the Stage Buffer to the Flash Page Buffers, and the flash has been set up for the write from the Flash Page Buffers to the flash cells.

The next time the write handler is called, the Flash Transfer Done State is identified in Step 5301. In Step 5324, CS is set. This is identical to FIG. 51, Step 5102.

In Step 5325, CLE is set, and the second write opcode is sent to the flash. This causes the flash to write the values from the Flash Page Buffers to the flash memory. In Step 5326, the Stage Buffer is released for use by other operations.

In Step 5327, the Flash HEMi updates the Page Request State Variables to indicate that the next State is Page Request Done.

In Step 5328, the return value is set to Flash Port not busy, and the write handler exits and returns control to the Flash HEMi Execute Loop (FIG. 50, Step 5015). At this point, the data is being written from the Flash Page Buffers to the flash cells.

Processing following identification of the Page Request Done State in Step 5301 begins with Step 5329, in which a check is done to determine if any errors were detected on the write.

If errors were detected ("yes" outcome to Step 5329), in Step 5330 an error handler is called. This Step operates similarly to Step 5314.

If no errors were detected ("no" outcome to Step 5329), processing continues with Steps 5331 through 5335, which are identical to Steps 5119-5123 of FIG. 51. Following this, the write handler is finished and exits, and control returns to the Flash HEMi Execute Loop (FIG. 50, Step 5015).

The process shown in FIG. 53 illustrates a read-modify-write operation. If the Transfer Length of the Page Request is 15, indicating that the write will replace the entire SuperPage, the read-modify portion of the operation is unnecessary, and the Command and Need Stage Buffer 1 paths are not used. Instead, the Page Request State Variables start out in the Need Stage Buffer 2 State.

As is described above, in the case of a write operation, the Flash HEMi is required to allocate a SuperPage to the Page Request. The flowchart in FIG. 54 illustrates this process.

In Step 5401, the Flash HEMi uses the first LBA assigned to the Page Request by the Transfer Request as an index for a lookup into Forward Table 3201, and identifies the Bank currently holding the data associated with the LBA.

In Step 5402, the Flash HEMi checks SuperPage Pointer List 2919 to determine if there are any available SuperPages on the Bank. The Bank selection for a read-modify-write attempts to use a SuperPage on the same Bank as the SuperPage that holds the original data. This significantly enhances performance, because the read side of the transaction can be handled by a read of the data from the flash memory to the flash Page Buffers, without any requirement of a read to the Stage Buffer. The new and old data is then merged in the Page Buffers. By avoiding a read to the Stage Buffer, this method increases the performance of write operations and avoids tying up the flash interface, thereby freeing it for other transactions.

If a SuperPage is available on the Bank ("yes" outcome to Step 5402), processing proceeds to Step 5403, in which the entry corresponding to the SuperPage is checked in SuperBlock Metadata Table 3501 to determine if the SuperPage has been identified as defective.

If the SuperPage is defective ("yes" outcome to Step 5403), processing proceeds to Step 5404, in which the defective SuperPage is skipped. Processing then returns to Step 5402.

If the SuperPage is not defective, ("no" outcome to Step 5403), processing proceeds to Step 5412, which is described below.

If there are no available SuperPages on the Bank ("no" outcome to Step 5402), in Step 5405 the Flash HEMi increments the Bank, thereby moving to the next Bank and rolling over to Bank 0 if necessary.

In Step 5406 the Flash HEMi determines whether it has checked all Banks in the Flash Group (i.e., whether the current Bank is the same as the first Bank that was checked). If not ("no" outcome to Step 5406), the Flash HEMi returns to Step 5402 to determine whether a SuperPage is available on the next Bank. Note that each time through a new Bank is checked, as a result of the increment in Step 5405.

If all Banks are checked and no SuperPages are available ("yes" outcome to Step 5406), then the currently open SuperBlock is full and must be closed, and a new SuperBlock must be opened. In Step 5407, the Flash HEMi copies SuperBlock Metadata Table 3501 for the currently open SuperBlock from Data Path DRAM 107 to SuperPage 0 of Block 0 of the open SuperBlock. This is accomplished by issuing an internal Transfer Request to move the data.

Prior to the copying operation, Closed Flag 3509 of the Table is set.

In Step 5408, the Flash HEMi pops the next SuperBlock from SuperBlock Freelist 2912, and copies the identifier of that SuperBlock into Open SuperBlock Pointer 2914.

In Step 5409, the Flash HEMi writes the current time into the Time Stamp field in the Reverse Table corresponding to the newly opened SuperBlock (e.g., Reverse Table 3205).

In Step 5410, the Flash HEMi copies the SuperBlock Metadata Table from SuperPage 0 of Block 0 of the newly opened SuperBlock into SuperBlock Metadata Table 3501 of Data Path DRAM 107. At this point the Table is blank with the exception of defect and erase count information, and Open Flag 3508, which is set.

In Step 5411, the Flash HEMi initializes SuperPage Pointer List 2919. The pointer for Bank 0 is set to SuperPage 1, since the SuperBlock Metadata Table occupies SuperPage 0. All other pointers are set to SuperPage 0. Processing then returns to Step 5402 for allocation of a SuperPage to the Page Request.

Step 5412 is reached if there is a non-defective SuperPage available on the Bank ("no" outcome to Step 5403). In Step 5412, the Flash HEMi allocates the next SuperPage on the Pointer List to the Page Request, choosing the entry from the current Bank. The Flash HEMi writes the address of the SuperPage into Flash Write Address Field 4007 of the Page Request. Note that the entire address is available, since a flash address is characterized by Port, Bank, Block and Page. The Port information is not needed, since the Flash HEMi only operates on a single Port, and the Bank, Block and Page information are available based on a combination of the SuperBlock identifier, the SuperPage number and the Bank used to identify which of the SuperPage lists was used.

In Step 5413, the Flash HEMi updates the SuperPage Pointer List to reflect the SuperPage allocated in Step 5412, by incrementing the Pointer for the relevant Bank.

Processing of this operation then ends.

Clean up of a completed transaction is described in FIG. 55. The process described in this flowchart is carried out as part of Step 5003 of FIG. 50. At this point, a Transfer Request invoked as part of a Host-initiated read or write command is on the Local Transfer Request Queue as a result of the Page Request handler having determined that the last Page Request for the Transfer Request has been completed (e.g., FIG. 51, Step 5122).

In Step 5501, the Transfer Request is popped off the Local Transfer Request Queue. Steps 5501 through 5504 are executed by a Transfer Request handler running on the Flash HEMi.

In Step 5502, Transfer Request State Variables Field 3908 is checked. In general, Transfer Requests that are on the Queue will have a State of Done (see, e.g., FIG. 49, Step 4921), the major exception being a Transfer Request invoked as part of a garbage collection routine. In this case, since the Transfer Request results from a completed read or write command, it has a State of Done.

In Step 5503, the Page Requests identified in Page Request Pointer Array 3913 are placed on Page Request Freelist 2910. These Page Requests are now available for use by other Transfer Requests.

In Step 5504, the Internal Transfer Request is placed on Local Transfer Request Freelist 2905. This Internal Transfer Request is now free to be allocated to a Transfer Request on the Flash HEMi's external Worklist. The Transfer Request handler calls an IOP handler running on the Flash HEMi and terminates.

In Step 5505, the IOP handler running on the Flash HEMi decrements the Remaining Transfer Requests Field 3808 of the IOP identified in the Transfer Request's Calling IOP Field 3902. Note that at this point the IOP is not on any HEMi's Worklist, so that the Flash HEMi is allowed to access it, even though it is not on the Flash HEMi's Worklist.

In Step 5506, the Flash HEMi determines whether the Remaining Transfer Requests Field has reached zero, indicating that the IOP has no active Transfer Requests.

If the value is above zero ("no" outcome to Step 5506), the Transfer Request handler ends. No clean-up is required because the IOP is not yet finished.

If the value is zero ("yes" outcome to Step 5506), in Step 5507, the IOP is placed on the Worklist for the Transmit HEMi associated with the Port identified in Host Port Field 3803 of the IOP. The IOP handler running on the Flash HEMi then terminates.

In Step 5508, IOP Command Field 3806 is evaluated to determine whether the IOP relates to a read or a write command. This and all subsequent steps are carried out by an IOP handler running on the Transmit HEMi.

If the command is a read command ("yes" outcome to Step 5508), in Step 5509 the Transmit HEMi sets up data and other frames necessary to convey the data to the Host, and transmits those frames to the Host.

Following Step 5509, or if the command is a write rather than a read ("no" outcome to Step 5508), in Step 5510 the Transmit HEMi transmits a status frame to the Host indicating that the command has been completed.

In Step 5511, the Transmit HEMi (a) places the CDBinfo identified in IOP CDBinfo Field 3805 on CDBinfo Freelist 4102, (b) places the IOP on IOP Freelist 4103, and (c) places the Transfer Requests identified in IOP Transfer Request Pointer Array 3809 on Transfer Request Freelist 4104.

In Step 5512, the Transmit HEMi cleans up various other data structures to reflect the closing of the CDBinfo and the IOP. For example, the Transmit HEMi decrements Count Field 4203 in the Initiator Info entry for the Initiator identified in IOP Initiator Field 3804.

The clean-up process then ends.

C. Garbage Collection

Garbage collection is the process of freeing up flash memory space for new writes. This is performed on a Flash Port by Flash Port basis, as the Flash HEMi associated with each Port determines whether garbage collection is required for the Flash Group associated with the Port, and then carries out garbage collection operations if necessary.

Each Flash Group includes a number of SuperBlocks, which are in one of three states: (1) open (a single SuperBlock that is currently open for writing; (2) closed (SuperBlocks into which data has been written, but which are no longer open for writing) and (3) free (SuperBlocks on SuperBlock Freelist 2912, which have been erased and are available for future writes). Closed SuperBlocks normally include a combination of valid SuperPages (containing Sectors with data that is currently valid) and invalid SuperPages (containing Sectors with data corresponding to LBAs that have subsequently been written elsewhere and are therefore no longer valid). As is explained in connection with FIG. 34, invalid SuperPages are so designated in the Reverse Table for the Flash Group.

In order to operate, each Flash Group needs free SuperBlocks, since, if the open SuperBlock contains insufficient room for a write (i.e., no free SuperPages shown on SuperPage Pointer List 2919), that SuperBlock must be closed, a SuperBlock from the SuperBlock Freelist must be opened, and the new data must be written into the newly opened SuperBlock. Garbage collection is the process of consolidating data to free up SuperBlocks for future writes.

Returning to FIG. 29, in the currently preferred embodiment, each time a SuperBlock is allocated from SuperBlock Freelist 2912, SuperBlock Freelist Counter 2913 in the MRAM of the relevant Flash HEMi is decremented. This Counter contains the number of SuperBlocks currently on SuperBlock Free List 2912.

Following the decrementing of Counter 2913, the value currently held in the Counter is compared to two values maintained in Garbage Collection Thresholds Section 2915 of the Flash HEMi's mRAM: the Critical Threshold and the Non-Critical Threshold. In the currently preferred embodiment, these values are set at initialization to default values of "2" and "6," respectively, but, as is discussed below, other values could be used. Moreover, these values are programmable, and therefore can be altered by the user.

If the Counter value (and thus the number of SuperBlocks on the SuperBlock Freelist) is at or below the Critical Threshold, a Critical Flag is set and the Flash HEMi shifts into critical garbage collection mode, with garbage collection operations taking precedence over all other operations, including Host reads and writes. This continues until the Counter value (and therefore the number of SuperBlocks on the SuperBlock Freelist) exceeds the Critical Threshold, causing the Critical Flag to be reset.

If the Counter value is above the Critical Threshold, but at or below the Non-Critical Threshold, the Flash HEMi shifts into non-critical garbage collection mode, and garbage collection operations are initiated, but only after all Host-initiated reads and writes have been handled. If the amount of available free space is above the Non-Critical Threshold, garbage collection does not occur.

In the currently preferred embodiment, the Critical Threshold is set to 2 because at least one free SuperBlock is needed at all times, in order to insure that an incoming write can be accommodated, and an additional SuperBlock is required to provide protection against the possibility that Transfer Requests that were on Local Transfer Request Queue 2904 prior to the Critical Flag being set might use up an additional SuperBlock. Note that even in Critical Mode, Transfer Requests already on the Local Transfer Request Queue will be handled by the Flash HEMi before garbage collection Transfer Requests, which, as with all other new Transfer Requests, are appended to the bottom of Local Transfer Request Queue 2904.

In the currently preferred embodiment, the Non-Critical Threshold is set at "6," which represents a compromise between reducing the frequency of garbage collection (which requires a lower number) and minimizing the possibility that a sequence of Host-initiated writes could be interrupted by the need for critical mode garbage collection (which requires a higher number). In alternate embodiments, this number could be set either somewhat higher or somewhat lower. Note that a lower number will tend to reduce the frequency of garbage collection, and will therefore increase the amount of time a SuperBlock remains closed before it is subject to garbage collection. Since the amount of valid data a SuperBlock contains will tend to decrease as time goes on (as valid SuperPages in the SuperBlock are the subject of new writes and are therefore invalidated), garbage collection is more efficient on older, staler SuperBlocks, because such SuperBlocks contain less valid information that must be copied into the open SuperBlock. Thus, setting the Non-Critical Threshold to a lower value tends to increase the efficiency of garbage collection operations by increasing the amount of time a given SuperBlock is closed prior to being subjected to garbage collection. Again, however, this is a compromise, since the lower the number, the more likely that the Critical Threshold will be reached, at which point system performance will degrade, since critical mode garbage collection takes precedence over normal reads and writes.

The process of garbage collection is illustrated in the flowchart shown in FIG. 56

Garbage collection requires the selection of a SuperBlock for erasure. This is represented in Step 5601. Since this requires that data from the valid SuperPages in the selected SuperBlock be written to the currently open SuperBlock, it makes sense to choose SuperBlocks that have the least amount of valid data. Thus, when garbage collection is initiated, the relevant Flash HEMi checks the Count Field for each SuperBlock in the Reverse Table for the Flash Group, beginning with the SuperBlock after the SuperBlock that was most recently added to the SuperBlock Freelist (e.g., if the last SuperBlock that was added to the Freelist as a result of garbage collection is 17, the first SuperBlock Count Field checked in the next garbage collection operation would be SuperBlock 18) and proceeding through each SuperBlock in numerical order, wrapping around through SuperBlock 0.

The Flash HEMi selects the SuperBlock with the highest Count Field value, indicating the largest number of invalid SuperPages. If more than one SuperBlock is tied for the highest Count Field, in the currently preferred embodiment, the first such SuperBlock encountered is chosen for garbage collection. In an alternative embodiment, ties could be broken by checking the Erase Count field in the SuperBlock Metadata Table (or the Reverse Table) for each of the tied SuperBlocks, with the SuperBlock having the lowest Erase Count being selected. This alternative has the advantage of imposing a certain degree of wear leveling. As those of ordinary skill in the art will appreciate, erase operations tend to create wear in flash memories, so that those blocks having a higher number of erases will tend to have a higher number of defects. This type of wear leveling tends to even out the number of defects across blocks, though at a cost of imposing an additional operation prior to each garbage collection.

Once a SuperBlock is chosen for garbage collection, in Step 5602 the associated Flash HEMi creates a series of internal Transfer Requests sufficient to move the data from each valid SuperPage in that SuperBlock into the currently open SuperBlock.

Internal Transfer Requests are issued by and specific to particular Flash HEMi's. They differ from normal Transfer Requests in that internal Transfer Requests are only held in the MRAM of the issuing Flash HEMi and are never stored in Shared RAM or operated on by any other HEMi. Since an internal Transfer Request is not invoked as a result of an IOP, Calling IOP Field 3902 of each internal Transfer Request is left blank.

As is described above, each Transfer Request can issue three Page Requests, and each Page Request can cause the transfer of one SuperPage of data. Thus, the number of internal Transfer Requests that the Flash HEMi is required to issue to move data will equal the number of valid SuperPages in the SuperBlock divided by three, rounded up.

In the currently preferred embodiment, assuming eight Blocks per Flash Group, each SuperBlock contains 512 SuperPages (64 SuperPages per Block×8), so in theory garbage collection could require the issuance of 171 Transfer Requests (though, as should be understood, no point would be served in performing garbage collection on a SuperBlock if every SuperPage in the SuperBlock were valid). In practice, however, as SuperBlocks chosen for garbage collection tend to have relatively few valid SuperPages, far fewer than 171 Transfer Requests are required.

In Step 5603, the Page Requests issued as a result of the Transfer Requests set up in Step 5602 are executed. As should be understood, Steps 5602 and 5603 will probably overlap, since it is likely that the number of Transfer Requests required for moving valid SuperPages from the old SuperBlock to the open SuperBlock will exceed six, which is the number of Transfer Requests that can be handled simultaneously by the Flash HEMi. Thus, some number of Transfer Requests will be allocated, Page Requests will then be executed for those Transfer Requests, and, as each Transfer Request is completed, its slot in Local Transfer Request Table 2901 will open up, thereby allowing the Flash HEMi to issue a new Transfer Request.

The operation of copying data from valid SuperPages into the currently open SuperBlock is similar to a normal write operation, except without external data. As is described above in connection with the description of SuperPage Pointer List 2919, writes preferentially take place to SuperPages on the same Bank as the SuperPage that is to be invalidated by the write. This minimizes the number of transfers required, since a write from one location in a Flash Bank to another location in the same Bank does not require moving the data to the Flash Stage Buffer, but can be accomplished by writing the data from the flash memory to the Flash Page Buffers and then back from the Flash Page Buffers into the flash memory. This is significantly faster than moves that require transferring data to the Stage Buffer, and does not tie up the bus that connects the Stage Buffer and the Flash Group.

Garbage collection writes are preferentially to the same Bank, using SuperPage Pointer List 2919. One Page Request can handle both the read from flash memory and the write to flash memory, so a single Transfer Request can handle three valid SuperPages. As with normal writes, each time the data from a valid SuperPage is copied into a new location, the entry in Forward Table 3201 corresponding to those LBAs is updated.

Following the Transfer Requests that move data from the old SuperBlock into the open SuperBlock, in Step 5604, three Transfer Requests are issued, containing a total of seven Page Requests (three Page Requests in the first two Transfer Requests and one Page Request in the third Transfer Request). Each of these Page Requests executes a flash erase command to a single block. As is described above, each SuperBlock consists of the same block in each of the eight banks of the port. Thus, each Page Request erases the same block at a different chip select. As one of ordinary skill in the art will understand, a flash erase command causes a series of "1s" to be written into the erased Block. These seven Page Requests erase Blocks 1-7 of the SuperBlock.

The last Transfer Request required for the garbage collection operation contains three Page Requests. In Step 5605, the first of these Page Requests copies the defect column and erase count from the SuperBlock Metadata Table stored in Bank 0, SuperPage 0 of the SuperBlock (see FIG. 35) into the Flash Stage Buffer. Note that this resides in Block 0 of the SuperBlock, which was not erased in Step 5604.

In Step 5606, the Flash HEMi increments Erase Count Field 3507 in the SuperBlock Metadata Table, reflecting the fact that the SuperBlock has now been erased an additional time. In Step 5607, the Flash HEMi accesses the Reverse Table for the Flash Group in Data Path DRAM 107, marks all SuperPages from the SuperBlock as valid and sets the Count Field for the SuperBlock to 0.

In Step 5608, the second Page Request from the last Transfer Request erases Block 0. Note that this and Steps 5609-5610 can occur in parallel with Step 5607.

In Step 5609, the last Page Request copies the erase count and defect data from the Stage Buffer back into SuperPage 0 of Bank 0 of the SuperBlock, therefore setting up a new SuperBlock Metadata Table in flash that is blank except for those entries.

In Step 5610, the SuperBlock is placed back onto SuperBlock Free List 2912 and SuperBlock Freelist Counter 2913 is incremented. The garbage collection operation for that SuperBlock then completes.

Although the currently preferred embodiment copies the valid data from the old SuperBlock into the currently open SuperBlock, just as occurs in the case of a Host-initiated write, in an alternative embodiment there are two "open" SuperBlocks at the same time, one used for normal reads, and a second used to collect data from SuperBlocks being recycled through the garbage collection process. In this embodiment, garbage collection-initiated Transfer Requests are identified (e.g., by a garbage collection flag in the Transfer Request), and cause data to be written to the open garbage collection SuperBlock, rather than the open SuperBlock used for Host-initiated writes.

Valid data resulting from garbage collection is relatively "stale" in comparison with valid data in the SuperBlock currently open for writing. For this reason, copying valid data resulting from garbage collection into a garbage collection SuperBlock will tend to concentrate data that is relatively stale, and therefore less likely to be used with great frequency. As will be understood by those of ordinary skill in the art, data that has not been recently written is significantly less likely to be read or written in the near future than is more recent data.

The use of "garbage collection" SuperBlocks has the advantage of concentrating relatively stale data in one or more SuperBlocks. Because such data is relatively less likely to be overwritten, such SuperBlocks will tend to fill up with valid data. If, as is described above, garbage collection is preferentially applied to SuperBlocks with a relatively high proportion of invalid data, SuperBlocks used as the repository for garbage collection will probably not themselves be subject to garbage collection. This has the advantage that data that is expected to be relatively static will concentrate in a relatively small number of SuperBlocks, and this data will not be subject to garbage collection, and therefore it will be unnecessary to regularly copy this data to new SuperBlocks as part of the garbage collection process. Conversely, the SuperBlocks used for normal writes will tend to include a concentration of data that is used and rewritten frequently. Such SuperBlocks will therefore have a tendency to include a relatively high proportion of invalid SuperPages. When such SuperBlocks are themselves subjected to garbage collection, the amount of valid data that will have to be copied out of the SuperBlock will be relatively low, thereby decreasing the time required for garbage collection.

Garbage collection SuperBlocks can therefore improve performance, by minimizing the amount of time necessary for garbage collection operations, though at the cost of some additional complexity.

In an extension of this alternate embodiment, a hierarchical memory system is used, involving relatively expensive fast memory and relatively cheaper slower memory. SuperBlocks used for storing data collected during garbage collection are stored in slower memory, since such SuperBlocks are expected to include data not required on as frequent a basis as data that has been more recently updated and is therefore stored in SuperBlocks kept in faster memory.

D. Patrol Function.

As is understood in the field, data integrity in flash memories may deteriorate for various reasons. During each read, the charge within the cells of a page may dissipate slightly, causing the voltages in the cells to deteriorate until that voltage can no longer be read correctly. Neighboring pages may also be affected by a read operation, thereby causing the voltages in the cells of such pages to deteriorate even though the actual cell was not read. This is referred to as a "read disturb." Over time, this dissipation may cause cell voltages to drop below a threshold and cause a "1" to register as a "0". If these errors are not dealt with, over time there may be more errors than are recoverable through ECC and data corruption may occur.

Additionally, programming (writing) or erasing a memory cell may also degrade performance and lead to increased data errors. For example, when a cell is programmed or erased, increased voltages may be required to cause charge to flow onto or off of a floating gate. However, the increased voltages may stress the semiconductor materials used to form the cells. Over many program or erase cycles, the cells' ability to effectively store charge may degrade, leading to increased errors in the data.

The amount of time since a flash memory cell was written can also contribute to data unreliability.

Note that these problems may or may not result from physical defects in the flash memory that may cause a SuperPage to be identified as defective. A physical defect is permanent, and the affected SuperPage is permanently mapped out and no longer used. Instead, these types of errors are transient, resulting from degradation of the charge held by one or more flash cells on the SuperPage. Detection of such transient errors does not require that the SuperPage be identified as defective, and the errors themselves are correctable through use off ECC.

However, ECC can only correct a given number of errors per page. Moreover, once the integrity of a page begins to be affected by factors such as those listed above (e.g., read disturbs, write disturbs, etc.), it is likely that the number of errors on the page will increase over time, so that at some point the information on the page will not be recoverable.

Error-handling remains one of the most significant challenges facing enterprise-level flash storage. As is well-known in the art, flash storage has a relatively high rate of errors, and this is compounded by the fact that error correction in a flash memory system requires writing an entire page using a read-modify-write operation that consumes significant system resources.

SSD Controller 106 is uniquely suited to deal with flash memory errors, since the large number of processors, and the multiple independent pipelines, allow Controller 106 to detect and correct errors more or less continuously without degrading host-perspective system performance.

The design of SSD Controller 106 allows significant choice in terms of error correction algorithms, several of which are described herein.

In one embodiment, SSD Controller 106 uses independent patrol functions consisting of firmware running on each flash HEMi that "patrols" each flash group independently, reading every SuperPage that contains valid information and correcting errors that exceed a threshold. This embodiment is illustrated in FIG. 57.

The FIG. 57 flowchart begins with a "no" outcome from FIG. 50, Step 5004. As is described above in connection with FIG. 50, Steps 5007-5009 may in some circumstances be replaced by the patrol function.

Step 5701 represents a check to determine if the patrol function is operating. In one embodiment, the patrol function operates periodically. In this embodiment, the function checks every valid SuperPage in the Flash Group, and then shuts down for a period of time. For example, the patrol function may run to completion once every 24 hours. In this embodiment, once the patrol function completes, it will not restart until the designated period is complete, e.g., it may start every midnight, run to completion (as is explained below, the function is periodically interrupted to allow other operations to take place), and then shut down until the following midnight.

In embodiments in which the patrol function runs periodically, a "no" outcome to Step 5701 leads to FIG. 50, Step 5007, in which the Flash HEMi may go into sleep mode.

In embodiments in which the patrol function is continuously operative (again, the function is interrupted for other tasks), Step 5701 is skipped. In those embodiments, or if the patrol function is operative ("yes" outcome to Step 5701), in Step 5702 a check is done to determine if any Local Transfer Requests are available. Note that in the preferred embodiment, this and certain following steps do not represent independent patrol function programming, but instead calls to firmware routines normally used for host-initiated reads and writes (e.g., FIG. 49).

If no Local Transfer Requests are available ("no" outcome to Step 5702), processing returns to FIG. 50, Step 5007.

If Local Transfer Requests are available ("yes" outcome to Step 5702), in Step 5703 a Local Transfer Request is popped.

In Step 5704, the Local Transfer Request is populated. In general, this mirrors the process used for Host-initiated transactions (see, e.g., FIG. 49), with a Read command used for Command Field 3907. However, the LBA range for the Transfer Request is based on the LBA range used for the immediately preceding iteration of the patrol function on this Flash Group, taking into account the LBA striping used among the Flash Groups, the goal being to cover all LBAs assigned to the Flash Group.

The first time the patrol function runs following initialization (or the first time it restarts after a periodic shut-down), the Transfer Request will be assigned the first 90 LBAs stored in the Flash Group. The next time, the Transfer Request will be assigned the next 90 LBAs stored in the Flash Group, and so on, until the last LBA stored in the Flash Group is reached, at which point the patrol function will restart at the beginning (if it runs continuously), or shut down pending the next triggering event (e.g., the next midnight).

The patrol function keeps track of the LBAs most recently assigned using a data structure in the Flash HEMi mRAM (e.g., a variable in Local Variables 2916).

As is described above (see, e.g., FIG. 16 and accompanying discussion), LBAs are striped among the Flash Groups. Thus, the patrol function cannot simply assign the next 90 LBAs to a Transfer Request, but must instead identify the next group of 90 LBAs that has been assigned to the Flash Group. This can be accomplished by reading through Forward Table 3201 to find the next row with a Port value that equals the Flash Group that the patrol function is running on. Alternatively, the patrol function can use the same algorithm used to assign LBAs to Flash Groups in the first place (e.g., LBAs assigned in stripes of 90, with gaps equal to 90 multiplied by the number of Flash Groups).

Following population of the Local Transfer Request in Step 5704, in Step 5705, three Page Requests are popped and populated, each receiving fifteen of the forty-five LBAs assigned to the Transfer Request. The manner in which Page Requests are populated is described above in connection with FIG. 49.

In Step 5706, the Page Requests are sent to Bank Queues. This is the same process used for Page Requests generated to handle Host-initiated transactions. See, e.g., FIG. 49.

In Step 5707, the Page Request reads are carried out. Note that the data is read to the Flash Stage Buffers, but is not transmitted to Data Path DRAM 107. Instead, the sole purpose of the read is to trigger an ECC check. As is described above in connection with FIG. 31, ECC Check 3104 operates every time data is read into a Flash Stage Buffer, and, if errors are discovered, the data is transmitted to ECC Correction Engine 3101

In Step 5708, an indicator set by ECC Check 3104 is checked to determine if any read errors were detected. If not ("no" outcome to Step 5708), processing proceeds back to the beginning of the FIG. 50 loop. This allows the Flash HEMi to handle other, non-patrol function tasks, even while the patrol function is running, and ensures that the patrol function will not noticeably decrease performance for Host-initiated reads and writes. If no other operations are required, when the FIG. 50 loop returns to Step 5004, a "no" outcome from that Step will trigger the patrol function again, this time with a new set of 45 LBAs.

If read errors were detected ("yes" outcome to FIG. 5708, in Step 5709, the sector containing the errors is sent to ECC Correction Engine 3101. ECC correction is described above in connection with FIG. 31.

In Step 5710, the number of errors corrected by ECC Correction Engine 3101 is checked to determine if it exceeds the threshold of allowable errors, which is set at eight in the current embodiment (see above in connection with FIG. 31).

If the number of errors is at or below the threshold ("no" outcome to Step 5710, the patrol function returns control to FIG. 50, Step 5001. As is described above in connection with FIG. 31, if the number of detected errors does not exceed the threshold, corrected data is not written into the flash.

If the number of errors exceeds the threshold ("yes" outcome to Step 5710), in Step 5711, the corrected data is written into a new SuperPage, using a read-modify-write operation. See FIG. 53, and accompanying description, above.

Following Step 5711, the patrol function returns control to FIG. 50, Step 5001.

FIG. 57 describes one embodiment of the patrol function, in which the function runs independently on each Flash Group. This is made possible by the fact that each Flash Group is served by an independent Flash HEMi. The processing power inherent in SSD Controller 106 allows flash errors to be detected and corrected on a continuous or periodic basis, without any effect on overall system performance, and without requiring attempts to predict which areas of the flash are particularly susceptible to errors.

In a different embodiment, SSD Controller 106 issues IOPs for the patrol function. Each IOP specifies an LBA range, and the IOPs are issued periodically until the entire LBA range governed by SSD Controller 106 is covered. In this embodiment, it is not necessary to separately calculate which LBAs are assigned to which Flash Groups, since this is automatically handled as SSD Controller 106 deals with the IOP (see above).

In this embodiment, no check is done to determine if other tasks are waiting to be handled. For this reason, IOP issuances should be spaced out (e.g., one per minute). In addition, in one alternative, Transfer Requests and Page Requests invoked as a result of a patrol function IOP could be identified as of lower priority, and handled after other Transfer Requests and Page Requests (see above).

E. Abort Handling

SSD Controller 106 is required to respond correctly to SCSI abort commands, and to similar commands in other relevant protocols. Abort commands may require aborting a particular read or write command, or all commands from a particular Initiator. SSD Controller 106 must also respond correctly to hard resets, in which all current commands are aborted and the system is returned to its default power-on state.

Following an abort command or a hard reset, the data stored in LBAs that were subject to aborted write commands begun but not ended prior to the abort is in an undefined state, and the Initiator is required to rewrite such data to return it to a known state.

In the case of a request that a particular command be aborted, the SSD Controller responds by identifying the SCSI Tag received with the abort command, and matching that information to SCSI Tag Field 3705 in the CDBinfos present in CDBinfo Table 4109, thereby identifying the CDBinfo that was created in response to the command now being aborted. IOP Field 3704 of that CDBinfo is then used to identify the IOP invoked to handle the transaction. That IOP's Transfer Request Pointer Array 3809 is then checked to identify each Transfer Request issued as a result of the IOP. Each of those Transfer Requests is then aborted, meaning that its Abort Flag 3906 is set, and the Flash HEMi execute loop initiates an abort handler for each Transfer Request. The abort handler puts the Transfer Request into a done state, and removes all Page Requests identified in Page Request Pointer Array 3913 from the Bank Queues. Clean-up of the Page Requests, Transfer Requests and the IOP proceeds as described in connection with FIG. 55.

An abort queue command requires aborting all commands issued by the Initiator responsible for the abort queue command. That Initiator is identified from metadata accompanying the abort queue command. All CDBinfo's and IOPs identifying that Initiator are retired by being removed from all worklists and returned to their Freelists, and all Transfer Requests issued by such IOPs are also retired.

A hard reset requires that all active commands be terminated. In one embodiment, this is handled by setting Abort Flag 3811 in all active IOPs, but taking no other action. When an IOP is sent to a Transmit HEMi for purposes of sending data (on a write) or status information (on a read) to the Host (see FIG. 55, Step 5507), the Transmit HEMi reads the Abort Flag and terminates processing of the IOP without sending any communication to the Host. The transaction otherwise completes normally. In this embodiment, therefore, no special handling is required, since all transactions complete normally, except that no communications are sent to the Host.

In an alternate embodiment, a hard reset causes the Abort Flag to be set on all active IOPs and Transfer Requests. Once this is done, IOPs and Transfer Requests that are popped off of a HEMi Worklist are not handled, but are instead ignored, and all Page Requests are removed from the Bank Queues. Once all HEMi's have run out of work (as a result of the retirement of all Page Requests, IOPs and Transfer Requests), control is turned over to ARM 2002, which is responsible for cleaning up, including returning all Page Requests, IOPs and Transfer Requests to the Freelists, and setting all state parameters to a default value. This alternate embodiment is faster than allowing all transactions to complete, but the requirement of using special handling introduces some risk of a software error.

F. Power Loss Recovery.

As is described above, Data Path DRAM 107 is used for storing the Forward and Reverse Tables. Since reads from and writes to the DRAM are much faster than reads or writes to flash, storing this information in the DRAM provides a significant performance advantage, particularly given the large number of writes required to these tables.

However, because DRAM 107 is a volatile memory, if power is lost unexpectedly, these tables must be rebuilt, as must the SuperBlock Metadata Table for the currently open SuperBlock for each Flash Port, which, as is described above, is also stored in DRAM 107.

In general, the open SuperBlock Metadata Tables are rebuilt using information stored in the flash SuperPage metadata fields, and the Forward and Reverse Tables are rebuilt using information stored in the SuperBlock Metadata Tables in flash and the rebuilt open SuperBlock Metadata Tables. This is illustrated in FIG. 58, which shows the rebuild process for a single Flash Group.

In Step 5801, the current SuperBlock is set to 0. This sets up a loop through all of the SuperBlocks in the Flash Group.

In Step 5802, SuperBlock Metadata Table 3501 for the current SuperBlock is copied from flash to the Stage Buffer. It is easier to read from and write to the Table in the Stage Buffer than in the flash memories.

In Step 5803, SuperBlock Metadata Table Open Flag 3508 and Closed Flag 3509 are checked to determine if the SuperBlock was in an erased condition at the time of the power loss.

If both Flags are cleared ("yes" outcome to Step 5803), this means the SuperBlock was erased. In Step 5804, the SuperBlock is placed on SuperBlock Freelist 2912, following which processing continues with Step 5821, which as is described below, triggers analysis of the next SuperBlock.

If the SuperBlock was not erased ("no" outcome to Step 5803), in Step 5805, the Open and Closed Flags are checked to determine if the SuperBlock was open at the time of power loss. This is indicated by the Open Flag being set and the Closed Flag not being set. Note that this step can be combined with Step 5803.

If the SuperBlock was closed at the time of the power loss ("no" outcome to Step 5805), in Step 5806 SuperBlock Time Stamp 3506 from the SuperBlock Metadata Table is copied into Reverse Table Time Stamp Field 3405 for the SuperBlock. This Step updates the Reverse Table with the correct Time Stamp information for the SuperBlock.

In Step 5807, the Bank is set to zero. This sets up a loop through all of the Blocks, keeping in mind that each SuperBlock consists of a single Block on each Bank.

In Step 5808, the SuperPage is set to zero. This sets up a loop through the 64 SuperPages in a Block.

In Step 5809, the SuperBlock Metadata Table LBA Field for the current SuperPage and Bank is used as an index for a lookup into Forward Table 3201. Note that Bank 0, SuperPage 0 is a special case, since this SuperPage contains the SuperBlock Metadata Table, so that this SuperPage is skipped in the analysis.

If the Forward Table row for the LBA is already filled in ("yes outcome to Step 5809), this means that the LBA has already been encountered during the rebuilding process, meaning that the LBA was written at least twice into open SuperBlocks. This requires that the latest such write be identified as valid, and any earlier writes be invalidated. In Step 5810, the data from the Forward Table row corresponding to the LBA is used to identify the SuperBlock into which the LBA was written. Reverse Table Time Stamp Field 3405 for that earlier SuperBlock is compared to Time Stamp Field

3506 from the SuperBlock Metadata Table for the SuperBlock currently being evaluated.

If the Reverse Table Time Stamp is lower (earlier) than the SuperBlock Metadata Table Time Stamp ("<" outcome to Step 5810), this means that the entry already in the Forward Table was subsequently replaced by a newer entry reflected in the SuperBlock Metadata Table currently being evaluated. In this case, in Step 5811, the existing Reverse Table SuperPage entry corresponding to the existing Forward Table entry for the LBA is marked invalid in the Reverse Table. Processing then proceeds to Step 5815, which is described below.

If the Reverse Table Time Stamp corresponding to the existing Forward Table entry is higher (later) than the SuperBlock Metadata Table Time Stamp (">" outcome to Step 5810), this means that the LBA entry currently in the Forward Table replaced the LBA entry in the SuperBlock Metadata Table (e.g., the LBA was written again after being written into the SuperBlock currently being evaluated). In this case, in Step 5812, the Reverse Table entry for the SuperPage containing that LBA in the current SuperBlock Metadata Table is marked invalid. Processing then proceeds to Step 5817, which is described below.

If the Reverse Table Time Stamp is equal to the SuperBlock Metadata Table Time Stamp ("=" outcome to Step 5810), this means that the same LBA was written twice in the same SuperBlock. To determine which was written later, it is necessary to read the Time Stamp from the SuperPage Metadata. In Step 5813, the contents of Time Stamp Field 1403 from the two SuperPages are copied from flash into the Stage Buffer.

In Step 5814, the SuperPage Time Stamps are compared.

In Step 5811, the older of the two SuperPages is marked invalid in the Reverse Table.

Step 5815 is reached if the LBA is not already in the Forward Table ("no" outcome to Step 5809), or following Step 5811, in which an old SuperPage has been marked invalid in the Reverse Table. In Step 5815, the Forward Table fields corresponding to the LBA are written with flash address information for the new SuperPage. The Forward Table entry for the LBA now points to this SuperPage as storing the current, valid version of the LBA data.

In Step 5816, the SuperPage is marked valid in the Reverse Table.

Step 5817 is reached after Step 5816 or after Step 5812. In Step 5817, the SuperPage is incremented.

In Step 5818, the incremented SuperPage value is compared to 63.

If the newly incremented SuperPage is less than or equal to 63 ("no" outcome to Step 5818), this means that additional SuperPages remain to be evaluated in the current Bank, and processing returns to Step 5809, at which evaluation of the next SuperPage begins. Note that the SuperPages listed in the SuperBlock Metadata Table are evaluated in order, from 0 to 63.

If the newly incremented SuperPage is greater than 63, ("yes" outcome to Step 5818), this means that the last SuperPage in the Bank has been reached. In Step 5819, the Bank is incremented.

In Step 5820, the newly incremented Bank value is compared to the number of Banks, designated as "n." (As is noted above, the number of Banks is implementation-specific.)

If the newly incremented Bank is less than or equal to n ("no" outcome to Step 5820), this means that additional Blocks remain to be checked in the SuperBlock. (As is described above, a SuperBlock consists of the same Block on each Bank). In this case, processing returns to Step 5808, at which evaluation of SuperPage 0 of the next Bank begins. As should be understood, the Banks are evaluated in order from 0 to n.

If the newly incremented Bank is greater than n ("yes" outcome to Step 5820), this means that the last Block in the SuperBlock has been reached.

In Step 5821, the SuperBlock is incremented. Note that this Step is reached either from Step 5820, or from Step 5804, in which the current SuperBlock is placed on the SuperBlock Freelist.

In Step 5822, the newly incremented SuperBlock value is compared to the total number of SuperBlocks per Flash Group, designated as "p." (As is noted above, the number of SuperBlocks per Flash Group is implementation-specific).

If the newly incremented SuperBlock is less than or equal to p ("no" outcome to Step 5822), this means that additional SuperBlocks remain to be evaluated in this Flash Group. In this case, processing returns to Step 5802, at which the SuperBlock Metadata Table for the next SuperBlock is copied into the Stage Buffer, overwriting the Table for the previous SuperBlock, and the process begins again for the new SuperBlock.

If the newly incremented SuperBlock is greater than p ("yes" outcome to Step 5822), the last SuperBlock has been evaluated, and the recovery of the SuperBlock Metadata Tables, Forward Table and Reverse Table for this Flash Group is complete.

Returning to Step 5805, if the analysis of the Open and Closed Flags indicate that the SuperBlock was open at the time of power loss (Open Flag set, Closed Flag not set), the SuperBlock Metadata Table stored in flash for this SuperBlock will not be useful in determining which LBAs have been assigned to the SuperPages of the SuperBlock, since this information is only stored into flash when the SuperBlock is closed. For this reason, the SuperBlock Metadata Table must be rebuilt using the SuperPage Metadata stored in flash. Once the Table is rebuilt, the SuperBlock can then be analyzed using the same methodology as is used for all other SuperBlocks.

In Step 5823, the current time is written into SuperBlock Metadata Table Time Stamp Field 3506. Although this Time Stamp does not reflect the time when the SuperBlock was closed (since the SuperBlock was not closed at the time of power loss), the current time is guaranteed to be later than the Reverse Table Time Stamp value for any other SuperBlock. Thus, if the same LBA is written in the open SuperBlock and in a closed SuperBlock, the time stamp value for the open SuperBlock will be later than that for the closed SuperBlock, thus causing the SuperPage for the open SuperBlock to be accepted as storing the valid contents for the LBA. This is the correct result, since information in the open SuperBlock is by definition later than information in previously closed SuperBlocks. Note that, after the rebuild procedure is complete, the open SuperBlock will remain open. When the SuperBlock is closed, the SuperBlock Metadata Table Time Stamp value will be overwritten with the time of closing prior to the Table being stored back into flash and therefore will be correct.

In Step 5824, the Bank is set to 0, thus setting up a loop through all of the Blocks (one per Bank) of the SuperBlock.

In Step 5825, the SuperPage is set to 0, thus setting up a loop through all of the SuperPages in the Block.

In Step 5826, SuperPage Metadata 1401 for the current SuperPage is copied from flash to the Stage Buffer.

In Step 5827, a check is made to determine if the SuperPage was written prior to the power loss. A SuperPage that has been written will include valid Metadata.

If the SuperPage was written ("yes" outcome to Step 5827), in Step 5828 the SuperPage Metadata is used to populate the entry for that SuperPage in the SuperBlock Metadata Table. SPage Index Field 1402 is used for the SuperBlock Metadata Table LBA Field. Time Stamp Field 1403 is used for the SuperBlock Metadata Table SuperPage Time Stamp Field. Note that the SuperBlock Metadata Defect Field for the SuperPage already contains valid information, since defect information is maintained in the flash version of the Metadata Table for erased SuperBlocks, and is therefore valid when the Metadata Table for the open SuperBlock is copied from Flash to the Stage Buffer.

Steps 5829-5832 operate identically to Steps 5817-5820. As is explained above, these steps control the looping process, and insure that each SuperPage of each Block is evaluated.

Note that if the current SuperPage was not written ("no" outcome to Step 5827), processing skips to Step 5831, at which the Bank is incremented. Because SuperPages of a SuperBlock are allocated in order on each Bank, if a SuperPage on a Bank is unwritten, this means that subsequent SuperPages on that Bank will also be unwritten.

Once the last Block in the SuperBlock Metadata Table has been evaluated ("yes" outcome to Step 5832), the rebuild process for the Table is complete, and processing returns to Step 5806, at which the Time Stamp information for the Metadata Table is copied into the Reverse Table, thereby insuring that SuperPages in this SuperBlock will always be treated as valid if a conflict is found with any other SuperBlock. Processing then continues from Step 5806 for this SuperBlock.

VI. MLC Flash

Although most of the embodiments described herein use SLC flash memory, SSD Controller 106 is well-adapted to the use of MLC flash. MLC flash stores multiple bits per flash cell, and is therefore able to store a larger volume of data. MLC is also lower cost per unit of storage volume.

MLC suffers, however, from several problems that render it difficult to use in high-performance, high-reliability applications such as datacenters. First, MLC is slower than SLC. As is described above, an MLC write may take 100 microseconds longer than an SLC write, and some MLC is even lower performance.

Second, MLC flash tends to have less endurance than SLC. In general, SLC flash is specified to handle 100,000 erase cycles without failure, whereas current MLC flash technology is only specified to handle 10,000 erase cycles.

Third, MLC flash is subject to a higher rate of data errors than SLC.

SSD Controller 106 is designed to operate with MLC flash at a very high performance level, and with minimal or no changes to the Controller software or hardware.

First, as is explained above in connection with FIG. 44, the parallel pipelining used in SSD Controller 106 masks write latency, so that, although an MLC write takes longer than an SLC write, over a series of writes most of this difference is masked, since SSD Controller 106 can break a write down into page-sized chunks and handle those chunks in a parallel and overlapping fashion.

Second, the flash memory architecture of SSD Controller 106 tends to move newly written data around in a relatively large memory space, thereby minimizing the effect of erase cycle limitations, even without the use of special wear leveling techniques. As is described above, a new write is made to a different SuperPage than the SuperPage that holds the existing data, and the new SuperPage may be on a different block than the original SuperPage. This tends to move data around within a Flash Group, so that, if particular elements of data are erased relatively frequently, these erases will be spread out across a large number of physical flash pages.

In a different embodiment, SSD Controller 106 could use explicit wear leveling techniques. For example, in identifying SuperBlocks to be subjected to garbage collection, SSD Controller 106 could preferentially choose SuperBlocks with a relatively low erase count identified in Erase Count Field 3507 (see FIG. 35). The Erase Count information for each SuperBlock could be stored in a row in the Reverse Table, in a manner similar to Time Stamp Field 3405. SSD Controller 106 could use Erase Count information to break garbage collection ties between SuperBlocks with the same number of valid SuperPages (see discussion in connection with FIG. 56), or could use the Erase Count information to divide SuperBlocks into categories, with SuperBlocks having an Erase Count that approaches a danger zone (e.g., 5,000 erases) being preferentially chosen as "garbage collection" SuperBlocks (as is described above in connection with FIG. 56, in one embodiment valid data from SuperBlocks that are being erased in connection with a garbage collection operation are stored in a garbage collection SuperBlock, resulting in relatively fewer data invalidations on the garbage collection SuperBlock, such that erasures of that SuperBlock will tend to occur relatively less frequently). Similarly, as is described above, SuperBlocks with an Erase Count value that exceeds a threshold could be identified so that they are preferentially not chosen for normal garbage collection, thereby reducing additional wear on such SuperBlocks.

While the embodiments of the various aspects of the present invention that have been described are the preferred implementation, those skilled in the art will understand that variations thereof may also be possible. Therefore, the invention is entitled to protection within the full scope of the appended claims.

What is claimed is:

1. An external memory coupled to a mass storage controller, wherein the mass storage controller is coupled to a plurality of groups of flash memory devices, the external memory comprising:

a portion for a data buffer for holding data received by the mass storage controller from one or more hosts, and for holding data received by the mass storage controller from the plurality of groups of flash memory devices coupled to the mass storage controller, each group of flash memory devices comprising a plurality of banks, each bank comprising a plurality of blocks, each block comprising a minimum size erase unit of flash memory and further comprising a plurality of superpages, each superpage comprising a plurality of flash pages, wherein each group of flash memory devices further includes a plurality of superblocks, wherein each superblock includes a corresponding block from each bank of the plurality of banks in the group of flash memory devices;

a portion for a first table including a series of physical addresses in the plurality of groups of flash memory devices, the series of physical addresses arranged in an order reflecting a logical addressing system used by the one or more hosts, the first table including one physical flash memory address for every n addresses from the logical addressing system, n being larger than one and representing the number of logical addresses assignable to each superpage, and further including a field to store a count for the number of times each of the physical flash memory addresses has been accessed;

a portion for a plurality of second tables, the plurality of second tables comprising a separate second table for each group of flash memory devices, each second table indicating, for each superpage in a respective group of flash memory devices, whether the superpage contains valid data, and for each superblock in the respective group of flash memory devices, a count for the number of superpages in the superblock which store invalid data and a count for the number of times the superblock has been erased; and an interface to the mass storage controller, wherein the mass storage controller is configured to generate and store aggregated data in the external memory, the aggregated data including data stored in the first table and the plurality of second tables in the external memory.

2. The external memory as in claim 1, further including:

a portion for a plurality of firmware overlays, related to a plurality of processors, the firmware overlays including program code to be loaded by and used by the processors.

3. The volatile external memory as in claim 1, further including:

a portion for a third table holding Small Computer Systems Interface (SCSI) tag information, the third table including a plurality of indicators, each indicator indicating whether one or more SCSI tags is currently active in the storage controller.

4. The external memory as in claim 3, wherein:

the third table further includes information identifying an initiator for each currently active SCSI tag.

5. The external memory as in claim 1, wherein:

n is a number ranging from approximately twelve (12) to approximately sixteen (16).

6. The external memory as in claim 5, wherein:

each first table physical flash memory address represents a location on more than one flash memory die.

7. The external memory as in claim 6, further including:

a portion for a plurality of third tables, each containing information relating to an area of flash memory device that is currently open for writing, the information including a time stamp and an indication regarding whether a subset of the area is defective.

8. The external memory as in claim 7, wherein:

each third table further includes an erase count for the area or for a subset of the area and information associating logical addresses with physical addresses that are within the area.

9. The external memory as in claim 8, wherein:

the mass storage controller includes a plurality of flash ports, and each third table is associated with each flash port.

10. A method of operating a system, the system including a mass storage controller, an external memory coupled to the mass storage controller, the mass storage controller coupled to a plurality of groups of flash memory devices, the method comprising:

storing, in a data buffer in the external memory, a first data received by the mass storage controller from one or more hosts, and a second data received by the mass storage controller from the plurality of groups of flash memory devices coupled to the mass storage controller, each group of flash memory devices comprising a plurality of banks, each bank comprising a plurality of blocks, each block comprising a minimum size erase unit of flash memory and further comprising a plurality of superpages, each superpage comprising a plurality of flash pages, wherein each group of flash memory devices further includes a plurality of superblocks, wherein each superblock includes a corresponding block from each bank of the plurality of banks in the group of flash memory devices;

translating, using a first table in the external memory, logical addresses received from the one or more hosts into physical addresses in the plurality of groups of flash memory devices, wherein n logical addresses are assigned to a single physical address, n being larger than one and representing the number of logical addresses assignable to each superpage, wherein the first table includes a series of physical addresses in the plurality of groups of flash memory devices, the series of physical addresses arranged in an order reflecting a logical addressing system used by the one or more hosts, the first table including one physical flash memory address for every n addresses from the logical addressing system and further including a field to store a count for the number of times each of the physical flash memory addresses has been accessed; and storing, in a plurality of second tables in the external memory, the plurality of second tables comprising a separate second table for each group of flash memory devices, data indicating, for each superpage in a respective group of flash memory devices, whether the superpage contains valid data, and for each superblock in the respective group of flash memory devices, a count for the number of superpages in the superblock which store invalid data and a count for the number of times the superblock has been erased.

11. The method of claim 10, wherein the external memory further includes:

a portion for a plurality of firmware overlays, related to a plurality of processors, the firmware overlays including program code to be loaded by and used by the processors.

12. The method of claim 10, wherein the external memory further includes:

a portion for a third table holding Small Computer Systems Interface (SCSI) tag information, the third table including a plurality of indicators, each indicator indicating whether one or more SCSI tags is currently active in the storage controller.

13. The method of claim 12, wherein the third table further includes information identifying an initiator for each currently active SCSI tag.

14. The method of claim 10, wherein n is a number ranging from approximately twelve (12) to approximately sixteen (16).

15. The method of claim 14, wherein each first table physical flash memory address represents a location on more than one flash memory die.

16. The method of claim 15, wherein the external memory further includes:

a portion for a plurality of third tables, each containing information relating to an area of flash memory device that is currently open for writing, the information including a time stamp and an indication regarding whether a subset of the area is defective.

17. The method of claim 16, wherein:

each third table further includes an erase count for the area or for a subset of the area and information associating logical addresses with physical addresses that are within the area.

18. The method of claim 17, wherein:
the mass storage controller includes a plurality of flash ports, and
each third table is associated with each flash port.

19. A system including a mass storage controller, an external memory coupled to the mass storage controller, the mass storage controller coupled to a plurality of groups of flash memory devices, the system comprising:
one or more ports for coupling to one or more hosts;
the external memory coupled to the mass storage controller; and
the mass storage controller coupled to the plurality of groups of flash memory devices, each group of flash memory devices comprising a plurality of banks, each bank comprising a plurality of blocks, each block comprising a minimum size erase unit of flash memory and further comprising a plurality of superpages, each superpage comprising a plurality of flash pages, wherein each group of flash memory devices further includes a plurality of superblocks, wherein each superblock includes a corresponding block from each bank of the plurality of banks in the group of flash memory devices, the mass storage controller configured to generate and store aggregated data in the external memory;
the external memory including:
an interface to the mass storage controller;
a portion for a data buffer for holding data received by the mass storage controller from the one or more hosts, and for holding data received by the mass storage controller from the plurality of groups of flash memory devices coupled to the mass storage controller;
a portion for a first table including a series of physical addresses in the plurality of groups of flash memory devices, the series of physical addresses arranged in an order reflecting a logical addressing system used by the one or more hosts, the first table including one physical flash memory address for every n addresses from the logical addressing system, n being larger than one and representing the number of logical addresses assignable to each superpage, and further including a field to store a count for the number of times each of the physical flash memory addresses has been accessed; and
a portion for a plurality of second tables, the plurality of second tables comprising a separate second table for each group of flash memory devices, each second table indicating,
for each superpage in a respective group of flash memory devices, whether the superpage contains valid data, and
for each superblock in the respective group of flash memory devices, a count for the number of superpages in the superblock which store invalid data and a count for the number of times the superblock has been erased.

20. The system of claim 19, wherein the external memory further includes:
a portion for a plurality of firmware overlays, related to a plurality of processors, the firmware overlays including program code to be loaded by and used by the processors.

21. The system of claim 19, wherein the external memory further includes:
a portion for a third table holding Small Computer Systems Interface (SCSI) tag information, the third table including a plurality of indicators, each indicator indicating whether one or more SCSI tags is currently active in the storage controller.

22. The system of claim 21, wherein the third table further includes information identifying an initiator for each currently active SCSI tag.

23. The system of claim 19, wherein n is a number ranging from approximately twelve (12) to approximately sixteen (16).

24. The system of claim 23, wherein each first table physical flash memory address represents a location on more than one flash memory die.

25. The system of claim 24, wherein the external memory further includes:
a portion for a plurality of third tables, each containing information relating to an area of flash memory device that is currently open for writing, the information including a time stamp and an indication regarding whether a subset of the area is defective.

26. The system of claim 25, wherein:
each third table further includes an erase count for the area or for a subset of the area and information associating logical addresses with physical addresses that are within the area.

27. The system of claim 26, wherein:
the mass storage controller includes a plurality of flash ports, and
each third table is associated with each flash port.

* * * * *

UNITED STATES PATENT AND TRADEMARK OFFICE
CERTIFICATE OF CORRECTION

PATENT NO. : 8,751,755 B2  
APPLICATION NO. : 12/082206  
DATED : June 10, 2014  
INVENTOR(S) : Prins et al.

Page 1 of 1

It is certified that error appears in the above-identified patent and that said Letters Patent is hereby corrected as shown below:

In the claims,

Claim 3, col. 93, line 21, please delete "volatile"

Signed and Sealed this  
Twenty-sixth Day of August, 2014

Michelle K. Lee  
*Deputy Director of the United States Patent and Trademark Office*